US006908724B2

(12) United States Patent
Araki et al.

(10) Patent No.: US 6,908,724 B2
(45) Date of Patent: Jun. 21, 2005

(54) FLUORINE-CONTAINING POLYMER HAVING ACID-REACTIVE GROUP AND CHEMICALLY AMPLIFYING TYPE PHOTORESIST COMPOSITION PREPARED FROM SAME

(75) Inventors: Takayuki Araki, Settsu (JP); Meiten Koh, Settsu (JP); Yoshito Tanaka, Settsu (JP); Takuji Ishikawa, Settsu (JP); Hirokazu Aoyama, Settsu (JP); Tetsuo Shimizu, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 80 days.

(21) Appl. No.: 10/262,893

(22) Filed: Oct. 3, 2002

(65) Prior Publication Data

US 2003/0152864 A1 Aug. 14, 2003

Related U.S. Application Data

(63) Continuation-in-part of application No. PCT/JP01/02897, filed on Apr. 3, 2001.

(30) Foreign Application Priority Data

| Apr. 4, 2000 | (JP) | 2000-102799 |
|---|---|---|
| Jun. 13, 2000 | (JP) | 2000-177494 |
| Mar. 6, 2001 | (JP) | 2001-061896 |

(51) Int. Cl.$^7$ .............................................. G03F 7/004

(52) U.S. Cl. ................... 430/270.1; 430/905; 430/907; 526/242; 526/281

(58) Field of Search .............................. 430/270.1, 905, 430/907; 526/242, 281

(56) References Cited

U.S. PATENT DOCUMENTS

| 3,282,875 A | 11/1966 | Connolly et al. |
|---|---|---|
| 3,624,053 A | 11/1971 | Gibbs et al. |
| 4,596,864 A | 6/1986 | Trotz et al. |
| 4,632,881 A | 12/1986 | Trotz et al. |
| 4,963,463 A | 10/1990 | Koshiba et al. |
| 4,985,337 A | 1/1991 | Sasa et al. |
| 5,212,046 A | 5/1993 | Lamola et al. |
| 5,229,473 A | 7/1993 | Kobo et al. |

(Continued)

FOREIGN PATENT DOCUMENTS

| DE | 42 07 261 A1 | 9/1993 |
|---|---|---|
| DE | 43 19 178 A1 | 12/1993 |
| EP | 0 789 278 A2 | 8/1997 |
| EP | 0 875 789 A1 | 11/1998 |
| EP | 0 880 075 A1 | 11/1998 |
| EP | 1 035 441 A1 | 9/2000 |
| JP | 55-18673 A | 2/1980 |
| JP | 55-58211 A | 4/1980 |
| JP | 64-43512 A | 2/1989 |
| JP | 3-3238 A | 1/1991 |
| JP | 9-50129 | 2/1997 |
| JP | 10-111569 A | 4/1998 |
| JP | 10-158337 A | 6/1998 |
| JP | 11-84663 A | 3/1999 |
| JP | 11-133593 A | 5/1999 |
| JP | 11-174677 A | 7/1999 |
| JP | 11-242337 A | 9/1999 |
| JP | 11-327147 A | 11/1999 |
| JP | 2000-292926 A | 10/2000 |
| JP | 2000-298345 A | 10/2000 |
| JP | 2000-321774 A | 11/2000 |
| JP | 2001-22076 A | 1/2001 |
| JP | 2001-133979 A | 5/2001 |
| JP | 2001-154362 A | 6/2001 |
| JP | 2001-296662 | 10/2001 |
| JP | 2001-328964 | 11/2001 |
| WO | WO 00/17712 A1 | 3/2000 |
| WO | WO 00/67072 A1 | 11/2000 |
| WO | WO 01/37047 A2 | 5/2001 |
| WO | WO 200273316 A1 * | 9/2002 ........... G03F/7/039 |

OTHER PUBLICATIONS

Toriumi et al. "Tetrafluoroethylene–based fluoropolymers for 157 nm Resist Materials"; Journal of Photopolymer Science and Technology vol. 16 No. 4, (2003), 607–614.*

International Preliminary Examination Report for PCT/JP01/02897 dated Mar. 19, 2002.

International Search Report for PCT/JP01/02897 dated Jun. 26, 2001.

International Preliminary Examination Report for PCT/JP01/02897 (Japanese language).

Barr et al.; "Perfluoralkyl Derivatives of Nitrogen. Part I. Perfluoro–2–methyl–1 : 2–oxazetidine and Perfluoro(alkylenealkylamines)"; J. Fluorine Chem., pp. 1881–1891 (1955).

*Primary Examiner*—Yvette C. Thornton
(74) *Attorney, Agent, or Firm*—Sughrue Mion, PLLC

(57) ABSTRACT

There is provided a novel fluorine-containing polymer having an acid-reactive group which has a high transparency against energy rays (radioactive rays) in a vacuum ultraviolet region (157 nm), and further there are provided a material for fluorine-containing base polymer prepared from the polymer and suitable for a photoresist and a chemically amplifying type resist composition obtained therefrom.

The polymer has a number average molecular weight of from 1,000 to 1,000,000 and represented by the formula: —(M1)—(M2)—(A)—, wherein M1 is a structural unit having an acid-labile or acid-degradable functional group, M2 is a structural unit of fluorine-containing acryl ester, A is a structural unit derived from other copolymerizable monomer, the percent by mole ratio M1/M2 is 1 to 99/99 to 1 and the polymer comprises from 1 to 99% by mole of the structural unit M1, from 1 to 99% by mole of the structural unit M2 and from 0 to 98% by mole of the structural unit A1. The material for fluorine-containing base polymer comprises a fluorine-containing polymer having an acid-reactive group such as the above-mentioned polymer and is suitable for a photoresist, and the chemically amplifying type resist composition is obtained from those polymer and material.

38 Claims, No Drawings

U.S. PATENT DOCUMENTS

| | | |
|---|---|---|
| 5,292,614 A | 3/1994 | Ochiai et al. |
| 5,302,490 A | 4/1994 | Fedynyshyn et al. |
| 5,362,606 A | 11/1994 | Hartney et al. |
| 5,391,465 A | 2/1995 | Feely |
| 5,658,708 A | 8/1997 | Kondo |
| 5,698,369 A | 12/1997 | Kawamura et al. |
| 5,731,123 A | 3/1998 | Kawamura et al. |
| 5,738,975 A | 4/1998 | Nakano et al. |
| 5,756,254 A | 5/1998 | Kihara et al. |
| 5,780,566 A | 7/1998 | Mertesdorf |
| 5,837,420 A | 11/1998 | Aoai et al. |
| 5,840,467 A | 11/1998 | Kitatani et al. |
| 5,863,701 A | 1/1999 | Mertesdorf |
| 5,876,899 A | 3/1999 | Szmanda et al. |
| 5,900,346 A | 5/1999 | Sinta et al. |
| 5,935,733 A | 8/1999 | Scott et al. |
| 5,948,587 A | 9/1999 | Kawabe et al. |
| 5,952,150 A | 9/1999 | Ohta et al. |
| 6,042,991 A | 3/2000 | Aoai et al. |
| 6,143,472 A * | 11/2000 | Sumino et al. ............ 430/283.1 |
| 6,159,655 A * | 12/2000 | Sato ........................ 430/270.1 |
| 6,387,589 B1 * | 5/2002 | Koh et al. ................ 430/270.1 |
| 6,468,712 B1 * | 10/2002 | Fedynyshyn ............. 430/270.1 |
| 6,579,658 B2 | 6/2003 | Hatakeyama et al. |
| 6,593,058 B1 * | 7/2003 | Feiring et al. ............ 430/270.1 |
| 2001/0018161 A1 | 8/2001 | Hashimoto |
| 2002/0009668 A1 | 1/2002 | Nishimura et al. |
| 2003/0059710 A1 | 3/2003 | Inoue |
| 2004/0101787 A1 * | 5/2004 | Naito et al. .................. 430/325 |

\* cited by examiner

FLUORINE-CONTAINING POLYMER HAVING ACID-REACTIVE GROUP AND CHEMICALLY AMPLIFYING TYPE PHOTORESIST COMPOSITION PREPARED FROM SAME

CROSS-REFERENCE TO RELATED APPLICATION

This is a continuation-in-part of PCT international application No. PCT/JP01/02897 filed Apr. 3, 2001, the disclosure of which is incorporated herein by reference.

BACKGROUND OF THE INVENTION

The present invention relates to a novel fluorine-containing polymer having an acid-reactive group, and further relates to a material for a fluorine-containing base polymer which has a high transparency against energy rays (radioactive rays) in a vacuum ultraviolet region and is suitable for use on a photoresist and relates to a chemically amplifying type photoresist composition prepared therefrom.

As a result of an increasing necessity for high integration of a large scale integrated circuit (LSI), microfabrication technology is required for photolithography technology. In order to satisfy such requirements, there have been attempts to use, as exposure light sources, a deep ultraviolet, a KrF excimer laser (wavelength: 248 nm) and a ArF excimer laser (wavelength: 193 nm) which have a wavelength shorter than conventional g-rays (wavelength: 436 nm) and i-rays (wavelength: 365 nm). Those light sources are put into practical use.

Recently a process using a $F_2$ laser (wavelength: 157 nm) having a wavelength in a vacuum ultraviolet region has been studied in a ultra-microfabrication technology and is considered promising as an exposure technology aiming at a technology node of 0.1 μm.

On the other hand in the pattern formation, a chemically amplifying type resist which becomes advantageous in transparency, resolution, sensitivity and dry etching resistance in cases of energy rays having various wavelengths has been studied. The chemically amplifying type resist means, for example, in case of a positive resist, an energy-sensitive composition comprising a resin soluble in an alkali developing solution and having an introduced substituent which has an effect of inhibiting dissolution of the resin but is deprotected due to action of an acid, and a compound which generates an acid by irradiation of energy rays such as light and electron beam (hereinafter referred to as a photoacid generator). When the composition is irradiated with light or electron beam, an acid is generated from the photoacid generator, and by heating (post-exposure bake, hereinafter referred to as "PEB") after the exposure of light, the substituent which has been giving a dissolution inhibiting effect on the resin is deprotected due to action of an acid. As a result, the exposed portion becomes soluble in alkali, and by treating the exposed portion with an alkali developing solution, a positive resist pattern can be obtained. In that case, the acid acts as a catalyst and exhibits its effect in a very small amount. Also action of the acid becomes active by the PEB and a chemical reaction is accelerated like a chain reaction, and thus sensitivity is enhanced.

Examples of conventional resins used for such a chemically amplifying type resist are phenol resins, a part or a whole of hydroxyl groups of which is protected by protective groups such as acetal and ketal (KrF resist), methacrylic acid resins in which an acid-labile ester group acid is introduced into carboxyl group (ArF resist) and the like.

However there is a basic problem that those conventional polymers for a resist have a strong absorption in a wavelength range of a vacuum ultraviolet region and transparency thereof is low (molecular absorption coefficient is large) in a $F_2$ laser having a wavelength of 157 nm which have been studied for use in a ultra-microfabrication process. Therefore in case of exposure with a $F_2$ laser, it is necessary to make a thickness of the resist extremely thin, and substantially it is difficult to use those polymers as a single layer $F_2$ resist.

R. R. Kunz, T. M. Bloomstein, et al. made a comparison of transparency of various materials at a wavelength of 157 nm and disclosed in Journal of Photopolymer Science and Technology (Vol. 12, No.4 (1999), pp 561–569) that fluorocarbons have good transparency, which suggests possibility of use thereof as the $F_2$ resist.

However that publication only describes that the existing fluorocarbon polymers have a high transparency at a wavelength of 157 nm but does not describe a concrete preferred structure of a fluorine-containing polymer. Also, for example, with respect to a fluorine-containing polymer having a functional group necessary for a chemically amplifying type positive or negative resist, neither evaluation of its transparency nor its synthesis was made. Further there was no suggestion at all with respect to a fluorine-containing base polymer material preferable for a chemically amplifying type resist and a preferable resist composition prepared from such a material, and there was found no possibility of forming a $F_2$ resist pattern by using a fluorine-containing polymer.

Thereafter A. E. Feiring, et al. of E.I. du Pont de Nemours and Company disclosed in PCT patent publication No. WO00/17712 (laid open on Mar. 30, 2000) that a specific fluorine-containing polymer is useful for $F_2$ resist application.

That PCT patent publication discloses use of a fluorine-containing polymer comprising a structural unit of fluoroolefin and a structural unit having a polycyclic structure, but a fluorine-containing polymer not having a polycyclic structure, for example, a fluorine-containing ethylenic polymer having a chain structure is not disclosed therein.

Also, introduction of an acid-labile (or an acid-degradable) functional group which is necessary for a positive resist, into a fluorine-containing polymer has been carried out by copolymerizing a monomer obtained by introducing an acid-labile (or an acid-degradable) functional group into a conventional acrylic, methacrylic, norbornene or vinyl ester monomer. However there is no disclosure with respect to use of a monomer having both of fluorine atom or fluoroalkyl group and an acid-labile (or an acid-degradable) functional group.

Also, there is disclosed a norbornene derivative and halogen-substituted norbornene as an example of a polycyclic structure constituting a fluorine-containing polymer for use in a resist. However concretely there is no disclosure as to fluorine substitution, simultaneous substitution of fluorine atom and an acid-reactive group in one molecule and further substitution at a specific position.

Further thereafter A. E. Feiring, et al. of E.I. du Pont de Nemours and Company disclosed in PCT patent publication No. WO00/67072 (laid open on Nov. 9, 2000) that a fluorine-containing polymer having —C(Rf)(Rf')OH or —C(Rf)(Rf')O—Rb is useful for $F_2$ resist application.

The above-mentioned PCT patent publication discloses an introduction of —C(Rf)(Rf')OH or —C(Rf)(Rf')O—Rb into a fluorine-containing polymer by copolymerization of a norbornene derivative or an ethylenic monomer having —C(Rf)(Rf')OH or —C(Rf)(Rf')O—Rb but discloses no fluorine-containing polymer having a structural unit of a fluorine-containing monomer having a functional group which is converted to carboxyl group by a reaction with an acid.

Also, norbornene derivatives having —C(Rf)(Rf')OH or —C(Rf)(Rf')O—Rb are disclosed as one example of fluorine-containing polymers for use in a resist, and a halogen-substituted norbornene is also described therein. However concretely there is no disclosure as to fluorine substitution, simultaneous substitution of fluorine atom and an acid-reactive group (particularly a functional group to be converted to carboxyl group by a reaction with an acid) in one molecule and further substitution at a specific position.

The first object of the present invention is to provide a novel fluorine-containing polymer having an acid-reactive group and usable as a polymer for a resist and to provide a coating film thereof.

The second object is to provide a fluorine-containing base polymer material which has a high transparency at a wavelength in a vacuum ultraviolet region (for example, 157 nm), is usable as a base polymer for a chemically amplifying type photoresist, and has an introduced acid-reactive group.

Further the third object is to provide a chemically amplifying type photoresist composition which comprises a fluorine-containing polymer having an acid-reactive group and a photoacid generator and is usable for a patterning process using a $F_2$ laser as a light source, and to provide a coating film obtained by coating the composition.

Further Katsuyama, et al. of Matsushita Electric Industrial Co., Ltd. have proposed a method of forming a pattern by exposure of light having a wavelength within the range of from 1 to 180 nm by using a resist material having halogen atom, etc. (JP-A-2000-321774, laid open on Nov. 24, 2000). However only a methacrylic resin having a structural unit of methacrylic acid ester having —$CH_2CF_3$ group or —CH($CF_3$)$_2$ group on its side chain is disclosed as a base resin having halogen atom for a resist, and there is disclosed neither a resin having fluorine atom on its trunk chain nor a polymer which has a structural unit of fluorine-containing monomer having fluorine atom and a functional group simultaneously and can be used for a chemically amplifying type resist (positive or negative). Further there is no disclosure as to a polymer having a ring structure on its trunk chain.

SUMMARY OF THE INVENTION

The inventors of the present invention have made intensive studies in order to attain those objects and as a result have found a novel fluorine-containing polymer having an acid-reactive group which is useful as a polymer for a resist.

The inventors also have found that a fluorine-containing polymer having a specific acid-reactive group is useful as a base polymer material for a resist and further has a high transparency in a vacuum ultraviolet region.

Further the inventors have found that a composition comprising such a base polymer material for a resist and a photoacid generator is useful as a resist composition, can provide a coating film having a high transparency in a vacuum ultraviolet region by coating the composition and can be used as a chemically amplifying type positive or negative resist.

The first invention I (hereinafter referred to as Invention I) relates to novel fluorine-containing polymers having an acid-labile or acid degradable functional group as an acid-reactive group.

One of the novel fluorine-containing polymers of the first invention I is a fluorine-containing acrylic polymer having a number average molecular weight of from 1,000 to 1,000,000 and represented by the formula I-(1):

wherein M1 is represented by:

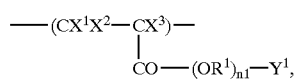

M2 is represented by:

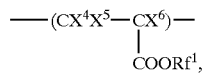

wherein $X^1$, $X^2$, $X^4$ and $X^5$ are the same or different and each is H or F; $X^3$ and $X^6$ are the same or different and each is H, Cl, $CH_3$, F or $CF_3$; $Y^1$ is an acid-labile or acid-degradable functional group; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; $Rf^1$ is a fluorine-containing alkyl group having 1 to 20 carbon atoms, a fluorine-containing alkyl group having 2 to 100 carbon atoms and ether bond or a fluorine-containing aryl group having 3 to 20 carbon atoms; n1 is 0 or 1, A1 is a structural unit derived from a monomer copolymerizable with the structural units M1 and M2, when M1+M2 is assumed to be equal to 100% by mole, a percent by mole ratio M1/M2 is 1 to 99/1 to 99, and the fluorine-containing polymer comprises from 1 to 99% by mole of the structural unit M1, from 1 to 99% by mole of the structural unit M2 and from 0 to 98% by mole of the structural unit A1.

The first invention also relates to the second and third fluorine-containing polymers represented by the formulae I-(2) and I-(3) mentioned hereinafter.

Further the first invention relates to a base polymer material comprising the above-mentioned fluorine-containing polymer and relates to a chemically amplifying type photoresist composition comprising the fluorine-containing polymer having an acid-reactive group, a photoacid generator and a solvent.

The second invention II (hereinafter referred to as Invention II) relates to a chemically amplifying type photoresist composition comprising:

(A) a fluorine-containing polymer having an acid-reactive group, (B) a photoacid generator, and (C) a solvent, wherein the fluorine-containing polymer (A) having an acid-reactive group is a fluorine-containing polymer represented by the formula II-(1):

in which
① the structural unit M1 is a structural unit derived from an ethylenic monomer having an acid-reactive group,
② the structural unit M2 is a structural unit derived from a fluorine-containing ethylenic monomer and ③ the structural unit N is a structural unit derived from an ethylenic monomer copolymerizable with M1 and M2, when M1+M2 is equal to 100% by mole, a percent by mole ratio M1/M2 is 1 to 99/1 to 99, and the polymer comprises from 1 to 99% by mole of the structural unit M1, from 1 to 99% by mole of the structural unit M2 and from 0 to 98% by mole of the structural unit N and does not have a polycyclic structure in its side chain.

The third invention III (hereinafter referred to as Invention III) relates to a chemically amplifying type photoresist composition which comprises:

(A) a fluorine-containing polymer having an acid-reactive group, (B) a photoacid generator and (C) a solvent, wherein the fluorine-containing polymer (A) having an acid-reactive group is a fluorine-containing polymer represented by the formula III-(1):

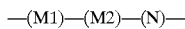

—(M1)—(M2)—(N)—  III-(1), in which

① the structural unit M1 is a structural unit derived from an ethylenic monomer having an acid-reactive group, ② the structural unit M2 is a structural unit having a fluorine-containing aliphatic ring structure in the trunk chain of polymer, and ③ the structural unit N is a structural unit derived from a fluorine-containing ethylenic monomer copolymerizable with M1 and M2, when M1+M2 is assumed to be equal to 100% by mole, a percent by mole ratio M1/M2 is 1 to 99/1 to 99, and the polymer comprises from 1 to 99% by mole of the structural unit M1, from 1 to 99% by mole of the structural unit M2 and from 0 to 98% by mole of the structural unit N and does not have a polycyclic structure in its trunk chain and side chain.

The fourth invention IV (hereinafter referred to as Invention IV) relates to a chemically amplifying type photoresist composition which comprises:

(A) a fluorine-containing polymer having an acid-labile or acid-degradable functional group, (B) a photoacid generator, and (C) a solvent, wherein the fluorine-containing polymer (A) having an acid-reactive group is a polymer represented by the formula IV-(1):

—(M1)—(M2)—(M3)—(N)—  IV-(1),

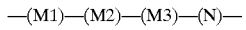

in which

① the structural unit M1 is a structural unit derived from a fluorine-containing ethylenic monomer having a functional group which is acid-labile or acid-degradable and is converted to carboxyl group by a reaction with an acid, ② the structural unit M2 is a structural unit derived from an alicyclic monomer, ③ the structural unit M3 is a structural unit derived from a fluorine-containing ethylenic monomer, and ④ the structural unit N is a structural unit derived from an ethylenic monomer copolymerizable with M1, M2 and M3, when M1+M2+M3 is assumed to be equal to 100% by mole, a percent by mole ratio M1/M2/M3 is 1 to 98/1 to 98/1 to 98, and the polymer comprises from 1 to 98% by mole of the structural unit M1, from 1 to 98% by mole of the structural unit M2, from 1 to 98% by mole of the structural unit M3 and from 0 to 97% by mole of the structural unit N.

The fifth invention V (hereinafter referred to as Invention V) relates to a chemically amplifying type photoresist composition which comprises:

(A) a fluorine-containing polymer having an acid-reactive group, (B) a photoacid generator, and (C) a solvent, wherein the fluorine-containing polymer (A) having an acid-reactive group is a fluorine-containing polymer comprising the structural unit M1 derived from a fluorine-containing alicyclic monomer which has an acid-reactive group and is represented by the formula V-(1):

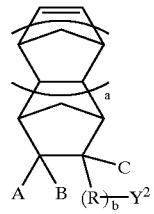

V-(1)

in which A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that b is 0 or R does not have fluorine atom, any one of A to C is fluorine atom or a fluorine-containing alkyl group.

The first disclosure of the invention (Invention I) relates to the novel fluorine-containing polymers having an acid-labile or acid-degradable functional group as an acid-reactive group.

First, explained below is the first novel fluorine-containing acrylic polymer represented by the formula I-(1).

In the fluorine-containing polymer of the formula I-(1), when any of $X^1$, $X^2$ and $X^3$ as essential components of the structural unit M1 having $Y^1$ are other than fluorine atom and n1 is 0 or $R^1$ does not have fluorine atom, the structural unit M2 of the fluorine-containing acryl is contained as an essential component, and when M1+M2 is assumed to be equal to 100% by mole, the percent by mole ratio M1/M2 is 1 to 99/1 to 99.

When M1 has fluorine atom, the polymer may be one comprising at least one selected from the structural units M1 (when M1+M2 is assumed to be equal to 100% by mole, the percent by mole ratio M1/M2 is 1 to 100/0 to 99).

The fluorine-containing polymer represented by the formula I-(1) is preferably one having a number average molecular weight of from 1,000 to 1,000,000 and represented by the formula I-(1)-1:

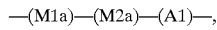

—(M1a)—(M2a)—(A1)—, wherein M1a is represented by:

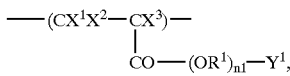

M2a is represented by:

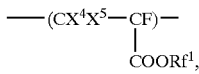

wherein $Y^1$, $X^1$, $X^2$, $X^4$, $X^5$, $R^1$, $Rf^1$ and n1 are as defined in the formula I-(1),
A1 is a structural unit derived from a monomer copolymerizable with the structural units M1a and M2a,
when M1a+M2a is assumed to be equal to 100% by mole, the percent by mole ratio M1a/M2a is 1 to 100/0 to 99,
and the fluorine-containing polymer comprises from 1 to 100% by mole of the structural unit M1a, from 0 to 99% by mole of the structural unit M2a and from 0 to 99% by mole of the structural unit A1.

The fluorine-containing polymer represented by the formula I-(1) is further preferably one having a number average molecular weight of from 1,000 to 1,000,000 and represented by the formula I-(1)-2:

—(M1b)—(M2b)—(A1)—, wherein M1b is represented by:

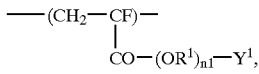

M2b is represented by:

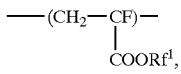

wherein $Y^1$, $R^1$, $Rf^1$ and n1 are as defined in the formula I-(1),
A1 is a structural unit derived from a monomer copolymerizable with the structural units M1b and M2b,
when M1b+M2b is assumed to be equal to 100% by mole, the percent by mole ratio M1b/M2b is 1 to 100/0 to 99,
and the fluorine-containing polymer comprises from 1 to 100% by mole of the structural unit M1b, from 0 to 99% by mole of the structural unit M2b and from 0 to 99% by mole of the structural unit A1.

The fluorine-containing acrylic polymer as represented by the formula I-(1)-1 or the formula I-(1)-2 which has an acid-reactive functional group and fluorine atom at a-position is particularly preferred from the viewpoint that it can be used for various optical applications and semiconductor applications such as a resist because it is excellent not only in heat resistance and mechanical properties but also in optical properties because of a low refractive index and further is high in transparency up to a vacuum ultraviolet region.

In the formulae I-(1), I-(1)-1 and I-(1)-2, the polymer may have or may not have —$OR^1$—. When the polymer has —$OR^1$—, $R^1$ may be selected from the above-mentioned divalent hydrocarbon groups and fluorine-containing alkylene groups and is preferably a divalent hydrocarbon group. Examples thereof are:

—$(CH_2)_n$— (n represents an integer of from 1 to 10),

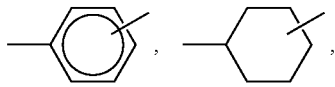

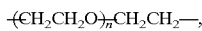

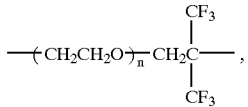 (n is 0 or an integer of from 1 to 5),

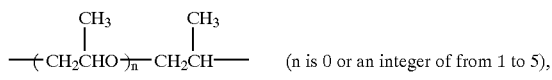

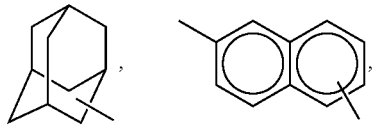

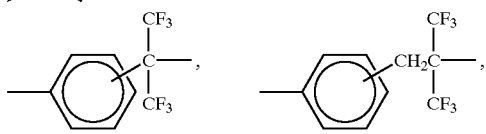

and the like.

In the formulae I-(1), I-(1)-1 and I-(1)-2, -$Rf^1$ is selected from the above-mentioned fluorine-containing alkyl groups. Examples thereof are preferably —$(CH_2)_m(CF_2)_n$—F, $(CH_2)_m(CF_2)_n$—H, —$(CH_2)_m(CF_2)_n$—Cl (m is an integer of from 1 to 5, n is an integer of from 1 to 10),

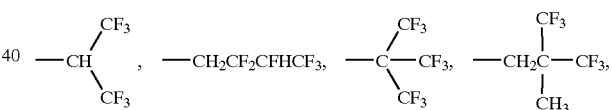

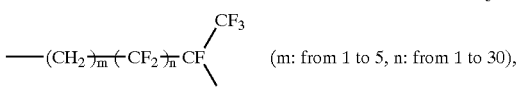 (m: from 1 to 5, n: from 1 to 30),

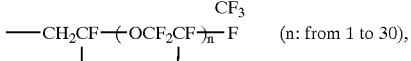 (n: from 1 to 30),

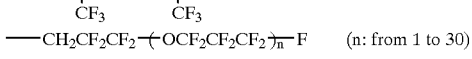 (n: from 1 to 30)

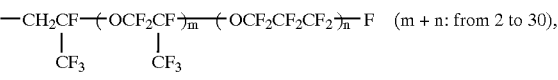 (m + n: from 2 to 30), and the like.

The polymers of the formulae I-(1), I-(1)-1 and I-(1)-2 of the present invention can be obtained by polymerizing ethylenically unsaturated monomers corresponding to the respective structural units M1 and M2 and if necessary, a monomer corresponding to A1; M1, M2 and A1; M1a, M2a and A1 (corresponding monomers, respectively); and M1b, M2b and A1 (corresponding monomers, respectively).

Examples of the monomers for the structural units M1, M1a and M1b having the acid-labile or acid-degradable functional group $Y^1$ (hereinafter represented by M1 unless otherwise noted) are:

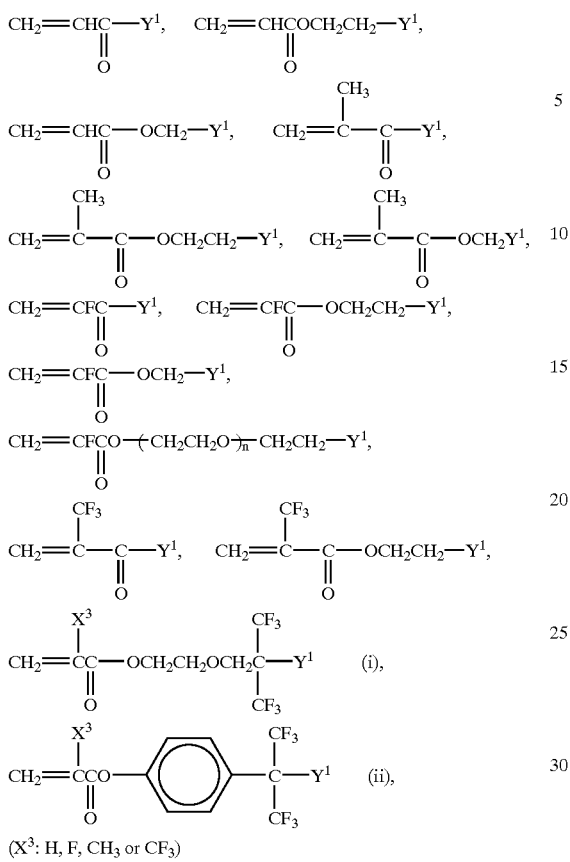

($X^3$: H, F, $CH_3$ or $CF_3$)

and the like.

Among the above-mentioned examples of the monomers constituting the M1, the compounds represented by the formulae (i) and (ii) have not been disclosed in pamphlets and patent publications and accordingly the polymers prepared from those monomers also have not been disclosed in pamphlets and patent publications.

Examples of the monomers for another structural units M2, M2a and M2b (hereinafter represented by M2 unless otherwise noted) constituting the polymer are:

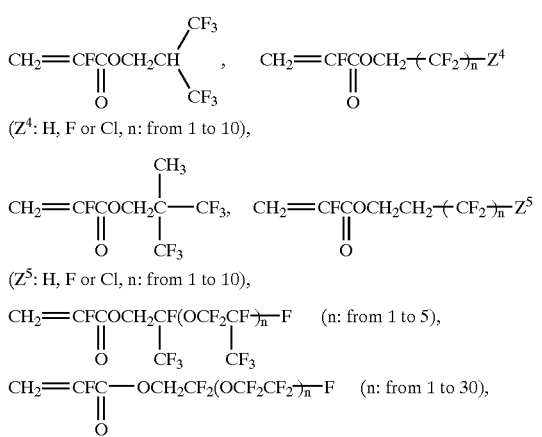

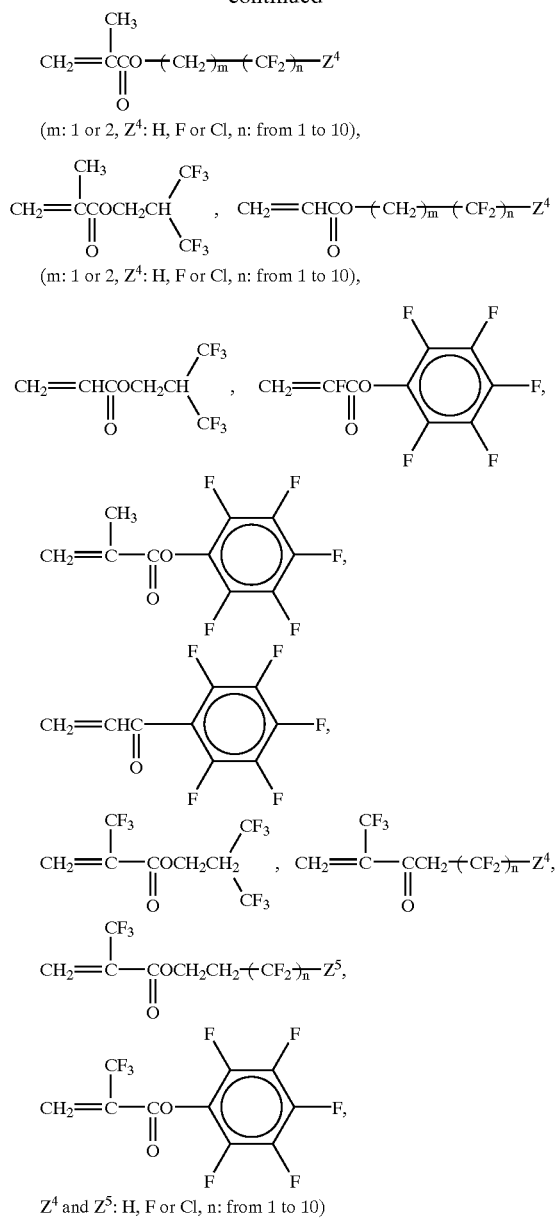

$Z^4$ and $Z^5$: H, F or Cl, n: from 1 to 10)

and the like.

In the formulae I-(1), I-(1)-1 and I-(1)-2 of the present invention, the acid-labile or acid-degradable functional group $Y^1$ represents a functional group causing dissociation reaction or degradation reaction due to action of an acid or cation.

Those reactions may be initiated at low temperature or may be initiated only by heating to high temperature.

It is particularly preferable that $Y^1$ is a functional group which can be converted to a hydrophilic group due to action of an acid, more preferably a functional group which can be converted to a group having an ability of making the fluorine-containing polymer soluble in an aqueous alkali solution.

Concretely preferred is a functional group convertible to —OH group, —COOH group, —$SO_3$H group or the like due to action of an acid.

Examples of $Y^1$ are:

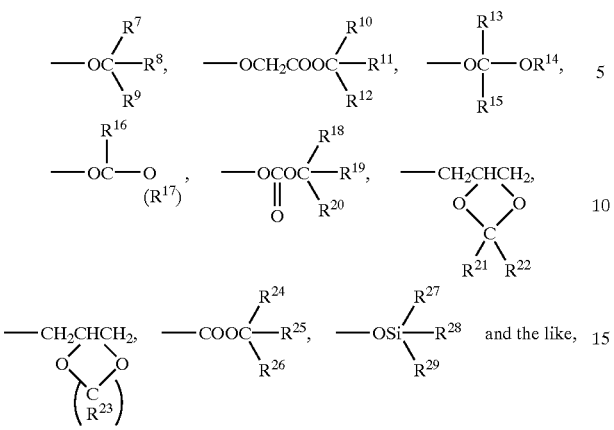

wherein $R^7$, $R^8$, $R^9$, $R^{10}$, $R^{11}$, $R^{12}$, $R^{14}$, $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or a hydrocarbon group having 1 to 10 carbon atoms; and $R^{17}$ and $R^{23}$ are divalent hydrocarbon groups having 2 to 10 carbon atoms.

More concretely there are:

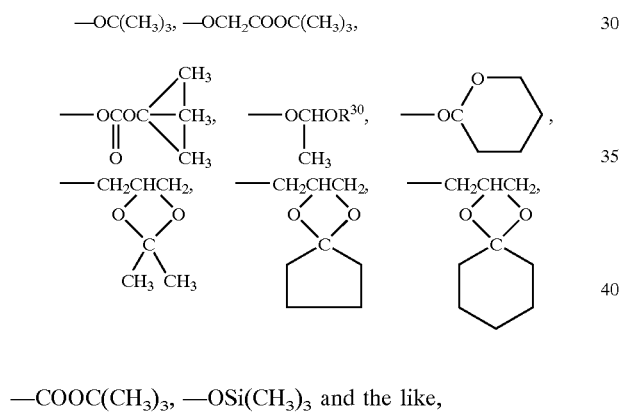

—COOC(CH$_3$)$_3$, —OSi(CH$_3$)$_3$ and the like, wherein $R^{30}$ is an alkyl group having 1 to 10 carbon atoms.

Functions of those functional groups make it possible to use the polymer on various acid-sensitive materials, photosensitive materials and resist materials.

The structural unit A1 derived from the monomer copolymerizable with M1 and M2 is an optional component and is not limited particularly. The structural unit A1 may be selected optionally depending on intended applications and required properties of the fluorine-containing polymer. Examples of the monomer giving the structural unit A1 are, for instance, the following compounds.

Acrylic Monomer (Excluding Monomers Giving M1 and M2):

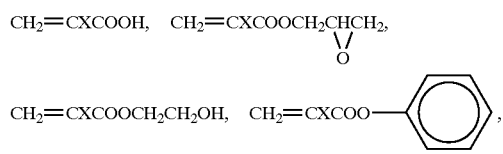

-continued

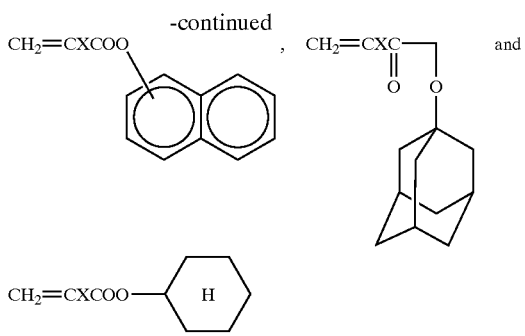

wherein X is selected from H, CH$_3$, F and CF$_3$.

Styrene Monomer:

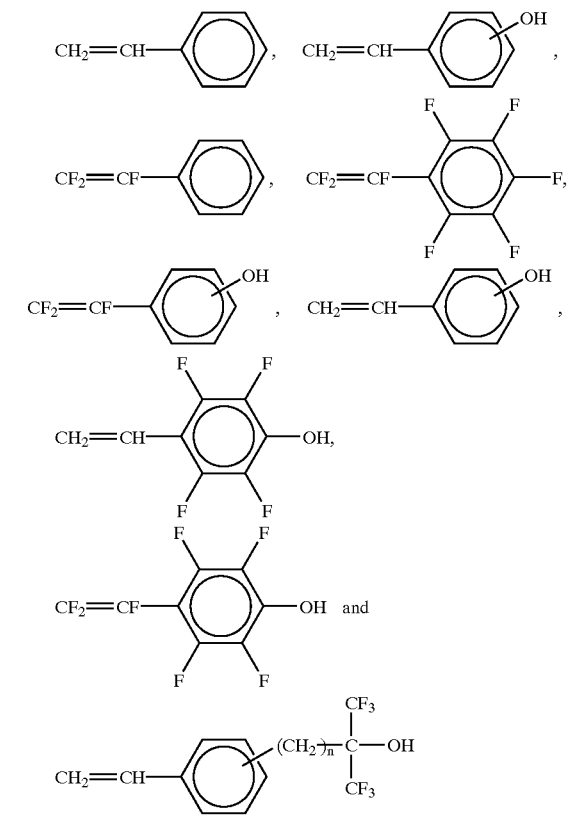

wherein n is 0 or an integer of 1 or 2.

Ethylene Monomer:
CH$_2$=CH$_2$, CH$_2$=CHCH$_3$, CH$_2$=CHCl and the like.

Maleic Acid Monomer:

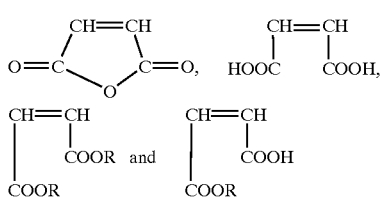

wherein R is a hydrocarbon group having 1 to 20 carbon atoms.

Allyl Monomer:
CH$_2$=CHCH$_2$Cl, CH$_2$=CHCH$_2$OH, CH$_2$=CHCH$_2$COOH, CH$_2$=CHCH$_2$Br and the like.

Allyl Ether Monomer:

CH$_2$=CHCH$_2$OR (R is a hydrocarbon group having 1 to 20 carbon atoms), CH$_2$=CHCH$_2$OCH$_2$(CF$_2$)$_n$X (n: from 1 to 10, X: H, Cl or F), CH$_2$=CHCH$_2$OCH$_2$CH$_2$COOH,

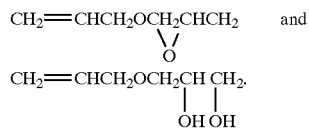

Alicyclic monomer which may have a functional group:

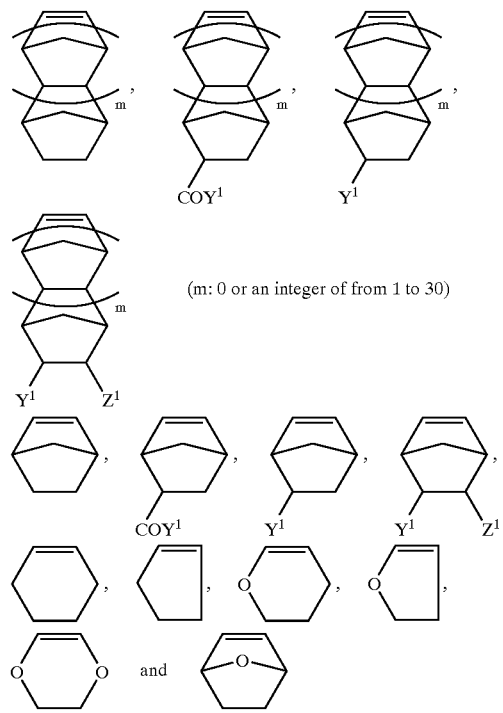

wherein Y$^1$ is an acid-labile or acid-degradable functional group, Z$^1$ is a functional group which is not dissociated by an acid.

Fluorine-containing alicyclic monomer represented by the formula (9):

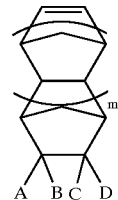

wherein A, B, C and D are H, F, an alkyl group having 1 to 10 carbon atoms or a fluorine-containing alkyl group having 1 to 10 carbon atoms, m is 0 or an integer of from 1 to 3, any one of A, B, C and D has fluorine atom.

Examples thereof are:

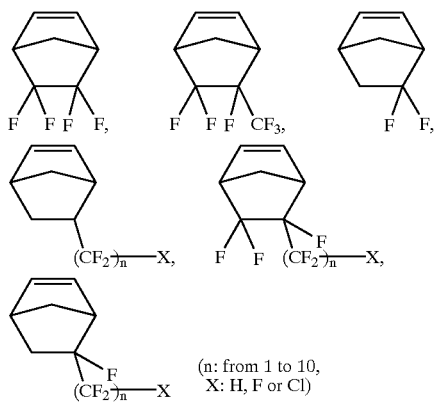

and the like.
In addition, there are:

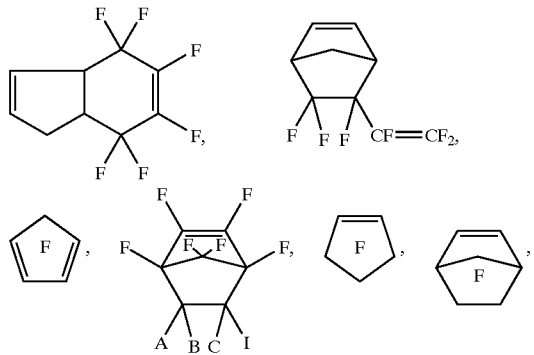

and the like, wherein A, B, C and D are H, F, an alkyl group having 1 to 10 carbon atoms or a fluorine-containing alkyl group having 1 to 10 carbon atoms.

Fluorine-containing alicyclic monomer having a functional group:

Examples thereof are novel fluorine-containing monomers represented by the formula (10):

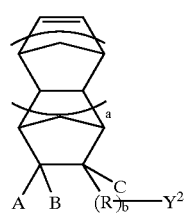

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; Y$^2$ is an acid-reactive functional group; provided that b is 0 or R does not have fluorine atom, any one of A, B and C is fluorine atom or a fluorine-containing alkyl group.

It is preferable that any one of A, B and C is fluorine atom, or that a content of fluorine atom of R is not less than 60% by weight when A, B and C do not have fluorine atom, and further it is preferable that R is a perfluoro alkylene group from the viewpoint that transparency can be imparted to the polymer.

Examples thereof are:

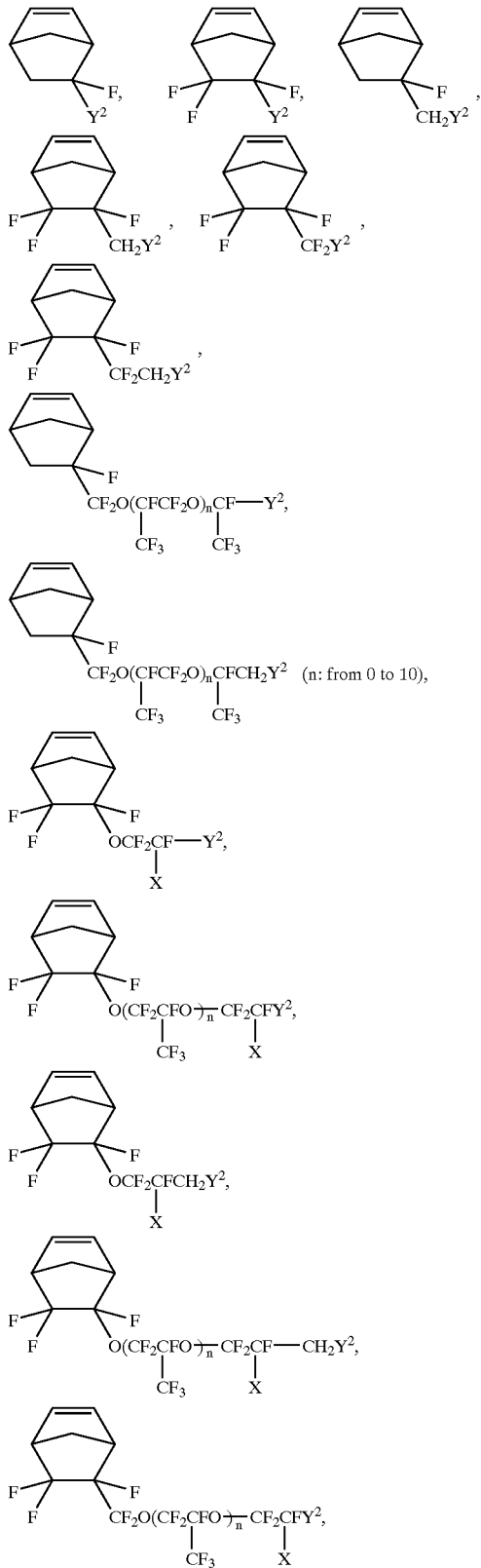

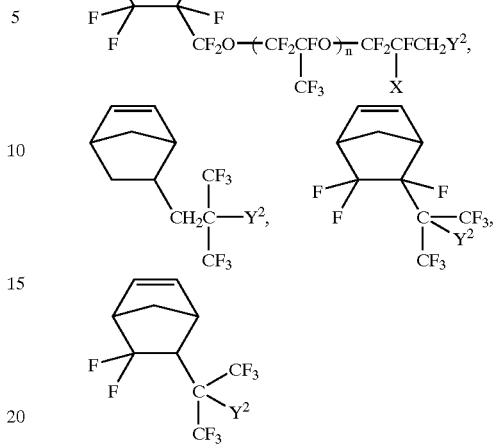

and the like wherein n is from 0 to 10, X is F or $CF_3$.

Also there are novel fluorine-containing monomers represented by the formula (11):

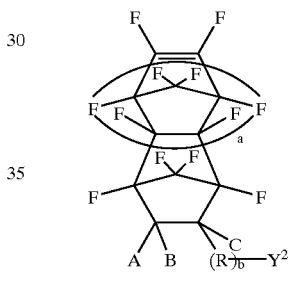

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group.

Examples thereof are preferably those having norbornene backbone such as:

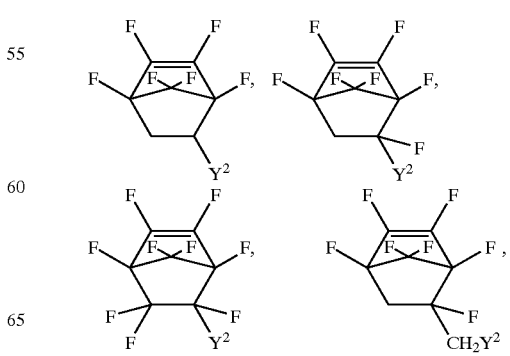

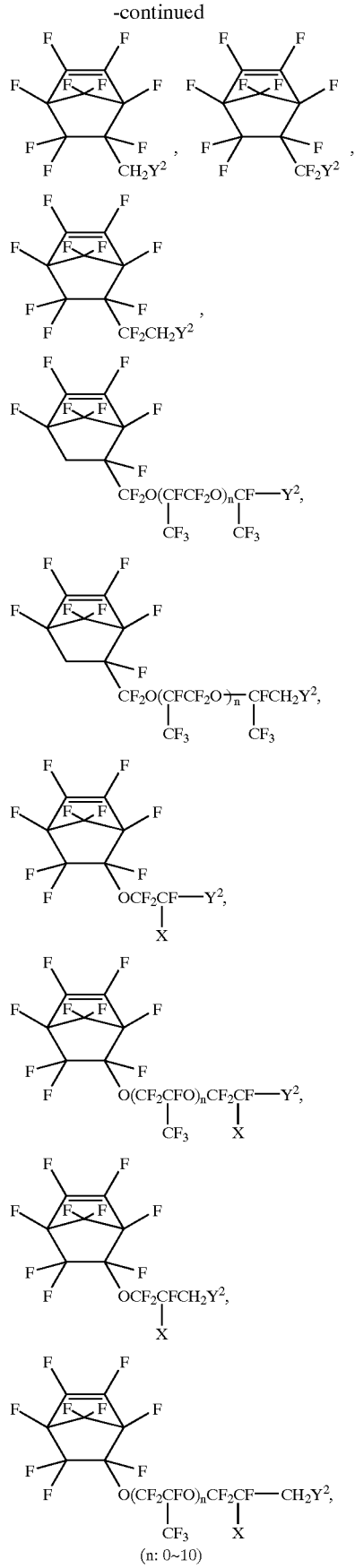
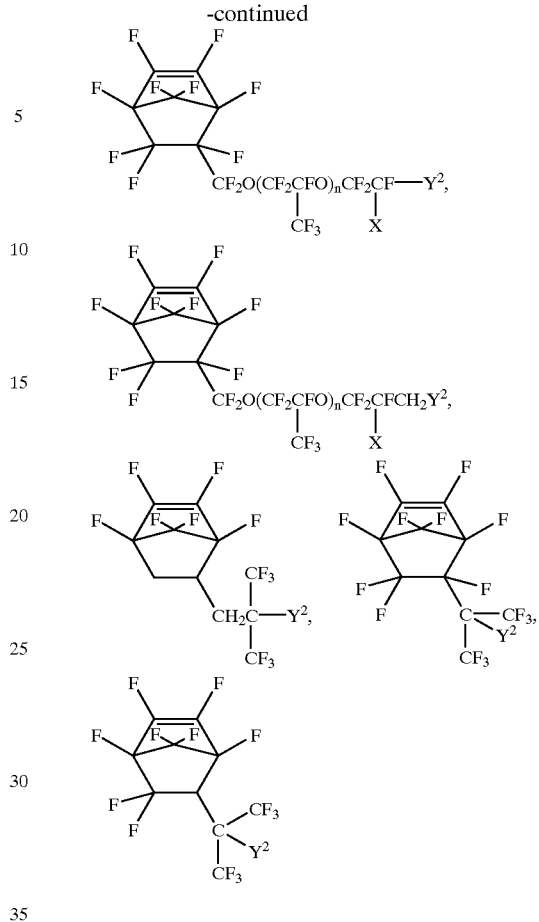
and the like, wherein n is from 0 to 10 and X is F or $CF_3$.
In addition, there are
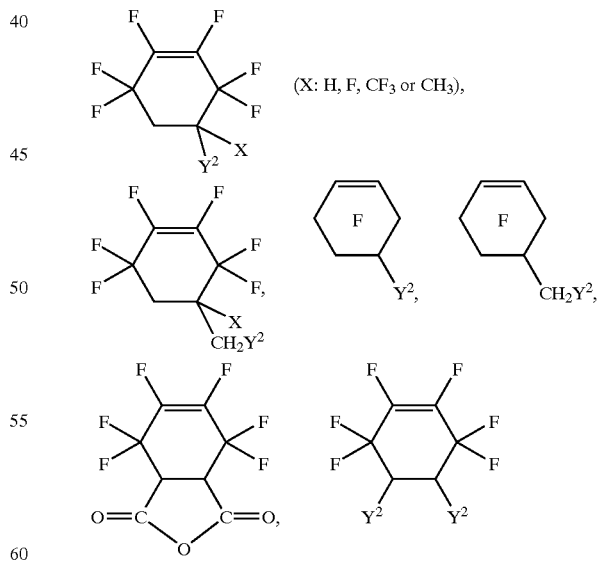
and the like.
The acid-reactive groups $Y^2$ contained in those alicyclic monomers are concretely acid-labile or acid-degradable functional groups or functional groups undergoing condensation reaction by an acid.

① Acid-labile or Acid-degradable Functional Group:

Examples thereof are preferably $Y^1$ which are exemplified in M1 of the above-mentioned formula I-(1) and are capable of changing to —OH group, —COOH group, —SO$_3$H group or the like due to action of an acid or cation.

② Functional Group Undergoing Condensation Reaction by an Acid:

The functional group undergoing condensation reaction by an acid is concretely a functional group which causes self-condensation or poly-condensation due to action of an acid or cation or condensation reaction or poly-condensation reaction with a crosslinking agent due to action of an acid in the presence of the crosslinking agent, or a functional group which causes a change in polarity by rearrangement by an acid or cation (for example, pinacol rearrangement or carbinol rearrangement). Preferred are functional groups selected from —OH, —COOH, —CN, —SO$_3$H, epoxy group and the like.

In the polymers of the formulae I-(1), I-(1)-1 and I-(1)-2, a ratio of M1/M2 (M1/M2, M1a/M2a, M1b/M2b) can be selected from the above-mentioned range depending on application, intended function, kind of the functional group $Y^1$ and the like. For example, in order to make the polymer soluble in alkali after the reaction with an acid, it is preferable that M1 (M1a, M1b) is present in an amount of from 5 to 100% by mole, preferably from 10 to 100% by mole, particularly preferably from 20 to 100% by mole, and a total amount of the structural units M2 (M2a, M2b) and A1 is from 0 to 95% by mole, preferably from 0 to 90% by mole, particularly preferably from 0 to 80% by mole.

The molecular weight of the polymers of the formulae I-(1), I-(1)-1 and I-(1)-2 can be selected within the range of from 1,000 to 1,000,000 in a number average molecular weight depending on application, purpose and form thereof at use, and is preferably from 3,000 to 700,000, more preferably from about 5,000 to about 500,000. When the molecular weight is too low, heat resistance and mechanical properties of the obtained polymer coating film tend to be insufficient, and a too high molecular weight is disadvantageous from the viewpoint of processability. Particularly when the polymer is used in the form of a coating material for forming a thin coating film, a too high molecular weight is disadvantageous from the viewpoint of film forming property, and the molecular weight is preferably not more than 300,000, particularly preferably not more than 200,000.

Concretely in the polymer of the formula I-(1) of the present invention, various combinations of M1 and M2 can be selected from the above-mentioned examples depending on intended application, physical properties (particularly glass transition temperature, melting point, etc.) and functions (transparency, refractive index, etc.). Usually a function of the functional group $Y^1$ is given to M1, and the above-mentioned other functions are adjusted by selecting kind (particularly Rf$^1$ group) and proportion of M2 and kind and proportion of A1. For example, in case of obtaining a polymer having a high Tg or a high melting point for enhancing heat resistance and mechanical properties, it is preferable that the monomer for M2 is selected from those having a bulky side chain. For example, the monomer for M2 can be selected from:

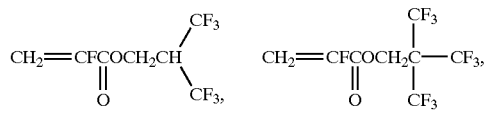

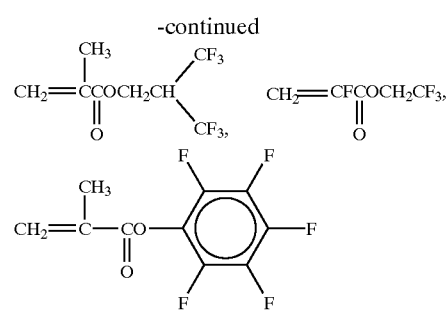

and the like.

On the contrary, when imparting flexibility and elasticity (elastomeric property), it is preferable that M2 is selected from those having a side chain with high mobility even at low temperature. For example, among the monomers for M2, the following monomers can be selected preferably:

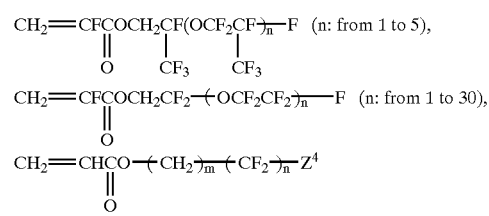

(m: 1 or 2, n: from 1 to 10, $Z^4$: H, F or Cl) and the like.

Also, in case of obtaining a transparent polymer having a low refractive index for optical applications (plastic optical fiber (POF), etc.) and semiconductor applications (resist, interface insulation film, etc.), it is preferable to make a content of fluorine atoms in the whole polymer including M1, M2 and A1 as high as possible, namely not less than 30% by weight, preferably not less than 50% by weight, particularly preferably not less than 60% by weight. From that point of view, in the formula I-(1), it is preferable that $X^3$ and $X^6$ are fluorine atom or CF$_3$, and further that M2 is selected from those having a higher fluorine atom content. For example, among the monomers for M2, there can be selected preferably:

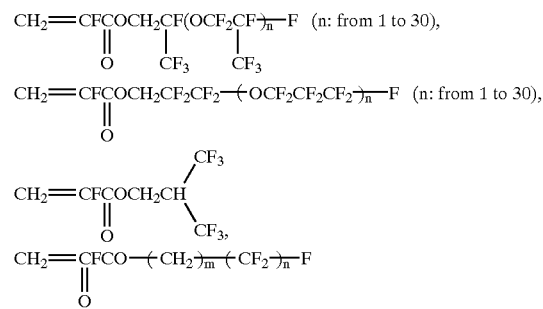

(m: 1 or 2, n: from 3 to 10) and the like.

The thus obtained fluorine-containing polymer of the formula I-(1) can be used for optical applications such as a plastic optical fiber and semiconductor applications such as a resist and interface insulation film because the polymer has good heat resistance, is non-crystalline, has a high transparency in a wide range of wavelength including a vacuum ultraviolet region and has a low refractive index.

Another novel fluorine-containing polymers of Invention I are the fluorine-containing allyl polymer and the fluorine-containing vinyl polymer represented by the formulae I-(2) and I-(2a), respectively.

The second novel fluorine-containing polymer is a fluorine-containing polymer having a number average molecular weight of from 1,000 to 1,000,000 and represented by the formula I-(2):

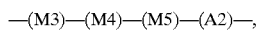

wherein M3 is represented by:

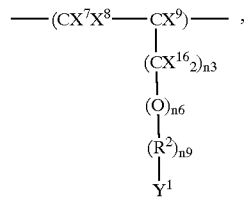

M4 is represented by:

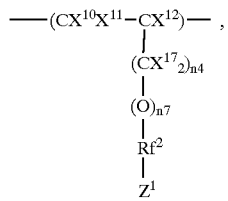

M5 is represented by:

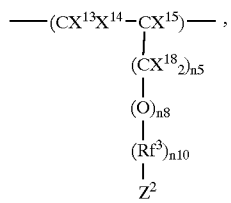

in which $X^7$, $X^8$, $X^9$, $X^{10}$, $X^{11}$, $X^{12}$, $X^{13}$, $X^{14}$, $X^{16}$, $X^{17}$ and $X^{18}$ are the same or different and each is H or F; $X^{15}$ is H, F or $CF_3$; $Y^1$ is an acid-labile or acid-degradable functional group; $Z^1$ is a functional group which is not dissociated or degraded by an acid; $Z^2$ is H, F or Cl; $R^2$, $Rf^2$ and $Rf^3$ are the same or different and each is a fluorine-containing alkylene group having 1 to 20 carbon atoms, a fluorine-containing alkylene group having 2 to 100 carbon atoms and ether bond or a fluorine-containing arylene group having 3 to 20 carbon atoms; n3, n4 and n5 are the same or different and each is 0 or an integer of 1 or 2; n6, n7, n8 and n10 are the same or different and each is 0 or 1; n9 is 1, A2 is a structural unit derived from a monomer copolymerizable with the structural units M3, M4 and M5, when M3+M4+M5 is assumed to be equal to 100% by mole, the percent by mole ratio M3/M4/M5 is 1 to 100/0 to 99/0 to 99, and the fluorine-containing polymer comprises from 1 to 100% by mole of the structural unit M3, from 0 to 99% by mole of the structural unit M4, from 0 to 99% by mole of the structural unit M5 and from 0 to 99% by mole of the structural unit A2.

The third novel fluorine-containing polymer is a fluorine-containing polymer having a number average molecular weight of from 1,000 to 1,000,000 and represented by the formula I-(2a):

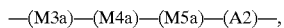

wherein M3a is represented by:

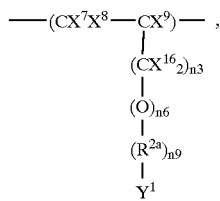

M4a is represented by:

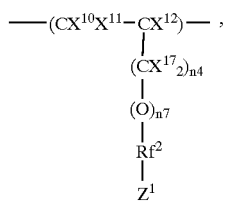

M5a is represented by:

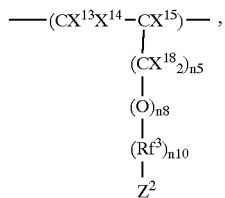

in which $R^{2a}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n9 is 0 or 1; $X^7$, $X^8$, $X^9$, $X^{10}$, $X^{11}$, $X^{12}$, $X^{13}$, $X^{14}$, $X^{15}$, $X^{16}$, $X^{17}$, $X^{18}$, $Y^1$, $Z^1$, $Z^2$, $Rf^2$, $Rf^3$, n3, n4, n5, n6, n7, n8 and n10 are as defined in the above-mentioned formula I-(2), at least one of $X^{13}$, $X^{14}$ and $Z^2$ is F or $X^{15}$ is F or $CF_3$, A2 is a structural unit derived from a monomer copolymerizable with the structural units M3a, M4a and M5a, when M3a+M4a+M5a is assumed to be equal to 100% by mole, the percent by mole ratio M3a/(M4a+M5a) is 1 to 90/10 to 99, and the fluorine-containing polymer comprises from 1 to 90% by mole of the structural unit M3a, from 0 to 99% by mole of the structural unit M4a, from 0 to 99% by mole of the structural unit M5a and from 0 to 99% by mole of the structural unit A2.

Unless otherwise noted particularly hereinafter, explanation is made by representing the structural units M3 and M3a by M3, the structural units M4 and M4a by M4 and the structural units M5 and M5a by M5, respectively.

The structural unit M3 is the structural unit of the monomer having an acid-labile or acid-degradable functional group, is present as an essential component and can impart a new function to the fluorine-containing polymer.

The structural unit M4 has a functional group which is not dissociated or degraded by an acid but can impart, to the fluorine-containing polymer, solubility, crosslinkability and adhesion with a substrate and can adjust them. The structural unit M4 is preferable as a component unit of the fluorine-containing monomer.

The structural unit M5 is the component unit of the fluorine-containing monomer not having a functional group and is preferred from the viewpoint that mechanical properties and heat resistance (glass transition temperature or melting point) of the polymer can be adjusted depending on purpose. Further M5 is a preferable component from the viewpoint that a fluorine content of the whole polymer can be adjusted by M4 and M5 and that transparency can be imparted to the polymer and a refractive index can be decreased.

The structural unit A2 is an optional component like the above-mentioned formula I-(1) and is copolymerized to impart characteristics required depending on necessity.

The fluorine-containing polymers of the formulae I-(2) and I-(2a) of the present invention may comprise only at least one selected from the structural units M3 and may not contain M4, M5 and A2 when M3 has fluorine atom.

Namely fluorine atom is contained in the structural unit M3 of the fluorine-containing polymer of the formula I-(2) and in that case, the polymer may comprise only the structural units selected from the group of structures M3.

On the other hand, with respect to the fluorine-containing polymer of the formula I-(2a), the structural unit M3a encompasses a structural unit having an acid-labile $Y^1$ but having no fluorine atom, and therefore any one of the structural units M4a and M5a is contained in the polymer as an essential component.

Example of the first preferable polymer of the formula I-(2) is a polymer having the structural unit M3 represented by the formula I-(2)-1:

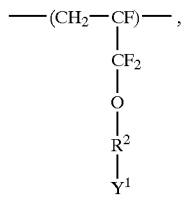

wherein $Y^1$ and $R^2$ are as defined in the formula I-(2).

It is preferable that the polymer of the formula I-(2) has, in addition to the above-mentioned structural unit of the formula I-(2)-1, a structural unit represented by the formula I-(2)-2 as the structural unit M4:

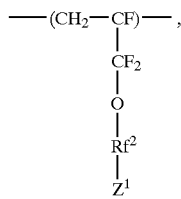

wherein $Rf^2$ and $Z^1$ are as defined in the formula I-(2), and the percent by mole ratio M3/M4/M5 is 1 to 99/1 to 99/0 to 98.

In the polymer of the formula I-(2) of the present invention, preferable examples of the monomer constituting the structural unit of the formula I-(2)-1 are:

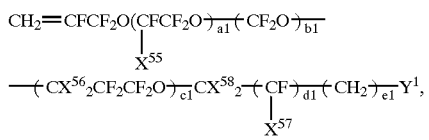

wherein a1+b1+c1 is from 0 to 30; d1 is 0 or 1; e1 is from 0 to 5; $X^{55}$ is F or $CF_3$; $X^{56}$ and $X^{58}$ are H or F; $X^{57}$ is H, F or $CF_3$; when $X^{58}$ is assumed to be H, a1+b1+c1+d1 is not 0.

Further there are concretely:

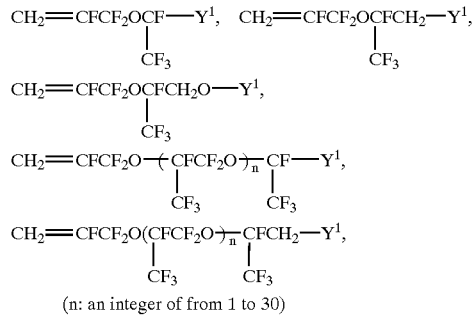

(n: an integer of from 1 to 30)

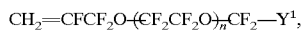

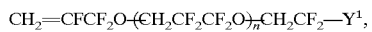

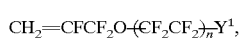

Further in the polymer of the formula I-(2) of the present invention, examples of the preferable monomer constituting the structural unit of the formula I-(2)-2 are:

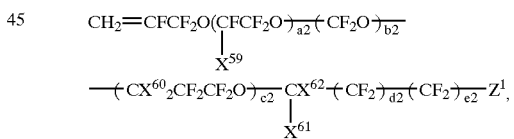

wherein a2+b2+c2 is from 0 to 30; d2 is 0 or 1; e2 is from 0 to 5; $X^{59}$ is F or $CF_3$; $X^{60}$ and $X^{62}$ are H or F; $X^{61}$ is H, F or $CF_3$; when $X^{61}$ and $X^{62}$ are assumed to be H, a2+b2+c2+d2+e2 is not 0.

Further there are concretely:

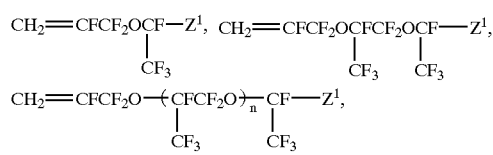

-continued

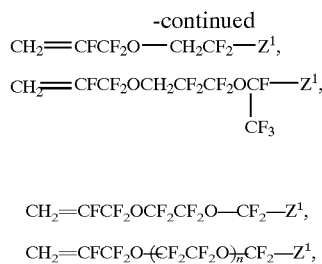

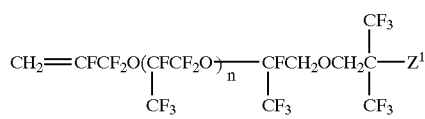

(iii)

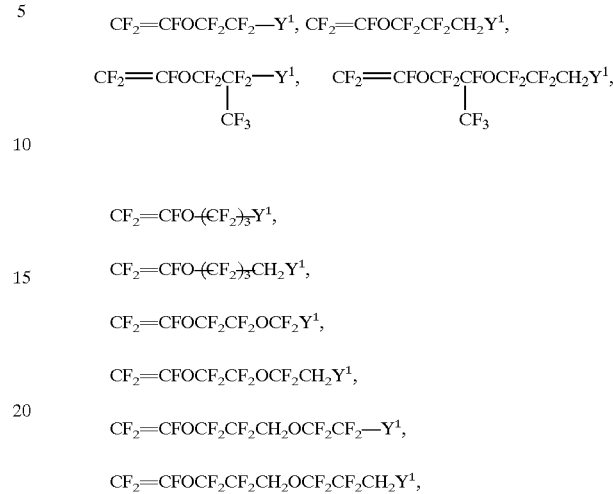

(n: an integer of from 1 to 30, $Z^1$ is as defined in the formula I-(2)) and the like.

Example of the other preferable polymer of the formula I-(2) is the polymer containing a structural unit represented by the formula I-(2)-3 as the structural unit M3:

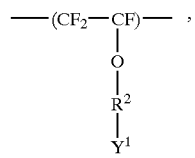

wherein $Y^1$ and $R^2$ are as defined in the formula I-(2).

In the polymer of the formula I-(2), preferred is a copolymer which comprises the structural unit represented by the following formula I-(2)-4 as the structural unit M4 in addition to the above-mentioned structural unit of the formula I-(2)-3:

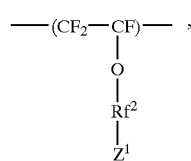

wherein $Rf^2$ and $Z^1$ are as defined in the formula I-(2), and has the percent by mole ratio M3/M4/M5 of 1 to 99/1 to 99/0 to 98.

In the polymer of the formula I-(2) of the present invention, preferable examples of the monomer constituting the structural unit of the formula I-(2)-3 are:

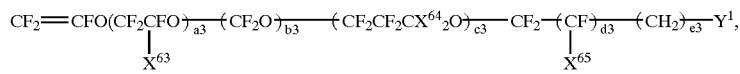

wherein $a3+b3+c3$ is from 0 to 30, $d3$ is 0, 1 or 2, $e3$ is from 0 to 5, $X^{63}$ and $X^{65}$ are F or $CF_3$, $X^{64}$ is H or F.

Further there are concretely:

$CF_2$=$CFOCF_2CF_2$—$Y^1$, $CF_2$=$CFOCF_2CF_2CH_2Y^1$, $CF_2$=$CFOCF_2CF_2$—$Y^1$,  $CF_2$=$CFOCF_2CFOCF_2CF_2CH_2Y^1$,
                    |                                |
                    $CF_3$                           $CF_3$ $CF_2$=$CFO$-($CF_2$)$_3$$Y^1$, $CF_2$=$CFO$-($CF_2$)$_3$$CH_2Y^1$, $CF_2$=$CFOCF_2CF_2OCF_2Y^1$, $CF_2$=$CFOCF_2CF_2OCF_2CH_2Y^1$, $CF_2$=$CFOCF_2CF_2CH_2OCF_2CF_2$—$Y^1$, $CF_2$=$CFOCF_2CF_2CH_2OCF_2CF_2CH_2Y^1$,

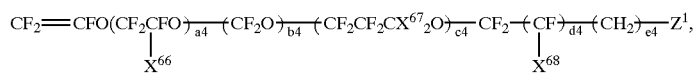

(n: an integer of from 1 to 30)

and the like.

In the polymer of the formula I-(2) of the present invention, preferable examples of the monomer constituting the structural unit of the above-mentioned formula I-(2)-4 are:

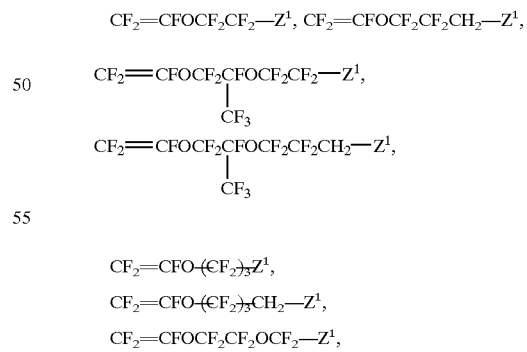

wherein $a4+b4+c4$ is from 0 to 30, $d4$ is 0, 1 or 2, $e4$ is from 0 to 5, $X^{66}$ and $X^{68}$ are F or $CF_3$, $X^{67}$ is H or F.

Further there are concretely:

$CF_2$=$CFOCF_2CF_2$—$Z^1$, $CF_2$=$CFOCF_2CF_2CH_2$—$Z^1$, $CF_2$=$CFOCF_2CFOCF_2CF_2$—$Z^1$,
              |
              $CF_3$ $CF_2$=$CFOCF_2CFOCF_2CF_2CH_2$—$Z^1$,
              |
              $CF_3$ $CF_2$=$CFO$-($CF_2$)$_3$$Z^1$, $CF_2$=$CFO$-($CF_2$)$_3$$CH_2$—$Z^1$, $CF_2$=$CFOCF_2CF_2OCF_2$—$Z^1$, $CF_2=CFOCF_2CF_2OCF_2CH_2Z^1$, $CF_2=CFOCF_2CF_2CH_2OCF_2CF_2-Z^1$ and $CF_2=CFOCF_2CF_2CH_2OCF_2CF_2CH_2Z^1$.

In the fluorine-containing polymer of the formula I-(2), examples of the preferable monomer constituting the M3 other than the preferable examples raised in the above-mentioned formulae I-(2)-1 and I-(2)-3 are, for instance, $CF_2=CFCF_2-O-Rf-Y^1$, $CF_2=CF-Rf-Y^1$, $CH_2=CH-Rf-Y^1$, $CH_2=CHO-Rf-Y^1$, (Rf is the same as $Rf^2$ of the formula I-(2)) and the like.
Concretely there are:

$CF_2=CF-CF_2OCF_2CF_2CF_2Y^1$,
$CF_2=CFCF_2OCF_2CF_2CF_2CH_2Y^1$, $CF_2=CFCF_2OCF_2CF-Y^1$,
$\quad\quad\quad\quad\quad\quad\quad|$
$\quad\quad\quad\quad\quad\quad\quad CF_3$ $CF_2=CFCF_2OCF_2CF-CH_2Y^1$,
$\quad\quad\quad\quad\quad\quad\quad|$
$\quad\quad\quad\quad\quad\quad\quad CF_3$ $CF_2=CFCF_2-Y^1$, $CF_2=CFCF_2-CH_2Y^1$, $CH_2=CHCF_2CF_2CH_2CH_2-Y^1$, $CH_2=CHCF_2CF_2-Y^1$, $CH_2=CHCF_2CF_2CH_2Y^1$, $CH_2=CHCF_2CF_2CF_2CF_2-Y^1$, $CH_2=CHCF_2CF_2CF_2CF_2CH_2Y^1$, $CH_2=CHO-CH_2CF_2CF_2-Y^1$, $CH_2=CHOCH_2CF_2CF_2CH_2Y^1$ and the like.

Examples of the preferable monomer constituting the M4 in the fluorine-containing polymer of the formula I-(2) other than the preferable examples raised in the above-mentioned formulae I-(2)-2 and I-(2)-4 are, for instance, $CF_2=CFCF_2-O-Rf-Z^1$, $CF_2=CF-Rf-Z^1$, $CH_2=CH-Rf-Z^1$, $CH_2=CHO-Rf-Z^1$, ($Z^1$ and Rf is the same as $Rf^2$ of the formula I-(2)) and the like.
Concretely there are:

$CF_2=CF-CF_2OCF_2CF_2CF_2Z^1$,
$CF_2=CFCF_2OCF_2CF_2CF_2CH_2Z^1$, $CF_2=CFCF_2OCF_2CF-Z^1$, $CF_2=CFCF_2OCF_2CF-CH_2Z^1$,
$\quad\quad\quad\quad\quad\quad|\quad\quad\quad\quad\quad\quad\quad\quad\quad\quad\quad\quad|$
$\quad\quad\quad\quad\quad\quad CF_3\quad\quad\quad\quad\quad\quad\quad\quad\quad\quad\quad\quad CF_3$ $CF_2=CFCF_2-Z^1$, $CF_2=CFCF_2-CH_2Z^1$, $CH_2=CHCF_2CF_2CH_2CH_2-Z^1$, $CH_2=CHCF_2CF_2-Z^1$, $CH_2=CHCF_2CF_2CH_2Z^1$, $CH_2=CHCF_2CF_2CF_2CF_2-Z^1$, $CH_2=CHCF_2CF_2CF_2CF_2CH_2Z^1$, $CH_2=CHO-CH_2CF_2CF_2-Z^1$, $CH_2=CHOCH_2CF_2CF_2CH_2Z^1$ and the like.

In the polymer of the formula I-(2), various proportions of M3/M4/M5 can be selected in the above-mentioned range depending on application, intended function, kind of the functional group $Y^1$, etc. For example, when making the fluorine-containing polymer soluble in alkali after the reaction with an acid, it is preferable that the structural unit M3 is present in an amount of from 5 to 100% by mole, preferably from 10 to 100% by mole, particularly preferably from 20 to 100% by mole, and a total amount of the structural units M4, M5 and A2 is from 0 to 95% by mole, preferably from 0 to 90% by mole, particularly preferably from 0 to 80% by mole.

Also, in the polymers of the formula I-(2a), the first preferable polymer is one which comprises, in addition to the above-mentioned structural unit M3a (further M4a) shown in the formula I-(2a), a structural unit represented by the following formula I-(2a)-5 as the structural unit M5a:

$$-(CX^{13}X^{14}-CX^{15})-$$
$$\quad\quad\quad\quad\quad|$$
$$\quad\quad\quad\quad(CX^{18}{}_2)_{n5},$$
$$\quad\quad\quad\quad\quad|$$
$$\quad\quad\quad\quad\quad Z^2$$

in which $X^{13}$, $X^{14}$, $X^{15}$, $X^{18}$, $Z^2$ and n5 are as defined in the formula I-(2a), and has the percent by mole ratio M3a/(M4a+M5a) of 1 to 90/99 to 10 and the percent by mole ratio M3a/M4a/M5a of 1 to 90/0 to 98/1 to 99.

Further in the polymers of the formula I-(2a), particularly in the polymers having the above-mentioned structural unit of the formula I-(2a)-5, more preferred is a polymer having the structural unit M3a represented by the formula I-(2a)-6:

$$-(CH_2-CF)-,$$
$$\quad\quad\quad\quad|$$
$$\quad\quad\quad CF_2$$
$$\quad\quad\quad\quad|$$
$$\quad\quad\quad\quad O$$
$$\quad\quad\quad\quad|$$
$$\quad\quad\quad R^{2b}$$
$$\quad\quad\quad\quad|$$
$$\quad\quad\quad Y^1$$

wherein $R^{2b}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms; $Y^1$ is as defined in the formula I-(2a), or represented by the formula I-(2a)-7:

$$-(CF_2-CF)-,$$
$$\quad\quad\quad|$$
$$\quad\quad\quad O$$
$$\quad\quad\quad|$$
$$\quad\quad R^{2b}$$
$$\quad\quad\quad|$$
$$\quad\quad Y^1$$

wherein $R^{2b}$ and $Y^1$ are as defined in the formula I-(2a).

In the polymers of the formula I-(2a) of the present invention, examples of the preferable monomers constituting the structural units of the formulae I-(2a)-6 and I-(2a)-7

(monomers constituting M3a) are the same as the fluorine-containing monomers corresponding to the above-mentioned structural unit M1. In addition, the monomer constituting M3a may be a monomer not having fluorine atom. Examples of the monomer not having fluorine atom are:

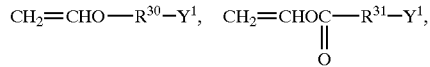

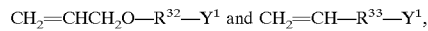

wherein $Y^1$ is as defined in the formula I-(2a); $R^{30}$, $R^{31}$, $R^{32}$ and $R^{33}$ are divalent hydrocarbon groups, for example, a divalent alkylene group, divalent alicyclic hydrocarbon, divalent aromatic hydrocarbon and hydrocarbon groups having oxygen, nitrogen, sulfur or the like.

Concretely there are:

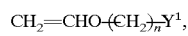

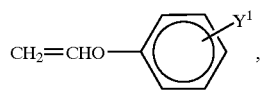

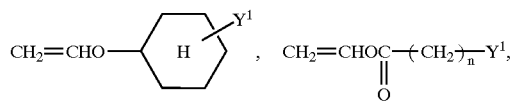

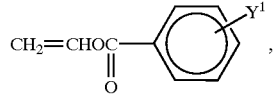

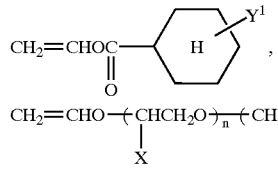

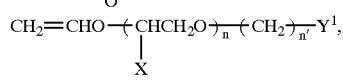

(X: H or $CH_3$, n': from 1 to 10)

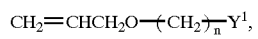

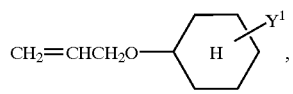

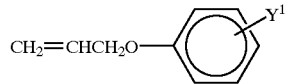

(n: from 1 to 10)

and the like.

In the polymers of the formula I-(2a) of the present invention and further the polymers having the structural units of the formulae I-(2a)-5, I-(2a)-6 and I-(2a)-7 of the present invention, examples of the preferable monomer constituting the M4a are the same as the monomers corresponding to the structural unit represented by the above-mentioned formulae I-(2)-2 and I-(2)-4.

In the polymers of the present invention of the formulae I-(2) and I-(2a), examples of the preferable monomer constituting the M5 and M5a (or the structural unit I-(2a)-5) are:

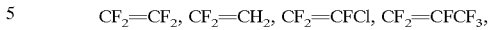

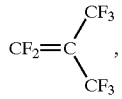

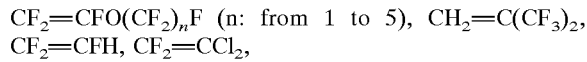

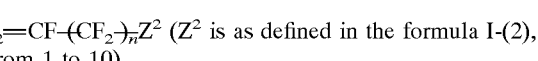

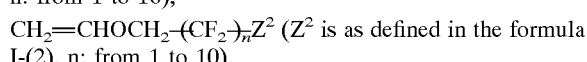

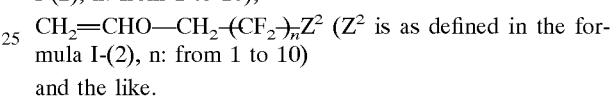

and the like.

In the polymers of the present invention of the formula I-(2a), concretely the polymers having the structural units of the formulae I-(2a)-5, I-(2a)-6 and I-(2a)-7, various proportions of M3a, M4a and M5a can be selected in the above-mentioned range depending on application, intended function, kind of the functional group $Y^1$, etc. For example, when making the fluorine-containing polymer soluble in alkali after the reaction with an acid, it is preferable that the structural unit M3a is present in an amount of from 5 to 100% by mole, preferably from 10 to 100% by mole, particularly preferably from 20 to 100% by mole, and a total amount of the structural units M4a, M5a and A2 is from 0 to 95% by mole, preferably from 0 to 90% by mole, particularly preferably from 0 to 80% by mole.

In the polymers of the present invention of the formula I-(2), concretely the polymers having the structural units of the formulae I-(2)-1 to I-(2)-4, and in the polymers of the present invention of I-(2a), concretely the polymers having the structural units of the formulae I-(2a)-5 to I-(2a)-7, the acid-labile or acid-degradable functional group $Y^1$ is preferably the same as the functional group $Y^1$ of the above-mentioned formula I-(1).

In the polymers of the present invention of the formula I-(2), concretely the polymers having the structural units of the formulae I-(2)-1 to I-(2)-4, and in the polymers of the present invention of I-(2a), concretely the polymers having the structural units of the formulae I-(2a)-5 to I-(2a)-7, the functional group $Z^1$ which is not degraded due to acid is a functional group which is neither dissociated nor degraded due to action of an acid or cation. However self-condensation and poly-condensation reaction and condensation and poly-condensation reaction in the presence of a crosslinking agent may arise. It is preferable that the functional group $Z^1$ is not changed only by a contact of the functional group $Z^1$ with an acid (or cation) in a system not containing a crosslinking agent, etc.

Examples of the functional group $Z^1$ which is not degraded by an acid are $-CH_2OH$, $-COOH$, $-SO_3H$, $-CN$ and the like.

When the acid-labile or acid-degradable functional group $Y^1$ and the functional group $Z^1$ which is not degraded by an acid are present in the fluorine-containing polymer and when kind and proportion of the respective functional groups are adjusted, for example, there can be obtained preferable effects that solubility of the fluorine-containing polymer in alkali or a solvent before and after the reaction with an acid can be adjusted, a difference in the solubility in alkali or a solvent before and after the reaction with an acid can be adjusted, and functions such as adhesion to a substrate can be imparted to the fluorine-containing polymer before the reaction with an acid.

The functions of those functional groups make it possible to apply the fluorine-containing polymer on various acid-sensitive materials, photosensitive materials, resist materials, etc.

The structural unit A2 is an optional component and is not limited particularly as far as it is a monomer copolymerizable with the structural units M3, M4 and M5. The structural unit A2 may be selected optionally depending on intended applications and required characteristics of the fluorine-containing polymer.

Examples of the monomer for the structural unit A2 are, for instance, monomers mentioned below.

Alicyclic Monomer:

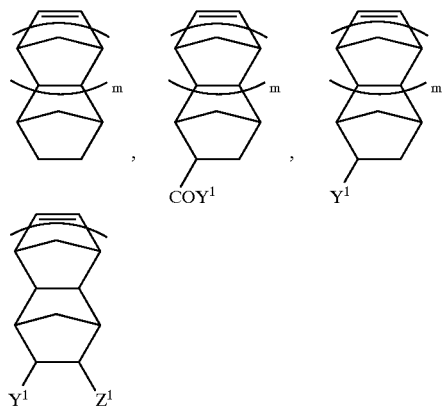

(m: 0 or an integer of from 1 to 3),

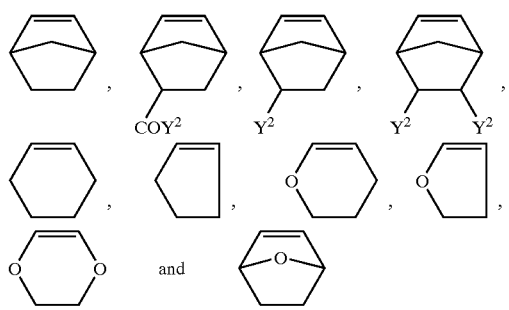

wherein $Y^1$ is an acid-labile or acid-degradable functional group, $Y^2$ is an acid-reactive functional group, $Z^1$ is a functional group which is not degraded by an acid.

Fluorine-containing Alicyclic Monomer:
Monomers represented by the formula (9):

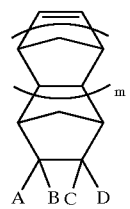

wherein A, B, C and D are H, F, an alkyl group having 1 to 10 carbon atoms or a fluorine-containing alkyl group having 1 to 10 carbon atoms, m is 0 or an integer of from 1 to 3, any one of A, B, C or D has fluorine atom.
Concretely there are:

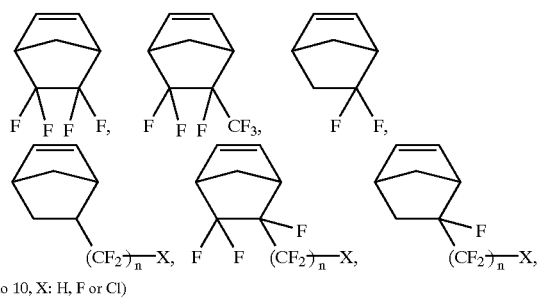

(n: 1 to 10, X: H, F or Cl)

and the like.
In addition, there are:

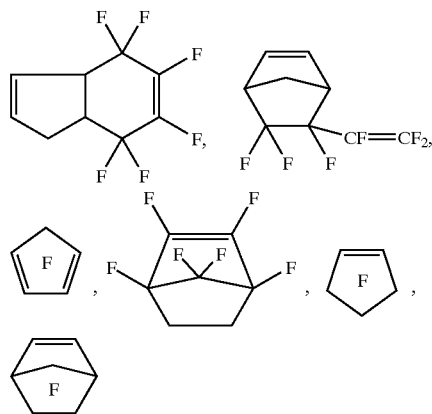

and the like.
Fluorine-containing Alicyclic Monomer having a Functional Group:
Examples thereof are the novel fluorine-containing monomers represented by the formula (10):

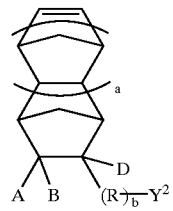

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that b is 0 or R does not have fluorine atom, any one of A, B or C is fluorine atom or a fluorine-containing alkyl group.

It is preferable that any one of A, B and C is fluorine atom, and that a fluorine content of R is not less than 60% by weight when fluorine atom is not contained in A, B and C, and further it is preferable that R is a perfluoro alkylene group from the viewpoint that transparency can be imparted to the polymer.

Concretely there are:

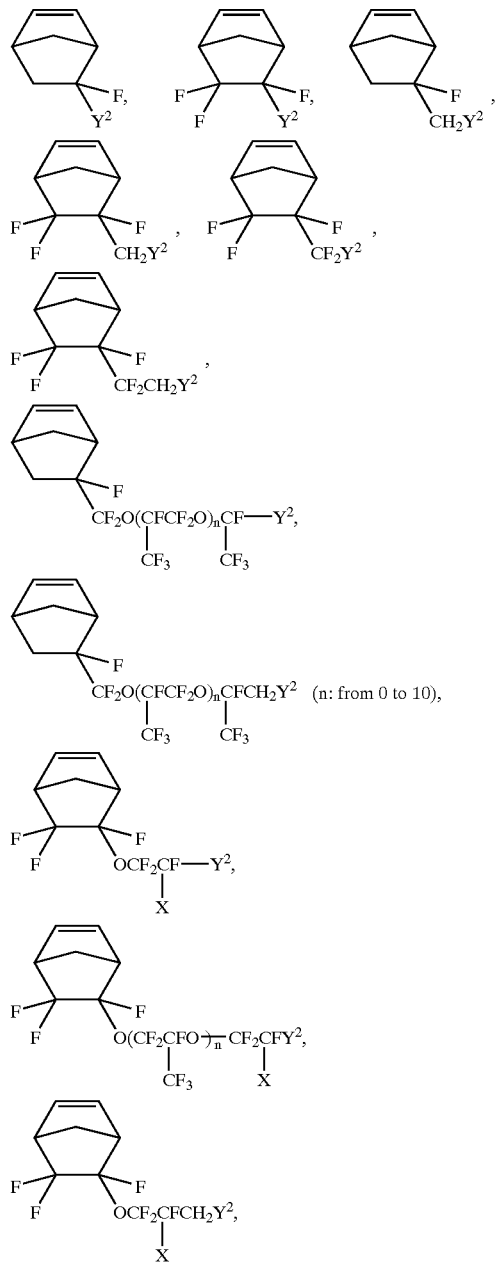

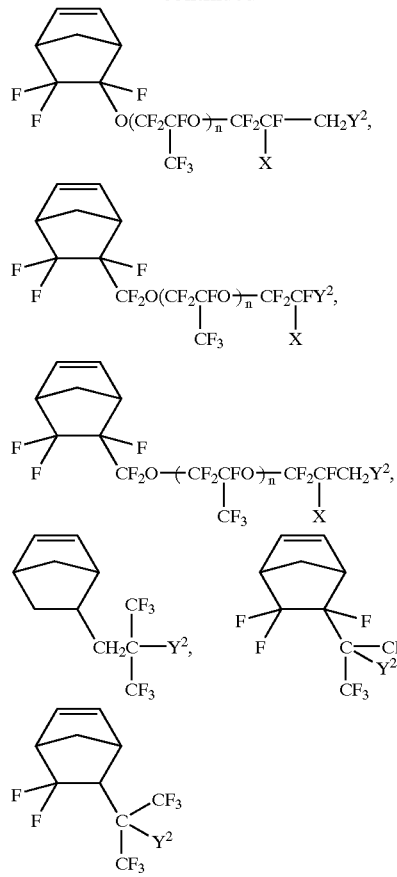

(n: from 0 to 10, X: F or $CF_3$)

and the like.

Also there are novel fluorine-containing monomers represented by the formula (11):

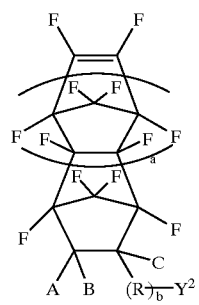

wherein A, B and C are H, F, an alkyl group having 1 to 10 carbon atoms or a fluorine-containing alkyl group having 1 to 10 carbon atoms, R is a divalent hydrocarbon group having 1 to 20 carbon atoms, a fluorine-containing alkylene group having 1 to 20 carbon atoms or a fluorine-containing alkylene group having 2 to 100 carbon atoms and ether bond, a is 0 or an integer of from 1 to 3, b is 0 or 1, $Y^2$ is an acid-reactive functional group.

Concretely there are preferably the following monomers having norbornene backbone:

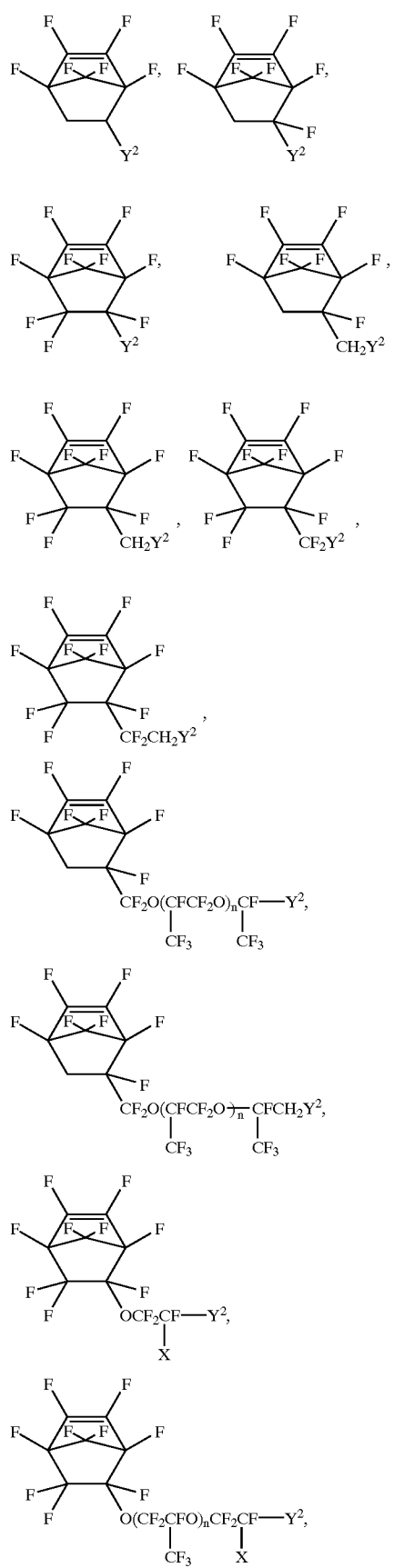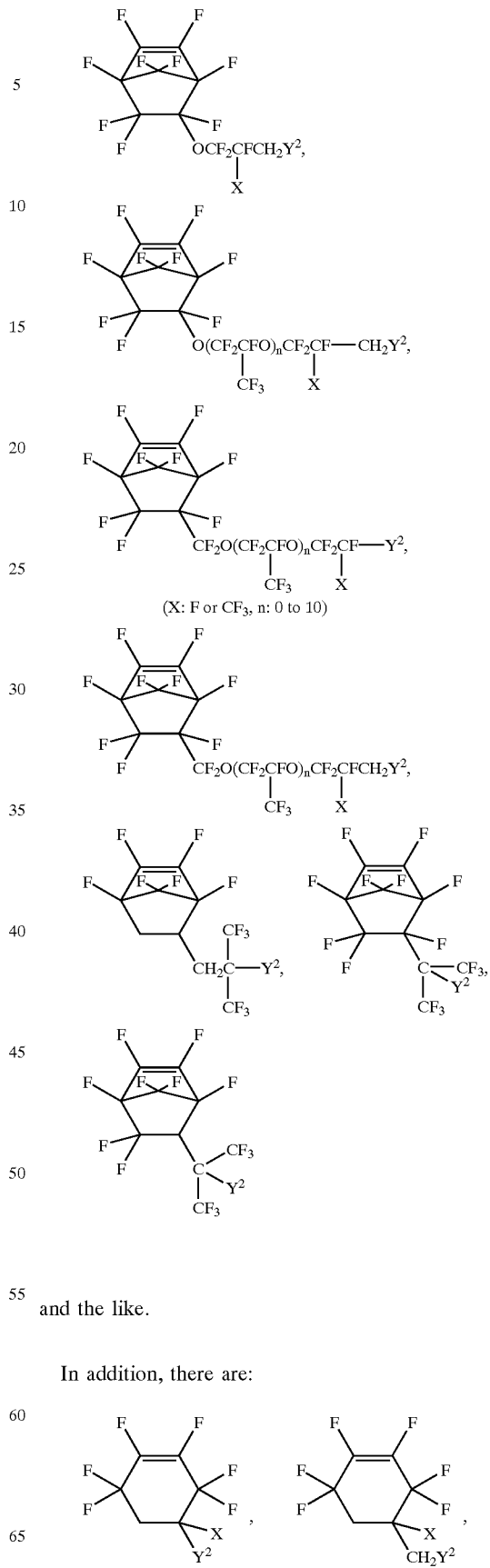
(X: F or CF$_3$, n: 0 to 10)
and the like.
In addition, there are:

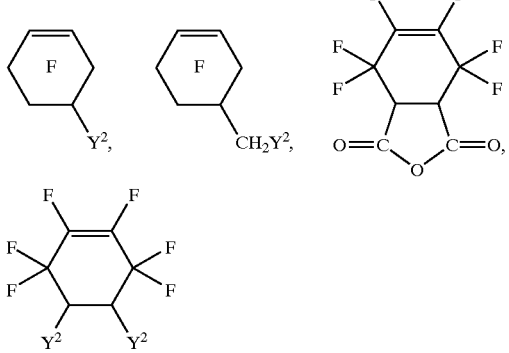

(X: H, F, $CF_3$ or $CH_3$) and the like.

The acid-reactive group $Y^2$ contained in those alicyclic monomers is concretely an acid-labile or acid-degradable functional group or a functional group undergoing condensation reaction by an acid.

① Acid-labile or Acid-degradable Functional Group:

The acid-labile or acid-degradable functional groups are those which are capable of changing to —OH group, —COOH group, —$SO_3$H group or the like due to action of an acid or cation.

Examples of the acid-labile or acid-degradable functional group are preferably $Y^1$ exemplified in M1 of the above-mentioned formula I-(1).

② Functional Group Undergoing Condensation by an Acid:

The functional group undergoing condensation by an acid is concretely a functional group which causes self-condensation or poly-condensation due to action of an acid or cation or condensation reaction or poly-condensation reaction with a crosslinking agent due to action of an acid in the presence of the crosslinking agent, or a functional group which causes a change in polarity by rearrangement (for example, pinacol rearrangement or carbinol rearrangement) with an acid or cation. The functional group is preferably selected from —OH, —COOH, —CN, —$SO_3$H, epoxy group and the like.

Ethylene Monomer:

Ethylene, propylene, butene, vinyl chloride, vinylidene chloride and the like.

Vinyl Ether or Vinyl Ester Monomer:

$CH_2$=CHOR, $CH_2$=CHOCOR (R: hydrocarbon group having 1 to 20 carbon atoms) and the like.

Allyl Monomer:

$CH_2$=$CHCH_2$Cl, $CH_2$=$CHCH_2$OH, $CH_2$=$CHCH_2$COOH, $CH_2$=$CHCH_2$Br and the like.

Allyl Ether Monomer:

$CH_2$=$CHCH_2$OR (R: hydrocarbon group having 1 to 20 carbon atoms), $CH_2$=$CHCH_2OCH_2CH_2$COOH,

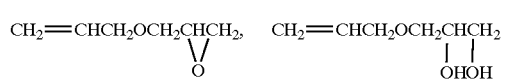

and the like.

A molecular weight of the polymers of the present invention of the formula I-(2), concretely the polymers having the structural units of the formulae I-(2)-1 to I-(2)-4, and in the polymers of the present invention of I-(2a), concretely the polymers having the structural units of the formulae I-(2a)-5 to I-(2a)-7 can be selected within the range of from 1,000 to 1,000,000 in a number average molecular weight depending on application, purpose and form thereof at use, preferably from 3,000 to 700,000, more preferably from about 5,000 to about 500,000. When the molecular weight is too low, heat resistance and mechanical properties of the obtained polymer coating film tend to become insufficient, and a too high molecular weight tends to be disadvantageous from the viewpoint of processability. Particularly in the case of forming a thin coating film in the form of a coating material, a too high molecular weight is disadvantageous from the viewpoint of film forming property. The molecular weight is preferably not more than 300,000, particularly preferably not more than 200,000.

In the polymers of the formulae I-(2) and I-(2a), various combinations of the structural units M3, M4, M5 and A2 can be selected from the above-mentioned examples depending on intended application, physical properties (particularly glass transition temperature, melting point, etc.), functions (transparency, refractive index, etc.) and the like.

Usually a function of dissociation or degradation by an acid (namely a function of changing functions and characteristics after the degradation) is given to the M3, and to the polymer after the degradation are given the intended functions such as solubility in an aqueous alkali solution by the functional group of M4 and the functional group of M3 after the degradation. The other functions and characteristics are controlled by M5 and if necessary, by A2. A balance of those functions and characteristics are adjusted by selecting the respective kinds and proportions of M3, M4, M5 and A2.

For example, in case of aiming at a polymer having transparency and low refractive index for optical applications (POF, etc.) and semiconductor applications (resist, interface insulation film, etc.), it is preferable to make a content of fluorine atoms in the whole polymer including M3, M4, M5 and A2 as high as possible, namely not less than 30% by weight, preferably not less than 50% by weight, particularly preferably not less than 60% by weight. From that point of view, the structural units of the formulae I-(2)-2, I-(2)-4, I-(2a)-6 and I-(2a)-7 are preferably selected. The thus obtained fluorine-containing polymer can be used for optical applications such as a plastic optical fiber and for semiconductor applications such as a resist and interface insulation film because the polymer has good heat resistance, is non-crystalline, has a high transparency in a wide range of wavelength including a vacuum ultraviolet region, and has a low refractive index.

The polymers of the formulae I-(2) and I-(2a) of the present invention were found to generally have a high transparency in a vacuum ultraviolet region. For that reason, those polymers are useful in semiconductor and liquid crystal applications such as a resist and pellicle, optical applications such as a reflection reducing film, and the like.

Also the polymers are useful for an oxygen enrichment membrane, etc., since a selective gas (particularly oxygen) permeability thereof was found to be good.

The fourth novel fluorine-containing polymer of the present invention is a fluorine-containing polymer having a number average molecular weight of from 1,000 to 1,000,000 which has an aliphatic ring structure and is represented by the formula I-(3):

—(M6)—(M7)—(A3)—, wherein M6 is represented by:

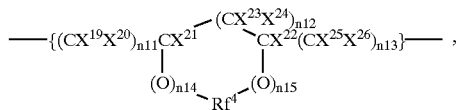

M7 is represented by:

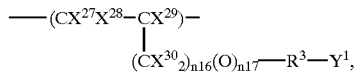

in which $X^{19}$, $X^{20}$, $X^{23}$, $X^{24}$, $X^{25}$ and $X^{26}$ are the same or different and each is H or F; $X^{21}$ and $X^{22}$ are the same or different and each is H, F, Cl or $CF_3$; $Rf^4$ is a fluorine-containing alkylene group having 1 to 10 carbon atoms or a fluorine-containing alkylene group having 2 to 10 carbon atoms and ether bond; n12 is 0 or an integer of from 1 to 3; n11, n13, n14 and n15 are the same or different and each is 0 or 1; $X^{27}$, $x^{28}$, $X^{29}$ and $X^{30}$ are the same or different and each is H or F; $Y^1$ is an acid-labile or acid-degradable functional group; $R^3$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n 16 is 0 or an integer of 1 or 2; n17 is 0 or 1,
A3 is a structural unit derived from a monomer copolymerizable with the structural units M6 and M7,
when M6+M7 is assumed to be equal to 100% by mole, the percent by mole ratio M6/M7 is 1 to 99/1 to 99,
and the polymer comprises from 1 to 99% by mole of the structural unit M6, from 1 to 99% by mole of the structural unit M7 and from 0 to 98% by mole of the structural unit A3.

The fluorine-containing polymer of the formula I-(3) of the present invention is a polymer comprising the aliphatic ring structural unit M6 having fluorine atom, the structural unit M7 derived from an ethylenic monomer having an acid-labile or acid-degradable functional group and the optional structural unit A3 copolymerizable with those structural units M6 and M7.

In the polymer of the formula I-(3) of the present invention, preferred is the polymer having the structural unit M6 represented by the formula I-(3)-1:

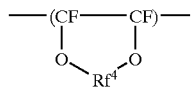

wherein $Rf^4$ is a fluorine-containing alkylene group having 1 to 10 carbon atoms.

Examples of the monomer for the structural unit of the formula I-(3)-1 constituting the polymer of the formula I-(3) are:

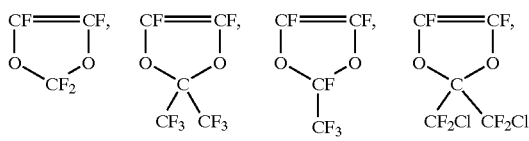

and the like, and the polymer can be obtained by copolymerizing with the monomer of the structural unit M7.

On the other hand the structural units M3 and M3a exemplified in the above-mentioned polymers of the formulae I-(2) and I-(2a) can be used preferably as the structural unit M7 in the polymer of the formula I-(3) of the present invention. Particularly preferred monomers forming M3 and M3a are fluorine-containing allyl ethers having the functional group $Y^1$ and exemplified in the formulae I-(2)-1 and I-(2a)-6; $CH_2$=$CFCF_2$—O—$R^2$—$Y^1$, in which $R^2$ and $Y^1$ are as defined in the formula I-(2)-1, fluorine-containing vinyl ethers having the functional group $Y^1$ and exemplified in the formulae I-(2)-3 and I-(2)-4; $CF_2$=CF—O—$R^2$—$Y^1$, in which $R^2$ and $Y^1$ are as defined in the formula I-(2)-3; $CH_2$=$CFCF_2$—$OR^{2b}$—$Y^1$ ($R^{2b}$ and $Y^1$ are as defined in the formula I-(2a)-6); and $CF_2$=CFO—$R^{2b}$—$Y^1$ ($R^{2b}$ and $Y^1$ are as defined in the formula I-(2a)-7), from the viewpoint of good copolymerizability and from the point that an acid-reactive function of the functional group $Y^1$, excellent transparency, low refractive index, non-tackiness and stain-proofing property can be imparted to the obtained polymer. The monomers for M3 which are exemplified in the formulae I-(2)-1, I-(2a)-6, I-(2)-3 and I-(2a)-7 can be used similarly as the monomer for M7 of the polymer of the formula I-(3).

In the polymer of the formula I-(3) of the present invention, it is preferable that the structural unit M6 is a structural unit represented by the formula I-(3)-2:

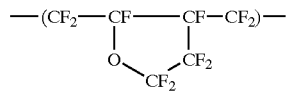

or the formula I-(3)-3:

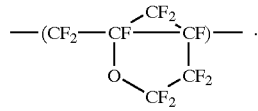

The monomer component M6 of the formulae I-(3)-2 or I-(3)-3 constituting the polymer is one obtained by cyclopolymerization by using a diene compound represented by $CF_2$=$CFOCF_2CF_2CF$=$CF_2$ as a copolymerizable component.

The inventors of the present invention have found that even in copolymerization of the above-mentioned diene compound with the monomer for the structural unit M7 having the acid-labile or acid-degradable functional group $Y^1$ and represented by the above-mentioned formula I-(3), cyclopolymerization of the diene compound arises and the diene compound has good copolymerizability with the monomer (M7) having the acid-labile or acid-degradable functional group $Y^1$.

Namely, also with respect to the polymer having the structural unit of the formula I-(3)-1, the monomers exemplified as the monomer for the structural unit M7 can be used preferably. Particularly preferred monomers forming M3 and M3a are fluorine-containing allyl ethers having the functional group $Y^1$ and exemplified in the formulae I-(2)-1 and I-(2a)-6; $CH_2$=$CFCF_2$—O—$R^2$—$Y^1$, in which $R^2$ and $Y^1$ are as defined in the formula I-(2)-1, fluorine-containing vinyl ethers having the functional group $Y^1$ and exemplified in the formulae I-(2)-3 and I-(2)-4; $CF_2$=CF—O—$R^2$—$Y^1$, in which $R^2$ and $Y^1$ are as defined in the formula I-(2)-3; $CH_2$=$CFCF_2$—$OR^{2b}$—$Y^1$ ($R^{2b}$ and $Y^1$ are as defined in the formula I-(2a)-6); and $CF_2$=CFO—$R^{2b}$—$Y^1$ ($R^{2b}$ and $Y^1$ are as defined in the formula I-(2a)-7), from the viewpoint of good copolymerizability and from the point that an acid-reactive function of the functional group $Y^1$, excellent transparency, low refractive index, non-tackiness and stain-proofing property can be imparted to the obtained polymer. The monomers for M3 which are exemplified in the formulae I-(2)-1, I-(2a)-6, I-(2)-3 and I-(2a)-7 can be used similarly as the monomer for M7 of the polymers having the structural units of I-(3)-2 and I-(3)-3.

Further in the polymer of the formula I-(3) of the present invention, preferred are polymers containing M6 represented by the formula I-(3)-4:

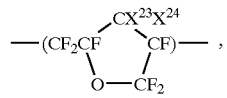

the formula I-(3)-5:

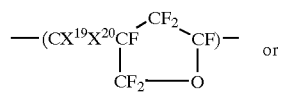

the formula I-(3)-6:

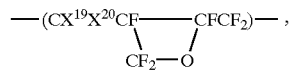

wherein $X^{19}$, $X^{20}$, $X^{23}$ and $X^{24}$ are H or F.

In the present invention the structural unit (M6) of the formula I-(3)-4, I-(3)-5 or I-(3)-6 is obtained by cyclopolymerization by using a diene compound represented by $CF_2=CFOCF_2CF=CX^{19}X^{20}$, in which $X^{19}$ and $X^{20}$ are H or F, concretely by using a diene compound represented by $CF_2=CFOCF_2CF=CF_2$ or $CF_2=CFOCF_2CF=CH_2$.

The inventors of the present invention have found that even in copolymerization of the above-mentioned diene compound with the monomer for the structural unit M7 which has the acid-labile or acid-degradable functional group $Y^1$ and is represented by the above-mentioned formula I-(3), the cyclopolymerization of the diene compound arises and the diene compound has good copolymerizability with the monomer (M7) having the acid-labile or acid-degradable functional group $Y^1$.

Namely, the monomers exemplified as the monomer for the structural unit M7 of the polymer of the formula I-(3) can be used preferably. Particularly preferred monomers forming M3 and M3a are fluorine-containing allyl ethers having the functional group $Y^1$ and exemplified in the formulae I-(2)-1 and I-(2a)-6; $CH_2=CFCF_2-O-R^2-Y^1$, in which $R^2$ and $Y^1$ are as defined in the formula I-(2)-1, fluorine-containing vinyl ethers having the functional group $Y^1$ and exemplified in the formulae I-(2)-3 and I-(2)-4; $CF_2=CF-O-R^2-Y^1$, in which $R^2$ and $Y^1$ are as defined in the formula I-(2)-3; $CH_2=CFCF_2-OR^{2b}Y^1$ ($R^{2b}$ and $Y^1$ are as defined in the formula I-(2a)-6); and $CF_2=CFO-R^{2b}-Y^1$ ($R^{2b}$ and $Y^1$ are as defined in the formula I-(2a)-7), from the viewpoint of good copolymerizability and from the point that an acid-reactive function of the functional group $Y^1$, excellent transparency, low refractive index, non-tackiness and stain-proofing property can be imparted to the obtained polymer. The monomers for M3 which are exemplified in the formulae I-(2)-1, I-(2a)-6, I-(2)-3 and I-(2a)-7 can be used similarly as the monomer for M7 of the polymers having the structural units of I-(3)-4 to I-(3)-6.

In the polymers of the formula I-(3) of the present invention and the polymers of the present invention having the structural units of I-(3)-1 to I-(3)-6, the same acid-labile or acid-degradable functional group $Y^1$ as in the above-mentioned formulae I-(1) and I-(2) can be exemplified and used preferably.

The structural unit A3 is an optional component and is not limited particularly if it is a monomer copolymerizable with the structural units M6 and M7. For example, there can be used the same structural units as the structural units M4, M5 and A2 explained in the formulae I-(2) and I-(2a).

A molecular weight of the polymers of the formula I-(3) and the polymers having the structural units of the formulae I-(3)-1 to I-(3)-6 can be selected within the range of from 1,000 to 1,000,000 in a number average molecular weight depending on application, purpose and form thereof at use, preferably from 3,000 to 700,000, more preferably from about 5,000 to about 500,000. When the molecular weight is too low, heat resistance and mechanical properties of the obtained polymer coating film tend to become insufficient, and a too high molecular weight tends to be disadvantageous from the viewpoint of processability. Particularly in the case of forming a thin coating film in the form of a coating material, a too high molecular weight is disadvantageous from the viewpoint of film forming property. The molecular weight is preferably not more than 300,000, particularly preferably not more than 200,000.

In the polymers of the formula I-(3), various combinations of the structural units M6, M7 and A3 can be selected from the above-mentioned examples depending on intended application, physical properties (particularly glass transition temperature, melting point, etc.), functions (transparency, refractive index, etc.), and the like.

Usually a function of dissociation or degradation by an acid (namely a function of changing functions and characteristics after the degradation) is given to M7, and to the polymer after the degradation are given the intended functions such as solubility in an aqueous alkali solution by the functional group of M6 and the functional group of M7 after the degradation. The other functions and characteristics are controlled by M6 and if necessary, by A3. A balance of those functions and characteristics are adjusted by selecting the respective kinds and proportions of M6, M7 and A3.

The fluorine-containing cyclic polymers of the formulae I-(3) and the fluorine-containing cyclic polymers having the structural units of I-(3)-1 to I-(3)-6 are preferred since they have a bulky structure, a large free area and a high content of fluorine, and therefore have the characteristics such as:

high glass transition temperature and good mechanical properties, good heat resistance, high transparency in a wide range of wavelength, low refractive index and excellent water-repellency, non-tackiness and stain-proofing property.

In addition, those polymers are preferred because there can be obtained a function of the functional group $Y^1$ reacting with an acid and the following functions to be imparted to the fluorine-containing polymer after the reaction with an acid:

solubility in and affinity for an aqueous alkali solution, solubility in a solvent and hydrophilic property, adhesion to a substrate, crosslinkability and the like. The polymers can be used as optical materials such as an antireflection agent and optical fiber, semiconductor-related materials such as a resist, pellicle and interface insulation film, coating material, material having selective gas permeability, electronic and electric parts (molding material) and moisture-proof material.

Also for example, in case of aiming at a polymer having transparency and low refractive index for optical applications (POF, etc.) and semiconductor applications (resist, interface insulation film, etc.), it is preferable to make a content of fluorine atoms in the whole polymer including M6, M7 and A3 as high as possible, namely not less than 30% by weight, preferably not less than 50% by weight, particularly preferably not less than 60% by weight. The thus obtained fluorine-containing polymer has a good heat resistance, a high transparency in a wide range of wavelength including a vacuum ultraviolet region and a low refractive index and is non-crystalline, and therefore can be used for optical applications such as a plastic optical fiber and semiconductor applications such as a resist and interface insulation film. Particularly the polymers of the formulae I-(3) of the present invention were found to generally have a high transparency in a vacuum ultraviolet region. For that reason, those polymers are useful for semiconductor and liquid crystal applications such as a resist and pellicle, optical applications such as an antireflection agent and the like.

In the present invention in the polymers of the formulae I-(3) and the polymers having the structural units of I-(3)-1 to I-(3)-6, various proportions of M6/M7/A3 can be selected within the above-mentioned range depending on application, intended function, kind of the functional group $Y^1$, etc. For example, when making the fluorine-containing polymer soluble in alkali after the reaction with an acid, it is preferable that the structural unit M7 is present in an amount of from 5 to 99% by mole, preferably from 10 to 99% by mole, particularly preferably from 20 to 99% by mole, and a total amount of the structural units M6 and A3 is from 1 to 95% by mole, preferably from 1 to 90% by mole, particularly preferably from 1 to 80% by mole.

Also in order to exhibit excellent characteristics of the above-mentioned cyclic structure, it is preferable that the structural unit M6 is present in an amount of from 30 to 99% by mole, preferably from 40 to 99% by mole, particularly preferably from 60 to 99% by mole, and a total amount of the structural units M7 and A3 is from 1 to 70% by mole, preferably from 1 to 60% by mole, particularly preferably from 1 to 40% by mole.

The polymers of the formulae I-(1), I-(2), I-(2a) and I-(3) of the present invention are characterized by having the acid-labile or acid-degradable functional group $Y^1$. For introducing such a functional group into the fluorine-containing polymers, various methods can be used. Generally there can be used:

① a method of previously synthesizing a monomer having the functional group $Y^1$ and then polymerizing, ② a method of once synthesizing a polymer having another functional group and then converting the functional group by high molecular reaction, thus introducing the functional group $Y^1$ into the polymer, or the like method.

For example, as the method ②, there can be used a method of once preparing a fluorine-containing polymer having OH group (for example, a polymer comprising M4 and M5) and then reacting the polymer with a vinyl ether such as ethyl vinyl ether or dihydropyran in the presence of an acid such as toluenesulfonic acid or the like, thus introducing a functional group (ketals) degradable by an acid; a method of reacting a fluorine-containing polymer having 1,2-diol with ketone to obtain a functional group degradable by an acid (cyclic acetal compound); or the like method.

The novel fluorine-containing polymers of the formulae I-(1), I-(2), I-(2a) and I-(3) of the present invention can be prepared by (co)polymerizing, by various known methods, the monomers corresponding to the respective structural units, namely the ethylenic monomer (M1, M3 or M7) having the functional group $Y^1$, the ethylenic monomer (M2, M4 or M5), and a diene compound or the cyclic monomer (M6) forming a cyclic structure. For the polymerization, radical polymerization, anion polymerization, cation polymerization and the like can be used. Among them, radical polymerization method is preferably employed from the viewpoint that radical polymerizability of each monomer for obtaining the polymers of the present invention is good, quality control of components and molecular weight is easy and production in an industrial scale is easy. Namely, for initiating the polymerization, there is no restriction with respect to means for polymerization as far as the polymerization proceeds radically. The polymerization is initiated, for example, with an organic or inorganic radical polymerization initiator, heat, light, ionizing radiation or the like. The polymerization can be carried out by solution polymerization, bulk polymerization, suspension polymerization, emulsion polymerization or the like. Also the molecular weight is controlled by the contents of the monomers to be used for the polymerization, the content of the polymerization initiator, the content of a chain transfer agent and temperature. The components of the prepared polymer can be controlled by the starting monomer components.

The second of Invention I relates to the material for fluorine-containing base polymer to be used suitably for a chemically amplifying type photoresist.

The material for fluorine-containing base polymer of the present invention to be used for a photoresist comprises the fluorine-containing polymer having the acid-reactive group $Y^2$. The acid-reactive group $Y^2$ is an acid-labile or acid-degradable functional group or a functional group undergoing condensation by an acid.

① Acid-labile or Acid-degradable Functional Group:

The acid-labile or acid-degradable functional group is a functional group which enables the polymer to be soluble in alkali developing solution due to action of an acid though the polymer is insoluble or hardly soluble in alkali before the reaction with an acid.

The functional group has an ability of changing to —OH group, —COOH group, —SO$_3$H group or the like due to action of an acid or cation, and as a result, the fluorine-containing polymer itself dissolves in alkali.

Accordingly the polymer can be used as a base polymer for a positive resist. The following functional groups $Y^1$ raised in M1 of the above-mentioned formula I-(1) can be used preferably as the acid-labile or acid-degradable functional group.

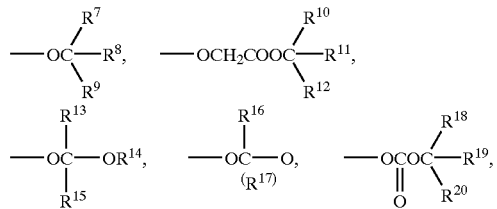

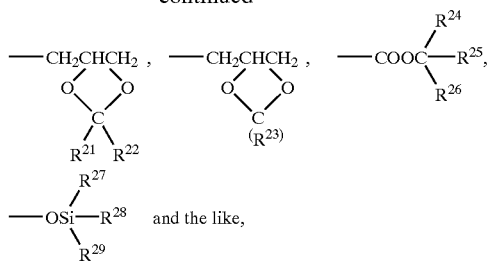

wherein the symbols are as defined above.
Concretely there are preferably:

—OC(CH$_3$)$_3$, —OCH$_2$COOC(CH$_3$)$_3$,

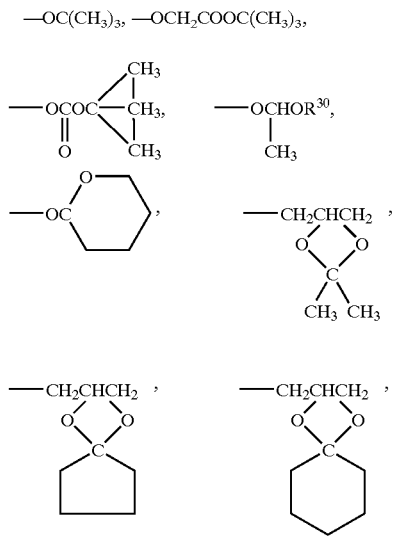

—COOC(CH$_3$)$_3$, —OSi(CH$_3$)$_3$ and the like (R$^{30}$ is an alkyl group having 1 to 10 carbon atoms).

② Functional Group Undergoing Condensation Reaction by an Acid:

The functional group undergoing condensation reaction by an acid is a functional group which enables the polymer itself to be insoluble in alkali developing solution (or a solvent described hereinafter) due to action of an acid though the polymer is soluble in alkali (or a solvent) before the reaction with an acid.

The functional group undergoing condensation reaction by an acid is concretely a functional group which causes self-condensation or poly-condensation due to action of an acid or cation or condensation reaction or poly-condensation reaction with a crosslinking agent due to action of an acid in the presence of the crosslinking agent, or a functional group which causes a change in polarity by rearrangement (for example, pinacol rearrangement or carbinol rearrangement) with an acid or cation. Anyway as a result, the polymer itself becomes insoluble in alkali (or a solvent).

Accordingly the polymer can be used as a base polymer for a negative resist.

Examples of the preferable functional group undergoing condensation by an acid are those selected from —OH, —COOH, —CN, —SO$_3$H, epoxy group and the like.

A crosslinking agent, when used, is not limited particularly, and can be selected optionally from conventional ones having been used as a crosslinking agent for a negative resist.

Preferable examples thereof are, for instance, N-methylol melamine, N-alkoxymethyl melamine compound, urea compound, epoxy compound, isocyanate compound and the like.

The fluorine-containing base polymer material of the present invention to be used for a photoresist is preferably one having the structural unit of the above-mentioned ethylenic monomer having an acid-reactive group.

The fluorine-containing base polymer material may be the fluorine-containing base polymer material (I) comprising a polymer having a structural unit which is derived from the fluorine-containing ethylenic monomer having an acid-reactive group Y$^2$ and is represented by the formula (4):

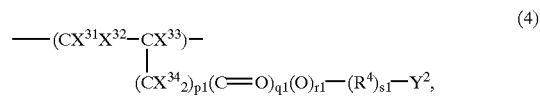

wherein X$^{31}$, X$^{32}$ and X$^{34}$ are the same or different and each is H or F; X$^{33}$ is H, CH$_3$, Cl, F or CF$_3$; Y$^2$ is an acid-reactive functional group; R$^4$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; p1 is 0, 1 or 2; q1 is 0 or 1; r1 is 0 or 1; s1is 0 or 1; provided that s1 is 0 or R$^4$ does not have fluorine atom, at least one of X$^{31}$, X$^{32}$ and X$^{34}$ is fluorine atom or X$^{33}$ is F or CF$_3$.

The fluorine-containing base polymer material (I) of the present invention is preferable because its content of fluorine atom can be set high, and can be preferably used for resist application because transparency is high in a vacuum ultraviolet region.

Further the fluorine-containing base polymer material (I) of the present invention can be used preferably for a process for patterning using a F$_2$ laser when q1 is 0 because transmission of light particularly in a vacuum ultraviolet region is high.

The fluorine-containing base polymer material may be the fluorine-containing base polymer material (II) comprising a polymer having a structural unit (a) which is derived from the ethylenic monomer having an acid-reactive functional group Y$^2$ and is represented by the formula (5):

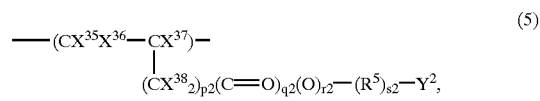

wherein X$^{35}$, X$^{36}$ and X$^{38}$ are the same or different and each is H or F; X$^{37}$ is H, CH$_3$, Cl, F or CF$_3$; Y$^2$ is an acid-reactive functional group; R$^5$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; p2 is 0, 1 or 2; q2 is 0 or 1; r2 is 0 or 1; s2 is 0 or 1; and a structural unit (b) which is derived from the fluorine-containing ethylenic monomer and is represented by the formula (6):

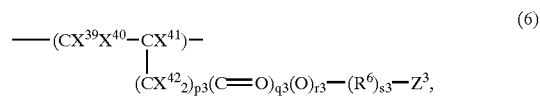

wherein X$^{39}$, X$^{40}$ and X$^{42}$ are the same or different and each is H or F; X$^{41}$ is H, CH$_3$, Cl, F or CF$_3$; Z$^3$ is H, F or Cl; R$^6$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; p3 is 0, 1 or 2; q3 is 0 or 1; r3 is 0 or 1; s3 is 0 or 1; provided that s3 is 0 or $R^6$ does not have fluorine atom, at least one of $X^{39}$, $X^{40}$, $X^{42}$ and $Z^3$ is fluorine atom or $X^{41}$ is F or $CF_3$.

The structural unit (a) of the formula (5) having the functional group $Y^2$ may contain or may not contain fluorine atom.

The fluorine-containing base polymer material (II) is preferable because by selecting the structural unit (b) of the formula (6), there can be obtained effects that physical properties (Tg and mechanical properties) of the fluorine-containing base polymer material can be controlled, a fluorine content can be controlled, and solubility and swelling property thereof into the developing solution can be controlled. The material is preferable as a resist material because transparency in a vacuum ultraviolet region is high and resolution and sensitivity can be made high. Further the production cost can be lowered.

Further when q2 is 0 and/or q3 is 0, the fluorine-containing base polymer material (II) of the present invention can be used preferably for a process for patterning using a $F_2$ laser because transmission of light particularly in a vacuum ultraviolet region is high.

The fluorine-containing base polymer material may be the fluorine-containing base polymer material (III) comprising a polymer having the structural unit (a) which is derived from the fluorine-containing ethylenic monomer having an acid-reactive group $Y^2$ and is represented by the formula (5):

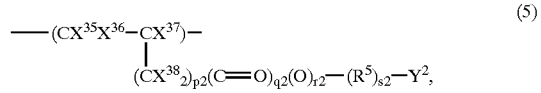

wherein $X^{35}$, $X^{36}$ and $X^{38}$ are the same or different and each is H or F; $X^{37}$ is H, $CH_3$, Cl, F or $CF_3$; $Y^2$ is an acid-reactive functional group; $R^5$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; p2 is 0, 1 or 2; q2 is 0 or 1; r2 is 0 or 1; s2 is 0 or 1; and a fluorine-containing aliphatic ring structural unit (c) represented by the formula (7):

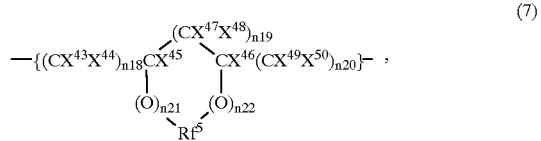

wherein $X^{43}$, $X^{44}$, $X^{47}$, $X^{48}$, $X^{49}$ and $X^{50}$ are the same or different and each is H or F; $X^{45}$ and $X^{46}$ are the same or different and each is H, F, Cl or $CF_3$; $Rf^5$ is a fluorine-containing alkylene group having 1 to 10 carbon atoms or a fluorine-containing alkylene group having 1 to 10 carbon atoms and ether bond; n19 is 0 or an integer of from 1 to 3; n18, n20, n21 and n22 are the same or different and each is 0 or 1.

In the fluorine-containing base polymer material (III), too, the structural unit of the formula (5) having the functional group $Y^2$ may contain or may not contain fluorine atom.

The fluorine-containing base polymer material (III) is preferable since because of the aliphatic ring structural unit (c), the material is bulky and has a large free area and thus Tg can be set high and mechanical properties are good. Also the material is preferable because even if the fluorine content is the same as in a polymer not having the aliphatic ring structural unit, transparency can be increased in a range including a vacuum ultraviolet region. As a result, when used for a resist, the material is preferable because transparency is high in a vacuum ultraviolet region and high resolution and high sensitivity can be obtained.

Further when q2 is 0, the fluorine-containing base polymer material (III) of the present invention is preferably used for a process for patterning using a $F_2$ laser because transmission of light particularly in a vacuum ultraviolet region is high.

In the fluorine-containing base polymer materials (II) and (III) to be used for a photoresist, particularly the structural unit (a) of the formula (5) having the acid-reactive group $Y^2$ is preferably a structural unit of a fluorine-containing ethylenic monomer. It is preferable that the structural unit (a) is a structural unit derived from a fluorine-containing ethylenic monomer and represented by the formula (8):

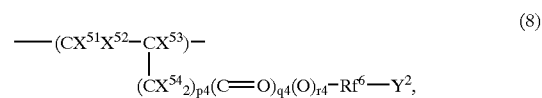

wherein $X^{51}$, $X^{52}$ and $X^{54}$ are the same or different and each is H or F; $X^{53}$ is H, $CH_3$, Cl, F or $CF_3$; $Y^2$ is an acid-reactive functional group; $Rf^6$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms; p4 is 0, 1 or 2; q4 is 0 or 1; r4 is 0 or 1.

Thereby a fluorine content of the fluorine-containing base polymer material can be further increased and transmission of light particularly in a vacuum ultraviolet region can be increased more, which is preferable.

Further particularly when q4 is 0, transmission of light particularly in a vacuum ultraviolet region is high and the material can be used preferably for a process for patterning using a $F_2$ laser.

Examples of the acid-reactive functional group are the above-mentioned $Y^1$ or the above-mentioned groups undergoing condensation by an acid.

In the fluorine-containing base polymer materials (I), (II) and (III) of the present invention to be used for a photoresist, examples of the preferable structural units (formulae (4) and (5)) having the acid-reactive group $Y^2$ and having fluorine atom are mentioned below.

① Structural unit derived from a fluorine-containing acrylic monomer

Concretely there are:

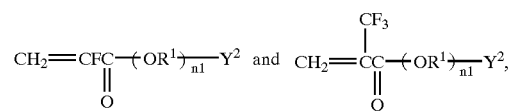

wherein $Y^2$, $R^1$ and n1 are as defined in the formula (1).

More concretely there are:

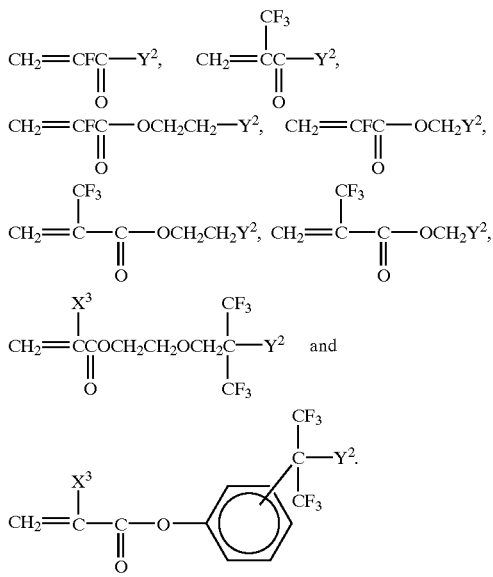

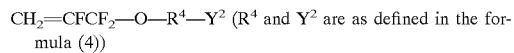

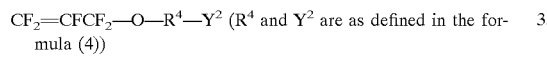

($X^3$: H, $CH_3$, F or $CF_3$)

② Structural Unit Derived From a Fluorine-containing Allyl Ether Monomer

Concretely there are:

$CH_2=CFCF_2-O-R^4-Y^2$ ($R^4$ and $Y^2$ are as defined in the formula (4))

$CF_2=CFCF_2-O-R^4-Y^2$ ($R^4$ and $Y^2$ are as defined in the formula (4))

Examples thereof are:

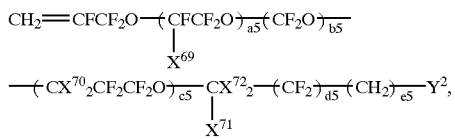

wherein $a5+b5+c5$ is from 0 to 30; $d5$ is from 0 to 2; $e5$ is from 0 to 5; $X^{69}$ is F or $CF_3$; $X^{70}$ and $X^{72}$ are H or F; $X^{71}$ is H, F or $CF_3$; when $X^{71}$ and $X^{72}$ are assumed to be H, $a5+b5+c5+d5+e5$ is not 0, and

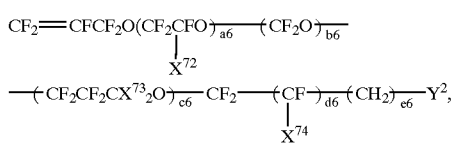

wherein $a6+b6+c6$ is from 0 to 30; $d6$ is from 0 to 2; $e6$ is from 0 to 5; $X^{72}$ and $X^{74}$ are F or $CF_3$; $X^{73}$ is H or F.

More concretely there are:

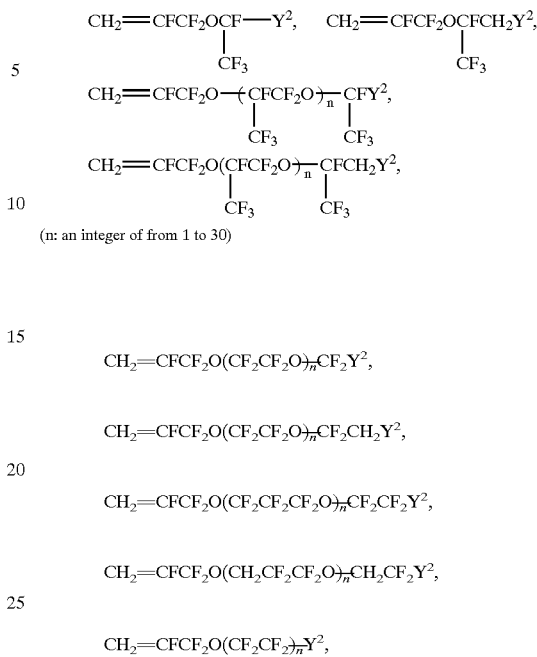

($n$: an integer of from 1 to 30)

$CH_2=CFCF_2O(CF_2CF_2O)_{\overline{n}}CF_2Y^2$, $CH_2=CFCF_2O(CF_2CF_2O)_{\overline{n}}CF_2CH_2Y^2$, $CH_2=CFCF_2O(CF_2CF_2CF_2O)_{\overline{n}}CF_2CF_2Y^2$, $CH_2=CFCF_2O(CH_2CF_2CF_2O)_{\overline{n}}CH_2CF_2Y^2$, $CH_2=CFCF_2O(CF_2CF_2)_{\overline{n}}Y^2$, $CF_2=CFCF_2OCF_2CF_2CF_2Y^2$, $CF_2=CFCF_2OCF_2CF_2CF_2-CH_2Y^2$, $CF_2=CFCF_2OCF_2CF-Y^2$, $CF_2=CFCF_2OCF_2CFCH_2Y^2$,
 | |
 $CF_3$ $CF_3$ $CF_2=CFCF_2O(CF_2CFO)_{\overline{n}}CF_2CF-Y^2$,
 | |
 $CF_3$ $CF_3$ $CF_2=CFCF_2O(CF_2CFO)_{\overline{n}}CF_2CFCH_2Y^2$,
 | |
 $CF_3$ $CF_3$ $\qquad\qquad\qquad\qquad\qquad\qquad\qquad\qquad$ (v)

$CH_2=CFCF_2O(CFCF_2O)_{\overline{n}}CFCH_2OCH_2C-Y^2$,
 | | |
 $CF_3$ $CF_3$ $CF_3$ ($n$: 0 or an integer of from 1 to 10)

and the like.

③ Structural Unit Derived From a Fluorine-containing Vinyl Ether Monomer

Examples thereof are:

$CF_2=CFO-R^4-Y^2$ ($R^4$ and $Y^2$ are as defined in the formula (4)) and

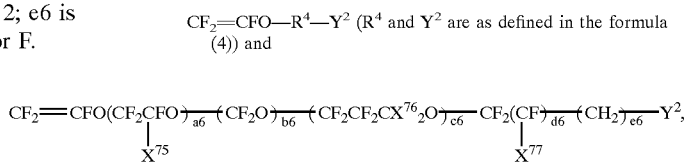

wherein a6+b6+c6 is from 0 to 30; d6 is from 0 to 2; e6 is from 0 to 5; $X^{75}$ and $X^{77}$ are F or $CF_3$; $X^{76}$ is H or F.
More concretely there are:

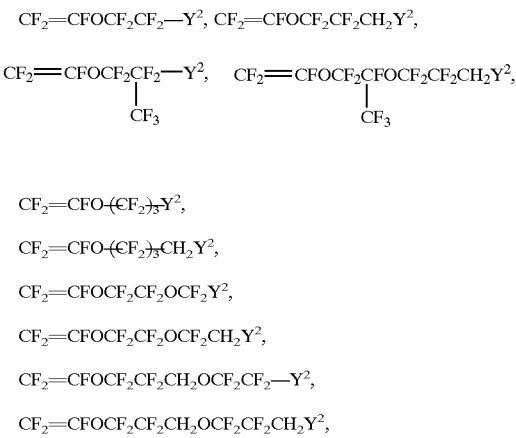

(n: from 0 to 10) and the like.

Among the above-mentioned examples, the formulae (v) and (vi) have not been disclosed in literatures and patent publications, and also the polymers prepared therefrom have not been disclosed in literatures and patent publications ④ Fluorine-containing Vinyl Compound There are:

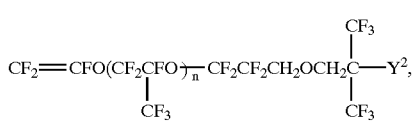

(n: from 1 to 10)

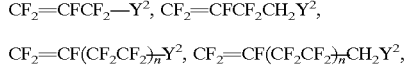

(n: from 1 to 10)

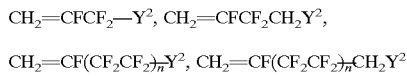

(n: from 1 to 10, n': from 1 to 5),

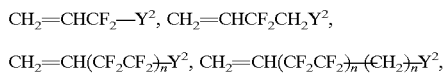

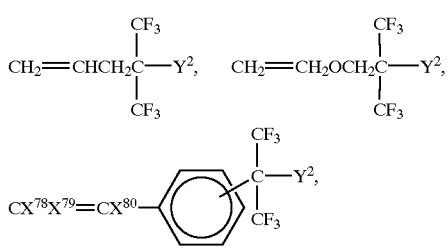

wherein $X^{78}$, $X^{79}$ and $X^{80}$ are H or F, and the like.

In the fluorine-containing base polymer materials (II) and (III) of the present invention which are used for a photoresist, the monomer giving the structural unit (formula (4) or (5)) having the acid-reactive group $Y^2$ may be one not having fluorine atom. Examples thereof are:

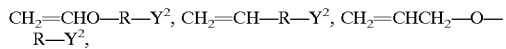

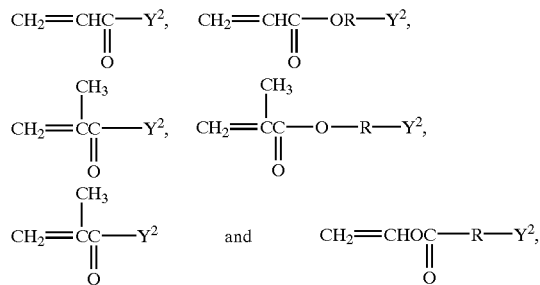

wherein R is a divalent hydrocarbon group having 1 to 20 carbon atoms, and more concretely there are:

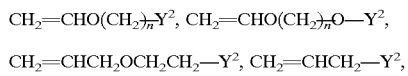

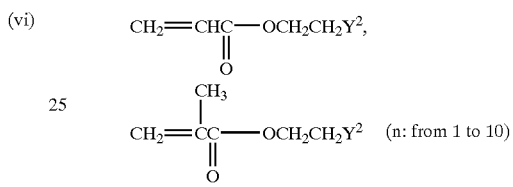

and the like.

In the fluorine-containing base polymer material of the present invention to be used for a photoresist, in case that the fluorine-containing base polymer material is obtained by copolymerizing the monomer having the acid-reactive group $Y^2$ with other monomer, the monomer to be copolymerized with the above-mentioned monomer having the acid-reactive group $Y^2$ is not limited particularly as far as it is copolymerizable with the monomer having the acid-reactive group $Y^2$. Preferable monomers are the ethylenic monomer corresponding to the formula (6) and the monomer capable of forming the ring structural unit of the formula (7) (cyclic monomer, diene monomer, etc.). Examples thereof are:

① Monomers corresponding to the above-mentioned structural units M2 of the fluorine-containing acrylic polymers described in the formulae I-(1), I-(1)-1 and I-(1)-2 are preferable. The same fluorine-containing acrylic monomers as those exemplified in the above-mentioned M2 can be used similarly preferably.

② Monomers corresponding to the structural units M4 and M5 described in the above-mentioned formulae I-(2), I-(2a), I-(2)-1, I-(2)-2, I-(2)-3, I-(2)-4, I-(2a)-5, I-(2a)-6 and I-(2a)-7 are preferable. The same ethylenic monomers as exemplified in the above-mentioned M4 and M5 can be used similarly preferably.

③ Monomers corresponding to the structural units M6 described in the above-mentioned formulae I-(3) and I-(3)-1 to I-(3)-6, particularly a diene monomer and cyclic monomer capable of forming the structural unit M6 are preferred. The same monomers as exemplified in the above-mentioned M6 can be used similarly preferably.

④ The monomers exemplified as the monomer corresponding to the structural unit A1 of the formula I-(1) and the monomers exemplified as the monomer corresponding to the structural unit A2 of the formula I-(2) can be used similarly preferably.

In the fluorine-containing base polymer material of the present invention to be used for a photoresist, when the monomer having the acid-reactive group $Y^2$ is a fluorine-containing ethylenic monomer, a monomer not having fluorine atom may be copolymerized as a copolymerizable component in an amount not lowering transparency in a vacuum ultraviolet region.

Examples thereof are ethylene, propylene, 1-butene, isobutene, vinyl ethers, vinyl esters, acrylates, methacrylates, maleic acids, styrenes, allyl ethers, vinyl chloride, vinylidene chloride and the like.

Further those monomers not having fluorine atom can be naturally used as the third component for the polymer having an acid-reactive group which is used for the fluorine-containing base polymer material, for example, as the structural unit of the third component of the fluorine-containing base polymer material (II) or (III) to be used for a photoresist.

The fluorine-containing polymer material exemplified above can be effectively used as a material for a photoresist by an effect of the acid-reactive functional group $Y^2$. Since transparency against light in a vacuum ultraviolet region having a wavelength of not more than 200 nm is good (namely, there is no absorption), transparency against a $F_2$ laser which has a wavelength of 157 nm and is to be used in a patterning process directed to micro-fabrication in the future is high. Thus the material is preferably used as a material for a resist in high productivity in a process of patterning aiming at a technology node of 0.1 μm. In order to use the fluorine-containing base polymer material of the present invention as a base polymer material for $F_2$ resist, a molecular absorption coefficient thereof at a wavelength of 157 nm is preferably not more than 3.0 $\mu m^{-1}$, more preferably not more than 1.5 $\mu m^{-1}$, further preferably not more than 1.0 $\mu m^{-1}$.

In other words, though a required transmittance of light having a wavelength of 157 nm in a 0.1 μm optical path length (coating thickness) is not less than 50%, preferably not less than 70%, further preferably not less than 80%, it can be achieved by using the fluorine-containing polymer material of the present invention.

Use of those transmissible materials enables a process of patterning a single layer resist using a $F_2$ laser.

The third of Invention I relates to the chemically amplifying type photoresist composition comprising the fluorine-containing polymer having an acid-reactive functional group as a binder.

The chemically amplifying type photoresist composition comprises a resin (polymer) component and a photoacid generator. When the resist is exposed to energy rays, an acid is generated from the photoacid generator on the exposed portion of the resist and a catalytic action of the acid is utilized. In the chemically amplifying type positive photoresist, by the heat treatment (post-exposure bake: PEB) subsequent to the irradiation of energy rays, not only an acid generated on its irradiated portion is scattered and acts to carry out deprotection of an acid-labile or acid-degradable functional group of the resin, etc. but also an acid is re-generated, thus making the energy-irradiated portion of the alkali-soluble resist.

The chemically amplifying type positive resist is classified into two types of resists. One is a resist comprising an alkali-soluble resin component, an acid generator and in addition, a dissolution inhibitor having a functional group (protective group) which is dissociated or degraded due to action of an acid. The functional group of the dissolution inhibitor itself has an ability of inhibiting dissolution of the alkali-soluble resin but the resin becomes soluble in alkali after the functional group (protective group) is dissociated due to action of an acid. Another resist is one in which the resin component has a functional group (protective group) which is dissociated or degraded due to action of an acid and is insoluble or hardly soluble in alkali but becomes soluble in alkali after the functional group (protective group) is dissociated due to action of an acid.

A chemically amplifying type negative photoresist generally comprises an alkali-soluble resin component and having a functional group capable of undergoing condensation reaction by an acid, an acid generator and in addition, a crosslinking agent.

In such a negative photoresist, an acid generated in the energy-irradiated portion thereof is scattered by the PEB treatment and acts on the functional group in the resin component which undergoes condensation by an acid and on the crosslinking agent, thereby hardening the binder resin in the energy-irradiated portion and making the resin insoluble or hardly soluble in alkali.

The chemically amplifying type photoresist composition of the present invention can be used on the above-mentioned positive and negative photoresists and comprises:

(A) a fluorine-containing polymer having an acid-reactive functional group, (B) a photoacid generator, and (C) a solvent.

Next, the fluorine-containing polymer (A) having an acid-reactive functional group which is used on the chemically amplifying type photoresist composition of the present invention is explained below.

The acid-reactive functional group of the fluorine-containing polymer (A) having an acid-reactive functional group represents an acid-labile or acid-degradable functional group and a functional group undergoing condensation reaction by an acid (condensation reactivity) as mentioned above, and the following three polymers can be used preferably as the fluorine-containing polymer (A).

① The fluorine-containing polymer having an acid-labile or acid-degradable functional group is used on the above-mentioned positive photoresist. The acid-labile or acid-degradable functional group is called a protective group as mentioned above. The fluorine-containing polymer (A) itself before the reaction is insoluble or hardly soluble in alkali but the functional group is dissociated or degraded by an acid generated from the photoacid generator (B) by the irradiation of energy rays and functions to make the fluorine-containing polymer (A) soluble in alkali. Further an acid is also generated from the protecting group released by the degradation of the functional group in the fluorine-containing polymer (A), which gives an effect of accelerating the degradation reaction.

With respect to the acid-labile or acid-degradable functional group, there can be used preferably the same ones as raised in the above-mentioned explanation of the fluorine-containing polymer to be used for a photoresist.

② The fluorine-containing polymer having a functional group undergoing condensation reaction by an acid is used for a negative photoresist. The functional group undergoing condensation reaction by an acid functions to cause condensation or poly-condensation reaction or rearrangement reaction by an acid generated from the photoacid generator (B) by irradiation of energy rays, thereby causing self-crosslinking reaction, rearrangement reaction in a molecule and crosslinking reaction with a crosslinking agent in the composition, which makes the fluorine-containing polymer (A) insoluble or hardly soluble in a developing solution (alkali or a solvent) though the polymer before the reaction is soluble in the developing solution. The functional group undergoing condensation reaction by an acid is preferably selected from the group consisting of —OH, —COOH, —CN, —SO₃H and epoxy group.

Further in the present invention particularly preferred are the functional groups undergoing condensation reaction (—COOH, —SO₃H, —OH and the like) which can impart a function of making the polymer soluble in a developing solution such as alkali and a solvent before the reaction with an acid. The functional group may be those (—CN, epoxy group and the like) which have only a function of undergoing condensation reaction (crosslinking reaction) by an acid and thereby making the polymer insoluble in the developing solution. In that case, the polymer can be used for a negative photoresist by a combination use of other functional group having a function of making the polymer soluble in the developing solution or by making a backbone of the fluorine-containing polymer have a structure soluble in the developing solution.

Particularly the fluorine-containing polymer having a functional group undergoing condensation is preferably a polymer soluble in alkali before the reaction with an acid, which is advantageous from the viewpoint of safety and environment because a solvent (particularly a flammable solvent) is not used as a developing solution and a developing process (dissolving process) can be carried out in an aqueous system.

The fluorine-containing polymer (A) having an acid-reactive functional group in the chemically amplifying type photoresist composition of the present invention is one which has the above-mentioned acid-labile or acid-degradable functional group or the functional group undergoing condensation by an acid and can be selected widely from those having fluorine atom, particularly from those having carbon-fluorine bond. Generally it is preferable that the polymer is selected from:

(IV) a fluorine-containing ethylenic polymer having an acid-reactive functional group and
(V) a fluorine-containing polymer having an acid-reactive functional group and a ring structure on its trunk chain.

It is particularly preferable from the viewpoint of transparency that the fluorine-containing polymer (V) having a ring structure on its trunk chain is (V-1) a fluorine-containing polymer having an acid-reactive functional group and a fluorine-containing aliphatic ring on its trunk chain.

On the other hand it is preferable that the acid-reactive functional group is introduced into the fluorine-containing polymer in the form of a structural unit of an ethylenic monomer having an acid-reactive functional group. Generally the acid-reactive functional group can be introduced by a method of polymerizing (homo-polymerizing or copolymerizing) an ethylenic monomer having an acid-reactive functional group or a method of carrying out a high molecular reaction of a fluorine-containing polymer comprising a structural unit of an ethylenic monomer having other functional group to convert into the acid-reactive functional group.

It is particularly preferable from the viewpoint of transparency that the structural unit of the ethylenic monomer having an acid-reactive functional group is a structural unit of a fluorine-containing ethylenic monomer.

In the chemically amplifying type photoresist composition of the present invention, the above-mentioned novel fluorine-containing polymers and fluorine-containing polymer materials to be used for a photoresist can be used preferably respectively as the fluorine-containing polymer (A) having an acid-reactive functional group. Concretely the above-mentioned fluorine-containing base polymer materials (I), (II) and (III) are preferred. Also the same monomer units as those of the above-mentioned fluorine-containing base polymer materials can be used preferably as the monomer units of the fluorine-containing polymer (A).

Further in the chemically amplifying type photoresist composition of the present invention, the fluorine-containing polymer (A) may be a fluorine-containing polymer having a recurring unit of a novel fluorine-containing alicyclic monomer having an acid-reactive functional group $Y^2$ and represented by the following formula (10) or (11). Use of such a monomer makes it possible to apply the polymer to a positive photoresist and a negative photoresist and is preferable because a photoresist composition which is excellent not only in transparency but also in an etching resistance can be obtained.

The novel fluorine-containing alicyclic monomers are fluorine-containing monomers represented by the formula (10):

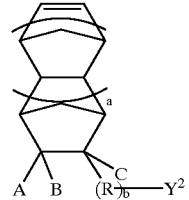

(10)

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that b is 0 or R does not have fluorine atom, any one of A, B and C is fluorine atom or a fluorine-containing alkyl group.

It is preferable that any one of A, B and C is fluorine atom, or when A, B and C do not have fluorine atom, R has a fluorine content of not less than 60%, and it is further preferable that R is a perfluoroalkylene group from the viewpoint that transparency can be imparted to the polymer.

Examples thereof are concretely as follows.

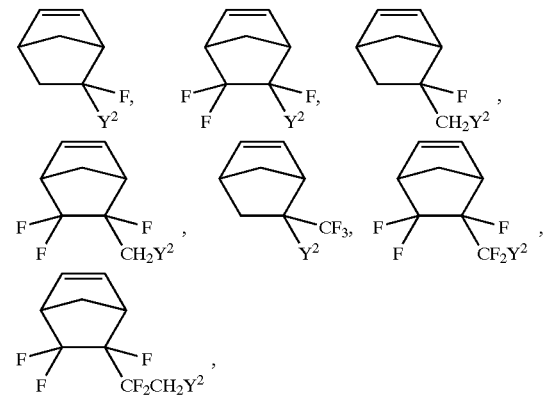

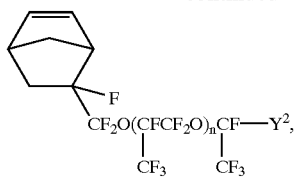

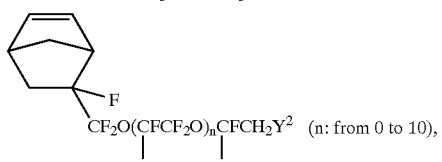 (n: from 0 to 10),

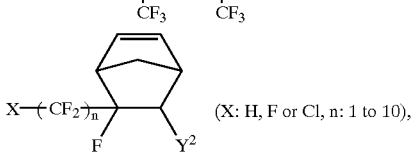 (X: H, F or Cl, n: 1 to 10),

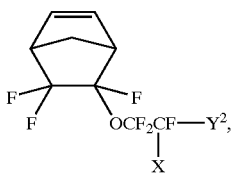

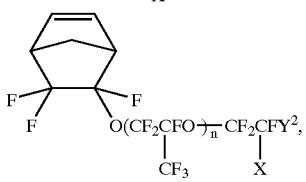

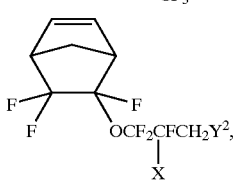

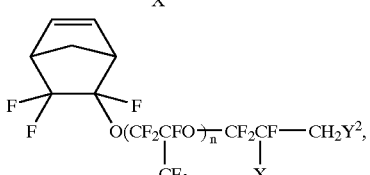

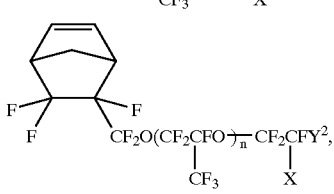

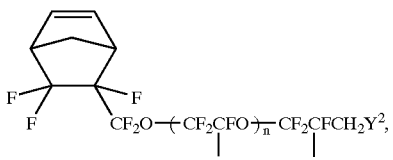

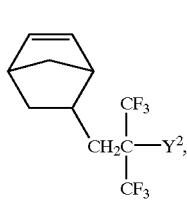

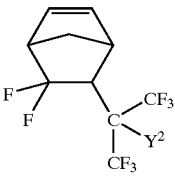

(n: from 0 to 10, X: F or $CF_3$).

Also there are novel fluorine-containing alicyclic monomers represented by the formula (11):

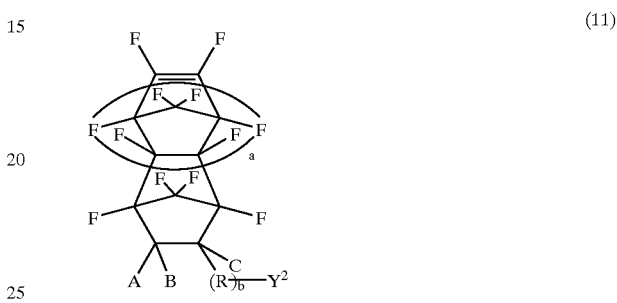 (11)

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group.

Concretely examples thereof are preferably monomers having norbornene backbone and raised below.

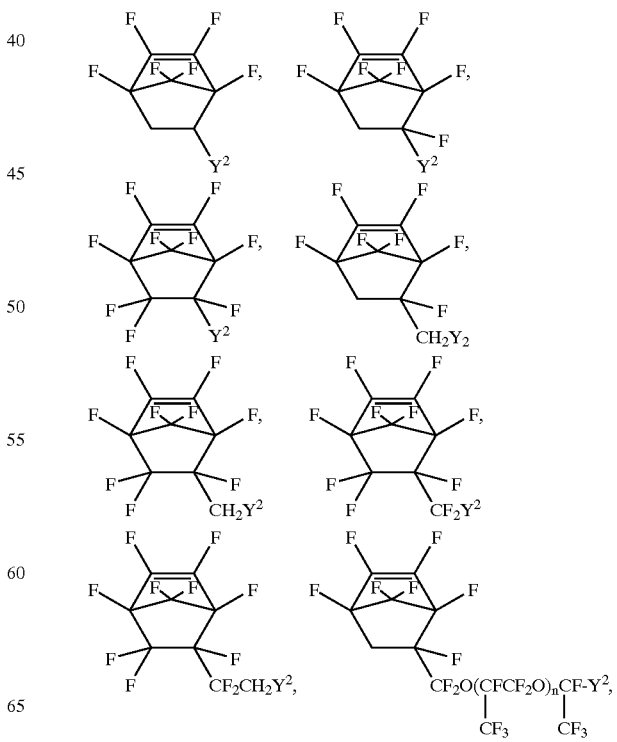

-continued

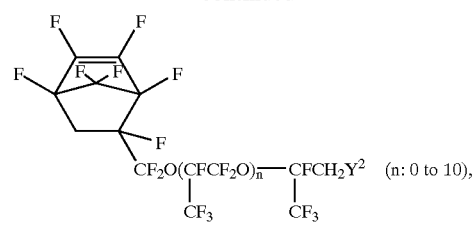
CF$_2$O(CFCF$_2$O)$_n$—CFCH$_2$Y$^2$ (n: 0 to 10),
       |                |
       CF$_3$           CF$_3$

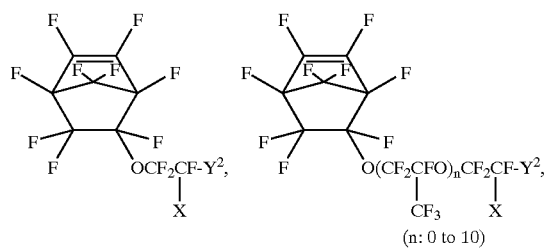
OCF$_2$CF-Y$^2$,     O(CF$_2$CFO)$_n$CF$_2$CF-Y$^2$,
    |                      |        |
    X                      CF$_3$   X
                        (n: 0 to 10)

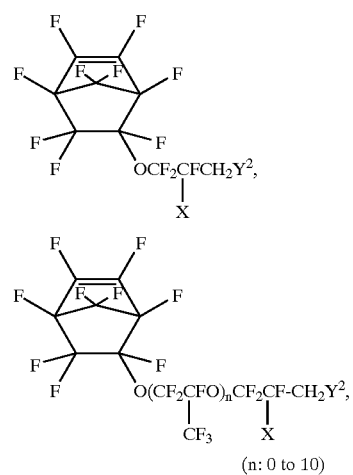
OCF$_2$CFCH$_2$Y$^2$,
    |
    X

O(CF$_2$CFO)$_n$CF$_2$CF-CH$_2$Y$^2$,
    |               |
    CF$_3$          X
(n: 0 to 10)

CF$_2$O(CF$_2$CFO)$_n$CF$_2$CF-Y$^2$,
          |             |
          CF$_3$        X
(X: F or CF$_3$)

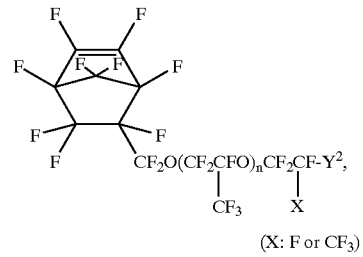
CF$_2$O(CF$_2$CFO)$_n$CF$_2$CFCH$_2$Y$^2$,
          |              |
          CF$_3$         X

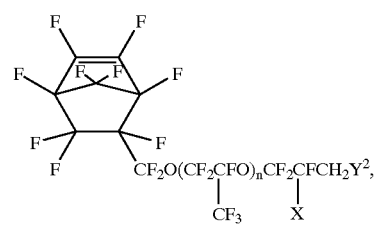
       CF$_3$
       |
    CH$_2$C-Y$^2$
       |
       CF$_3$

-continued

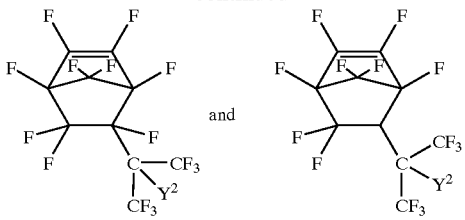
   C—CF$_3$          C—CF$_3$
   |                 |
   Y$^2$             Y$^2$
   |                 |
   CF$_3$            CF$_3$
       and Examples of the fluorine-containing polymer having recurring units of those fluorine-containing alicyclic monomers having an acid-reactive group are polymers raised below.

① Copolymers comprising the fluorine-containing alicyclic monomer represented by the formula (10) and an ethylenic monomer.

Examples of the ethylenic monomer as a copolymerizable component are, for instance, ethylene monomers such as ethylene, propylene, butene and vinyl chloride; acrylic monomers; methacrylic monomers; allyl monomers; allyl ether monomers; styrene monomers; and the like.

② Copolymers comprising the fluorine-containing alicyclic monomer represented by the formula (10) and a fluorine-containing ethylenic monomer.

The fluorine-containing ethylenic monomers as a copolymerizable component are preferably, for instance, tetrafluoroethylene, chlorotrifluoroethylene, hexafluoropropylene, $CF_2=CFRf$, in which Rf is a perfluoroalkyl group having 1 to 5 carbon atoms, vinylidene fluoride, vinyl fluoride, trifluoroethylene and the like, which are particularly preferable from the viewpoint that transparency can be imparted to the polymer.

③ Polymers obtained by ring-opening polymerization of the fluorine-containing alicyclic monomers of the formula (10) and/or (11) and/or polymers obtained by hydrogenation of the polymers obtained by the ring-opening polymerization.

④ Copolymers obtained by ring-opening polymerization of the fluorine-containing alicyclic monomers of the formula (10) and/or (11) with an alicyclic monomer represented by the formula (12):

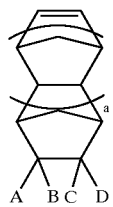

(12)

A  B C  D wherein A, B, C and D are H, F, an alkyl group having 1 to 10 carbon atoms or a fluorine-containing alkyl group having 1 to 10 carbon atoms, a is 0 or an integer of from 1 to 3, and/or copolymers obtained by hydrogenation of the copolymers obtained by the ring-opening polymerization.

The fluorine-containing polymer (A) to be used for the photoresist composition of the present invention may be, in addition to the above-mentioned fluorine-containing polymer having recurring units of the fluorine-containing alicyclic monomer, a copolymer comprising a fluorine-containing alicyclic monomer not having an acid-reactive functional group and a monomer having an acid-reactive functional group, for example, a copolymerizable alicyclic monomer having an acid-reactive group or an ethylenic monomer having an acid-reactive group.

Examples of the fluorine-containing alicyclic monomer not having an acid-reactive group are monomers represented by the formula (9):

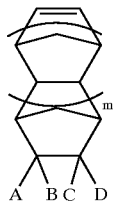

(9)

wherein A, B, C and D are H, F, an alkyl group having 1 to 10 carbon atoms or a fluorine-containing alkyl group having 1 to 10 carbon atoms, m is 0 or an integer of from 1 to 3, any one of A, B, C and D has fluorine atom.

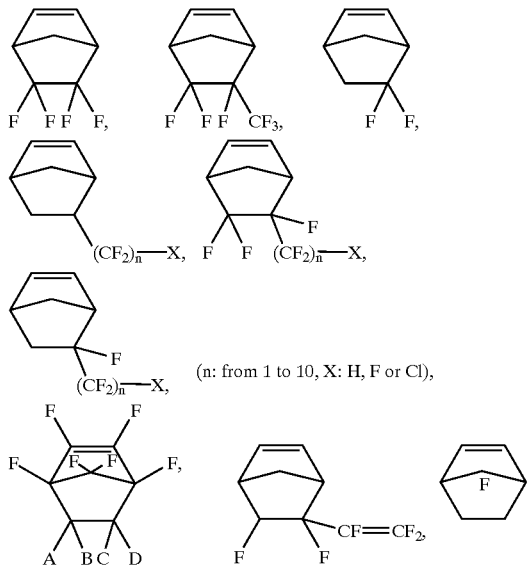

(n: from 1 to 10, X: H, F or Cl), (A, B, C and D are H, F, an alkyl group having 1 to 10 carbon atoms or a fluorine-containing alkyl group having 1 to 10 carbon atoms) and the like.

The alicyclic monomer having an acid-reactive group may be the monomers represented by the above-mentioned formulae (10) and (11) and further monomers not having fluorine atom and represented by:

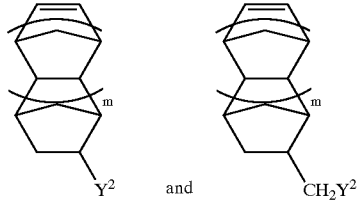

Examples of the preferable fluorine-containing polymer are copolymers obtained by ring-opening polymerization of a mixture of those alicyclic monomers and/or copolymers obtained by hydrogenation thereof.

Examples of the preferable copolymerizable ethylenic monomer having an acid-reactive group are acrylic monomers, methacrylic monomers, styrene monomers and the like which have the acid-reactive group $Y^2$.

In the chemically amplifying type resist composition of the present invention, the photoacid generator (B) is a compound which generates an acid or cation by irradiating the compound itself or a resist composition containing the compound with radial rays. The compounds can be used in a mixture of two or more thereof. For example, there are known compounds such as an organic halogen compound, sulfonic acid ester, onium salt, diazonium salt, disulfone compound and a mixture thereof. Examples thereof are, for instance, haloalkyl group-containing s-triazine derivatives such as tris(trichloromethyl)-s-triazine, tris(tribromomethyl)-s-triazine, tris(dibromomethyl)-s-triazine and 2,4-bis(tribromomethyl)-6-p-methoxyphenyl-s-triazine, halogen-substituted paraffin hydrocarbons such as 1,2,3,4-tetrabromobutane, 1,1,2,2-tetrabromoethane, carbon tetrabromide and iodoform, halogen-substituted cycloparaffin hydrocarbons such as hexabromocyclohexane, hexachlorocyclohexane and hexabromocyclododecane, haloalkyl group-containing benzene derivatives such as bis(trichloromethyl)benzene and bis(tribromomethyl)benzene, haloalkyl group-containing sulfone compounds such as tribromomethylphenyl sulfone and trichloromethylphenyl sulfone, halogen-containing sulfolane compounds such as 2,3-dibromosulfolane, haloalkyl group-containing isocyanurates such as tris(2,3-dibromopropyl)isocyanurate, sulfonium salts such as triphenylsulfonium chloride, triphenylsulfoniummethane sulfonate, triphenylsulfoniumtrifluoromethane sulfonate, triphenylsulfonium-p-toluene sulfonate, triphenylsulfoniumtetrafluoro borate, triphenylsulfoniumhexafluoro arcenate and triphenylsulfoniumhexafluoro phosphonate, iodonium salts such as diphenyl-iodonium-trifluoromethane-sulfonate, diphenyl-iodonium-p-toluene-sulfonate, diphenyliodonium tetrafluoroborate, diphenyliodonium hexafluoroarcenate and diphenyliodonium hexafluorophosphonate, sulfonic acid esters such as methyl p-toluenesulfonate, ethyl p-toluenesulfonate, butyl p-toluenesulfonate, phenyl p-toluenesulfonate, 1,2,3-tris(p-toluenesulfonyloxy)benzene, p-toluenesulfonic acid benzoyl ester, methyl methanesulfonate, ethyl methanesulfonate, butyl methanesulfonate, 1,2,3-tris(methanesulfonyloxy)benzene, tri(methanesulfonyloxy)benzene, phenyl methanesulfonate, methane sulfonic acid benzoyl ester, methyl trifluoromethanesulfonate, ethyl trifluoromethanesulfonate, butyl trifluoromethanesulfonate, 1,2,3-tris(trifluoromethanesulfonyloxy)benzene, phenyl trifluoromethanesulfonate and benzoin trifluoromethanesulfonate, disulfones such as diphenyldisulfone, sulfonediazides such as bis(phenylsulfonyl)diazomethane, bis(2,4-dimethylphenylsulfonyl)diazomethane, bis(cyclohexylsulfonyl)diazomethane, cyclohexylsulfonyl-(2-methoxyphenylsulfonyl)diazomethane, cyclohexylsulfonyl-(3-methoxyphenylsulfonyl)diazomethane, cyclohexylsulfonyl-(4-methoxyphenylsulfonyl)diazomehtane, cyclopentylsulfonyl-(2-methoxyphenylsulfonyl)diazomethane, cyclopentylsulfonyl-(3-methoxyphenylsulfonyl)diazomethane, cyclopentylsulfonyl-(4-methoxyphenylsulfonyl)diazomethane, cyclohexylsulfonyl-(2-fluorophenylsulfonyl)diazomethane, cyclohexylsulfonyl-(3-fluorophenylsulfonyl)diazomethane, cyclohexylsulfonyl-(4-fluorophenylsulfonyl)diazomethane, cyclopentylsulfonyl(2-fluorophenylsulfonyl)diazomethane, cyclopentylsulfonyl-(3-fluorophenylsulfonyl)diazomethane, cyclopentylsulfonyl-(4-fluorophenylsulfonyl)diazomethane, cyclohexylsulfonyl-(2-chlorophenylsulfonyl)diazomethane, cyclohexylsulfonyl-(3-chlorophenylsulfonyl)diazomethane, cyclohexylsulfonyl-(4-chlorophenylsulfonyl)diazomethane, cyclopentylsulfonyl-(2-chlorophenylsulfonyl) diazomethane, cyclopentylsulfonyl-(3-chlorophenylsulfonyl)diazomethane, cyclopentylsulfonyl-(4-chlorophenylsulfonyl)diazomethane, cyclohexylsulfonyl-(2-trifluoromethyphenylsulfonyl)diazomethane, cyclohexylsulfonyl-(3-trifluoromethylphenylsulfonyl) diazomethane, cyclohexylsulfonyl-(4-trifluoromethylphenylsulfonyl)diazomethane, cyclopentylsulfonyl-(2-trifluoromethylphenylsulfonyl)diazomethane, cyclopentylsulfonyl-(3-trifluoromethylphenylsulfonyl) diazomethane, cyclopentylsulfonyl-(4-trifluoromethylphenylsulfonyl)diazomethane, cyclohexylsulfonyl-(2-trifluoromethoxyphenylsulfonyl)diazomethane, cyclohexylsulfonyl-(3-trifluoromethoxyphenylsulfonyl) diazomethane, cyclohexylsulfonyl-(4-trifluoromethoxyphenylsulfonyl)diazomethane, cyclopentylsulfonyl-(2-trifluoromethoxyphenylsulfonyl)diazomethane, cyclopentylsulfonyl-(3-trifluoromethoxyphenylsulfonyl) diazomethane, cyclopentylsulfonyl-(4-trifluoromethoxyphenylsulfonyl)diazomethane, cyclohexylsulfonyl-(2,4,6-trimethylphenylsulfonyl)diazomethane, cyclohexylsulfonyl-(2,3,4-trimethylphenylsulfonyl)diazomethane, cyclohexylsulfonyl-(2,4,6-trimethylphenylsulfonyl) diazomethane, cyclohexylsulfonyl-(2,3,4-triethylphenylsulfonyl)diazomethane, cyclopentylsulfonyl-(2,4,6-trimethylphenylsulfonyl)diazomethane, cyclopentylsulfonyl-(2,3,4-trimethylphenylsulfonyl) diazomethane, cyclopentylsulfonyl-(2,4,6-triethylphenylsulfonyl)diazomethane, cyclopentylsulfonyl-(2,3,4-triethylphenylsulfonyl)diazomethane, phenylsulfonyl-(2-methoxylphenylsulfonyl)diazomethane, phenylsulfonyl-(3-methoxylphenylsulfonyl)diazomethane, phenylsulfonyl-(4-methoxylphenylsulfonyl)diazomethane, bis(2-methoxylphenylsulfonyl)diazomethane, bis(3-methoxylphenylsulfonyl)diazomethane, bis(4-methoxylphenylsulfonyl)diazomethane, phenylsulfonyl-(2,4,6-trimethylphenylsulfonyl)diazomethane, phenylsulfonyl-(2,3,4-trimethylphenylsulfonyl)diazomethane, phenylsulfonyl-(2,4,6-triethylphenylsulfonyl) diazomethane, phenylsulfonyl-(2,3,4-triethylphenylsulfonyl)diazomethane, 2,4-dimethylphenylsulfonyl-(2,4,6-trimethylphenylsulfonyl)diazomethane, 2,4-dimethylphenylsulfonyl-(2,3,4-trimethylphenylsulfonyl) diazomethane, phenylsulfonyl-(2-fluorophenylsulfonyl)diazomethane, phenylsulfonyl-(3-fluorophenylsulfonyl) diazomethane and phenylsulfonyl-(4-fluorophenylsulfonyl) diazomethane, o-nitrobenzyl esters such as o-nitrobenzyl-p-toluenesulfonate, sulfone hydrazides such as N,N'-di(phenylsulfonyl)hydrazide and the like.

Examples of the preferable photoacid generator are compounds generating any of sulfonic acid, sulfenic acid or sulfinic acid. Examples thereof are onium sulfonates such as triphenylsulfonium-p-toluenesulfonate and diphenyliodonium-p-toluenesulfonate, sulfonic acid esters such as phenyl p-toluenesulfonate and 1,2,3-tris(p-toluenesulfonyloxy)benzene, disulfones such as diphenyldisulfone, sulfonediazides such as bis(phenylsulfonyl)diazomethane, bis(2,4-dimethylphenyl-sulfonyl)diazomethane, bis(cyclohexylsulfonyl) diazomethane, cyclohexylsulfonyl-(2-methoxyphenylsulfonyl)diazomethane, cyclohexylsulfonyl-(3-methoxyphenylsulfonyl)diazomethane, cyclohexylsulfonyl-(4-methoxyphenylsulfonyl)diazomehtane, cyclopentyl-sulfonyl-(2-methoxyphenylsulfonyl)diazomethane, cyclopentylsulfonyl-(3-methoxyphenylsulfonyl) diazomethane, cyclopentylsulfonyl-(4-methoxyphenyl-sulfonyl)diazomethane, cyclohexylsulfonyl-(2-fluorophenylsulfonyl)diazomethane, cyclohexylsulfonyl-(3-fluorophenylsulfonyl)diazomethane, cyclohexylsulfonyl-(4-fluorophenylsulfonyl)diazomethane, cyclopentylsulfonyl-(2-fluorophenylsulfonyl)diazomethane, cyclopentyl-sulfonyl-(3-fluorophenylsulfonyl)diazomethane, cyclopentylsulfonyl-(4-fluorophenylsulfonyl)diazomethane, cyclohexylsulfonyl-(2-chlorophenylsulfonyl)diazomethane, cyclohexylsulfonyl-(3-chlorophenylsulfonyl)diazomethane, cyclohexylsulfonyl-(4-chlorophenylsulfonyl)diazomethane, cyclopentylsulfonyl-(2-chlorophenylsulfonyl) diazomethane, cyclopentylsulfonyl-(3-chlorophenyl-sulfonyl)diazomethane, cyclopentylsulfonyl-(4-chlorophenylsulfonyl)diazomethane, cyclohexylsulfonyl-(2-trifluoromethylphenylsulfonyl)diazomethane, cyclohexylsulfonyl-(3-trifluoromethylphenylsulfonyl) diazomethane, cyclohexylsulfonyl-(4-trifluoromethyl-phenylsulfonyl)diazomethane, cyclopentylsulfonyl-(2-trifluoromethylphenylsulfonyl)diazomethane, cyclopentylsulfonyl-(3-trifluoromethylphenylsulfonyl) diazomethane, cyclopentylsulfonyl-(4-trifluoromethyl-phenylsulfonyl)diazomethane, cyclohexylsulfonyl-(2-trifluoromethoxyphenylsulfonyl)diazomethane, cyclohexylsulfonyl-(3-trifluoromethoxyphenylsulfonyl) diazomethane, cyclohexylsulfonyl-(4-trifluoromethoxy-phenylsulfonyl)diazomethane, cyclopentylsulfonyl-(2-trifluoromethoxyphenylsulfonyl)diazomethane, cyclopentylsulfonyl-(3-trifluoromethoxyphenylsulfonyl) diazomethane, cyclopentylsulfonyl-(4-trifluoromethoxy-phenylsulfonyl)diazomethane, cyclohexylsulfonyl-(2,4,6-trimethylphenylsulfonyl)diazomethane, cyclohexylsulfonyl-(2,3,4-trimethylphenylsulfonyl)diazomethane, cyclohexylsulfonyl-(2,4,6-triethylphenylsulfonyl) diazomethane, cyclohexylsulfonyl-(2,3,4-triethylphenyl-sulfonyl)diazomethane, cyclopentylsulfonyl-(2,4,6-trimethylphenylsulfonyl)diazomethane, cyclopentyl-sulfonyl-(2,3,4-trimethylphenylsulfonyl)diazomethane, cyclopentylsulfonyl-(2,4,6-triethylphenylsulfonyl) diazomethane, cyclopentylsulfonyl-(2,3,4-triethylphenylsulfonyl)diazomethane, phenylsulfonyl-(2-methoxylphenylsulfonyl)diazomethane, phenylsulfonyl-(3-methoxylphenylsulfonyl)diazomethane, phenylsulfonyl-(4-methoxylphenylsulfonyl)diazomethane, bis(2-methoxylphenylsulfonyl)diazomethane, bis(3-methoxylphenylsulfonyl)diazomethane, bis(4-methoxylphenylsulfonyl)diazomethane, phenylsulfonyl-(2,4,6-trimethylphenylsulfonyl)diazomethane, phenylsulfonyl-(2,3,4-trimethylphenylsulfonyl)diazomethane, phenylsulfonyl-(2,4,6-triethylphenylsulfonyl) diazomethane, phenylsulfonyl-(2,3,4-triethylphenyl-sulfonyl)diazomethane, 2,4-dimethylphenylsulfonyl-(2,4,6-trimethylphenylsulfonyl)diazomethane, 2,4-dimethylphenylsulfonyl-(2,3,4-trimethylphenylsulfonyl) diazomethane, phenylsulfonyl-(2-fluorophenylsulfonyl) diazomethane, phenylsulfonyl-(3-fluorophenylsulfonyl) diazomethane and phenylsulfonyl-(4-fluorophenylsulfonyl) diazomethane, o-nitrobenzyl esters such as o-nitrobenzyl-p-toluenesulfonate, and the like. Particularly sulfonediazides are preferable.

Further in addition to the above-mentioned examples, a photoacid generator of onium salt type having fluorine atom can be used. For example, there are preferably used a fluoroalkyl onium salt represented by the formula:

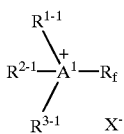

wherein $A^1$ is an element selected from iodine, sulfur, selenium, tellurium, nitrogen and phosphorus;

when $A^1$ is iodine, $R^{2-1}$ and $R^{3-1}$ are not present and $R^{1-1}$ is an alkyl group having 1 to 15 carbon atoms or an aryl group having 6 to 15 carbon atoms;

when $A^1$ is sulfur, selenium or tellurium, $R^{3-1}$ is not present and $R^{1-1}$ and $R^{2-1}$ are independently an alkyl group having 1 to 15 carbon atoms, an aryl group having 6 to 20 carbon atoms, a dialkylamino group having 2 to 30 carbon atoms, an alkylarylamino group having 7 to 35 carbon atoms or a diarylamino group having 12 to 40 carbon atoms and $R^{1-1}$ and $R^{2-1}$ may be bonded to each other to form a ring;

when $A^1$ is nitrogen or phosphorus, $R^{1-1}$, $R^{2-1}$ and $R^{3-1}$ are independently an alkyl group having 1 to 15 carbon atoms, an aryl group having 6 to 20 carbon atoms, a dialkylamino group having 2 to 30 carbon atoms, an alkylarylamino group having 7 to 35 carbon atoms or a diarylamino group having 12 to 40 carbon atoms and $R^{1-1}$, $R^{2-1}$ and $R^{3-1}$ may be bonded to each other to form one or more rings, or $R^{3-1}$ may not be present and $R^{1-1}$ and $R^{2-1}$ may be bonded to each other to form an aromatic ring including $A^1$;

the above-mentioned alkyl group, an alkyl group of the dialkylamino group and an alkyl group of the alkylarylamino group may be substituted with an aryl group, halogen atom, oxygen atom, nitrogen atom, sulfur atom or silicon atom, may be branched or may form a ring, and the above-mentioned aryl group, an aryl group of the alkylarylamino group and an aryl group of the diarylamino group may be substituted with an alkyl group, haloalkyl group, halogen atom, alkoxyl group, aryloxy group, nitro group, amide group, cyano group, alkanoyl group, aroyl group, alkoxycarbonyl group, aryloxycarbonyl group or acyloxy group;

$R_f$ is a perfluoroalkyl group which has 1 to 15 carbon atoms and may be branched or may form a ring, or is the perfluoroalkyl group in which a part of its fluorine atoms is substituted with hydrogen atoms; $X^-$ is a conjugated base of Brønsted acid, a fluoroalkyl onium salt represented by the formula:

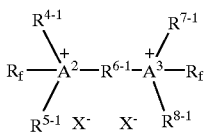

wherein $A^2$ and $A^3$ are the same or different and each is an element selected from iodine, sulfur, selenium, tellurium, nitrogen and phosphorus;

when $A^2$ or $A^3$ is iodine, $R^{4-1}$, $R^{5-1}$, $R^{7-1}$ and $R^{8-1}$ are not present;

when $A^2$ or $A^3$ is sulfur, selenium or tellurium, $R^{5-1}$ and $R^{8-1}$ are not present and $R^{4-1}$ and $R^{7-1}$ are independently an alkyl group having 1 to 15 carbon atoms, an aryl group having 6 to 20 carbon atoms, a dialkylamino group having 2 to 30 carbon atoms, an alkylarylamino group having 7 to 35 carbon atoms or a diarylamino group having 12 to 40 carbon atoms;

when $A^2$ or $A^3$ is nitrogen or phosphorus, $R^{4-1}$, $R^{5-1}$, $R^{7-1}$ and $R^{8-1}$ are independently an alkyl group having 1 to 15 carbon atoms, an aryl group having 6 to 20 carbon atoms, a dialkylamino group having 2 to 30 carbon atoms, an alkylarylamino group having 7 to 35 carbon atoms or a diarylamino group having 12 to 40 carbon atoms, and $R^{4-1}$ and $R^{5-1}$ or $R^{7-1}$ and $R^{8-1}$ may be bonded to each other, respectively to form a ring; the above-mentioned alkyl group, an alkyl group of the dialkylamino group and an alkyl group of the alkylarylamino group may be substituted with an aryl group, halogen atom, oxygen atom, nitrogen atom, sulfur atom or silicon atom, may be branched or may form a ring, and the above-mentioned aryl group, an aryl group of the alkylarylamino group and an aryl group of the diarylamino group may be substituted with an alkyl group, haloalkyl group, halogen atom, alkoxyl group, aryloxy group, nitro group, amide group, cyano group, alkanoyl group, aroyl group, alkoxycarbonyl group, aryloxycarbonyl group or acyloxy group;

$R^{6-1}$ is an alkylene group having 1 to 15 carbon atoms which may be substituted with an aryl group, halogen atom, oxygen atom, nitrogen atom, sulfur atom or silicon atom, may be branched or may form a ring; $R_f$ is a perfluoroalkyl group which has 1 to 15 carbon atoms and may be branched or form a ring, or is the perfluoroalkyl group in which a part of its fluorine atoms is substituted with hydrogen atoms;

$X^-$ is a conjugated base of Brønsted acid and the like.

Examples thereof are fluoroalkyl onium salts having iodine atom as its center element:

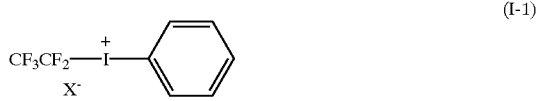 (I-1)

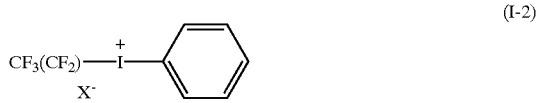 (I-2)

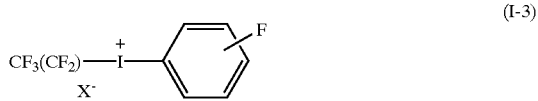 (I-3)

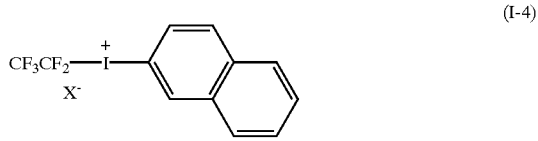 (I-4)

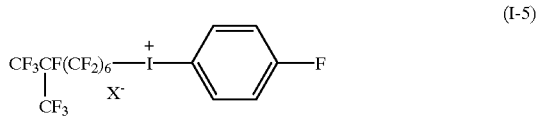 (I-5)

 (I-6)

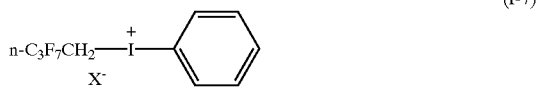 (I-7)

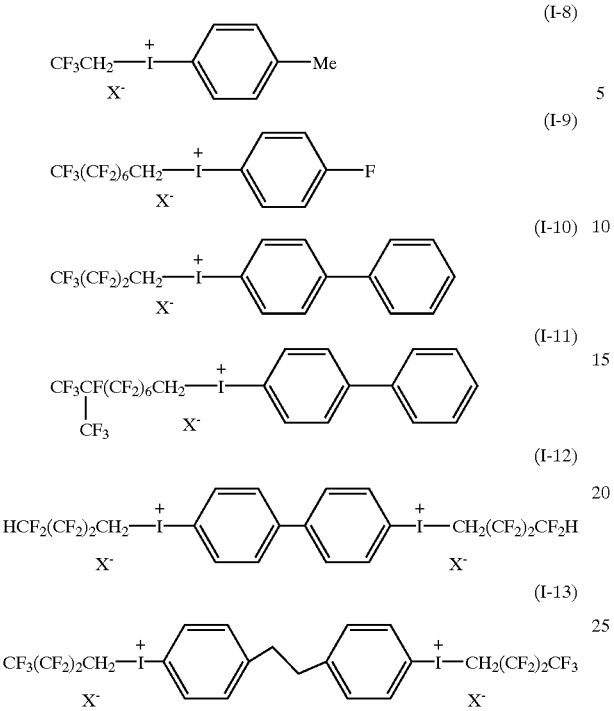
Fluoroalkyl onium salt having sulfur atom as its center element:
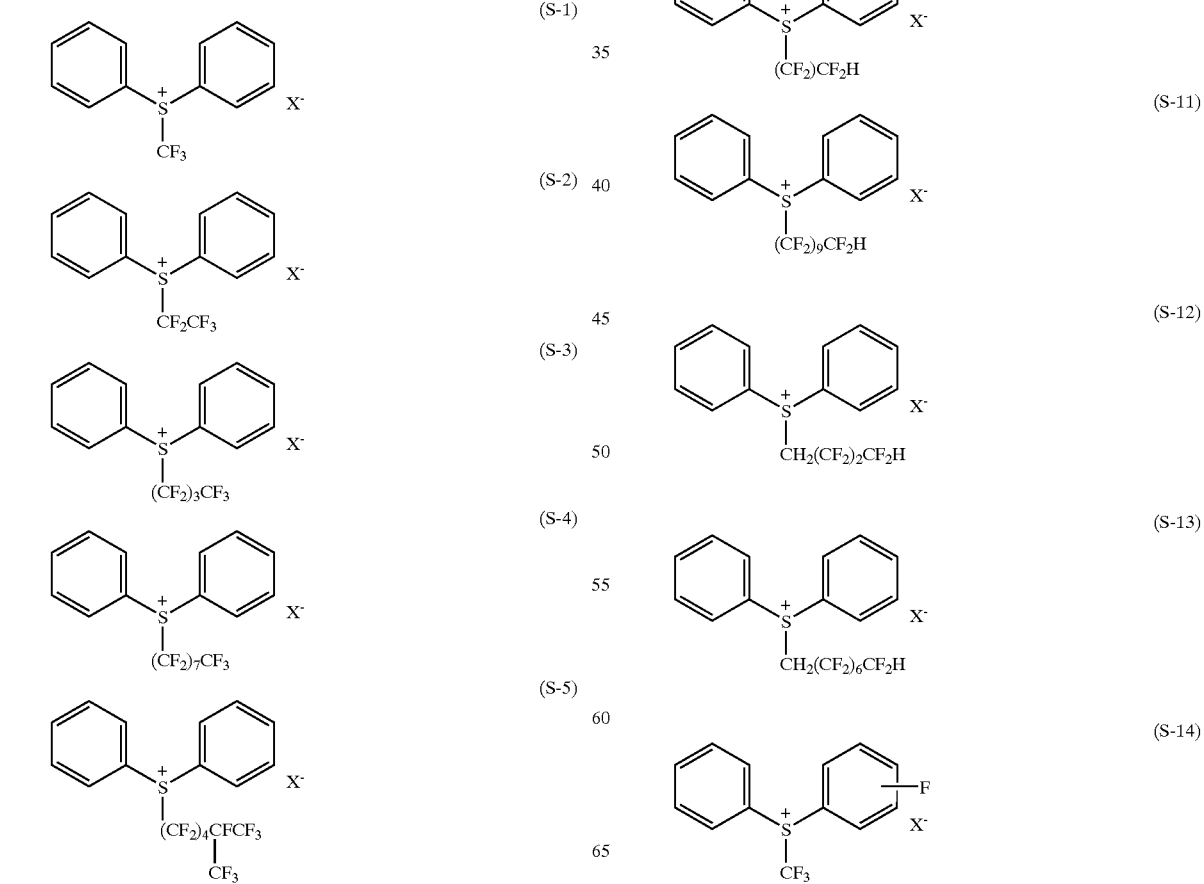

-continued
(S-15)
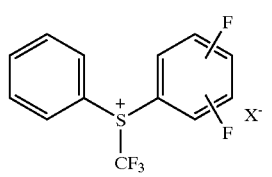
(S-16)
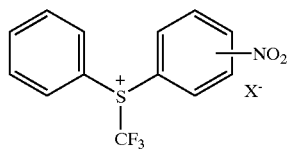
(S-17)
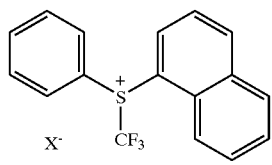
(S-18)
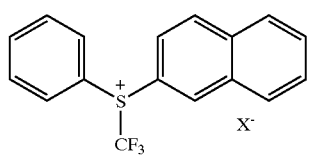
(S-19)
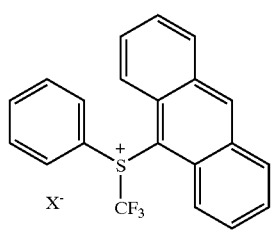
(S-20)
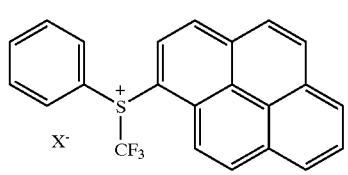
(S-21)
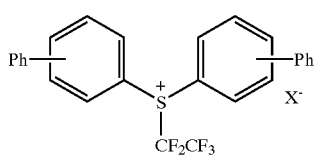
(S-22)
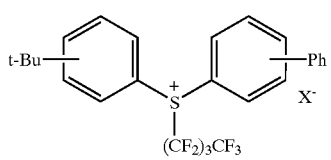
(S-23)
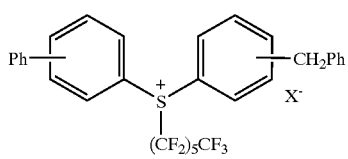
-continued
(S-24)
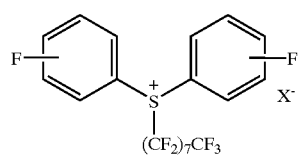
(S-25)
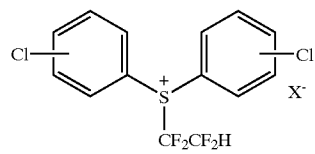
(S-26)
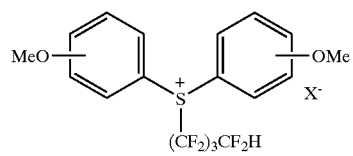
(S-27)
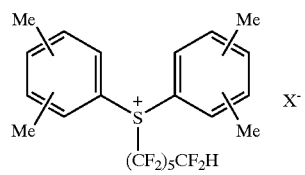
(S-28)
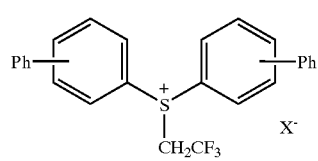
(S-29)
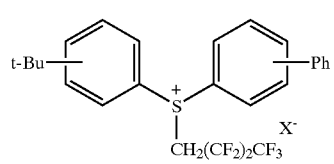
(S-30)
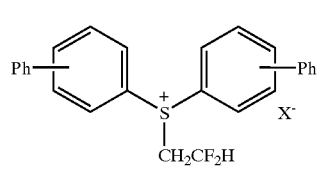
(S-31)
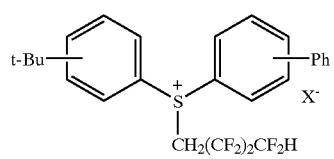
(S-32)
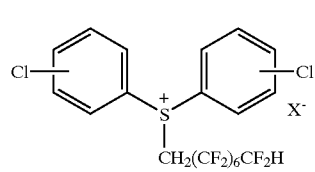

-continued
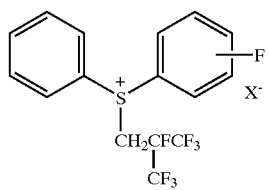 (S-33)
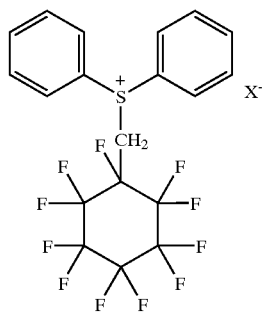 (S-34)
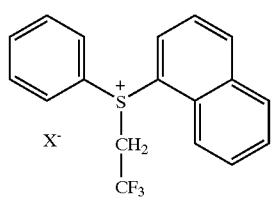 (S-35)
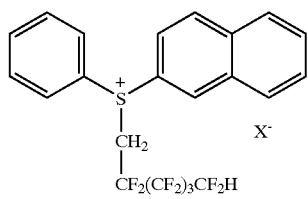 (S-36)
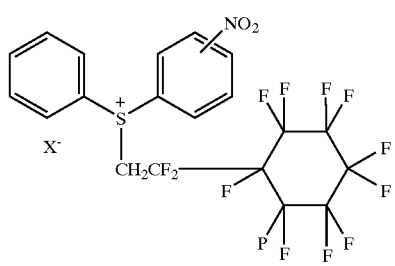 (S-37)
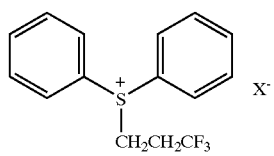 (S-38)
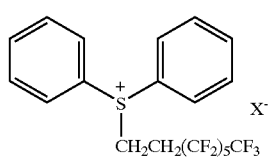 (S-39)
-continued
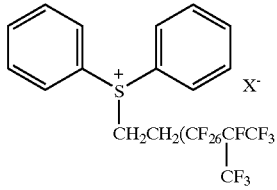 (S-40)
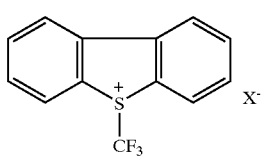 (S-41)
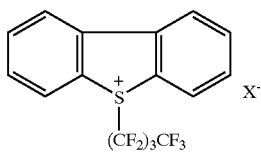 (S-42)
(S-43)
(S-44)
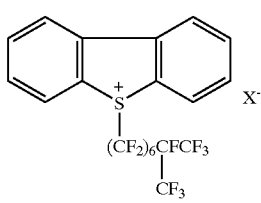 (S-45)
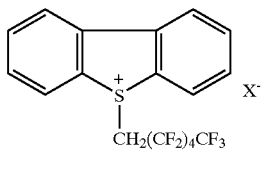 (S-46)
(S-47)
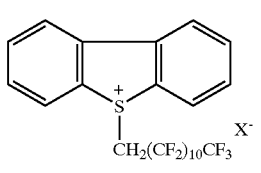 (S-47)
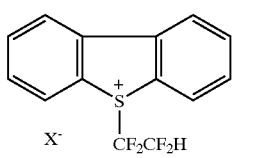 (S-48)

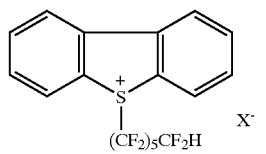 (S-49)
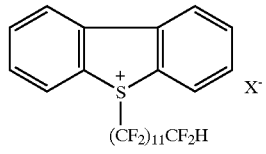 (S-50)
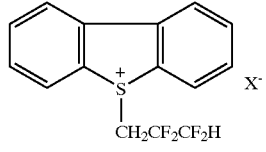 (S-51)
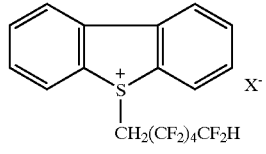 (S-52)
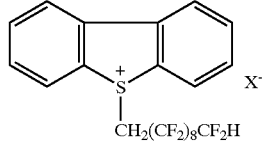 (S-53)
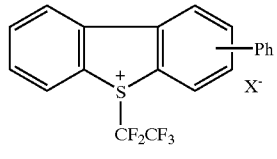 (S-54)
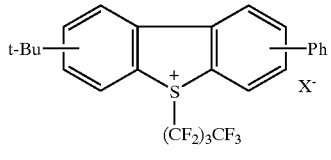 (S-55)
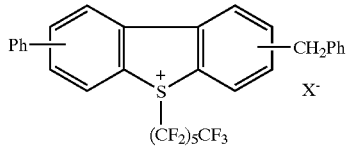 (S-56)
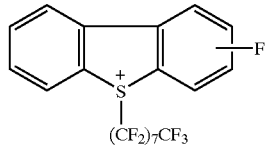 (S-57)
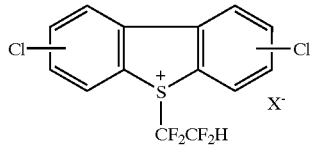 (S-58)
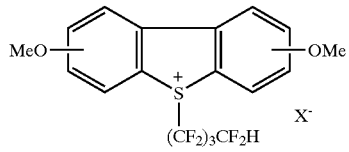 (S-59)
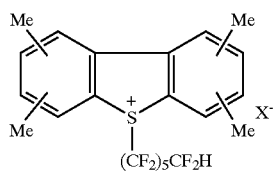 (S-60)
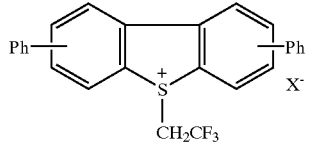 (S-61)
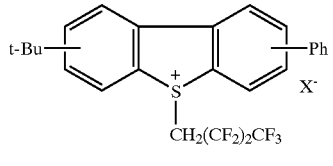 (S-62)
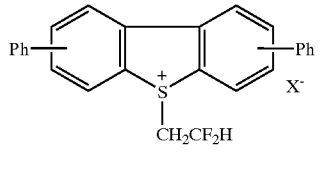 (S-63)
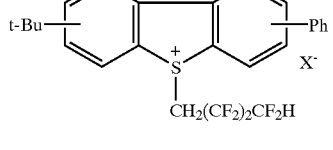 (S-64)
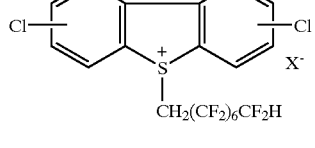 (S-65)
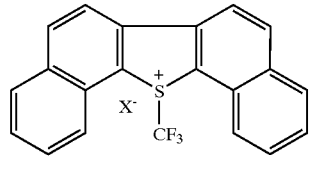 (S-66)
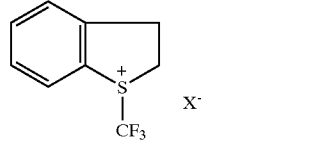 (S-67)
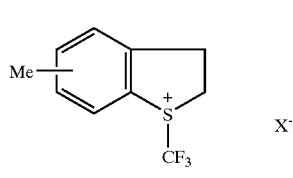 (S-68)

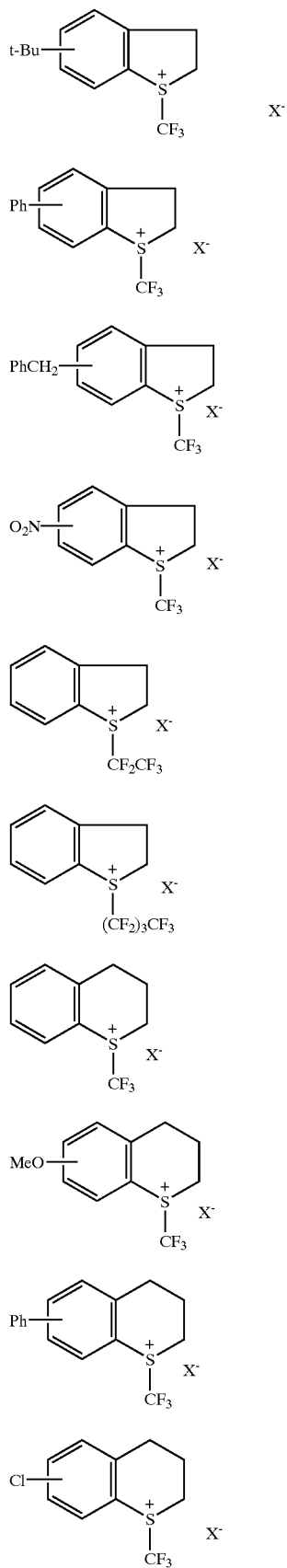
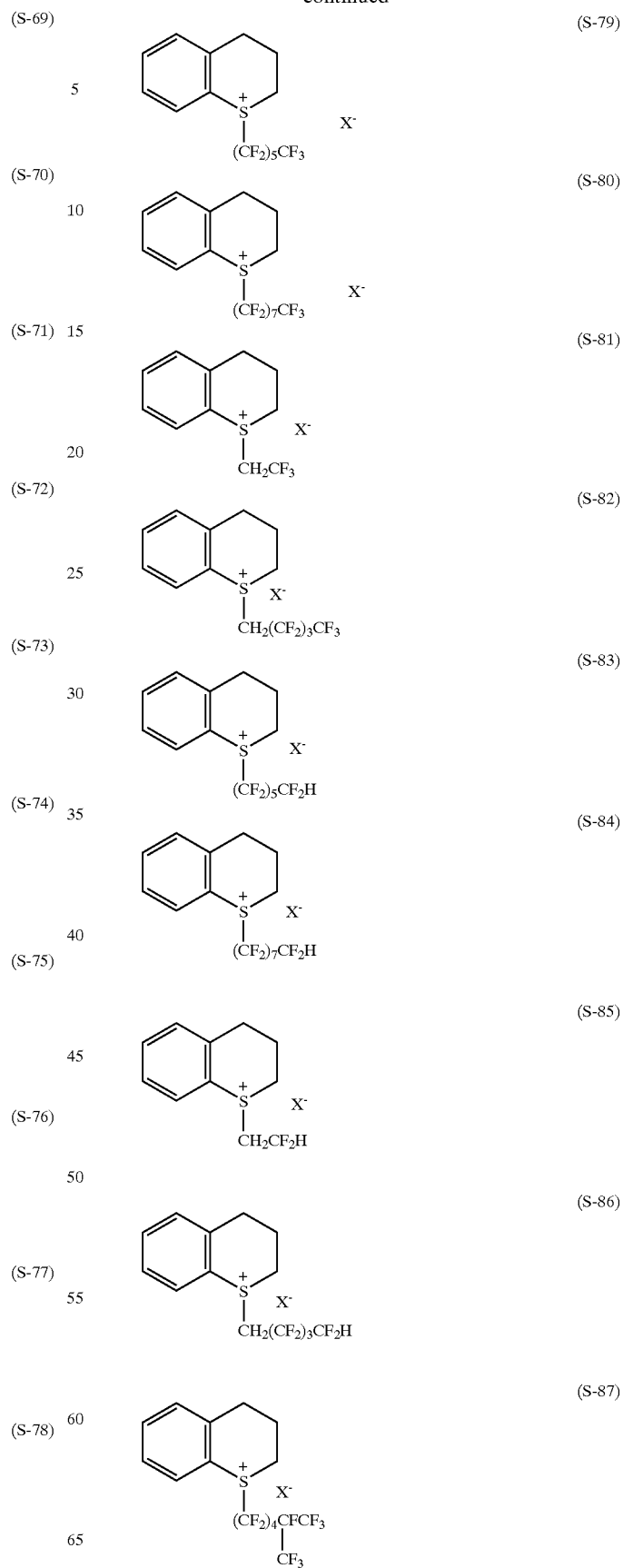

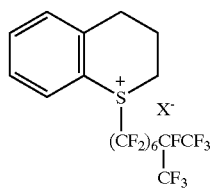
(S-88)
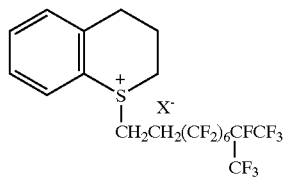
(S-89)
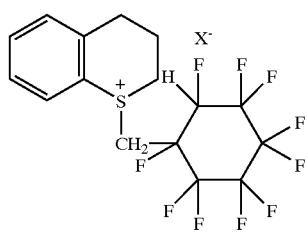
(S-90)
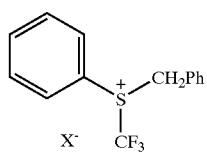
(S-91)
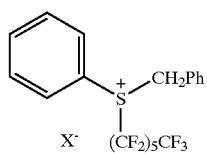
(S-92)
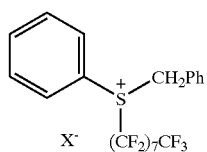
(S-93)
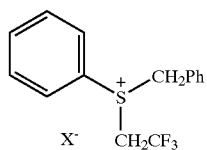
(S-94)
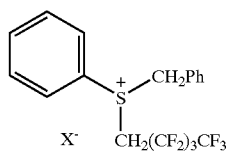
(S-95)
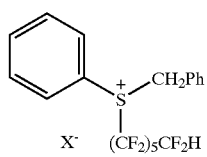
(S-96)
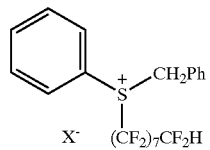
(S-97)
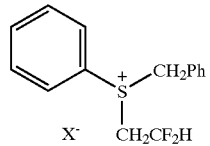
(S-98)
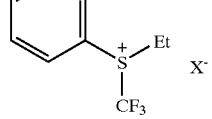
(S-99)
(S-100)
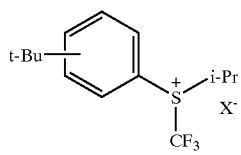
(S-101)
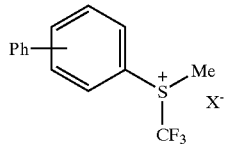
(S-102)
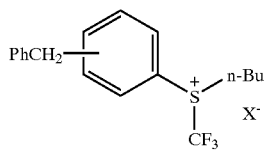
(S-103)
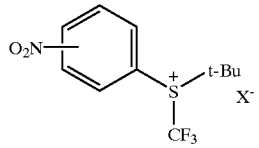
(S-104)
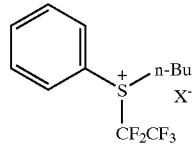
(S-105)
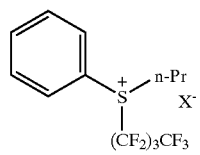
(S-106)

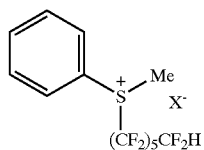 (S-95)
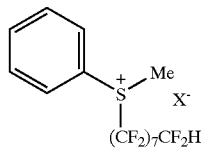 (S-96)
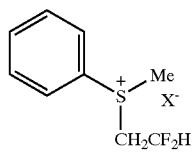 (S-97)
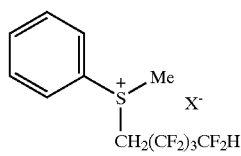 (S-98)
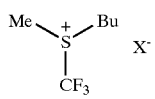 (S-99)
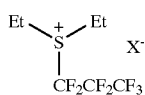 (S-100)
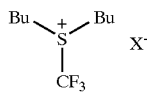 (S-101)
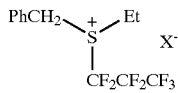 (S-102)
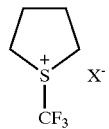 (S-103)
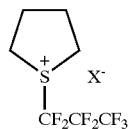 (S-104)
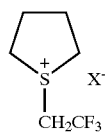 (S-105)
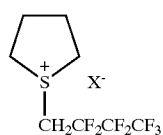 (S-106)
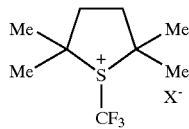 (S-107)
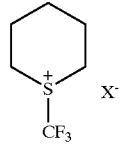 (S-108)
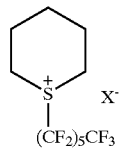 (S-109)
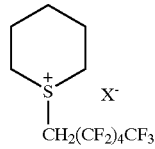 (S-110)
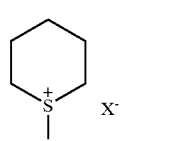 (S-111)
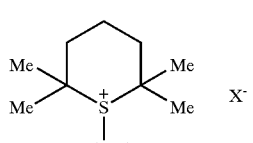 (S-112)
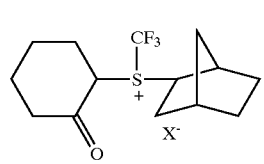 (S-113)
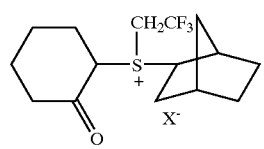 (S-114)
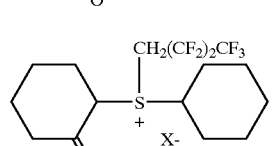 (S-115)
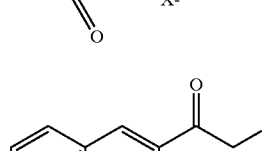 (S-116)

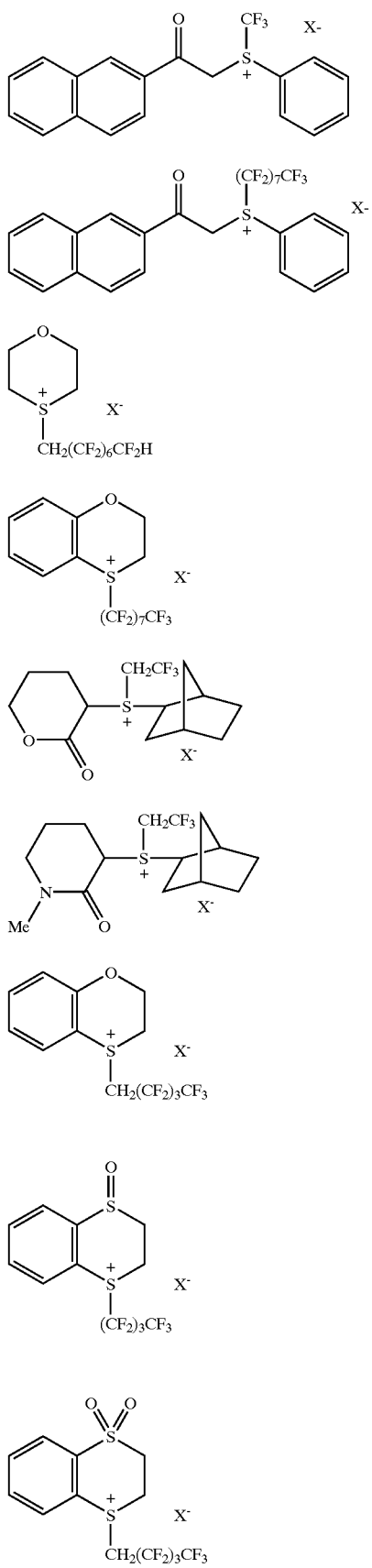
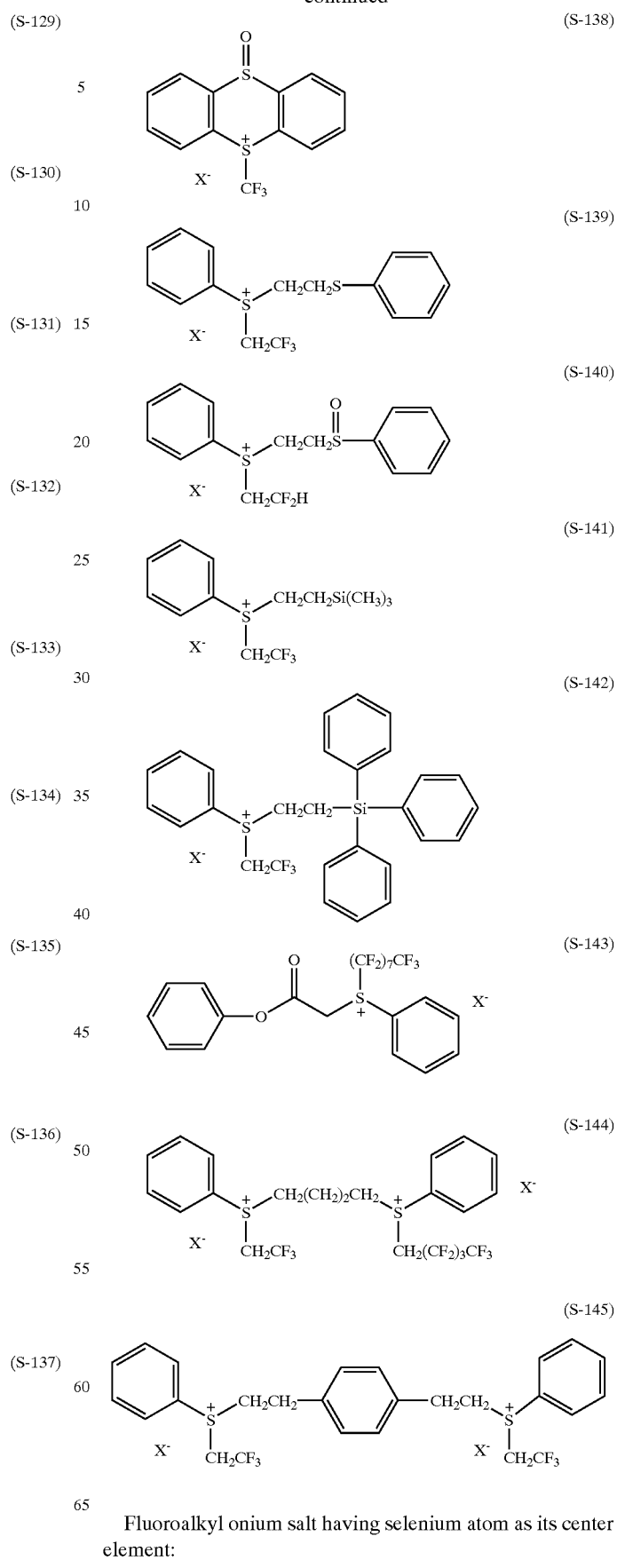
Fluoroalkyl onium salt having selenium atom as its center element:

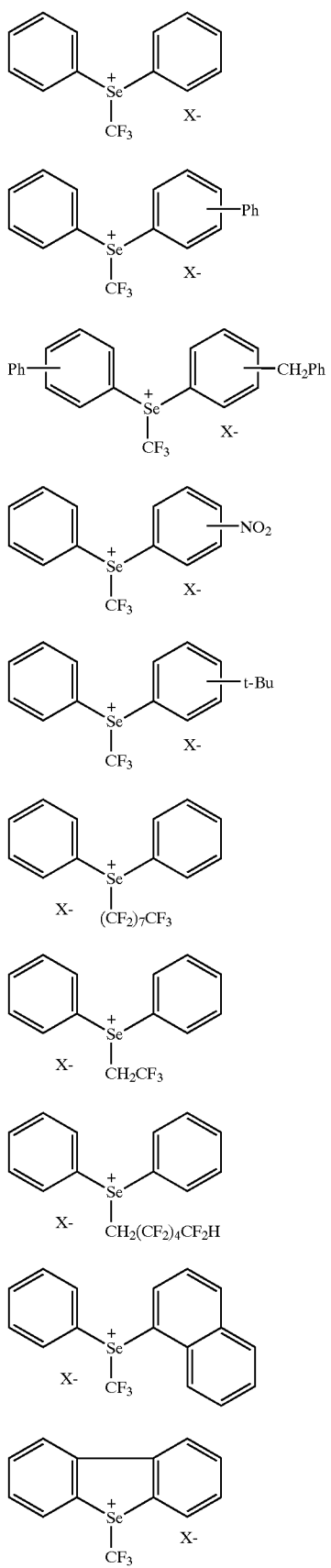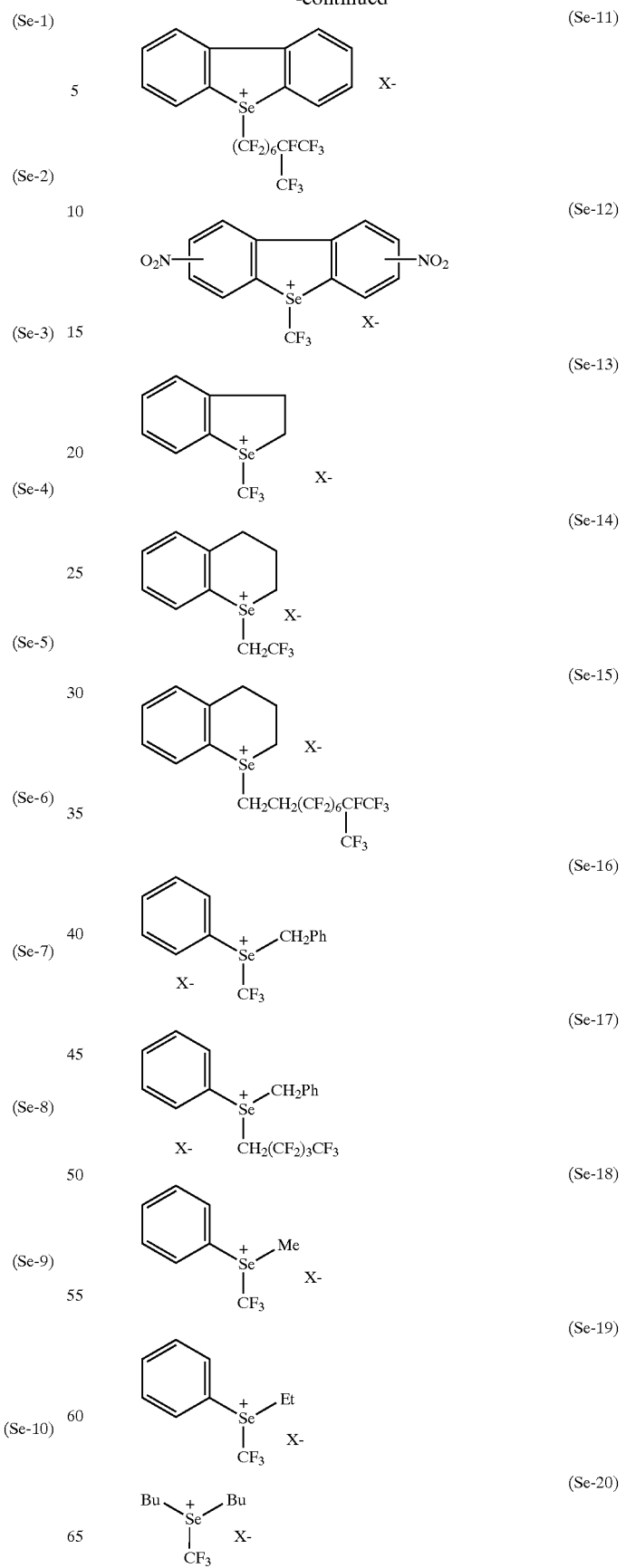

-continued
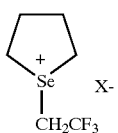 (Se-21)
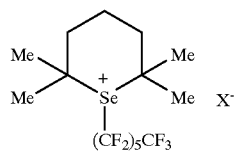 (Se-22)
Fluoroalkyl onium salt having tellurium atom as its center element:
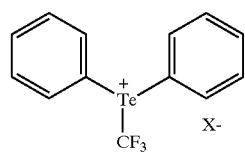 (Te-1)
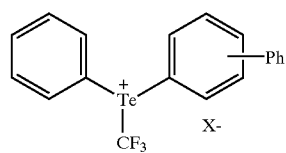 (Te-2)
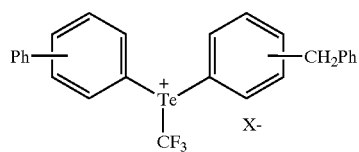 (Te-3)
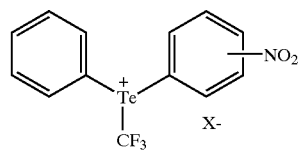 (Te-4)
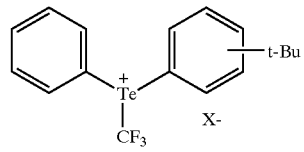 (Te-5)
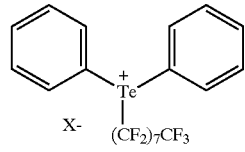 (Te-6)
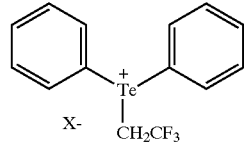 (Te-7)
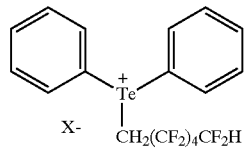 (Te-8)
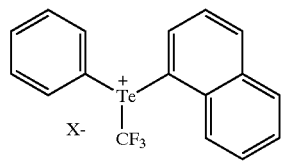 (Te-9)
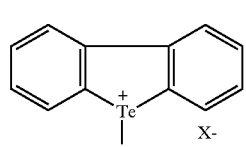 (Te-10)
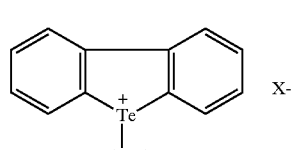 (Te-11)
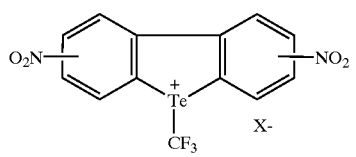 (Te-12)
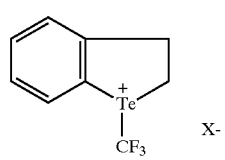 (Te-13)
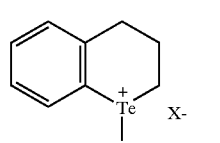 (Te-14)
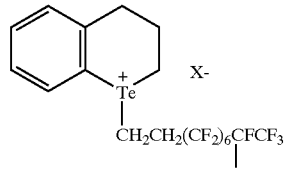 (Te-15)
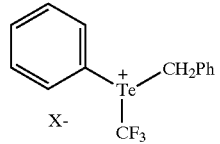 (Te-16)

-continued
(Te-17)
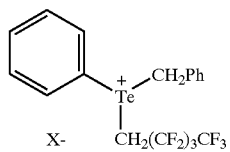
X⁻
(Te-18)
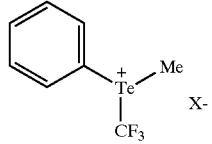
X⁻
(Te-19)
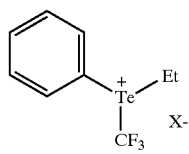
X⁻
(Te-20)
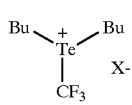
X⁻
(Te-21)
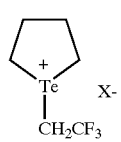
X⁻
(Te-22)
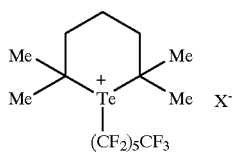
X⁻
Fluoroalkyl onium salt having nitrogen atom as its center element:
(N-1)
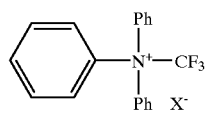
X⁻
(N-2)
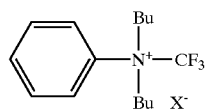
X⁻
(N-3)
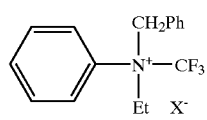
X⁻
(N-4)
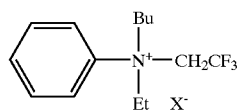
X⁻
(N-5)
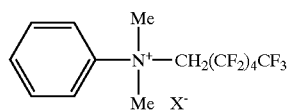
X⁻
-continued
(N-6)
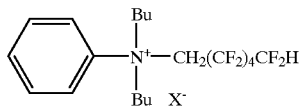
X⁻
(N-7)
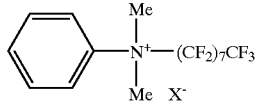
X⁻
(N-8)
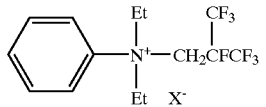
X⁻
(N-9)
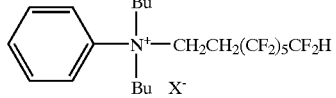
X⁻
(N-10)
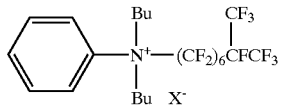
X⁻
(N-11)
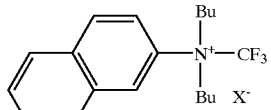
X⁻
(N-12)
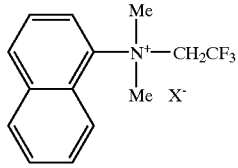
X⁻
(N-13)
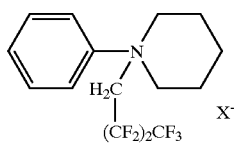
X⁻
(N-14)
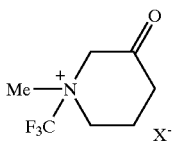
X⁻
(N-15)
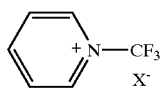
X⁻
(N-16)
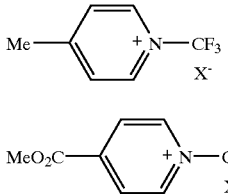
X⁻
(N-17)
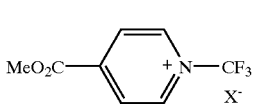
X⁻

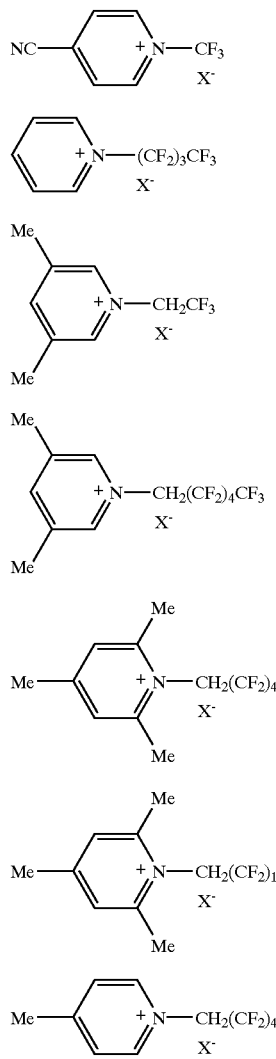
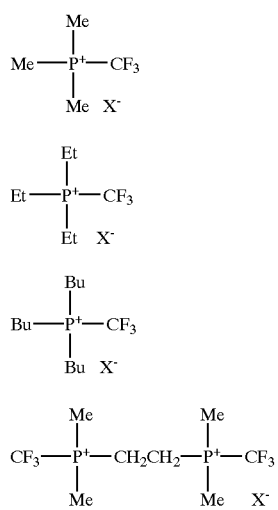
Fluoroalkyl onium salt having phosphorus atom as its center element:
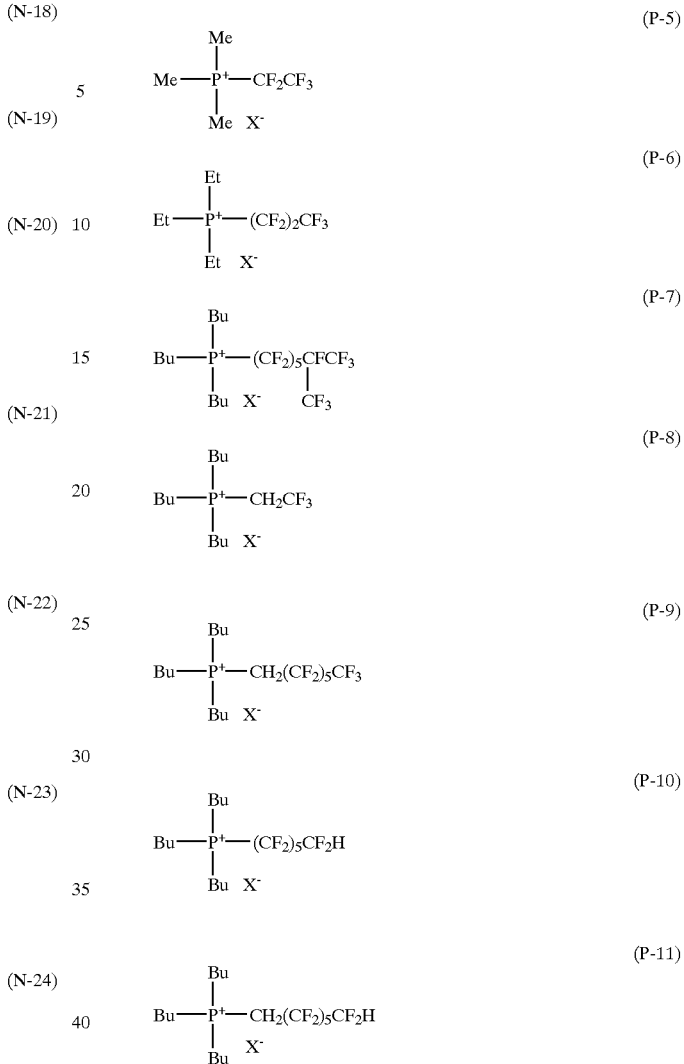
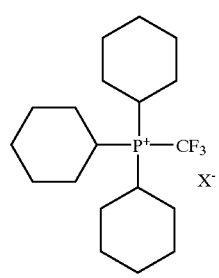
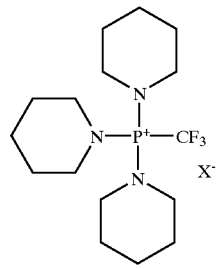

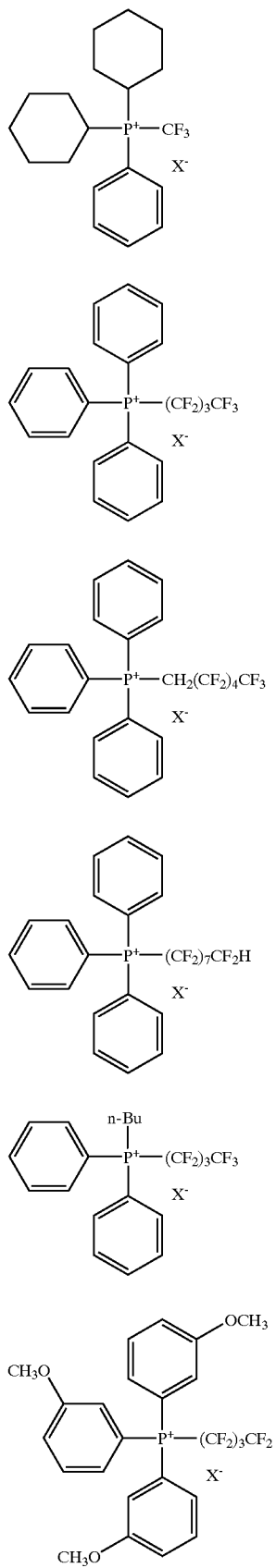
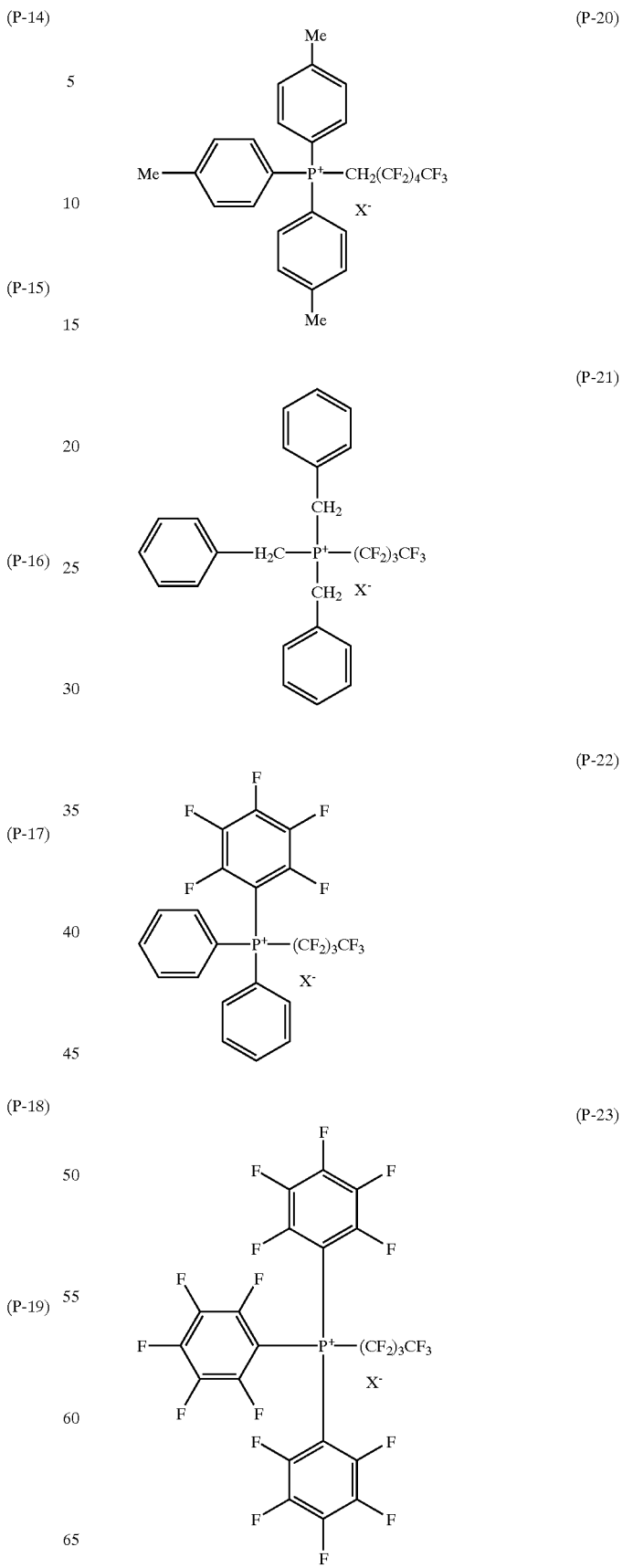

-continued

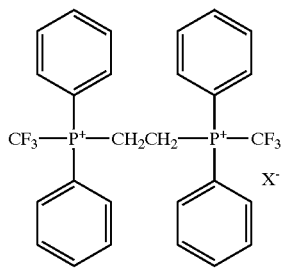

(P-24)

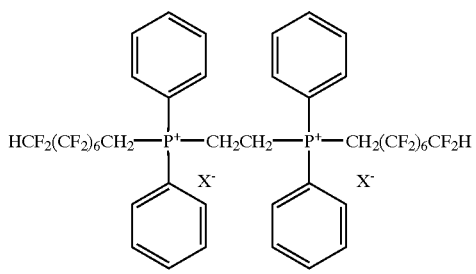

(P-25)

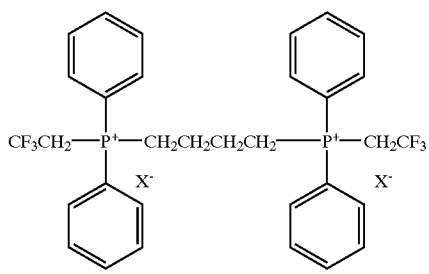

(P-26)

X⁻ in those exemplified fluoroalkyl onium salts is a conjugated base of Brønsted acid. Non-restricted examples of the Brønsted acid are fluoroalkylsulfonic acids such as trifluoromethanesulfonic acid, tetrafluoroethanesulfonic acid, perfluorobutanesulfonic acid, perfluoropentanesulfonic acid, perfluorohexanesulfonic acid, perfluorooctanesulfonic acid and difluoromethanesulfonic acid, methanesulfonic acid, trichloromethanesulfonic acid, benzenesulfonic acid, toluenesulfonic acid, sulfuric acid, fluorosulfonic acid, chlorosulfonic acid, $HBF_4$, $HSbF_6$, $HPF_6$, $HSbCl_5F$, $HSbCl_6$, $HAsF_6$, $HBCl_3F$, $HalCl_4$, and the like. Particularly fluoroalkylsulfonic acids which are strong acids are preferred because neither hydrogen fluoride nor hydrogen chloride is not generated.

Those onium salts having a fluorine-containing alkyl group are preferred because transparency thereof is high in a vacuum ultraviolet region and also because of good compatibility with the fluorine-containing polymer (A) having an acid-reactive group in the chemically amplifying type photoresist composition of the present invention.

The content of the photoacid generator in the chemically amplifying type photoresist composition of Invention I is preferably from 0.1 to 30 parts by weight, more preferably from 0.2 to 20 parts by weight, most preferably from 0.5 to 10 parts by weight based on 100 parts by weight of the fluorine-containing polymer (A) having an acid-reactive group.

When the content of the photoacid generator is less than 0.1 part by weight, sensitivity is lowered, and when the content is more than 30 parts by weight, an amount of light absorbed by the photoacid generator is increased and light does not reach a substrate sufficiently, thereby lowering a resolution easily.

Also to the photoresist composition of Invention I may be added an organic base capable of acting, as a base, on an acid generated from the above-mentioned photoacid generator.

The purpose of adding the organic base is to prevent migration of the acid generated from the photoacid generator and to prevent a resist pattern from undergoing a dimensional change during an interval between the exposure and the PEB treatment. Therefore the organic base is not limited particularly as far as it is a compound capable of neutralizing the acid generated from the photoacid generator as mentioned above. The organic base is preferred because when an inorganic compound is used as a base, a very small amount of its residue remains after forming a pattern and eliminating the resist and has an adverse effect on the pattern formation.

The organic base is an organic amine compound selected from nitrogen-containing compounds. Examples thereof are pyrimidine compounds such as pyrimidine, 2-aminopyrimidine, 4-aminopyrimidine, 5-aminopyrimidine, 2,4-diaminopyrimidine, 2,5-diaminopyrimidine, 4,5-diaminopyrimidine, 4,6-diaminopyrimidine, 2,4,5-triaminopyrimidine, 2,4,6-triaminopyrimidine, 4,5,6-triaminopyrimidine, 2,4,5,6-tetraaminopyrimidine, 2-hydroxypyrimidine, 4-hydroxypyrimidine, 5-hydroxypyrimidine, 2,4-dihydroxypyrimidine, 2,5-dihydroxypyrimidine, 4,5-dihydroxypyrimidine, 4,6-dihydroxypyrimidine, 2,4,5-trihydroxypyrimidine, 2,4,6-trihydroxypyrimidine, 4,5,6-trihydroxypyrimidine, 2,4,5,6-tetrahydroxypyrimidine, 2-amino-4-hydroxypyrimidine, 2-amino-5-hydroxypyrimidine, 2-amino-4,5-dihydroxypyrimidine, 2-amino-4,6-dihydroxypyrimidine, 4-amino-2,5-dihydroxypyrimidine, 4-amino-2,6-dihydroxypyrimidine, 2-amino-4-methylpyrimidine, 2-amino-5-methylpyrimidine, 2-amino-4,5-dimethylpyrimidine, 2-amino-4,6-dimethylpyrimidine, 4-amino-2,5-dimethylpyrimidine, 4-amino-2,6-dimethylpyrimidine, 2-amino-4-methoxypyrimidine, 2-amino-5-methoxypyrimidine, 2-amino-4,5-dimethoxypyrimidine, 2-amino-4,6-dimethoxypyrimidine, 4-amino-2,5-dimethoxypyrimidine, 4-amino-2,6-dimethoxypyrimidine, 2-hydroxy-4-methylpyrimidine, 2-hydroxy-5-methylpyrimidine, 2-hydroxy-4,5-dimethylpyrimidine, 2-hydroxy-4,6-dimethylpyrimidine, 4-hydroxy-2,5-dimethylpyrimidine, 4-hydroxy-2,6-dimethylpyrimidine, 2-hydroxy-4-methoxypyrimidine, 2-hydroxy-5-methoxypyrimidine, 2-hydroxy-4,5-dimethoxypyrimidine, 2-hydroxy-4,6-dimethoxypyrimidine, 4-hydroxy-2,5-dimethoxypyrimidine and 4-hydroxy-2,6-dimethoxypyrimidine, pyridine compounds such as pyridine, 4-dimethylaminopyridine and 2,6-dimethylpyridine, amines substituted with hydroxyalkyl group having not less than 1 and not more than 4 carbon atoms and such as diethanolamine, triethanolamine, triisopropanolamine, tris(hydroxymethyl)aminomethane and bis(2-hydroxyethyl)iminotris(hydroxymethyl)methane, aminophenols such as 2-aminophenol, 3-aminophenol and 4-aminophenol and the like. Preferable organic bases are pyrimidines, pyridines or amines having hydroxyl group, and particularly preferred are amines having hydroxyl group. Particularly preferred are amines having hydroxyl group. Those organic bases may be used solely or in a mixture of two or more thereof. The content of the organic base in the photoresist composition of the present invention is preferably from 0.1 to 100% by mole, more preferably from 1 to 50% by mole based on the content of the photoacid generator. When the content of the organic base is less than 0.1% by mole, resolution is lowered, and when the content of the organic base is more than 100% by mole, sensitivity tends to be lowered.

In the chemically amplifying type photoresist composition of Invention I, when a negative resist composition is prepared using the fluorine-containing polymer (A) having a functional group undergoing condensation by an acid, a crosslinking agent may be used as the case demands.

The crosslinking agent is not limited particularly and can be optionally selected from crosslinking agents which have been usually used for negative resists.

Examples of preferable crosslinking agent are, for instance, N-methylol melamine, N-alkoxymethylol melamine, urea compounds, epoxy compounds, isocyanate compounds and the like.

Those crosslinking agents may be used solely or in combination of two or more thereof. Among them, a combination of the melamine resin and the urea resin is advantageous.

The content of the crosslinking agent in the photoresist (particularly negative type) composition of Invention I is from 3 to 70 parts by weight, preferably from 5 to 50 parts by weight, more preferably from 10 to 40 parts by weight based on 100 parts by weight of the fluorine-containing polymer (A) having an acid-reactive group. When the content is less than 3 parts by weight, a resist pattern is difficult to be formed, and the content of more than 70 parts by weight is not preferable because light transmittance is lowered, resolution is easily lowered and developing property is lowered.

The photoresist composition of Invention I may contain, as the case demands, various additives which have been usually used in this field, such as dissolution inhibitor, sensitizer, dye, adhesion betterment material and water storage material. While the presence of water is necessary for generating an acid in a chemically amplifying type resist, the acid can be generated effectively in the presence of a small amount of water storage material such as polypropylene glycol.

When those additives are used, a total amount thereof is up to about 20% by weight based on the weight of the whole solids in the composition.

In the chemically amplifying type photoresist composition of Invention I, the solvent (C) is one which is capable of dissolving the fluorine-containing polymer (A) having an acid-reactive functional group, the photoacid generator (B) and the above-exemplified various additives. The solvent is not limited particularly as far as good coatability (surface smoothness, uniformity of coating thickness, etc.) can be obtained.

Examples of the preferable solvent (C) are, for instance, cellosolve solvents such as methyl cellosolve, ethyl cellosolve, methyl cellosolve acetate and ethyl cellosolve acetate, ester solvents such as diethyl oxalate, ethyl pyruvate, ethyl-2-hydroxybutyrate, ethyl acetoacetate, butyl acetate, amyl acetate, ethyl butyrate, butyl butyrate, methyl lactate, ethyl lactate, methyl 3-methoxypropionate, ethyl 3-methoxypropionate, methyl 2-hydroxyisobutyrate and ethyl 2-hydroxyisobutyrate, propylene glycol solvents such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate and dipropylene glycol dimethyl ether, ketone solvents such as 2-hexanone, cyclohexanone, methyl amino ketone and 2-heptanone, aromatic hydrocarbons such as toluene, xylene, chlorobenzene and chlorotoluene, a solvent mixture of two or more thereof and the like.

Also in order to enhance solubility of the fluorine-containing polymer (A), a fluorine-containing solvent may be used as the case demands.

Examples thereof are, for instance, $CH_3CCl_2F$ (HCFC-141b), a mixture of $CF_3CF_2CHCl_2$ and $CClF_2CF_2CHCl$ (HCFC-225), perfluorohexane, perfluoro(2-butyltetrahydrofuran), methoxy-nonafluorobutane, 1,3-bistrifluoromethylbenzene, and in addition, fluorine-containing alcohols such as:

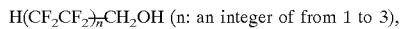
$H(CF_2CF_2)_{\overline{n}}CH_2OH$ (n: an integer of from 1 to 3),

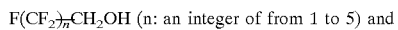
$F(CF_2)_{\overline{n}}CH_2OH$ (n: an integer of from 1 to 5) and

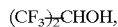
$(CF_3)_{\overline{2}}CHOH$, benzotrifluoride, perfluorobenzene, perfluoro (tributylamine), $ClCF_2CFClCF_2CFCl_2$ and the like.

Those fluorine-containing solvents may be used solely, in a mixture of two or more thereof or in a mixture of one or more of the fluorine-containing solvents and non-fluorine-containing solvents.

The amount of the solvent (C) is selected depending on kind of solids to be dissolved, kind of a substrate to be coated, an intended coating thickness, etc. From the viewpoint of easiness of coating, the solvent is used in such an amount that the concentration of the whole solids of the resist composition becomes from 0.5 to 70% by weight, preferably from 1 to 50% by weight, particularly preferably from 5 to 30% by weight.

The chemically amplifying type resist composition of Invention I is subjected to resist pattern formation according to conventional photoresist technology. In order to form a pattern properly, first, a solution of the photoresist composition is applied on a substrate such as a silicon wafer by a spinner or the like, and is dried to form a photosensitive layer. A pattern is drawn by irradiating the layer with ultraviolet ray, deep-UV, excimer laser or X-ray by a reduction projection exposure system, etc. through a proper mask pattern or the pattern is drawn with an electron beam, and then heating follows. The layer is then subjected to developing treatment with a developing solution, for example, an aqueous alkali solution such as an aqueous solution of 1 to 10% by weight of tetramethyl ammonium hydroxide. Thus an image faithful to the mask pattern can be obtained by the above-mentioned pattern forming method.

It has been found that by using the chemically amplifying type resist composition of the present invention I, a resist film (photosensitive layer) having a high transparency even in a vacuum ultraviolet region could be formed. Therefore the resist composition of the present invention can be preferably used particularly for a photolithography process using a $F_2$ laser (wavelength of 157 nm) which is under development aiming at a technology node of 0.1 $\mu$m.

The fourth of Invention I relates to a coating film obtained by applying the composition comprising the fluorine-containing polymer having an acid-reactive functional group on a substrate.

The coating film of Invention I is obtained by applying the fluorine-containing polymer which has an acid-reactive functional group or the composition comprising the polymer and the fluorine-containing polymer has a high transparency against light in a vacuum ultraviolet region.

The fluorine-containing polymer having an acid-reactive functional group for the coating film of Invention I has a molecular absorption coefficient at 157 nm of not more than 3.0 $\mu m^{-1}$, preferably not more than 1.5 $\mu m^{-1}$, more preferably not more than 1.0 $\mu m^{-1}$.

The coating film obtained by applying the fluorine-containing polymer having a high transparency in a vacuum ultraviolet region on a substrate is naturally useful as a resist coating film (photosensitive layer) in a photolithography process using a $F_2$ laser, and in addition, is preferable because it can be used for pellicle for $F_2$ lithography, reflection reducing film for optical parts such as lens and silicon wafer, non-tacky stain-proofing film for lens and peripheral optical parts, etc.

The acid-reactive functional groups in the fluorine-containing polymer to be used for the coating film of Invention I are those explained in the above-mentioned fluorine-containing base polymer material for a photoresist, namely the acid-labile or acid-degradable functional groups or the functional groups undergoing condensation reaction by an acid. Concretely preferable examples thereof are the same as those for the above-mentioned fluorine-containing base polymer materials. In case of the acid-labile or acid-degradable functional groups, adhesion to the substrate is enhanced by an effect of the functional group after the reaction with an acid, and thereby a strongly adhered coating film can be obtained. On the other hand the functional groups undergoing condensation reaction by an acid is preferable because there is an effect of enhancing mechanical properties, chemical resistance and solvent resistance of the coating film by the condensation reaction (crosslinking reaction) with an acid in a system which may contain a crosslinking agent.

The fluorine-containing polymer to be used for the coating film of Invention I is selected preferably from those having high transparency against light in a vacuum ultraviolet region among the polymers having the structures of (I), (II) and (III) which are explained in the above-mentioned base polymer materials for a photoresist.

Particularly preferred are the fluorine-containing polymer of the formula (I) having the structural unit of the formula (4) in which q1 is 0, the fluorine-containing polymer of the formula (II) having the structural unit of the formula (5) and (6) in which q2 and q3 are 0, and the fluorine-containing polymer of the formula (III) having the structural unit of the formula (5) in which q2 is 0. Further it is preferable that the fluorine content of the polymer is not less than 30%, preferably not less than 50%, further preferably not less than 60%.

The coating film of Invention I can be used for various substrates depending on purpose and application. Particularly in case of applications requiring transparency, namely in optical applications, the coating film is applied on inorganic substrates such as a silicon wafer, glass, LiF, $CaF_2$ and $MgF_2$, transparent resins such as an acrylic resin, triacetyl cellulose resin and polycarbonate resin, metal substrates, etc.

The coating thickness can be widely selected depending on purpose and application, and in case of applications aiming at high transparency, it is preferable that the coating film has a coating thickness of not more than 1.0 $\mu$m, preferably not more than 0.5 $\mu$m, further preferably not more than 0.3 $\mu$m.

Further it is preferable that when using the coating film of Invention I as a resist film (photosensitive layer) for a photoresist, the coating film is one formed by applying the above-mentioned chemically amplifying type photoresist composition.

The resist coating film of Invention I is formed by applying the above-mentioned chemically amplifying type photoresist composition on a substrate such as a silicon wafer by a coating method such as spin coating, and then drying. The coating film contains the solid components such as the fluorine-containing polymer (A) having an acid-reactive functional group, the photoacid generator (B) and additives.

The resist coating film of Invention I is a thin coating film usually having a thickness of not more than 1.0 $\mu$m. The thickness is preferably from 0.5 to 0.1 $\mu$m.

Further it is preferable that the resist coating film of Invention I has a high transparency in a vacuum ultraviolet region, and concretely has a molecular absorption coefficient of not more than 3.0 $\mu m^{-1}$, preferably not more than 1.5 $\mu m^{-1}$, more preferably not more than 1.0 $\mu m^{-1}$ at a wavelength of 157 nm. The coating film is preferred because it can be used effectively for a lithography process using light of a $F_2$ laser (157 nm).

The resist coating film of Invention I can be used similarly on various substrates which have been used for conventional resists, for example, any of a silicon wafer, a silicon wafer provided with an organic or inorganic reflection reducing film and a glass substrate. The coating film has good sensitivity and profile formation particularly on the silicon wafer provided with an organic reflection reducing film.

Invention I is all supported by Preparation Examples 1 to 10, Examples 1 to 117 and Comparative Examples 1 and 2.

The disclosure of the second invention (Invention II) relates to the chemically amplifying type photoresist composition comprising a specific fluorine-containing polymer having an acid-reactive functional group as a binder.

The chemically amplifying type photoresist comprises a resin (polymer) component and a photoacid generator and makes use of a catalytic action of an acid generated from the acid-generating agent on its portion irradiated with energy rays. In the chemically amplifying type positive photoresist, the acid generated in the energy-irradiated portion is scattered by the following heat treatment (post-exposure bake: PEB) for the deprotection of the acid-labile or acid-degradable functional groups of the resin, etc. and at the same time an acid is re-generated, thereby making the energy-irradiated portion soluble in alkali.

The chemically amplifying type positive resist is classified into two types of resist. One is a resist comprising an alkali-soluble resin component, an acid-generating agent and in addition, a dissolution inhibitor having a functional group (protective group) which is dissociated or degraded due to action of an acid. The functional group of the dissolution inhibitor itself has an ability of inhibiting dissolution of the alkali-soluble resin but the resin becomes soluble in alkali after the functional group (protective group) is dissociated due to action of an acid. Another resist is one in which the resin component has a functional group (protective group) which is dissociated or degraded due to action of an acid and is insoluble or hardly soluble in alkali but becomes soluble in alkali after the functional group (protective group) is dissociated due to action of an acid.

A chemically amplifying type negative photoresist generally comprises a resin component which has a functional group capable of undergoing condensation reaction by an acid and is soluble in alkali, an acid-generating agent and in addition, a crosslinking agent.

In such a negative photoresist, an acid generated on its portion irradiated with energy rays is scattered by PEB and acts on the functional group undergoing condensation by an acid and the crosslinking agent in the resin component, thereby hardening the binder resin on the energy-irradiated portion and making the resin insoluble or hardly soluble in alkali.

The chemically amplifying type photoresist composition of Invention II can be used as the above-mentioned positive and negative photoresists and comprises:

(A) a fluorine-containing polymer having an acid-reactive functional group, (B) a photoacid generator, and (C) a solvent.

The inventors of the present invention have found that the fluorine-containing polymer (A) which does not have a polycyclic structure and has a specific acid-reactive group is particularly high in transparency against light in a vacuum ultraviolet region and is excellent in properties of the resist such as etching resistivity, reactivity with an acid and solubility in a developing solution.

The first of the fluorine-containing polymers (A) having an acid-reactive group which is used for the chemically amplifying type photoresist composition of Invention II is the fluorine-containing polymer represented by the formula II-(1):

—(M1)—(M2)—(N)—        II-(1), in which

① the structural unit M1 is a structural unit derived from an ethylenic monomer having an acid-reactive group, ② the structural unit M2 is a structural unit derived from a fluorine-containing ethylenic monomer, and ③ the structural unit N is a structural unit derived from an ethylenic monomer copolymerizable with M1 and M2, when M1+M2 is assumed to be equal to 100% by mole, the percent by mole ratio M1/M2 is 1 to 99/1 to 99, and the polymer comprises from 1 to 99% by mole of the structural unit M1, from 1 to 99% by mole of the structural unit M2 and from 0 to 98% by mole of the structural unit N and does not have a polycyclic structure in its side chain. The polymer is preferable from the point that transparency and dry etching resistivity can be imparted to the resist composition by the structural unit M2 derived from the fluorine-containing ethylenic monomer.

Another example of the fluorine-containing polymer (A) having an acid-reactive group is the fluorine-containing polymer represented by the formula II-(1):

—(M1)—(M2)—(N)—        II-(1), in which

① the structural unit M1 is a structural unit derived from a fluorine-containing ethylenic monomer having an acid-reactive group, ② the structural unit M2 is a structural unit derived from a fluorine-containing ethylenic monomer, and ③ the structural unit N is a structural unit derived from an ethylenic monomer copolymerizable with M1 and M2, when M1+M2 is assumed to be equal to 100% by mole, the percent by mole ratio M1/M2 is 1 to 100/0 to 99, and the polymer preferably comprises from 1 to 100% by mole of the structural unit M1, from 0 to 99% by mole of the structural unit M2 and from 0 to 99% by mole of the structural unit N and does not have a polycyclic structure in its side chain. The polymer is preferred from the point that transparency and dry etching resistivity can be imparted more to the resist coating film since the structural unit Ml has fluorine atom or fluorine-containing alkyl group as well as the acid-reactive group.

The second of the preferable fluorine-containing polymers (A) having an acid-reactive group is the fluorine-containing acrylic polymer of the formula II-(2):

—(M1-1)—(M2-1)—(N)—        II-(2), in which the structural unit M1 is M1-1 represented by:

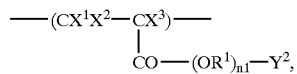

and M2 is M2-1 represented by:

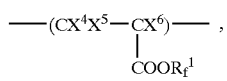

wherein $X^1, X^2, X^4$ and $X^5$ are the same or different and each is H or F; $X^3$ and $X^6$ are the same or different and each is H, Cl, $CH_3$, F or $CF_3$; $Y^2$ is an acid-reactive functional group; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; $R_f^1$ is a fluorine-containing alkyl group having 1 to 20 carbon atoms, a fluorine-containing alkyl group having 2 to 100 carbon atoms and ether bond or a fluorine-containing aryl group having 3 to 20 carbon atoms; n1 is 0 or 1; when M1-1+M2-1 is assumed to be equal to 100% by mole, the polymer has the percent by mole ratio M1-1/M2-1 of 1 to 99/1 to 99.

When fluorine atom is contained in M1-1, the polymer may be one comprising at least one selected from the structural units M1-1. It is preferable that when M1-1+M2-1 is assumed to be equal to 100% by mole, the polymer has the percent by mole ratio M1-1/M2-1 of 1 to 100/0 to 99. It is particularly preferable that the structural unit M1-1 has fluorine atom or a fluorine-containing alkyl group and particularly preferred is M1-1a represented by:

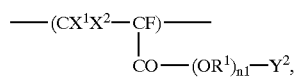

wherein $X^1$ and $X^2$ are the same or different and each is H or F; $Y^2$ is an acid-reactive functional group; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n1 is 0 or 1, from the viewpoint of good polymerizability, from the point that particularly transparency and etching resistivity can be improved as compared with conventional acrylic polymer and further from the viewpoint of heat resistance and mechanical properties.

Further preferable example is M1-1b represented by:

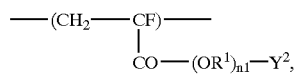

wherein $Y^2$ is an acid-reactive functional group; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n1 is 0 or 1.

In M1-1, M1-1a and M1-1b, —OR$^1$— may be contained or may not be contained therein. When —OR$^1$— is contained, R$^1$ may be selected from the above-mentioned divalent hydrocarbon groups and fluorine-containing alkylene groups. Preferable examples are divalent hydrocarbon groups without a polycyclic structure, and concretely there are:

—(CH$_2$)$_n$— (n is an integer of from 1 to 10),

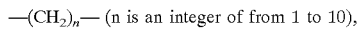

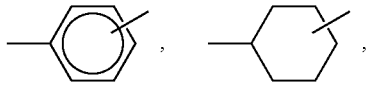

and the like.

In the structural unit M2-1, —R$_f^1$ is selected from the above-mentioned fluorine-containing alkylene groups, and preferable examples thereof are —(CH$_2$)$_m$(CF$_2$)$_n$—F, (CH$_2$)$_m$(CF$_2$)$_n$—H, —(CH$_2$)$_m$(CF$_2$)$_n$—Cl, (m: an integer of from 1 to 5, n: an integer of from 1 to 10),

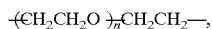

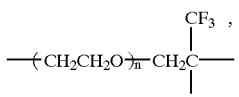

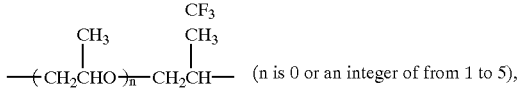 (m = from 1 to 5, n = from 1 to 30),

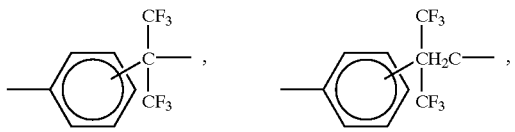 (n = from 1 to 30),

—CH$_2$CF$_2$CF$_2$—(OCF$_2$CF$_2$CF$_2$)$_n$F (n: from 1 to 30),

 (m + n: from 2 to 30)

and the like.

The fluorine-containing polymer (A) of the present invention can be obtained by polymerizing ethylenic monomers corresponding to the respective structural units M1-1 and M2-1 and if necessary, a monomer corresponding to the structural unit N; M1, M2 and N; or M1-1 (or M1-1a or M1-1b), M2-1 and N (each of corresponding monomers).

Examples of the monomer for the structural unit M1, M1-1, M1-1a or M1-1b (hereinafter represented by M1 unless otherwise noted) having the acid-reactive functional group Y$^2$ are:

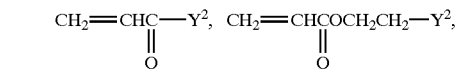

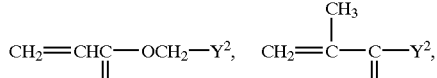

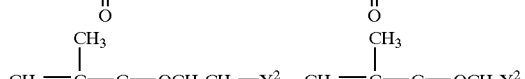

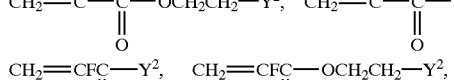

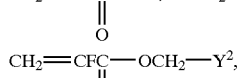

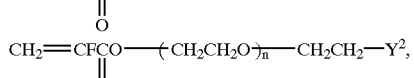

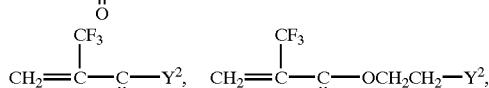

 (i)

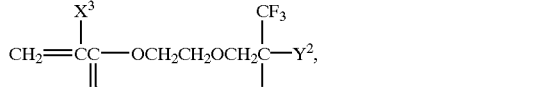 (ii)

(X$^3$: H, F, CH$_3$ or CF$_3$)

and the like.

Among the above-mentioned examples, the formulae (i) and (ii) have not been disclosed in any pamphlets and patent publications, and the polymer obtained therefrom have not been disclosed in any pamphlets and patent publications.

Examples of the monomer for another structural unit M2-1 (hereinafter represented by M2 unless otherwise noted) constituting the polymer are:

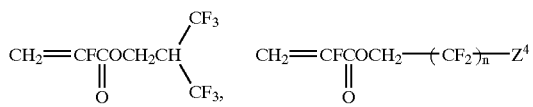

(Z$^4$: H, F or Cl, n: from 1 to 10),

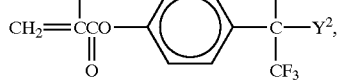

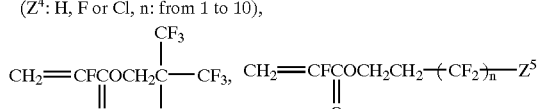

(Z$^5$: H, F or Cl, n: from 1 to 10),

-continued

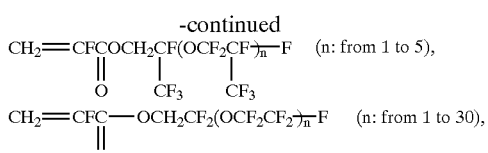

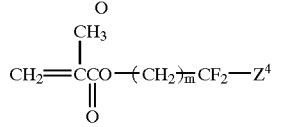

(m: 1 or 2, $Z^4$: H, F or Cl, n: from 1 to 10),

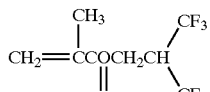

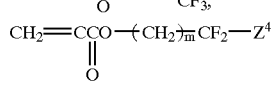

(m: 1 or 2, $Z^4$: H, F or Cl, n: from 1 to 10),

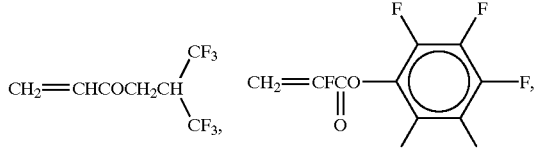

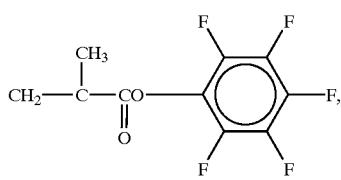

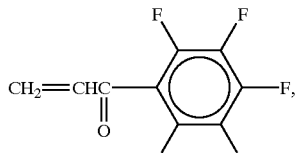

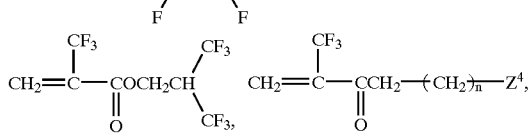

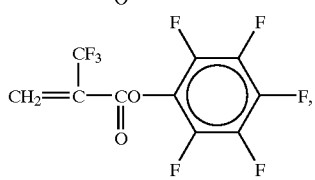

($Z^4$ and $Z^5$: H, F or Cl, n: from 1 to 10)

and the like.

The structural unit N derived from the monomer copolymerizable with M1 and M2 is an optional component and is not limited particularly. The structural unit N may be selected optionally depending on an intended application and required properties of the fluorine-containing polymer. Examples of the monomer giving the structural unit N are, for instance, the following compounds.

Acrylic Monomer (Excluding Monomers Giving M1 and M2):

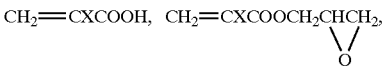

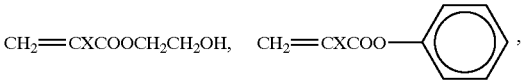

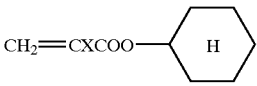

(X: selected from H, $CH_3$, F and $CF_3$)

Styrene Monomer:

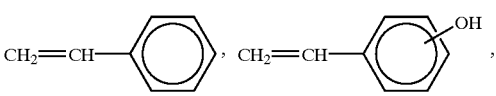

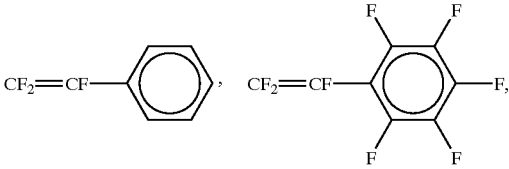

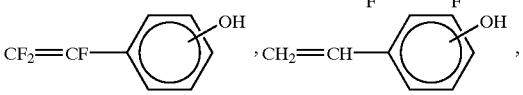

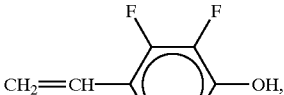

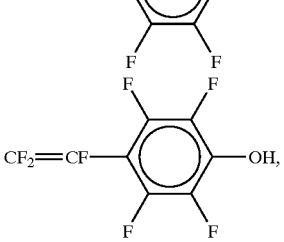

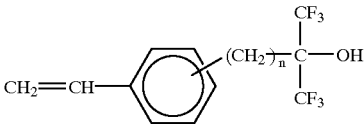

(n is 0 or an integer of 1 or 2)

Ethylene Monomer:

$CH_2=CH$, $CH_2=CHCH_3$, $CH_2=CHCl$ and the like

Maleic Acid Monomer:

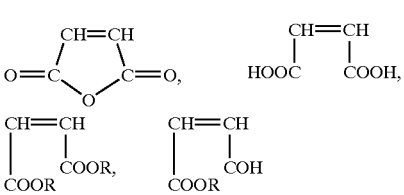

(R is a hydrocarbon group having 1 to 20 carbon atoms)

Allyl Monomer:

$CH_2=CHCH_2Cl$, $CH_2=CHCH_2OH$, $CH_2=CHCH_2COOH$, $CH_2=CHCH_2Br$ and the like Allyl Ether Monomer:

$CH_2=CHCH_2OR$ (R is a hydrocarbon group having 1 to 20 carbon atoms), $CH_2=CHCH_2OCH(CF_2)_{\overline{n}}X$ (n: from 1 to 10, X: H, Cl or F), $CH_2=CHCH_2OCH_2CH_2COOH$,

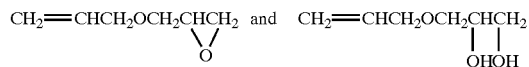

In the polymer having the structural units M1-1 and M2-1, the proportion of M1-1 (or M1-1a or M1-1b) to M2-1 can be optionally selected in the above-mentioned range depending on application, intended functions, kind of the functional group $Y^2$, etc. For example, in order to make the polymer soluble in alkali after the reaction with an acid, it is preferable that the structural unit M1 (M1-a or M1-b) is present in an amount of from 5 to 100% by mole, preferably from 10 to 100% by mole, particularly preferably from 20 to 100% by mole and a total amount of the structural units M2-1 and N is from 0 to 95% by mole, preferably from 0 to 90% by mole, particularly preferably from 0 to 80% by mole.

A number average molecular weight of the fluorine-containing polymer (A) can be selected within the range of from 1,000 to 1,000,000 depending on application, purpose and form thereof at use, and is preferably from 3,000 to 700,000, more preferably from about 5,000 to about 500,000. When the molecular weight is too low, heat resistance and mechanical properties of the coating film obtained from the polymer tends to be insufficient, and a too high molecular weight is disadvantageous from the viewpoint of processability. Particularly in case of forming a thin coating film using the polymer composition in the form of a coating material, a too high molecular weight is disadvantageous from the viewpoint of film forming property, and the molecular weight is preferably not more than 300,000, particularly preferably not more than 200,000.

In the fluorine-containing polymer comprising M1-1 and M2-1, the combination of M1-1 and M2-1 can be optionally selected from the above-mentioned examples depending on intended application, physical properties (particularly glass transition temperature, melting point, etc.) and functions (transparency, refractive index, etc.). Usually a function of $Y^2$ is given to M1-1, and the above-mentioned other functions are adjusted by selecting kind (particularly Rf group) and proportion of M2-1, and kind and proportion of N. For example, in case of obtaining a polymer having a high Tg or a high melting point for enhancing heat resistance and mechanical properties, it is preferable to select the monomer for M2-1 from those having a bulky side chain. For example, the following monomers can be selected preferably.

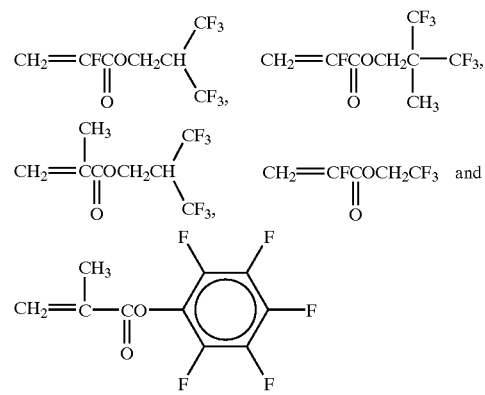

In case of obtaining the polymer having a high transparency in a vacuum ultraviolet region for use for resist application, particularly $F_2$ resist application, it is preferable to increase the fluorine atom content of the whole polymer including M1-1, M2-1 and N as high as possible. It is preferable that the fluorine atom content is not less than 30% by weight, preferably not less than 50% by weight, particularly preferably not less than 60% by weight. From that point of view, it is preferable that $X^3$ and $X^6$ of M1-1 and M2-1, respectively are fluorine atom or $CF_3$. Further it is preferable to select M2-1 having a higher content of fluorine atom. For example, among the monomers of M2-1, the following monomers can be selected preferably:

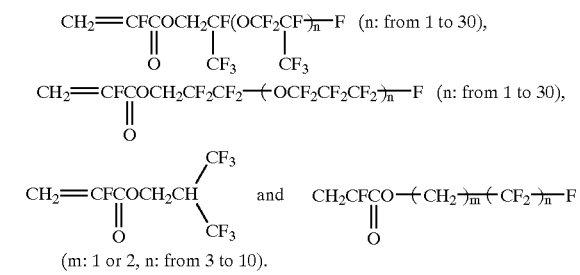

(m: 1 or 2, n: from 3 to 10).

The thus obtained fluorine-containing polymer is non-crystalline and has a high transparency in a wide range of wavelength including a vacuum ultraviolet region and can be used for the base polymer for a resist, particularly for a $F_2$ resist.

The third and the fourth of the preferable fluorine-containing polymers (A) having an acid-reactive group are fluorine-containing allyl polymers and fluorine-containing vinyl polymers, respectively.

The third of the fluorine-containing polymers (A) is a fluorine-containing polymer having a number average molecular weight of from 1,000 to 1,000,000 and represented by the formula II-(3):

—(M1-2)—(M2-2)—(M2-3)—(N)—          II-(3), wherein M1-2 is represented by:

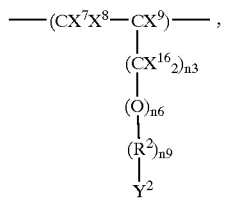

M2-2 is represented by:

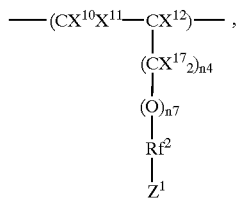

M2-3 is represented by:

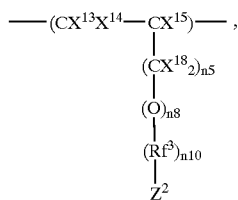

wherein $X^7$, $X^8$, $X^9$, $X^{10}$, $X^{11}$, $X^{12}$, $X^{13}$, $X^{14}$, $X^{16}$, $X^{17}$ and $X^{18}$ are the same or different and each is H or F; $X^{15}$ is H, F or $CF_3$; $Y^2$ is an acid-reactive functional group; $Z^1$ is a functional group which is neither dissociated nor degraded by an acid; $Z^2$ is H, F or Cl; $R^2$, $Rf^2$ and $Rf^3$ are the same or different and each is a fluorine-containing alkylene group having 1 to 20 carbon atoms, a fluorine-containing alkylene group having 2 to 100 carbon atoms and ether bond or a fluorine-containing arylene group having 3 to 20 carbon atoms; n3, n4 and n5 are the same or different and each is 0 or an integer of 1 or 2; n6, n7, n8 and n10 are the same or different and each is 0 or 1; n9 is 1, N is the structural unit derived from the monomer copolymerizable with the structural units M1-2, M2-2 and M2-3, when M1-2+M2-2+M2-3 is assumed to be equal to 100% by mole, the percent by mole ratio of M1-2/M2-2/M2-3 is 1 to 100/0 to 99/0 to 99, and the polymer comprises from 1 to 100% by mole of the structural unit M1-2, from 0 to 99% by mole of the structural unit M2-2, from 0 to 99% by mole of the structural unit M2-3 and from 0 to 99% by mole of the structural unit N.

The fourth of the fluorine-containing polymers (A) is a fluorine-containing polymer having a number average molecular weight of from 1,000 to 1,000,000 and represented by the formula II-(4):

—(M1-3)—(M2-2)—(M2-3)—(N)—     II-(4), wherein M1-3 is represented by:

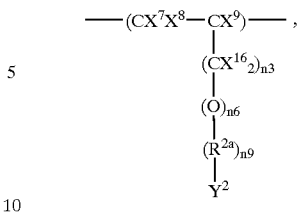

M2-2 is represented by:

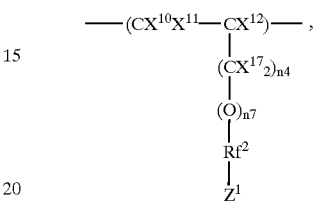

M2-3 is represented by:

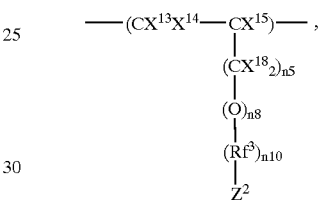

wherein $R^{2a}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n9 is 0 or 1; $X^7$, $X^8$, $X^9$, $X^{10}$, $X^{11}$, $X^{12}$, $X^{13}$, $X^{14}$, $X^{15}$, $X^{16}$, $X^{17}$, $X^{18}$, $Y^2$, $Z^1$, $Z^2$, $Rf^2$, $Rf^3$, n3, n4, n5, n6, n7, n8 and n10 are as defined in the above-mentioned formula I-(3) (at least one of $X^{13}$, $X^{14}$ and $Z^2$ is F or $X^{15}$ is F or $CF_3$), N is the structural unit derived from the monomer copolymerizable with the structural units M1-3, M2-2 and M2-3, when M1-3+M2-2+M2-3 is assumed to be equal to 100% by mole, the percent by mole ratio M1-3/(M2-2+M2-3) is 1 to 90/10 to 99, and the polymer comprises from 1 to 90% by mole of the structural unit M1-3, from 0 to 99% by mole of the structural unit M2-2, from 0 to 99% by mole of the structural unit M2-3 and from 0 to 99% by mole of the structural unit N.

Unless otherwise noted hereinafter, M1-2 represents the structural units M1-2 and M1-3.

The structural unit M1-2 is a structural unit of a monomer having an acid-labile or acid-degradable functional group and is present as an essential component. The structural unit M1-2 can impart a new function to the fluorine-containing polymer.

The structural unit M2-2 has a functional group which is neither dissociated nor degraded by an acid but can impart solubility, crosslinkability and adhesion to a substrate to the fluorine-containing polymer and adjust them. The structural unit M2-2 is a preferable component unit of the fluorine-containing monomer.

The structural unit M2-3 is a component unit of the fluorine-containing monomer not having a functional group and is preferable from the point that mechanical properties and heat resistance (glass transition temperature and melting point) of the polymer can be adjusted depending on purpose. Further the structural unit M2-3 is a preferable component from the point that the fluorine atom content of the whole polymer can be adjusted by M2-2 and M2-3, transparency can be imparted to the polymer and a refractive index can be lowered.

The structural unit N is an optional component similarly to the above-mentioned formula II-(1) and is copolymerized to impart properties required as the case demands.

When M1-2 contains fluorine atom, the fluorine-containing polymers of the formulae II-(3) and II-(4) of the present invention comprise one or more structural units selected from the structural units M1-2 and may not contain M2-2, M2-3 and N.

Namely, the structural unit M1-2 of the polymer of the formula II-(3) has fluorine atom. In that case, the polymer may comprise only the structural unit selected from the group consisting of the structural units M1-2.

On the other hand, in the polymer of the formula II-(4), there is a case where the structural unit M1-3 in the polymer of the formula II-(4) has the acid-labile group $Y^1$ but does not have fluorine atom, and the polymer contains any one of the structural units M2-2 and M2-3 as an essential component.

The preferable polymer of the formula II-(3) is the polymer of the formula II-(3a) having the following structural units:

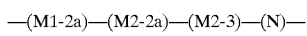
$$—(M1-2a)—(M2-2a)—(M2-3)—(N)— \qquad II\text{-}(3a),$$

wherein the structural unit M1-2a is preferably one represented by:

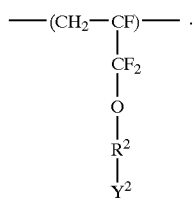

wherein $Y^2$ and $R^2$ are as defined in the formula II-(3), M2-2a is represented by:

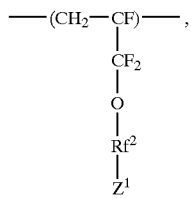

wherein $Rf^2$ and $Z^1$ are as defined in the formula II-(3), and the polymer has the percent by mole ratio M1-2a/M2-2a/M2-3 of 1 to 99/1 to 99/0 to 98.

In the polymers of the formulae II-(3) and II-(3a) of the present invention, preferable examples of the monomer constituting M1-2 and M1-2a are:

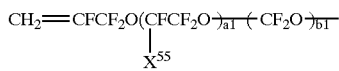

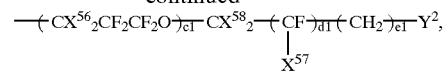

wherein a1+b1+c1 is from 0 to 30; d1 is 0 or 1; e1 is from 0 to 5; $X^{55}$ is F or $CF_3$; $X^{56}$ and $X^{58}$ are H or F; $X^{57}$ is H, F or $CF_3$; when $X^{58}$ is assumed to be H, a1+b1+c1+d1 is not 0; $Y^2$ is as defined as in the formula II-(3).

Further there are:

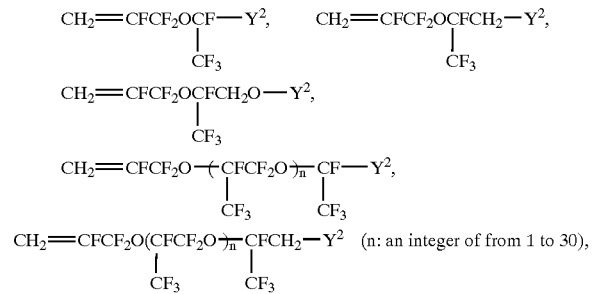

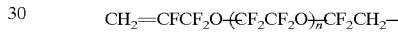

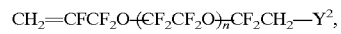

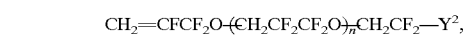

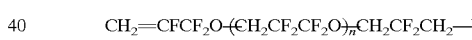

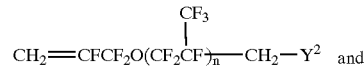

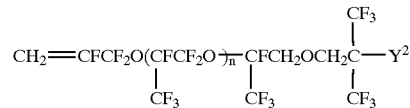
(v)

(n: an integer of from 0 to 30; $Y^2$ is as defined in the formula II-(3)).

Further, examples of the preferable monomer constituting M2-2 and M2-2a in the polymer of the formula II-(3a) of the present invention are:

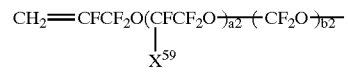
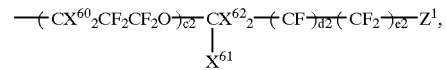

wherein a2+b2+c2 is from 0 to 30; d2 is 0 or 1; e2 is from 0 to 5; $X^{59}$ is F or $CF_3$; $X^{60}$ and $X^{62}$ are H or F; $X^{61}$ is H, F or $CF_3$; when $X^{61}$ and $X^{62}$ are assumed to be H, a2+b2+c2+d2+e2 is not 0; $Z^1$ is as defined in the formula II-(3).

Further there are:

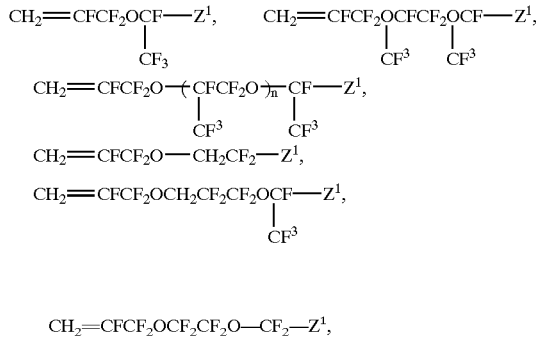

$CH_2$=$CFCF_2OCF_2CF_2O$—$CF_2$—$Z^1$, $CH_2$=$CFCF_2O$-($CF_2CF_2O$)$_n$$CF_2$—$Z^1$ and the like, wherein n is an integer of from 1 to 30; and $Z^1$ is as defined in the formula II-(3).

Example of another preferable polymer of the formula II-(3) is the polymer represented by the formula II-(3b):

—(M1-2b)—(M2-2b)—(M2-3)—(N)—    II-(3b), wherein M1-2b is the structural unit represented by:

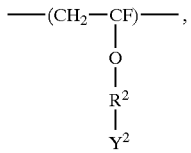

wherein $Y^2$ and $R^2$ are as defined in the formula II-(3),

M2-2b is the structural unit represented by:

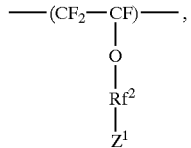

wherein $Rf^2$ and $Z^1$ are as defined in the formula II-(3).

In the polymer of the formula II-(3b), preferred is a polymer having the percent by mole ratio M1-2b/M2-2b/M2-3 of 1 to 99/1 to 99/0 to 98.

In the polymer of the formula II-(3b) of Invention II, preferable examples of the monomer constituting the structural unit M1-2b are:

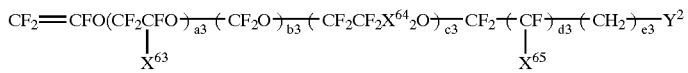

wherein a3+b3+c3 is from 0 to 30; d3 is 0, 1 or 2; e3 is from 0 to 5; $X^{63}$ and $X^{65}$ are F or $CF_3$; $X^{64}$ is H or F; $Y^2$ is as defined in the formula II-(3).

Further there are:

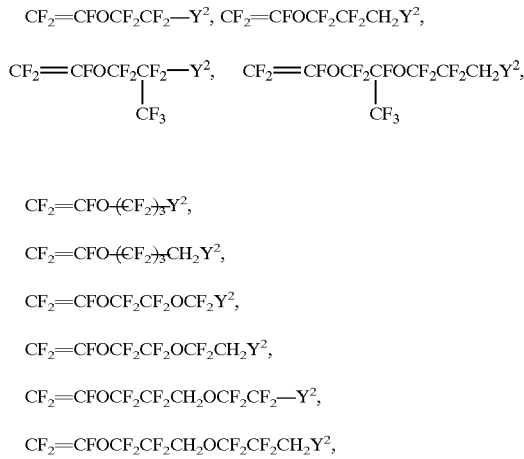

$CF_2$=$CFO$-($CF_2$)$_3$-$Y^2$, $CF_2$=$CFO$-($CF_2$)$_3$$CH_2Y^2$, $CF_2$=$CFOCF_2CF_2OCF_2Y^2$, $CF_2$=$CFOCF_2CF_2OCF_2CH_2Y^2$, $CF_2$=$CFOCF_2CF_2CH_2OCF_2CF_2$—$Y^2$, $CF_2$=$CFOCF_2CF_2CH_2OCF_2CF_2CH_2Y^2$,

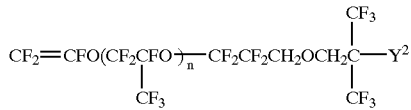 (vi)

and the like, wherein n is from 0 to 30; and $Y^2$ is as defined in the formula II-(3).

In those examples, the monomers (v) and (vi) are compounds which have not been disclosed in any of pamphlets and patent publications, and also polymers obtained therefrom have not been disclosed in any of pamphlets and patent publications similarly.

In the polymers of the formula II-(3b) of Invention II, preferable examples of the monomer constituting the structural unit M2-2 are:

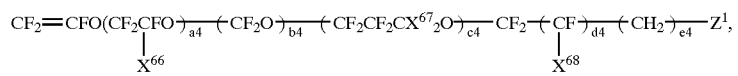

wherein a4+b4+c4 is from 0 to 30; d4 is 0, 1 or 2; e4 is from 0 to 5; $X^{66}$ and $X^{68}$ are F or $CF_3$; $X^{67}$ is H or F; and $Z^1$ is as defined in the formula II-(3).

Further there are:

$CF_2$=$CFOCF_2CF_2$—$Z^1$, $CF_2$=$CFOCF_2CF_2CH_2$—$Z^1$,

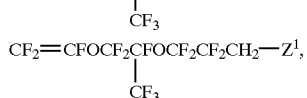

$CF_2=CFO(CF_2)_3Z^1$, $CF_2=CFO(CF_2)_3CH_2-Z^1$, $CF_2=CFOCF_2CF_2OCF_2-Z^1$, $CF_2=CFOCF_2CF_2OCF_2CH_2Z^1$, $CF_2=CFOCF_2CF_2CH_2OCF_2CF_2-Z^1$ and $CF_2=CFOCF_2CF_2CH_2OCF_2CF_2CH_2Z^1$ wherein $Z^1$ is as defined in the formula II-(3).

Examples of the preferable monomer constituting the structural unit M1-2 in the fluorine-containing polymer of the formula II-(2) other than the preferable examples described in the above-mentioned formulae M1-2a and M1-2b are, for instance, $CF_2=CFCF_2-O-Rf-Y^2$, $CF_2=CF-Rf-Y^2$, $CH_2=CH-Rf-Y^2$, $CH_2=CHO-Rf-Y^2$, (Rf is the same as $Rf^2$ of the formula II-(3) and $Y^2$ is as defined in the formula II-(3))
and the like.

Concretely there are:

$CF_2=CF-CF_2OCF_2CF_2CF_2Y^2$,
$CF_2=CFCF_2OCF_2CF_2CF_2CH_2Y^2$, $CF_2=CFCF_2OCF_2CF-Y^2$,    $CF_2=CFCF_2OCF_2CF-CH_2Y^2$,
               |                              |
               $CF_3$                         $CF_3$ $CF_2=CFCF_2-Y^2$, $CF_2=CFCF_2-CH_2Y^2$, $CH_2=CHCF_2CF_2CH_2CH_2-Y^2$, $CH_2=CHCF_2CF_2-Y^2$, $CH_2=CHCF_2CF_2CH_2Y^2$, $CH_2=CHCF_2CF_2CF_2CF_2-Y^2$, $CH_2=CHCF_2CF_2CF_2CF_2CH_2Y^2$, $CH_2=CH_2O-CH_2CF_2CF_2-Y^2$, $CH_2=CH_2OCH_2CF_2CF_2CH_2Y^2$ and the like.

Examples of the preferable monomer constituting the structural unit M2-2 in the fluorine-containing polymer of the formula II-(3) other than the preferable examples described in the above-mentioned M2-2a and M2-2b are, for instance, $CF_2=CFCF_2-O-Rf-Z^1$, $CF_2=CF-Rf-Z^1$, $CH_2=CH-Rf-Z^1$, $CH_2=CHO-Rf-Z^1$, (Rf is the same as $Rf^2$ of the formula II-(3) and $Z^1$ is as defined in the formula II-(3))
and the like.

Concretely there are:

$CF_2=CF-CF_2OCF_2CF_2CF_2Z^1$,
$CF_2=CFCF_2OCF_2CF_2CF_2CH_2Z^1$, $CF_2=CFCF_2OCF_2CF-Z^1$,    $CF_2=CFCF_2OCF_2CF-CH_2Z^1$,
               |                              |
               $CF_3$                         $CF_3$ $CF_2=CFCF_2-Z^1$, $CF_2=CFCF_2-CH_2Z^1$, $CH_2=CHCF_2CF_2CH_2CH_2-Z^1$, $CH_2=CHCF_2CF_2-Z^1$, $CH_2=CHCF_2CF_2CH_2Z^1$, $CH_2=CHCF_2CF_2CF_2CF_2-Z^1$, $CH_2=CHCF_2CF_2CF_2CF_2CH_2Z^1$, $CH_2=CH_2-CH_2CF_2CF_2-Z^1$, $CH_2=CH_2OCH_2CF_2CF_2CH_2Z^1$ ($Z^1$ is as defined in the formula II-(3))
and the like.

In the polymers of the formulae II-(3), II-(3a) and II-(3b), various proportions of M1-2 (M1-2a, M1-2b), M2-2 (M2-2a, M2-2b) and M2-3 can be selected within the range mentioned above depending on application, intended function, kind of the functional group $Y^2$, etc. For example, in order to make the fluorine-containing polymer soluble in alkali after the reaction with an acid, it is preferable that the structural unit M1-2 is present in an amount of from 5 to 100% by mole, preferably from 10 to 100% by mole, particularly preferably from 20 to 100% by mole and that a total amount of the structural units M2-2, M2-3 and N is from 0 to 95% by mole, preferably from 0 to 90% by mole, particularly preferably from 0 to 80% by mole.

In the polymer of the formula II-(4), preferred is the polymer represented by the formula II-(4a):

$$-(M1\text{-}3)-(M2\text{-}2)-(M2\text{-}3a)- \qquad \text{II-(4a)},$$

wherein the structural unit M2-3a is a structural unit represented by:

$$-(CX^{13}X^{14}-CX^{15})-,$$
$$\qquad\qquad\;\;\; |$$
$$\qquad\qquad (CX^{18}_2)_{n5}$$
$$\qquad\qquad\;\;\; |$$
$$\qquad\qquad\;\; Z^2$$

wherein $X^{13}$, $X^{14}$, $X^{15}$, $X^{18}$, $Z^2$ and n5 are as defined in the above-mentioned formula II-(4), the percent by mole ratio M1-3/(M2-2+M2-3a) is 1 to 90/99 to 10 and the percent by mole ratio M1-3/M2-2/M2-3a is 1 to 90/0 to 98/1 to 99.

In the polymer of the formula II-(4a), the structural unit M1-3 is preferably M1-3a represented by:

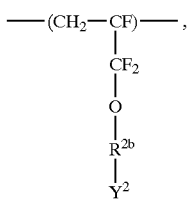

wherein $R^{2b}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms; $Y^2$ is an acid-reactive group, and, further in the polymer of the formula II-(4a), the structural unit M1-3 is preferably M1-3b represented by:

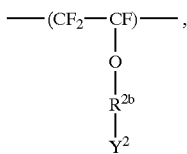

wherein $R^{2b}$ and $Y^2$ are as defined in the structural unit of M1-3a.

In the polymers of the formulae II-(4) and II-(4a) of Invention II, preferable monomers constituting the structural unit M1-3 are the same as the fluorine-containing monomers corresponding to the above-mentioned structural unit M1-2 and in addition, may be non-fluorine-containing monomers. Examples of the preferable non-fluorine-containing monomers are:

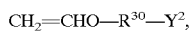

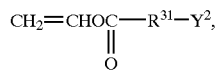

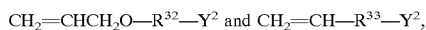

wherein $R^{30}$ to $R^{33}$ are divalent hydrocarbon groups, for example, divalent alkylene groups, divalent alicyclic hydrocarbon groups without a polycyclic structure, divalent aromatic hydrocarbons or hydrocarbon groups without a polycyclic structure having oxygen atom, nitrogen atom or sulfur; and Y2 is as defined in the formula II-(4).

More concretely there are:

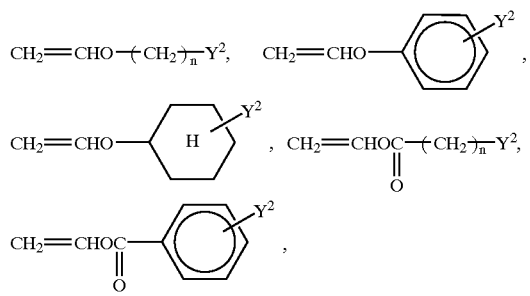

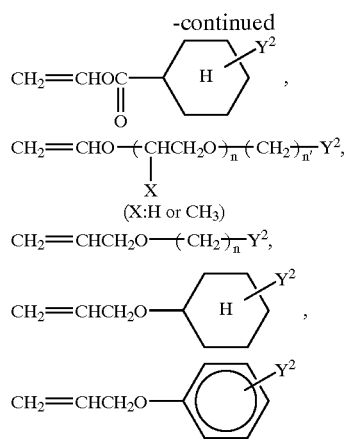

and the like, wherein n is an integer of from 1 to 30; and Y2 is as defined in the formula II-(4).

In the polymers of the formulae II-(4) and II-(4a) of Invention II, examples of the preferable monomer constituting the structural unit M2-2 are the same as the monomers for the structural unit M2-2 exemplified in the above-mentioned formulae II-(3), II-(3a) and II-(3b).

In the polymers of the formulae II-(3), II-(4) and II-(4a) of Invention II, examples of the preferable monomers constituting the structural unit M2-3 (M2-3a) are:

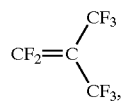

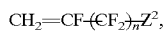

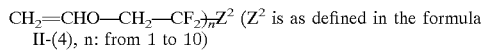

and the like.

In the polymers of the formulae II-(3), II-(3a), II-(3b), II-(4) and II-(4a), the functional group $Z^1$ which is not degraded by an acid is a functional group which is not degraded or dissociated due to action of an acid and cation. However the polymers may undergo self-condensation, poly-condensation reaction, or condensation or poly-condensation reaction in the presence of a crosslinking agent. Particularly in a system which does not contain a crosslinking agent and the like, it is preferable that the functional group $Z^1$ itself is not modified only by a contact of the functional group $Z^1$ with an acid (or cation).

Examples of the preferable functional group $Z^1$ which is not degraded by an acid are —CH$_2$OH, —COOH, —SO$_3$H, —CN and the like.

For example, in case of the acid-reactive group $Y^2$ which is acid-labile or acid-degradable, when the acid-labile or acid-degradable functional group $Y^2$ and the functional group $Z^1$ which is not degraded by an acid are present in the fluorine-containing polymer and when kinds and proportions of the respective functional groups are adjusted, for example, there can be obtained preferable effects that a solubility of the fluorine-containing polymer in alkali or a solvent before and after the reaction with an acid and a degree of the solubility in alkali or a solvent before and after the reaction with an acid can be adjusted and that an adhesion to a substrate can be imparted to the fluorine-containing polymer before the reaction with an acid.

The functions of these functional groups enable the fluorine-containing polymer to be used on various acid-reactive materials, photosensitive materials and resist materials.

The structural unit N is an optional component and is not limited as far as it is a monomer copolymerizable with the structural units M1-2, M2-2 and M2-3. The structural unit N may be optionally selected depending on intended application and required characteristics of the fluorine-containing polymer.

Ethylene Monomer:

Ethylene, propylene, butene, vinyl chloride, vinylidene chloride and the like.

Vinyl Ether or Vinyl Ester Monomer:

$CH_2=CHOR$, $CH_2=CHOCOR$ (R: hydrocarbon group having 1 to 20 carbon atoms) and the like.

Allyl Monomer:

$CH_2=CHCH_2Cl$, $CH_2=CHCH_2OH$, $CH_2=CHCH_2COOH$, $CH_2=CHCH_2Br$ and the like.

Allyl Ether Monomer:

$CH_2=CHCH_2OR$ (R: hydrocarbon group having 1 to 20 carbon atoms), $CH_2=CHCH_2OCH_2CH_2COOH$,

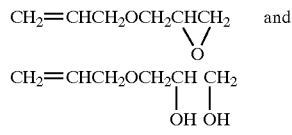

and the like.

The molecular weight of the polymers II-(3), II-(3a), II-(3b), II-(4) and II-(4a) of the present invention can be selected from a number average molecular weight within the range of from 1,000 to 1,000,000 depending on application, purpose and form thereof at use, and is preferably from 3,000 to 700,000, more preferably from about 5,000 to about 500,000. When the molecular weight is too low, heat resistance and mechanical properties of the obtained polymer coating film easily become insufficient, and a too high molecular weight tends to be disadvantageous from the viewpoint of processability. Particularly when the polymer is intended to be used in the form of a coating material for forming a thin coating film, a too high molecular weight is disadvantageous from the viewpoint of film forming property. The molecular weight is preferably from 3,000 to 200,000, particularly from 3,000 to 100,000.

In the polymers of the formulae II-(3) and II-(4) of the present invention, the combination of the structural units M1-2 (or M1-3), M2-2, M2-3 and N can be optionally selected from the above-mentioned examples, depending on intended application, physical properties (particularly glass transition temperature, etc.) and functions (transparency, refractive index, etc.).

Usually the acid-reactive function (namely a function of changing functions and properties after the reaction with an acid) is given to the structural unit M1-2, intended functions are imparted to the polymer after the degradation by the degraded functional group of M1-2 and the functional group of M2-2, and other functions and properties are controlled by M2-3 and if necessary, by N. A balance of those functions and properties is adjusted by selecting the respective kinds and proportions of M1-2, M2-2, M2-3 and N.

For example, when enhancing transparency in a vacuum ultraviolet region for applications on a resist, particularly a $F_2$ resist, it is preferable to increase a fluorine atom content of the whole polymer including M1-2, M2-2, M2-3 and N as high as possible. The fluorine atom content is not less than 30% by weight, preferably not less than 50% by weight, particularly preferably not less than 60% by weight. From that point of view, the polymers comprising M1-2a, M1-2b, M2-3a and M2-3b are selected preferably. The thus obtained fluorine-containing polymer has a good heat resistance, is non-crystalline and has a high transparency in a wide wavelength range including a vacuum ultraviolet region, and therefore is useful as a base polymer for a resist, particularly for a $F_2$ resist.

It was found that particularly the polymers of the formulae II-(3) and II-(4) of Invention II generally have a high transparency in a vacuum ultraviolet region. Those polymers are useful as materials for semi-conductor material applications such as a $F_2$ resist and $F_2$ pellicle.

In the chemically amplifying type resist composition of the present invention, the fluorine-containing polymer (A) having an acid-reactive group is the fluorine-containing polymer having the acid-reactive group $Y^2$. The acid-reactive group $Y^2$ is concretely an acid-labile or acid-degradable functional group or a functional group undergoing condensation by an acid.

① Acid-labile or Acid-degradable Functional Group:

The acid-labile or acid-degradable functional group is a functional group which can make the polymer soluble in alkaline developing solution due to action of an acid though the polymer is insoluble or hardly soluble in alkali before the reaction with an acid.

Examples thereof are those which has an ability of changing to —OH group, —COOH group, —SO$_3$H group or the like due to action of an acid or cation, thereby causing the fluorine-containing polymer itself to be dissolved in alkali.

Therefore the polymer can be used as a base polymer for a positive resist.

Examples of the acid-labile or acid-degradable functional group are:

$$-\text{OC}\begin{matrix}R^7\\ -R^8\\ R^9\end{matrix}, \quad -\text{OCH}_2\text{COOC}\begin{matrix}R^{10}\\ -R^{11}\\ R^{12}\end{matrix},$$

$$-\text{OC}\begin{matrix}R^{13}\\ |\\ -\text{OR}^{14}\\ |\\ R^{15}\end{matrix}, \quad -\text{OC}\begin{matrix}R^{16}\\ |\\ -\text{O},\\ (R^{17})\end{matrix} \quad -\text{OCOC}\begin{matrix}R^{18}\\ -R^{19}\\ R^{20}\end{matrix},$$

-continued

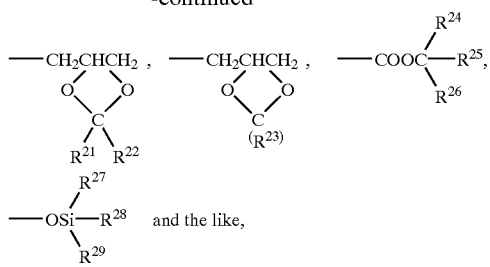

wherein $R^7$, $R^8$, $R^9$, $R^{10}$, $R^{11}$, $R^{12}$, $R^{14}$ $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or a hydrocarbon group having 1 to 10 carbon atoms; and $R^{17}$ and $R^{23}$ are a divalent hydrocarbon group having 2 to 10 carbon atoms.

More preferable examples are:

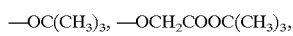

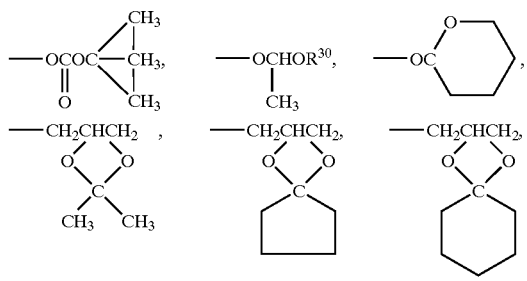

wherein $R^{30}$ is an alkyl group having 1 to 10 carbon atoms.

The fluorine-containing polymers having those acid-labile or acid-degradable functional groups can be used for the above-mentioned positive photoresist. The acid-labile or acid-degradable functional group is called the protective group as mentioned above. Though the fluorine-containing polymer (A) before the reaction is insoluble or hardly soluble in alkali, the functional group is dissociated or degraded by an acid generated from the photoacid generator (B) by irradiation of energy rays and functions to change the fluorine-containing polymer (A) to be soluble in alkali. Further an acid is also generated from the protecting group released by the degradation of the functional group in the fluorine-containing polymer (A), which has an effect of accelerating the degradation reaction.

In the fluorine-containing polymers having those acid-labile or acid-degradable functional groups, various proportions of the structural units M1, M2 and N can be selected within the above-mentioned range depending on kind of the composition, intended function, kind of the functional group $Y^2$ and the like. For example, in order to make the fluorine-containing polymer soluble in alkali after the reaction with an acid, it is preferable that the structural unit M1 is present in an amount of from 5 to 100% by mole, preferably from 10 to 100% by mole, particularly preferably from 20 to 100% by mole, and that a total amount of the structural units M2 and N is from 0 to 95% by mole, preferably from 0 to 90% by mole, particularly preferably from 0 to 80% by mole.

② Functional Group Undergoing Condensation Reaction by an Acid:

The fluorine-containing functional group undergoing condensation reaction by an acid enables the polymer itself to be insoluble in an alkaline developing solution (or the same solvent as mentioned above) due to action of an acid though the polymer is soluble in alkali (or a solvent) before the reaction with the acid.

The functional group undergoing condensation by an acid is concretely a functional group which causes self-condensation or poly-condensation due to action of an acid or cation or condensation reaction or poly-condensation reaction with a crosslinking agent due to action of an acid in the presence of the crosslinking agent, or a functional group which causes a change in polarity by rearrangement with an acid or cation (for example, pinacol rearrangement or carbinol rearrangement). In any case, the resultant polymer becomes insoluble in alkali (or a solvent).

Preferable functional groups undergoing condensation by an acid is selected from —OH, —COOH, —CN, —SO$_3$H and epoxy group.

The fluorine-containing polymers having those functional groups undergoing condensation reaction by an acid can be used for a negative photoresist. The functional group undergoing condensation reaction by an acid causes condensation or poly-condensation reaction or rearrangement reaction by an acid generated from the photoacid generator (B) by irradiation of energy rays, thereby causing a self-crosslinking reaction, rearrangement reaction in a molecule and crosslinking reaction with a crosslinking agent contained in the composition and making the fluorine-containing polymer (A) insoluble or hardly soluble in a developing solution (alkali or a solvent) though the fluorine-containing polymer (A) before the reaction is soluble in the developing solution.

Further it is particularly preferable that the functional group undergoing condensation reaction by an acid is one which can impart a function of making it possible to dissolve the polymer in a developing solution such as an alkali or a solvent before the reaction with an acid (for example, —COOH, —SO$_3$H, —OH or the like). The functional group undergoing condensation reaction by an acid may be one which has only a function of causing a condensation reaction (crosslinking reaction) by an acid and making the polymer insoluble in the developing solution (—CN, epoxy group or the like). In that case, the polymer can be used as a negative photoresist by a combination with other functional group having a function of making the polymer soluble in the developing solution or by making the fluorine-containing polymer have a backbone structure capable of dissolving in the developing solution.

It is particularly preferable that the fluorine-containing polymer having the functional group undergoing condensation by an acid is a polymer soluble in an aqueous alkaline solution before the reaction with an acid, which makes it possible to carry out a developing process (dissolving process) in an aqueous system without using a solvent (particularly a flammable solvent) as a developing solution and is advantageous from the viewpoint of safety and environment.

In order to impart solubility in an aqueous alkaline solution, it is preferable that the structural unit M1 is present in an amount of from 5 to 100% by mole, preferably from 10 to 100% by mole, particularly preferably from 20 to 100% by mole, and that a total amount of the structural units M2 and N is from 0 to 95% by mole, preferably from 0 to 90% by mole, particularly preferably from 0 to 80% by mole.

The crosslinking agent is not limited particularly and can be optionally selected from those which have been used as a crosslinking agent for a negative resist.

The polymers of the formulae II-(1), II-(2), II-(3) and II-(4) of Invention II are characterized by having the acid-reactive functional group $Y^2$. For introducing those functional groups into the fluorine-containing polymers, various methods can be used. Generally there can be used:

① a method of previously synthesizing a monomer having the functional group $Y^2$ and then polymerizing, ② a method of once synthesizing a polymer having another functional group and then converting the functional group by high molecular reaction, thus introducing the functional group $Y^2$ into the polymer, or the like method.

For example, as the method ② for introducing an acid-labile or acid-degradable functional group, there can be used a method of once preparing a fluorine-containing polymer having OH group and then reacting the polymer with a vinyl ether such as ethyl vinyl ether or dihydropyran in the presence of an acid such as toluenesulfonic acid, thus introducing a functional group (ketals) decomposable by an acid; a method of reacting a fluorine-containing polymer having 1,2-diol with ketone to give a functional group decomposable by an acid (cyclic acetal compound); or the like method.

The fluorine-containing polymer (A) which is used for the composition of the present invention can be prepared by (co)polymerizing, by various known methods, the monomers corresponding to the respective structural units, namely the ethylenic monomer (M1) having the functional group $Y^2$, fluorine-containing ethylenic monomer (M2) and if necessary, the fluorine-containing ethylenic monomer corresponding to the optional component (N). For the polymerization, radical polymerization, anion polymerization, cation polymerization and the like can be used. Among them, the radical polymerization method is preferably employed from the viewpoint that radical polymerizability of each monomer for obtaining the polymers of the present invention is good, quality control such as proportions of the components and molecular weight is easy and production in an industrial scale is easy. Namely, for initiating the polymerization, there is no restriction with respect to means for polymerization as far as the polymerization proceeds radically. The polymerization is initiated, for example, by an organic or inorganic radical polymerization initiator, heat, light, ionizing radiation or the like. The polymerization can be carried out by solution polymerization, bulk polymerization, suspension polymerization, emulsion polymerization or the like. Also the molecular weight is controlled by contents of monomers to be used for the polymerization, a content of the polymerization initiator, a content of a chain transfer agent and temperature. The components of the prepared copolymer can be controlled by the starting monomer components.

In the chemically amplifying type photoresist composition of Invention II, the photoacid generator (B) is a compound which generates an acid or cation by irradiating the compound itself or the resist composition containing the compound with radioactive rays. The photoacid generator (B) can be used in a mixture of two or more thereof.

The photoacid generators as exemplified in the chemically amplifying type resist composition disclosed in Invention I can be used preferably as the photoacid generator (B) for the chemically amplifying type resist composition of Invention II.

With respect to the content of the photoacid generator (B) of the chemically amplifying type resist composition of Invention II, the same content as mentioned in the chemically amplifying type resist composition disclosed in Invention I can be used preferably.

Also to the photoresist composition of Invention II may be added an organic base which can act as a base against the acid generated from the photoacid generator.

As the organic base to be added, the same bases as raised in the chemically amplifying type resist composition of Invention I can be used preferably.

In the addition of the organic base, the same adding amount as in the chemically amplifying type resist composition of Invention I can be used preferably.

The addition of the organic base imparts the same effect as in the chemically amplifying type resist composition of Invention I, to the resist composition of Invention II.

Also in the chemically amplifying type resist composition of Invention II, when a negative resist composition is prepared using the fluorine-containing polymer (A) having a functional group undergoing condensation by an acid, a crosslinking agent may be used as the case demands.

The crosslinking agent is not limited particularly, and those raised in the chemically amplifying type resist composition of Invention I can be used preferably.

With respect to the amount of the crosslinking agent of the photoresist composition of Invention II (particularly a negative type), the same amount as described in the chemically amplifying type resist composition of Invention I can be used preferably.

To the photoresist composition of Invention II can be added various additives which have been used in the field of photoresist such as a dissolution inhibitor, sensitizer, dye, adhesion betterment material and water storage material.

Examples of the additives which can be used preferably are the same as described in the chemically amplifying type resist composition of Invention I.

Those additives can be used in the same amount as in the chemically amplifying type resist composition of Invention I.

In the chemically amplifying type resist composition of Invention II, the solvent (C) is one which can dissolve the fluorine-containing polymer (A) having an acid-reactive functional group, the photoacid generator (B) and the above-mentioned various additives, and is not limited particularly as far as good coatability (surface smoothness, uniformity of coating thickness, and the like) can be obtained.

Examples of the solvent (C) which can be used preferably are the same as described in the chemically amplifying type resist composition of Invention I. The proportion of the solvent (C) to be used preferably in Invention II is the same as in the chemically amplifying type resist composition of Invention I.

The chemically amplifying type resist composition of Invention II is used according to a resist pattern formation method of conventional photoresist technology. The pattern formation methods to be applied preferably are the same as described in the chemically amplifying type resist composition of Invention I.

It has been found that by using the chemically amplifying type resist composition of Invention II, a resist coating film (photosensitive layer) having a high transparency even in a vacuum ultraviolet region can be obtained. Therefore the resist composition of Invention II could be preferably used particularly for a photolithography process using a $F_2$ laser (wavelength of 157 nm) which is under development aiming at a technology node of 0.1 $\mu$m.

The Invention II also relates to a coating film obtained by applying, on a substrate, the composition comprising the fluorine-containing polymer (A) having an acid-reactive functional group.

The coating film of Invention II is obtained by applying the fluorine-containing polymer which has an acid-reactive functional group and is high in transparency against light in a vacuum ultraviolet region.

The fluorine-containing polymer having an acid-reactive functional group for the coating film of Invention II has a molecular absorption coefficient at 157 nm of not more than 3.0 $\mu m^{-1}$, preferably not more than 1.5 $\mu m^{-1}$, more preferably not more than 1.0 $\mu m^{-1}$.

The coating film obtained by applying the fluorine-containing polymer having a high transparency in a vacuum ultraviolet region on a substrate is naturally useful as a resist coating film (photosensitive layer) in a photolithography process using a $F_2$ laser, and in addition, is preferable because it can be used for a pellicle for $F_2$ lithography, a reflection reducing film for optical parts such as lens and silicon wafer, a non-tacky stain-proofing film for lens and peripheral optical parts, etc.

The coating film of Invention II can be used on various substrates depending on purpose and application. Particularly in applications requiring transparency, namely in optical applications, the coating film can be applied on inorganic substrates such as a silicon wafer, glass, LiF, $CaF_2$ and $MgF_2$, transparent resins such as acrylic resin, triacetyl cellulose resin and polycarbonate resin, and other metallic substrates.

The coating thickness can be widely selected depending on purpose and application. In case of applications requiring transparency, the coating thickness is not more than 1.0 $\mu m$, preferably not more than 0.5 $\mu m$, more preferably not more than 0.3 $\mu m$.

Further when the coating film of Invention II is used for a photoresist coating film (photosensitive layer), it is preferable that the coating film is one which is formed by applying the above-mentioned chemically amplifying type photoresist composition.

The resist coating film of Invention II is formed by applying the above-mentioned chemically amplifying type photoresist composition on a substrate such as a silicon wafer by a coating method such as spin coating and then drying. In the coating film are contained solid components such as the fluorine-containing polymer (A) having an acid-reactive group, the photoacid generator (B) and the additives.

The resist coating film of Invention II is usually a thin film having a coating thickness of not more than 1.0 $\mu m$, preferably a thin coating film of from 0.5 $\mu m$ to 0.1 $\mu m$.

Further it is preferable that the resist coating film of Invention II has a high transparency in a vacuum ultraviolet region, concretely has a molecular absorption coefficient at a wavelength of 157 nm of not more than 3.0 $\mu m^{-1}$, preferably not more than 1.5 $\mu m^{-1}$, further preferably not more than 1.0 $\mu m^{-1}$. Thus the coating film is preferable from the point that it can be used effectively on a lithography process using $F_2$ laser (157 nm) beam.

The resist coating film of Invention II can be applied similarly on various substrates which have been used for applying a resist. For example, any of a silicon wafer, a silicon wafer provided with an organic or inorganic reflection reducing film, a glass substrate and the like may be used. Particularly sensitivity and profile formation on the silicon wafer provided with an organic reflection reducing film are good.

Preparation Examples and Examples directly relating to Invention II are Preparation Examples 1 to 6, and Examples 1 to 9, 12 to 22, 25 to 35, 47, 62 to 75, 88 to 93 and 112 to 117, respectively.

The third invention (Invention III) relates to the chemically amplifying type photoresist composition containing a specific fluorine-containing polymer having an acid-reactive functional group as a binder like Invention II.

The chemically amplifying type photoresist comprises a resin (polymer) component and a photoacid generator and makes use of a catalytic action of an acid generated from the acid-generating agent by irradiation of energy rays. In the chemically amplifying type positive photoresist, an acid generated in its portion irradiated with energy rays is scattered by the following heat treatment (post-exposure bake: PEB) to carry out deprotection of an acid-labile or acid-degradable functional group of the resin, etc. and at the same time an acid is re-generated, thereby making the energy-irradiated portion soluble in alkali.

The chemically amplifying type positive resist is classified into two types of resists. One is a resist comprising an alkali-soluble resin component, an acid-generating agent and in addition, a dissolution inhibitor which has a functional group (protective group) which is dissociated or degraded due to action of an acid. The functional group of the dissolution inhibitor itself has an ability of inhibiting dissolution of the alkali-soluble resin but the resin becomes soluble in alkali after the functional group (protective group) is dissociated due to action of an acid. Another resist is one in which the resin component has a functional group (protective group) which is dissociated or degraded due to action of an acid and is insoluble or hadly soluble in alkali but becomes soluble in alkali after the functional group (protective group) is dissociated by an action of an acid.

A chemically amplifying type negative photoresist generally comprises a resin component which has a functional group capable of undergoing condensation reaction by an acid and is soluble in alkali, and in addition to the resin component, an acid-generating agent and a crosslinking agent.

In such a negative photoresist, an acid generated in the energy-irradiated portion thereof is scattered by the PEB treatment and acts on the functional group undergoing condensation by an acid in the resin component and on the crosslinking agent, thereby hardening the binder resin in the energy-irradiated portion and making the resin insoluble or hardly soluble in alkali.

The chemically amplifying type photoresist composition of Invention III can be used on the above-mentioned positive and negative photoresists and comprises:

(A) a fluorine-containing polymer having an acid-reactive functional group, (B) a photoacid generator, and (C) a solvent.

The inventors of the present invention have found that the specific fluorine-containing polymer (A) which has an acid-reactive group and does not have a heterocyclic structure has an especially high transparency against light in a vacuum ultraviolet region and excellent resist properties such as an etching resistivity, reactivity with an acid and solubility in a developing solution.

The fluorine-containing polymer (A) having an acid-reactive group for the chemically amplifying type photoresist composition of Invention III is a polymer represented by the formula III-(1):

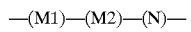   III-(1), in which

① the structural unit M1 is a structural unit derived from an ethylenic monomer having an acid-reactive group, ② the structural unit M2 is a structural unit having a fluorine-containing aliphatic ring structure in the polymer trunk chain, and ③ the structural unit N is a structural unit derived from a fluorine-containing ethylenic monomer copolymerizable with M1 and M2, when M1+M2 is assumed to be equal to 100% by mole, the percent by mole ratio M1/M2 is 1 to 99/1 to 99, and the polymer is a fluorine-containing polymer comprising from 1 to 99% by mole of the structural unit M1, from 1 to 99% by mole of the structural unit M2 and from 0 to 98% by mole of the structural unit N and having no polycyclic structure in its trunk chain and side chain, and is preferable from the point that transparency and dry etching resistivity can be imparted to the polymer by the structural unit M2 which has a fluorine-containing aliphatic ring structure in the polymer trunk chain.

Particularly it is preferable that the structural unit M1 is a structural unit derived from a fluorine-containing ethylenic monomer having an acid-reactive group. Namely, from the point that transparency and dry etching resistivity can be imparted more to the resist coating film, it is preferable that the structural unit M1 has not only the acid-reactive group but also fluorine atom or a fluorine-containing alkyl group.

The preferable structural unit M1 of the fluorine-containing polymer (A) having an acid-reactive group is M1-1 represented by the formula III-M1-1:

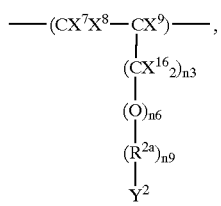

III-M1-1 wherein $X^7$, $X^8$, $X^9$ and $X^{16}$ are the same or different and each is H or F; $Y^2$ is an acid-reactive group; $R^{2a}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n6 and n9 are the same or different and each is 0 or 1; and n3 is 0 or an integer of 1 or 2.

The above-mentioned structural unit M1-1 may be either of the unit which has fluorine atom or a fluoroalkyl group or the unit which does not have fluorine atom or a fluoroalkyl group.

It is particularly preferable from the viewpoint of transparency and dry etching resistivity that any one of $X^7$, $X^8$, $X^9$ and $X^{16}$ is fluorine atom, or $R^{2a}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms.

Particularly preferable structural unit M1-1 is one represented by the formula M1-1a:

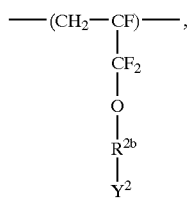

wherein $Y^2$ is an acid-reactive group and $R^{2b}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms.

Examples of the preferable monomer constituting the structural unit M1-1a are:

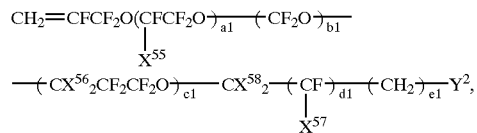

wherein a1+b1+c1 is from 0 to 30; d1 is 0 or 1; e1 is from 0 to 5; $X^{55}$ is F or $CF_3$; X56 and $X^{58}$ are H or F; $X^{57}$ is H, F or $CF_3$; when $X^{58}$ is assumed to be H, a1+b1+c1+d1 is not 0; $Y^2$ is as defined in the formula III-M1-1.

Examples thereof are:

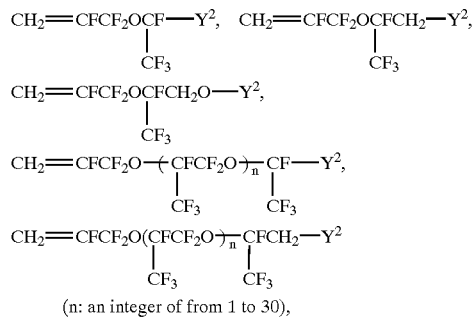

(n: an integer of from 1 to 30),

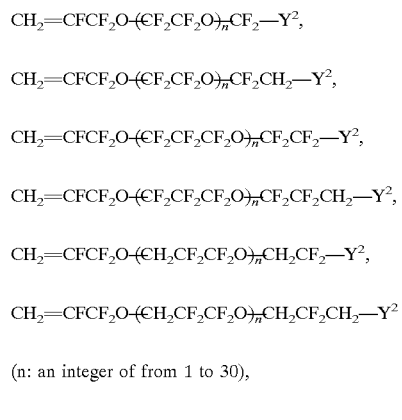

(n: an integer of from 1 to 30), $CH_2\!=\!CFCF_2O\text{-}(CF_2CF_2)_n\text{-}Y^2$, (v)

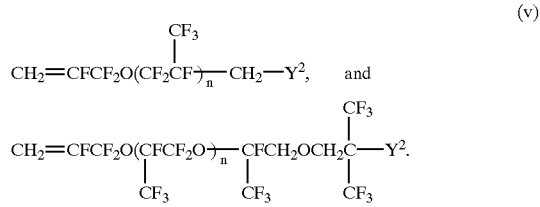

wherein n is from 0 to 30; and $Y^2$ is as defined in the formula III-M1-1.

Further example of the preferable structural unit M1-1 is M1-1b represented by:

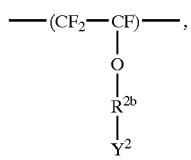

wherein $Y^2$ is an acid-reactive group and $R^{2b}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms.

Examples of the preferable monomer constituting the structural unit M1-1b are:

wherein a3+b3+c3 is from 0 to 30; d3 is 0, 1 or 2; e3 is from 0 to 5; $X^{63}$ and $X^{65}$ are F or $CF_3$; $X^{64}$ is H or F; $Y^2$ is as defined in the formula III-M1-1.

Examples thereof are:

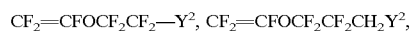

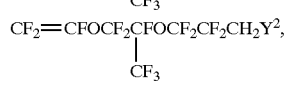

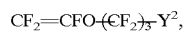

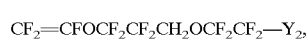

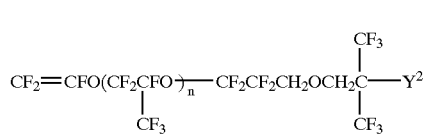

(vi)

and the like, wherein n is from 0 to 30; and $Y^2$ is as defined in the formula III-M1-1.

Examples of the preferable monomer constituting the structural unit M1-1 other than the examples of the above-mentioned formulae M1-1a and M1-1b are:

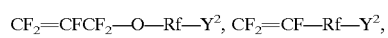

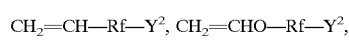

(Rf is the same as $R^{2a}$ of III-M1-1; and $Y^2$ is as defined in the formula III-M1-1)

and the like.

Concretely there are:

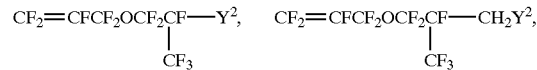

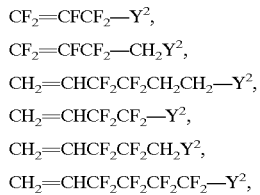

$CH_2=CHCF_2CF_2CF_2CH_2Y^2$, $CH_2=CH_2O-CH_2CF_2CF_2-Y^2$, $CH_2=CH_2OCH_2CF_2CF_2CH_2Y^2$ and the like, wherein $Y^2$ is as defined in the formula III-M1-1.

The structural unit M1 may be an ethylenic monomer not having fluorine atom. In that case, examples of the preferable ethylenic monomer constituting the M1 are:

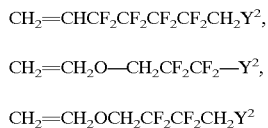

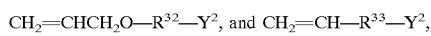

wherein $R^{30}$ to $R^{33}$ are divalent hydrocarbon groups, for example, a divalent alkylene group, a divalent alicyclic hydrocarbon without a polycyclic structure, a divalent aromatic hydrocarbon and a hydrocarbon group without a polycyclic structure having oxygen atom, nitrogen atom, sulfur or the like; $Y^2$ is as defined in the formula III-M1-1.

Examples thereof are:

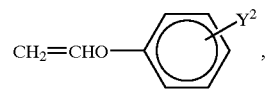

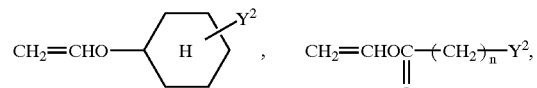

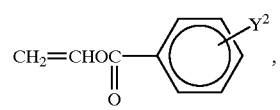

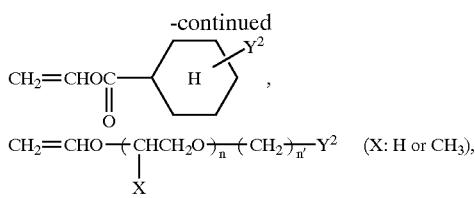

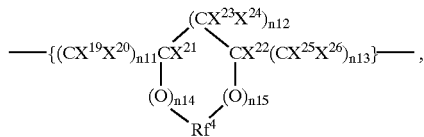

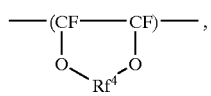

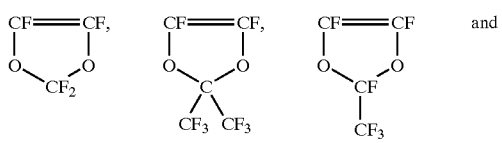

and the like, wherein n and n' are an integer of from 1 to 30; and $Y^2$ is as defined in the formula III-M1-1.

The structural unit M2 constituting the fluorine-containing polymer (A) having an acid-reactive group is a structural unit having a fluorine-containing aliphatic ring structure on its trunk chain, and example of the preferable structural unit M2 is M2-1 represented by the formula III-M2-1:

$$—\{(CX^{19}X^{20})_{n11}CX^{21} \begin{smallmatrix} (CX^{23}X^{24})_{n12} \\ CX^{22}(CX^{25}X^{26})_{n13} \end{smallmatrix}\}—,$$
$$(O)_{n14} \quad (O)_{n15}$$
$$Rf^4$$

III-M2-1 in which $X^{19}$, $X^{20}$, $X^{23}$, $X^{24}$, $X^{25}$ and $X^{26}$ are the same or different and each is H or F; $X^{21}$ and $X^{22}$ are the same or different and each is H, F, Cl or $CF_3$; $Rf^4$ is a fluorine-containing alkylene group having 1 to 10 carbon atoms or a fluorine-containing alkylene group having 2 to 10 carbon atoms and ether bond; n12 is 0 or an integer of from 1 to 3; n11, n13, n14 and n15 are the same or different and each is 0 or 1, Examples of the preferable structural unit M2-1 is a structural unit M2-1a represented by:

—(CF——CF)—,
   |      |
   O      O
    \\    /
     Rf⁴ wherein $Rf^4$ is a fluorine-containing alkylene group having 1 to 10 carbon atoms, Examples of the monomer constituting the structural unit M2-1a are:

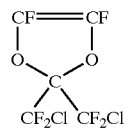

and

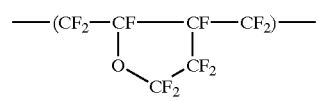

and the fluorine-containing polymer can be obtained by copolymerizing the monomer with the monomer constituting the structural unit M1.

It is preferable that another example of the structural unit M2-1 is the structural unit M2-1b:

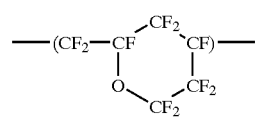

or the structural unit M2-1c:

—(CF₂—CF    CF₂ CF)—
        \\  /    
         O   CF₂
          \\ /
           CF₂

The monomer constituting the structural unit M2-1b and M2-1c is one obtained by cyclopolymerization using a diene compound of $CF_2{=}CFOCF_2CF_2CF{=}CF_2$ as a copolymerizable component.

Further examples of the preferable structural unit M2-1 are the structural unit M2-1d:

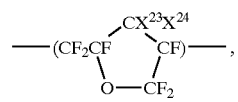

the structural unit M2-1e:

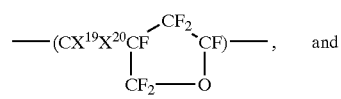, and the structural unit M2-1f:

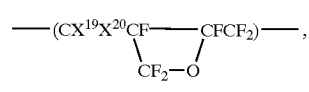

wherein $X^{19}$, $X^{20}$, $X^{23}$ and $X^{24}$ are H or F.

The structural units M2-1d, M2-1e and M2-1f are obtained by cyclopolymerization using a diene compound represented by $CF_2{=}CFOCF_2CF{=}CX^{19}X^{20}$, wherein $X^{19}$ and $X^{20}$ are H or F, and further are obtained by cyclopolymerization using a diene compound such as $CF_2{=}CFOCF_2CF{=}CF_2$ or $CF_2{=}CFOCF_2CF{=}CH_2$.

Further examples of the monomer constituting the fluorine-containing aliphatic ring structural unit are:

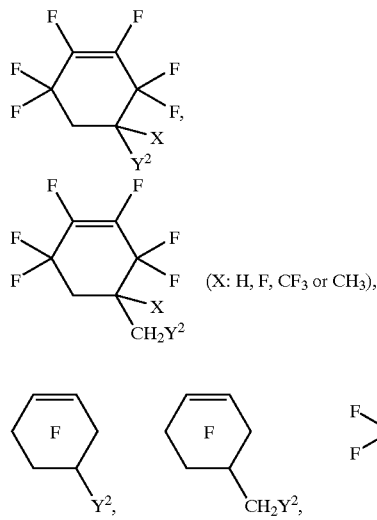

($Y^2$ is an acid-reactive group) and the like.

In the fluorine-containing polymer (A) having an acid-reactive group, the structural unit N is an optional component, and is selected from the structural units derived from the fluorine-containing ethylenic monomers copolymerizable with M1 and M2.

The preferable structural unit N is N-1 represented by the formula III-N-1:

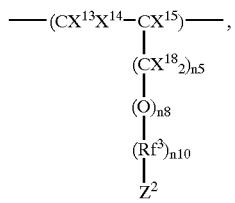

III-N-1 wherein $X^{13}$, $X^{14}$ and $X^{18}$ are the same or different and each is H or F; $X^{15}$ is H, F or $CF_3$; $Z^2$ is H, F or Cl; $Rf^3$ is the same or different and each is a fluorine-containing alkylene group having 1 to 20 carbon atoms, a fluorine-containing alkylene group having 2 to 100 carbon atoms and ether bond or a fluorine-containing arylene group having 3 to 20 carbon atoms; n5 is 0 or an integer of 1 or 2; n8 and n10 is the same or different and each is 0 or 1; provided that n10 is 0, at least one of $X^{13}$, $X^{14}$, $X^{18}$ and $Z^2$ is fluorine atom or $X^{15}$ is fluorine atom or $CF_3$.

The structural unit N-1 is a structural unit of a fluorine-containing monomer not having a functional group and is preferable since mechanical properties and glass transition temperature of the polymer can be adjusted according to purpose. Further the structural unit N-1 is a preferable component since a fluorine atom content of the whole polymer can be adjusted and transparency can be imparted to the polymer.

Further the preferable structural unit N-1 is N-1a represented by:

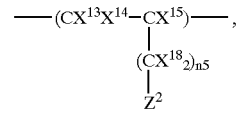

wherein $X^{13}$, $X^{14}$ and $X^{18}$ are the same or different and each is H or F; $X^{15}$ is H, F or $CF_3$; $Z^2$ is H, F or Cl; n5 is 0 or an integer of 1 or 2; at least one of $X^{13}$, $X^{14}$, $X^{18}$ and $Z^2$ is fluorine atom or $X^{15}$ is fluorine atom or $CF_3$.

Examples of the preferable monomers constituting the structural units N-1 and N-1a are:

$CF_2=CF_2$, $CF_2=CH_2$, $CF_2=CFCl$, $CF_2=CFCF_3$,

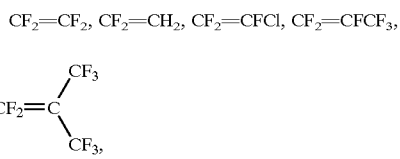

$CF_2=CFO(CF_2)_nF$ (n: from 1 to 5), $CH_2=C(CF_3)_2$, $CF_2=CFH$, $CF_2=CCl_2$,

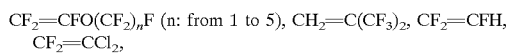

$CH_2=CF\text{-}(CF_2)_n\text{-}Z^2$, $CH_2=CHOCH_2\text{-}(CF_2)_n\text{-}Z^2$, $CH_2=CHO\text{-}CH_2\text{-}((CF_2)_n\text{-}Z^2)$, ($Z^2$ is H, F or Cl, n: from 1 to 10)

and the like.

The structural unit N may be a structural unit N-2 derived from a fluorine-containing ethylenic monomer having a functional group other than the functional group $Y^2$ of the structural unit M1.

The structural unit N-2 has a functional group $Z^1$ which undergoes neither dissociation nor degradation reaction by an acid but can impart a solubility, crosslinkability and adhesion to a substrate to the fluorine-containing polymer and can adjust them, and therefore is preferable as a structural unit for the fluorine-containing monomer.

Examples of the preferable monomer constituting the structural unit N-2 are:

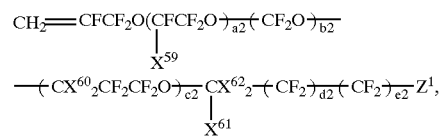

wherein a2+b2+c2 is from 0 to 30; d2 is 0 or 1; e2 is from 0 to 5; $X^{59}$ is F or $CF_3$; $X^{60}$ and $X^{62}$ are H or F; $X^{61}$ is H, F or $CF_3$; when $X^{61}$ and $X^{62}$ are assumed to be H, a2+b2+c2+d2+e2 is not 0; $Z^1$ is a functional group which is neither dissociated nor degraded by an acid.

Further there are:

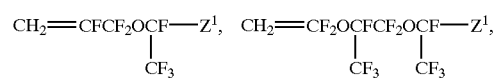

-continued

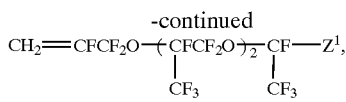

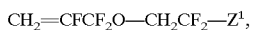

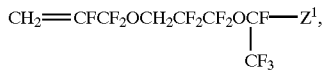

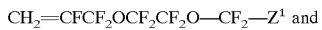

($Z^1$ is a functional group which is neither dissociated nor degraded by an acid)
and further there are:

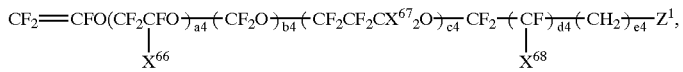

wherein a4+b4+c4 is from 0 to 30; d4 is 0, 1 or 2; e4 is from 0 to 5; $X^{66}$ and $X^{68}$ are F or $CF_3$; $X^{67}$ is H or F; $Z^1$ is a functional group which is neither dissociated nor degraded by an acid.
Further there are:

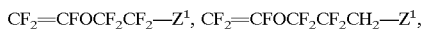

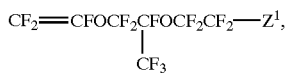

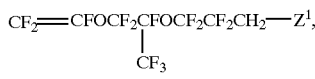

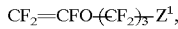

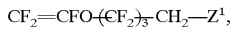

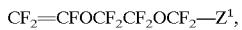

($Z^1$ is a functional group which is neither dissociated nor degraded by an acid)

and the like.
Further there are:

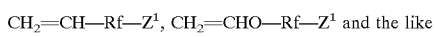

wherein Rf is a fluorine-containing alkylene group having 1 to 20 carbon atoms, a fluorine-containing alkylene group having 2 to 100 carbon atoms and ether bond or a fluorine-containing arylene group having 3 to 20 carbon atoms; and $Z^1$ is a functional group which is neither dissociated nor degraded by an acid.

Concretely there are:

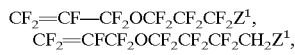

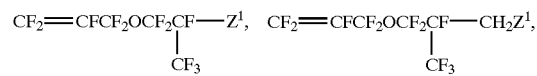

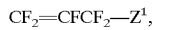

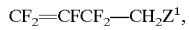

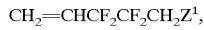

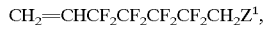

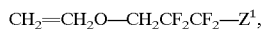

 and the like, wherein $Z^1$ is a functional group which is neither dissociated nor degraded by an acid.

The fluorine-containing base polymer material of the present invention to be used on a photoresist comprises a fluorine-containing polymer having the acid-reactive group $Y^2$. The acid-reactive group $Y^2$ is concretely an acid-labile or acid-degradable functional group or a functional group undergoing condensation by an acid.

① Acid-labile or Acid-degradable Functional Group:

The acid-labile or acid-degradable functional group is a functional group which can make the polymer soluble in alkaline developing solution due to action of an acid though the polymer is insoluble or hardly soluble in alkali before the reaction with an acid.

Examples thereof are those which have an ability of changing to —OH group, —COOH group, —$SO_3H$ group or the like due to action of an acid or cation, thereby causing the fluorine-containing polymer itself to be dissolved in alkali.

Therefore the polymer can be used as a base polymer for a positive resist. Examples of the acid-labile or acid-degradable functional group are:

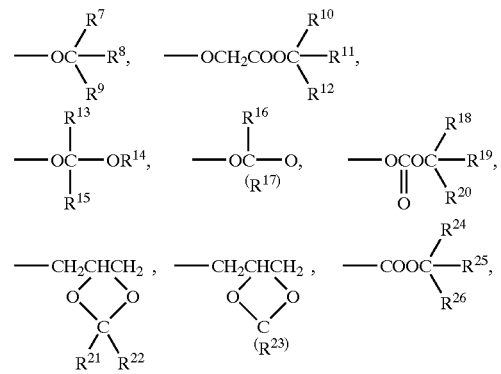

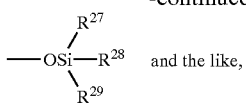 and the like, wherein $R^7$, $R^8$, $R^9$, $R^{10}$, $R^{11}$, $R^{12}$, $R^{14}$, $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or a hydrocarbon group having 1 to 10 carbon atoms; and $R^{17}$ and $R^{23}$ are a divalent hydrocarbon group having 2 to 10 carbon atoms.

More preferable examples are:

—OC(CH$_3$)$_3$, —OCH$_2$COOC(CH$_3$)$_3$,

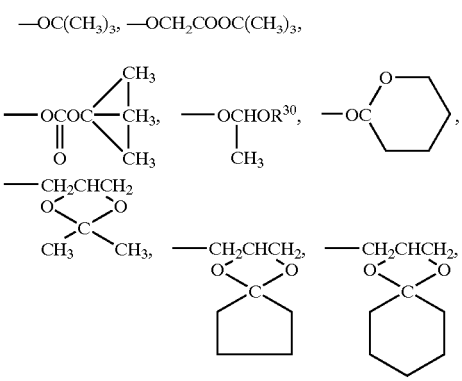

—COOC(CH$_3$)$_3$, —OSi(CH$_3$)$_3$ and the like,
wherein $R^{30}$ is an alkyl group having 1 to 10 carbon atoms.

The fluorine-containing polymers having the acid-labile or acid-degradable functional group can be used for the above-mentioned positive photoresist. The acid-labile or acid-degradable functional group is called the protective group as mentioned above. Though the fluorine-containing polymer (A) before the reaction is insoluble or hardly soluble in alkali, the functional group is dissociated or degraded by an acid generated from the photoacid generator (B) by irradiation of energy rays and functions to change the fluorine-containing polymer (A) to be soluble in alkali. Further an acid is generated also from the protecting group released by the degradation of the functional group in the fluorine-containing polymer (A), which has an effect of accelerating the degradation reaction.

In those fluorine-containing polymers having the acid-labile or acid-degradable functional group, various proportions of the structural units M1, M2 and N can be selected within the above-mentioned range depending on kind of the composition, intended function, kind of the functional group $Y^2$ and the like. For example, in order to make the fluorine-containing polymer soluble in alkali after the reaction with an acid, it is preferable that the structural unit M1 is present in an amount of from 5 to 100% by mole, preferably from 10 to 100% by mole, particularly preferably from 20 to 100% by mole, and that a total amount of the structural units M2 and N is from 0 to 95% by mole, preferably from 0 to 90% by mole, particularly preferably from 0 to 80% by mole.

② Functional Group Undergoing Condensation Reaction by an Acid:

The functional group undergoing condensation reaction by an acid enables the fluorine-containing polymer itself to be insoluble in an alkaline developing solution (or a solvent) due to action of an acid though the polymer is soluble in alkali (or the same solvent as mentioned above) before the reaction with the acid.

The functional group undergoing condensation reaction by an acid is concretely a functional group which causes self-condensation or poly-condensation due to action of an acid or cation or condensation reaction or poly-condensation reaction with a crosslinking agent due to action of an acid in the presence of the crosslinking agent, or a functional group which causes a change in polarity by rearrangement with an acid or cation (for example, pinacol rearrangement or carbinol rearrangement). In any case, the resultant polymer becomes insoluble in alkali (or a solvent).

Preferable functional groups undergoing condensation by an acid are selected from —OH, —COOH, —CN, —SO$_3$H, epoxy group and the like.

A crosslinking agent, when used, is not limited particularly, and can be selected optionally from conventional ones which have been used as a crosslinking agent for a negative resist.

Those fluorine-containing polymers having a functional group undergoing condensation reaction by an acid can be used for a negative photoresist. The functional group undergoing condensation reaction by an acid causes condensation or poly-condensation reaction or rearrangement reaction by an acid generated from the photoacid generator (B) by irradiation of energy rays, thereby causing a self-crosslinking reaction, rearrangement reaction in a molecule and crosslinking reaction with a crosslinking agent contained in the composition and making the fluorine-containing polymer (A) insoluble or hardly soluble in a developing solution (alkali or a solvent) though the fluorine-containing polymer (A) before the reaction is soluble in the developing solution.

Further it is particularly preferable that the functional group undergoing condensation reaction by an acid is one which can impart a function of making it possible to dissolve the polymer in a developing solution such as an alkali solvent before the reaction with an acid (for example, —COOH, —SO$_3$H, —OH or the like). However the functional group undergoing condensation reaction by an acid may be one which has only a function of causing a condensation reaction (crosslinking reaction) by an acid and making the polymer insoluble in the developing solution (—CN, epoxy group or the like). In that case, the polymer can be used as a negative photoresist by a combination with other functional group having a function of making the polymer soluble in the developing solution or by using the fluorine-containing polymer having a backbone structure capable of dissolving in the developing solution.

It is particularly preferable that the fluorine-containing polymer having the functional group undergoing condensation by an acid is a polymer soluble in an aqueous alkaline solution before the reaction with an acid, which makes it possible to carry out a developing process (dissolving process) in an aqueous system without using a solvent (particularly a flammable solvent) as a developing solution and is advantageous from the viewpoint of safety and environment.

In order to impart solubility in an aqueous alkaline solution, it is preferable that the structural unit M1 is present in an amount of from 5 to 100% by mole, preferably from 10 to 100% by mole, particularly preferably from 20 to 100% by mole, and that a total amount of the structural units M2 and N is from 0 to 95% by mole, preferably from 0 to 90% by mole, particularly preferably from 0 to 80% by mole.

In the fluorine-containing polymer having a functional group undergoing condensation by an acid, various proportions of the structural unit M1, M2 and N can be selected within the above-mentioned range depending on kind of the composition, intended functions, kind of the functional group $Y^2$, etc. For example, in order to make the fluorine-containing polymer soluble in alkali before the reaction with an acid, it is preferable that the structural unit M1 is present in an amount of from 5 to 100% by mole, preferably from 10 to 100% by mole, particularly preferably from 20 to 100% by mole and a total amount of the structural units M2 and N is from 0 to 95% by mole, preferably from 0 to 90% by mole, particularly preferably from 0 to 80% by mole.

A number average molecular weight of the fluorine-containing polymer (A) having an acid-reactive group can be selected within the range of from 1,000 to 1,000,000 depending on application, purpose and form thereof at use, and is preferably from 3,000 to 700,000, more preferably from about 5,000 to about 500,000. When the molecular weight is too low, heat resistance and mechanical properties of the obtained polymer coating film tends to become insufficient, and a too high molecular weight tends to become disadvantageous from the viewpoint of processability. Particularly in case of forming a thin coating film by using the composition comprising the polymer in the form of a coating material, a too high molecular weight is disadvantageous from the viewpoint of film forming property. The molecular weight is preferably not more than 200,000, particularly preferably not more than 100,000.

In the fluorine-containing polymer (A) having an acid-reactive group, various combinations of M1, M2 and N can be selected from the above-mentioned examples depending on intended application, physical properties (particularly glass transition temperature, melting point, etc.) and functions (transparency, dry etching resistivity).

Usually the function of dissociation or degradation by an acid and crosslinkability (namely a function of changing functions and characteristics after the degradation) is given to M1, and other functions and characteristics are controlled by the structural unit M2 and further by the structural unit N if necessary. A balance of those functions and characteristics are adjusted by selecting the respective kinds and proportions of M1, M2 and N.

Those polymers having a fluorine-containing aliphatic ring structure on a trunk chain thereof have a bulky structure, a large free area and a high fluorine content, and therefore have characteristics such as:

high glass transition temperature and good mechanical properties,
good heat resistance,
high transparency in a wide wavelength range,
low refractive index and
good dry etching resistivity, and are preferred. In addition, those polymers are preferable because there can be obtained a function of the functional group $Y^2$ reacting with an acid and the following functions to be imparted to the fluorine-containing polymer after the reaction with an acid:

solubility and affinity for an aqueous alkali solution,
ability of dissolving in a solvent and hydrophilic property,
adhesion to a substrate,
crosslinkability and the like. The polymers are suitable as a polymer for a resist, particularly for a $F_2$ resist.

For example, in case of aiming at a polymer having transparency in a vacuum ultraviolet region for resist applications, particularly for $F_2$ resist applications, it is preferable to make a content of fluorine atoms in the whole polymer including M1, M2 and N as high as possible, namely not less than 30% by weight, preferably not less than 50% by weight, particularly preferably not less than 60% by weight. The thus-obtained fluorine-containing polymer has a good heat resistance, is non-crystalline and has a high transparency in a wide range of wavelength including a vacuum ultraviolet region. It was found that particularly those fluorine-containing polymers having an aliphatic ring structure on a trunk chain thereof have a high transparency in a vacuum ultraviolet region. For that reason, those polymers are useful for resist applications, particularly $F_2$ resist applications.

On the other hand, in order to exhibit the excellent characteristics of the above-mentioned cyclic structure, it is preferable that the structural unit M2 is present in an amount of from 30 to 99% by mole, preferably from 40 to 99% by mole, particularly preferably from 60 to 99% by mole, and a total amount of the structural units M1 and N is from 1 to 70% by mole, preferably from 1 to 60% by mole, particularly preferably from 1 to 40% by mole.

Any of the fluorine-containing polymers to be used for the chemically amplifying type resist composition of Invention III are characterized by having the acid-reactive functional group $Y_2$. For introducing those functional groups into the fluorine-containing polymers, various methods can be used. Generally there can be used:

① a method of previously synthesizing a monomer having the functional group $Y^2$ and then polymerizing,
② a method of once synthesizing a polymer having another functional group and then converting the functional group by high molecular reaction, thus introducing the functional group $Y^2$ into the polymer or the like method.

For example, as an example for introducing an acid-labile or acid-degradable functional group by the method ②, there can be used a method of once preparing a polymer having OH group and then reacting the polymer with a vinyl ether such as ethyl vinyl ether or dihydropyran in the presence of an acid such as toluenesulfonic acid, thus introducing a functional group (ketals) decomposable by an acid; a method of reacting a fluorine-containing polymer having 1,2-diol with ketone to obtain a functional group decomposable by an acid (cyclic acetal compound); or the like method.

The fluorine-containing polymer (A) which is used for the composition of the present invention can be prepared by (co)polymerizing, by various known methods, the monomers corresponding to the respective structural units, namely the ethylenic monomer (M1) having the functional group $Y^2$, a diene compound or a cyclic monomer (M2) forming a ring structure and the fluorine-containing ethylenic monomer corresponding to the optional component (N) if necessary. For the polymerization, radical polymerization, anion polymerization, cation polymerization and the like can be used. Among them, the radical polymerization method is preferably employed from the viewpoint that radical polymerizability of each monomer for obtaining the polymers of the present invention is good, control of quality such as components and molecular weight is easy and production in an industrial scale is easy. Namely, for initiating the polymerization, there is no restriction with respect to means for polymerization as far as the polymerization proceeds radically. The polymerization is initiated, for example, by an organic or inorganic radical polymerization initiator, heat, light, ionizing radiation or the like. The polymerization can be carried out by solution polymerization, bulk polymerization, suspension polymerization, emulsion polymerization or the like. Also the molecular weight is controlled by contents of monomers to be used for the polymerization, a content of the polymerization initiator, a content of a chain transfer agent and temperature. The components of the prepared polymer can be controlled by the starting monomer components.

In the chemically amplifying type resist composition of Invention III, the photoacid generator (B) is a compound which generates an acid or cation by irradiating the compound itself or the resist composition containing the compound with radioactive rays. The photoacid generator (B) can be used in a mixture of two or more of those compounds.

The photoacid generators as exemplified in the chemically amplifying type resist composition disclosed in Invention I can be used preferably as the photoacid generator (B) for the chemically amplifying type resist composition of Invention III.

With respect to the content of the photoacid generator (B) of the chemically amplifying type resist composition of Invention III, the same content as mentioned in the chemically amplifying type resist composition of Invention I can be used preferably.

Also to the photoresist composition of Invention III may be added an organic base which can act as a base against the acid generated from the photoacid generator.

As the organic base to be added, the same bases as raised in the chemically amplifying type resist composition of Invention I can be used preferably.

In the addition of the organic base, the same adding amount as in the chemically amplifying type resist composition of Invention I can be used preferably.

The addition of the organic base imparts the same effect as in the chemically amplifying type resist composition of Invention I to the resist composition of Invention III.

Also in the chemically amplifying type resist composition of the present invention, when a negative resist composition is prepared using the fluorine-containing polymer (A) having a functional group undergoing condensation by an acid, a crosslinking agent may be used as the case demands.

The crosslinking agent is not limited particularly, and those raised in the chemically amplifying type resist composition of Invention I can be used preferably.

With respect to the content of the crosslinking agent in the photoresist composition (particularly negative type) of the present invention, the same amount as described in the chemically amplifying type resist composition of Invention I can be used preferably.

To the photoresist composition of the present invention can be added various additives which have been used in the field of photoresist such as a dissolution inhibitor, sensitizer, dye, adhesion betterment material and water storage material.

Examples of the additives which can be used preferably are the same as raised in the chemically amplifying type resist composition of Invention I.

Those additives can be used in the same amounts as in the chemically amplifying type resist composition of Invention I.

In the chemically amplifying type photoresist composition of Invention III, the solvent (C) is one which can dissolve the fluorine-containing polymer (A) having an acid-reactive functional group, the photoacid generator (B) and the above-mentioned various additives, and is not limited particularly as far as good coatability (surface smoothness, uniformity of coating thickness and the like) can be obtained.

Examples of the solvent (C) which can be used preferably are the same as raised in the chemically amplifying type resist composition of Invention I.

The proportion of the solvent (C) to be used preferably is the same as in the chemically amplifying type resist composition of Invention I.

The chemically amplifying type resist composition of Invention III is subjected to a resist pattern formation of conventional photoresist technology. The pattern formation method to be applied preferably is the same as described in the chemically amplifying type resist composition of Invention I.

It has been found that by using the chemically amplifying type resist composition of the present invention, a resist coating film (photosensitive layer) having a high transparency even in a vacuum ultraviolet region could be obtained. The resist composition of Invention III can be preferably used particularly for a photolithography process using a $F_2$ laser (wavelength of 157 nm) which is under development aiming at a technology node of 0.1 μm.

The Invention III also relates to a coating film obtained by applying, on a substrate, the composition comprising the fluorine-containing polymer having an acid-reactive functional group.

The coating film of Invention III is obtained by applying the fluorine-containing polymer which has an acid-reactive functional group and is high in transparency against light in a vacuum ultraviolet region.

The fluorine-containing polymer having an acid-reactive functional group for the coating film of Invention III has a molecular absorption coefficient at 157 nm of not more than 3.0 $\mu m^{-1}$, preferably not more than 1.5 $\mu m^{-1}$, more preferably not more than 1.0 $\mu m^{-1}$.

The coating film obtained by applying the fluorine-containing polymer having a high transparency in a vacuum ultraviolet region on a substrate is naturally useful as a resist coating film (photosensitive layer) in a photolithography process using a $F_2$ laser, and in addition, is preferable because it can be used for a pellicle for $F_2$ lithography, a reflection reducing film for optical parts such as lens and silicon wafer, a non-tacky stain-proofing film for lens and peripheral optical parts, etc.

The coating film of Invention III can be used on various substrates according to purpose and application. Particularly in applications requiring transparency, namely in optical applications, the coating film can be applied on inorganic substrates such as a silicon wafer, glass, LiF, $CaF_2$ and $MgF_2$, transparent resins such as acrylic resin, triacetyl cellulose resin and polycarbonate resin, and other metallic substrates.

The coating thickness can be widely selected depending on purpose and application. In case of applications requiring transparency, it is preferable that the coating thickness is as thin as not more than 1.0 μm, preferably not more than 0.5 μm, more preferably not more than 0.3 μm.

Further when the coating film of Invention III is used for a photoresist coating film (photosensitive layer), it is preferable that the coating film is one which is formed by applying the above-mentioned chemically amplifying type photoresist composition.

The resist coating film of Invention III is formed by applying the above-mentioned chemically amplifying type photoresist composition on a substrate such as a silicon wafer by a coating method such as spin coating and then drying. In the coating film are contained solid components such as the fluorine-containing polymer (A) having an acid-reactive group, the photoacid generator (B) and the additives.

The resist coating film of Invention III usually has a coating thickness of as thin as not more than 1.0 μm, preferably a thin coating thickness of from 0.5 μm to 0.1 μm.

Further it is preferable that the resist coating film of Invention III has a high transparency in a vacuum ultraviolet region, concretely has a molecular absorption coefficient at a wavelength of 157 nm of not more than 3.0 $\mu m^{-1}$, preferably not more than 1.5 $\mu m^{-1}$, further not more than 1.0 $\mu m^{-1}$. Thus the coating film is preferable from the point that it can be used effectively on a lithography process using a $F_2$ laser (157 nm).

The resist coating film of the present invention can be applied similarly on various substrates which have been used for applying a resist. For example, any of a silicon wafer, a silicon wafer provided with an organic or inorganic reflection reducing film, a glass substrate and the like may be used. Particularly sensitivity and profile formation on the silicon wafer provided with an organic reflection reducing film are good.

Examples directly relating to Invention III are Examples 10, 11, 23 and 24.

The fourth invention (Invention IV) relates to the chemically amplifying type photoresist composition containing a specific fluorine-containing polymer having an acid-reactive functional group as a binder.

The chemically amplifying type photoresist composition comprises a resin (polymer) component and a photoacid generator and makes use of a catalytic action of an acid generated from the acid-generating agent by irradiation of energy rays. In the chemically amplifying type positive photoresist, an acid generated in its portion irradiated with energy rays is scattered by the following heat treatment (post-exposure bake: PEB) to carry out deprotection of an acid-labile or acid-degradable functional group of the resin, etc. and an acid is re-generated, thereby making the energy-irradiated portion soluble in alkali.

The chemically amplifying type positive resist is classified into two types of resists. One is a resist comprising an alkali-soluble resin component, an acid-generating agent and in addition, a dissolution inhibitor having a functional group (protective group) which is dissociated or degraded due to action of an acid. The functional group of the dissolution inhibitor itself has an ability of inhibiting dissolution of the alkali-soluble resin but the resin becomes soluble in alkali after the functional group (protective group) is dissociated due to action of an acid. Another resist is one in which the resin component has a functional group (protective group) which is dissociated or degraded due to action of an acid and is insoluble or hardly soluble in alkali but becomes soluble in alkali after the functional group (protective group) is dissociated due to action of an acid.

The chemically amplifying type photoresist composition of Invention IV can be used on the above-mentioned positive photoresist and comprises:

(A) a fluorine-containing polymer having an acid-labile or acid-degradable functional group, (B) a photoacid generator, and (C) a solvent.

The inventors of the present invention have found that the specific fluorine-containing polymer (A) which comprises the fluorine-containing ethylenic monomer having the specific acid-labile or acid-degradable group and the alicyclic monomer has an especially high transparency against light in a vacuum ultraviolet region and excellent resist properties such as etching resistivity, reactivity with an acid and solubility in a developing solution.

The fluorine-containing polymer having an acid-reactive group of the chemically amplifying type photoresist composition of Invention IV is a fluorine-containing polymer represented by the formula IV-(1):

—(M1)—(M2)—(M3)—(N)—     IV-(1), in which

① the structural unit M1 is a structural unit derived from a fluorine-containing ethylenic monomer having a functional group which is dissociated or degraded by an acid and is converted to carboxyl group by a reaction with an acid, ② the structural unit M2 is a structural unit derived from an alicyclic monomer, ③ the structural unit M3 is a structural unit derived from a fluorine-containing ethylenic monomer, and ④ the structural unit N is a structural unit derived from an ethylenic monomer copolymerizable with M1, M2 and M3, when M1+M2+M3 is assumed to be equal to 100% by mole, the percent by mole ratio M1/M2/M3 is 1 to 98/1 to 98/1 to 98, and the polymer comprises from 1 to 98% by mole of the structural unit M1, from 1 to 98% by mole of the structural unit M2, from 1 to 98% by mole of the structural unit M3 and from 0 to 97% by mole of the structural unit N.

The polymer is characterized by having the structural unit M1 derived from a specific ethylenic monomer having the both of a functional group which is degraded due to action of an acid and converted to carboxyl group among the acid-labile or acid-degradable functional groups and fluorine atom or fluoroalkyl group. It was found that by the mentioned characteristic, not only a highly sensitive positive resist can be obtained by making use of good solubility of carboxyl group in an aqueous alkali solution (developing solution) but also transparency in a vacuum ultraviolet region becomes good by an effect of fluorine atom or fluoroalkyl group as compared with a conventional structural unit of acrylic monomer, and thus the polymer is advantageous for use in a $F_2$ resist.

Also a resist coating film having a good dry etching resistivity is obtained since the polymer comprises the structural unit (M2) derived from the alicyclic monomer.

Further it was found that transparency can be imparted and dry etching resistivity can be improved by the structural unit M3 of the fluorine-containing ethylenic monomer contained as an essential component.

Namely, since the fluorine-containing polymer comprises the structural unit M1 of the fluorine-containing ethylenic monomer having the acid-labile or acid-degradable functional group, the structural unit M2 of the alicyclic monomer and the structural unit M3 of the fluorine-containing ethylenic monomer, there can be obtained functions required for a resist such as transparency in a vacuum ultraviolet region, dry etching resistivity, sensitivity to exposed light and solubility in a developing solution.

Next, each structural unit is explained below.

The first of the preferable fluorine-containing polymer (A) having an acid-reactive group which is dissociated or degraded by an acid is a fluorine-containing acrylic polymer, in which the structural unit M1 is M1-1 represented by the formula IV-M1-1:

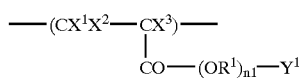
                                                                IV-M1-1 wherein $X^1$ and $X^2$ are the same or different and each is H or F; $X^3$ is the same or different and each is H, Cl, $CH_3$, F or $CF_3$; $Y^1$ is a functional group which is dissociated or degraded by an acid and is converted to carboxylic group by a reaction with an acid; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n1 is 0 or 1; provided that n1 is 0 or fluorine atom is not contained in $R^1$, at least one of $X^1$ and $X^2$ is fluorine atom or $X^3$ is fluorine atom or $CF_3$.

Namely, M1-1 is a fluorine-containing acrylic monomer having fluorine atom or fluoroalkyl group on its trunk chain and/or side chain and is a structural unit having a functional group which is converted to carboxyl group by a reaction with an acid.

From the viewpoint of good polymerizability, particularly transparency and dry etching resistivity improved as compared with conventional acrylic polymer and further from the viewpoint of heat resistance and mechanical properties, particularly preferred is M1-1a represented by:

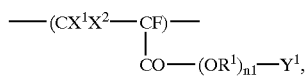

wherein $X^1$ and $X^2$ are the same or different and each is H or F; $Y^1$ is a functional group which is dissociated or degraded by an acid and is converted to carboxylic group by a reaction with an acid; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n1 is 0 or 1.

Further preferred example is M1-1b represented by:

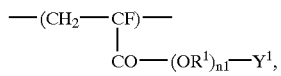

wherein $Y^1$ is as defined in the formula IV-M1-1; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n1 is 0 or 1.

M1-1, M1-1a and M1-1b may contain or may not contain $—OR^1—$ therein. When $—OR^1—$ is contained, $R^1$ may be selected from the above-mentioned divalent hydrocarbon groups and fluorine-containing alkylene groups. Preferred examples are divalent hydrocarbons, and concretely there are:

$—(CH_2)_n—$ (n is an integer of from 1 to 10)

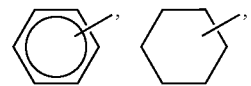

$(CH_2CH_2O)_n CH_2CH_2—$,

(n is 0 or an integer of from 1 to 5)

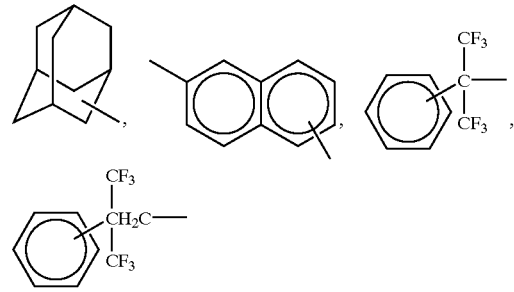

and the like.

Provided that when $—OR^1—$ is not contained or fluorine atom is not contained in $R^1$, fluorine atom or a group having fluorine is contained in any one of $X^1$, $X^2$ and $X^3$ of the above-mentioned structural unit M-1-1.

Examples of the acrylic monomer for the structural unit M1-1, M1-1a and M1-1b (hereinafter represented by M1 unless otherwise noted) having an acid-labile or acid-degradable functional group $Y^1$ are:

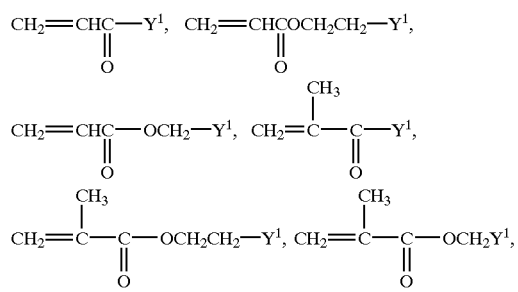

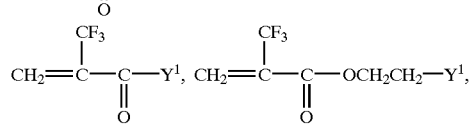

(i)

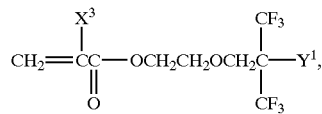

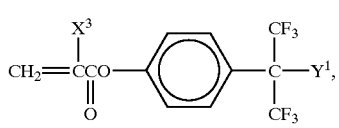

(ii)

and the like, wherein $X^3$ is H, F, $CH_3$ or $CF_3$) and $Y^1$ is as defined in the formula IV-M1-1.

Among the above-mentioned examples, the monomers represented by the formulae (i) and (ii) are compounds which have not been disclosed in any pamphlets and patent publications, and the polymers obtained therefrom are also compounds which have not been disclosed in any pamphlets and patent publications.

In the fluorine-containing polymer (A) having an acid-labile or acid-degradable functional group, the second of the preferable structural unit M1 is a structural unit derived from a fluorine-containing allyl monomer or a fluorine-containing vinyl monomer.

The preferable structural unit M1 is M1-2 represented by the formula IV-M1-2:

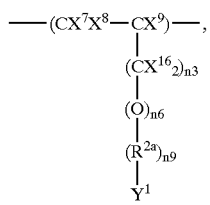

IV-M1-2 wherein $X^7$, $X^8$, $X^9$ and $X^{16}$ are the same or different and each is H or F; $Y^1$ is a functional group which is dissociated or degraded by an acid and is converted to carboxyl group by a reaction with an acid; $R^{2a}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n6 and n9 are the same or different and each is 0 or 1; and n3 is 0, 1 or 2; provided that n9 is 0 or $R^{2a}$ does not have fluorine atom, any one of $X^7$, $X^8$, $X^9$ and $X^{16}$ has fluorine atom.

Namely, the structural unit M1-2 is a structural unit which is derived from an allyl, allyl ether, vinyl or vinyl ether monomer having fluorine atom or fluoroalkyl group on its trunk chain or side chain and has a functional group which is converted to carboxyl group by a reaction with an acid. The structural unit M1-2 is preferred from the point that the fluorine atom content can be increased, transparency, particularly transparency in a vacuum ultraviolet region can be enhanced and further dry etching resistivity can be enhanced.

In the above-mentioned structural unit M1-2, it is particularly preferable from the viewpoint of transparency that $R^{2a}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms (provided that n9 is 1).

Particularly preferable structural unit M1-2 is M1-2a represented by:

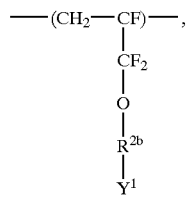

wherein $R^{2b}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; $Y^1$ is a functional group which is dissociated or degraded by an acid and is converted to carboxyl group by a reaction with an acid. The structural unit M1-2a is preferred from the point that copolymerizability with various other monomers such as a fluorine-containing ethylenic monomer is good and transparency of the polymer, particularly transparency in a vacuum ultraviolet region can be improved, and it is further preferable from the viewpoint of transparency that $R^{2b}$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms.

Examples of the preferable monomer constituting the structural unit M1-2a are:

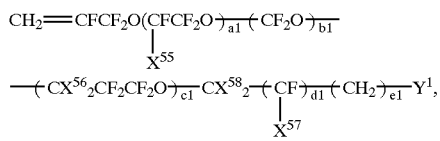

wherein a1+b1+c1 is from 0 to 30; d1 is 0 or 1; e1 is from 0 to 5; $X^{55}$ is F or $CF_3$; $X^{56}$ and $X^{58}$ are H or F; $X^{57}$ is H, F or $CF_3$; when $X^{58}$ is assumed to be H, a1+b1+c1+d1 is not 0; $Y^1$ is as defined in the formula IV-M1-2.

Further there are:

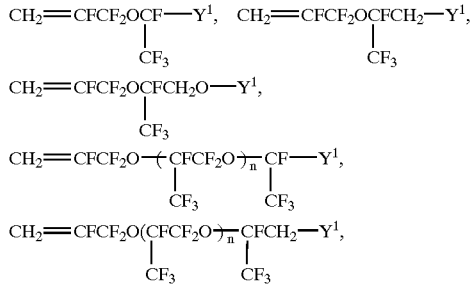

(n: an integer of from 1 to 30; $Y^1$ is as defined in the formula IV-M1-2)

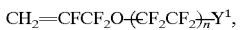

(n: an integer of from 1 to 30; $Y^1$ is as defined in the formula IV-M1-2)

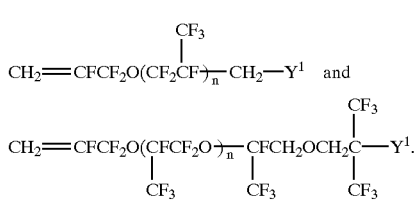
(iii)

(n is from 0 to 30; $Y^1$ is as defined in the formula IV-M1-2).

Further examples of the other preferable structural unit M1-2 are M1-2b represented by:

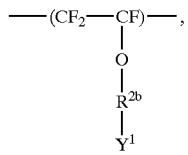

wherein $R^{2b}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms and $Y^1$ is a functional group which is dissociated or degraded by an acid and is converted to carboxyl group by a reaction with an acid. The structural unit M1-2b is preferred from the point that copolymerizability with other fluorine-containing ethylenic monomer is good and transparency of the polymer, particularly transparency in a vacuum ultraviolet region can be improved, and it is further preferable from the viewpoint of transparency that $R^b$ is a fluorine-containing alkylene group having 1 to 20 carbon atoms, a fluorine-containing alkylene group having 2 to 100 carbon atoms and ether bond or a fluorine-containing arylene group having 3 to 20 carbon atoms.

Examples of the preferable monomer constituting the structural unit M1-2b are:

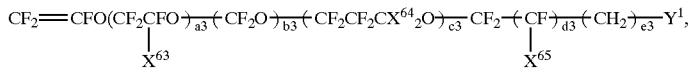

wherein a3+b3+c3 is from 0 to 30; d3 is 0, 1 or 2; e3 is from 0 to 5; $X^{63}$ and $X^{65}$ are F or $CF_3$; $X^{64}$ is H or F; $Y^1$ is as defined in the formula IV-M1-2).

Further there are:

$CF_2=CFOCF_2CF_2-Y^1$, $CF_2=CFOCF_2CF_2CH_2Y^1$,

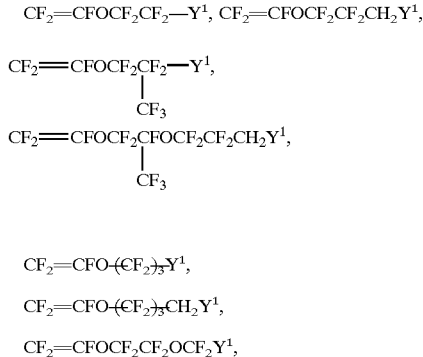

$CF_2=CFOCF_2CF_2OCF_2CH_2Y^1$, $CF_2=CFOCF_2CF_2CH_2OCF_2CF_2-Y^1$, $CF_2=CFOCF_2CF_2CH_2OCF_2CF_2CH_2Y^1$, ($Y^1$ is as defined in the formula IV-M1-2)

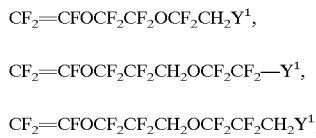
(iv)

(n is from 0 to 30; $Y^1$ is as defined in the formula IV-M1-2) and the like.

Among the above-mentioned examples, the monomers represented by the formulae (iii) and (iv) are compounds which have not been disclosed in any pamphlets and patent publications, and the polymers obtained therefrom are also compounds which have not been disclosed in any pamphlets and patent publications.

Examples of the preferred monomer constituting the structural unit M1-2 other than the examples raised in the above-mentioned formulae M1-2a and M1-2b are, for instance:

$CF_2=CFCF_2-O-Rf-Y^1$, $CF_2=CF-Rf-Y^1$, $CH_2=CH-Rf-Y^1$, $CH_2=CHO-Rf-Y^1$, (Rf is the same as $R^{2b}$ of M1-2b; $Y^1$ is as defined in the formula IV-M1-2)

and the like.

Concretely there are:

$CF_2=CF-CF_2OCF_2CF_2Y^1$,
$CF_2=CFCF_2OCF_2CF_2CF_2CH_2Y^1$,

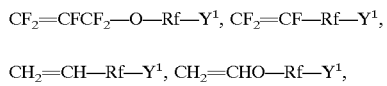

$CF_2=CFCF_2-Y^1$, $CF_2=CFCF_2-CH_2Y^1$, $CH_2=CHCF_2CF_2CH_2CH_2-Y^1$, $CH_2=CHCF_2CF_2-Y^1$, $CH_2=CHCF_2CF_2CH_2Y^1$, $CH_2=CHCF_2CF_2CF_2CF_2-Y^1$, $CH_2=CHCF_2CF_2CF_2CF_2CH_2Y^1$, $CH_2=CHO-CH_2CF_2CF_2-Y^1$,
$CH_2=CHOCH_2CF_2CF_2CH_2-Y^1$, ($Y^1$ is as defined in the formula IV-M1-2) and the like.

In the fluorine-containing polymer (A) having an acid-labile or acid-degradable functional group, the structural unit M2 is a structural unit having an aliphatic ring structure, and may be a structural unit having a ring structure on its trunk chain or side chain. Such a ring structure is preferred from the point that a good dry etching resistivity can be imparted to the fluorine-containing polymer (A) having an acid-labile or acid-degradable functional group.

Particularly preferred is the structural unit having a ring structure on its trunk chain from the viewpoint of dry etching resistivity since a glass transition temperature of the polymer can be set high.

Examples of the monomer having a ring structure on its trunk chain are:
Alicyclic Hydrocarbons:

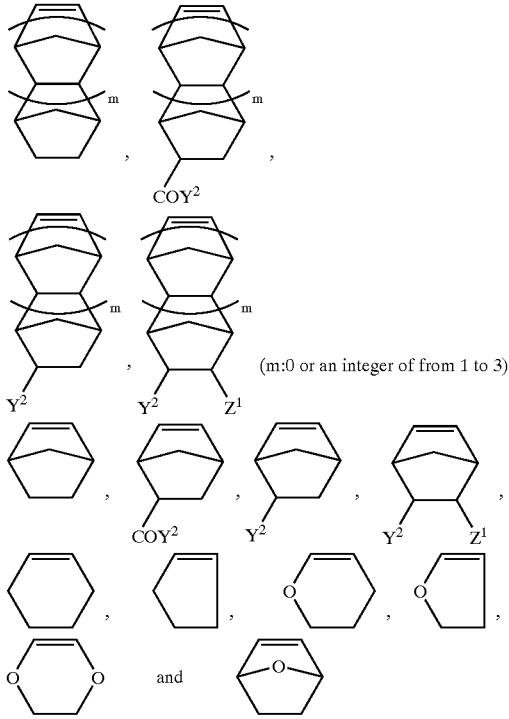

wherein $Y^2$ is an acid-reactive functional group; and $Z^1$ is a functional group which is not degraded by an acid. Fluorine-containing Alicyclic Monomers Represented by the Formula (9):

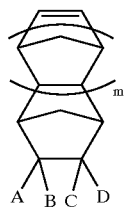

wherein A, B, C and D are the same or different and each is H, F, an alkyl group having 1 to 10 carbon atoms or a fluorine-containing alkyl group having 1 to 10 carbon atoms; m is 0 or an integer of from 1 to 3; any one of A, B, C or D has fluorine atom.

Examples thereof are:

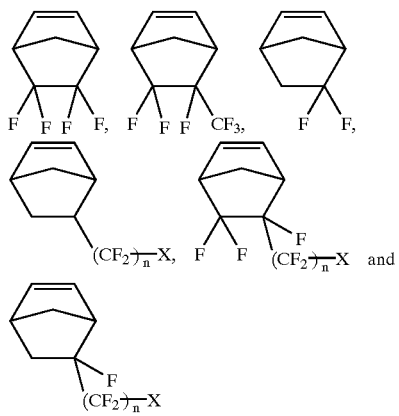

wherein n is from 1 to 10, X is H, F or Cl.
In addition, there are:

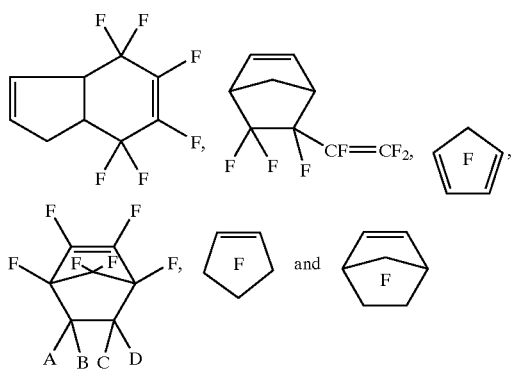

wherein A, B, C and D are H, F, an alkyl group having 1 to 10 carbon atoms or a fluorine-containing alkyl group having 1 to 10 carbon atoms and the like.

Fluorine-containing Alicyclic Monomers having a Functional Group:

Examples thereof are novel fluorine-containing monomers represented by:

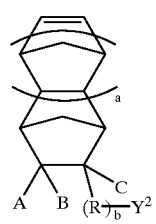

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that b is 0 or R does not have fluorine atom, any one of A, B and C is fluorine atom or a fluorine-containing alkyl group.

It is preferable that any one of A, B and C is fluorine atom, or when A, B and C do not have fluorine atom, a fluorine content of R is not less than 60% by weight. Further it is preferable that R is a perfluoro alkylene group from the point that transparency can be imparted to the polymer.

Examples thereof are:

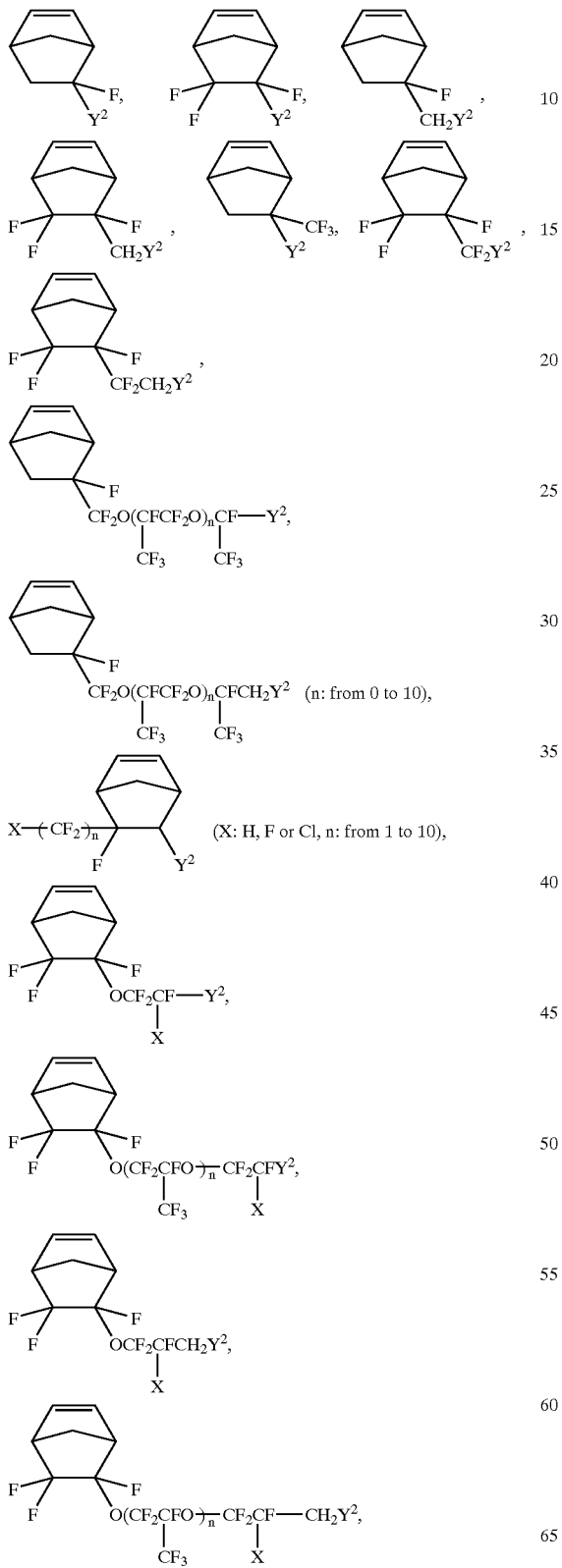

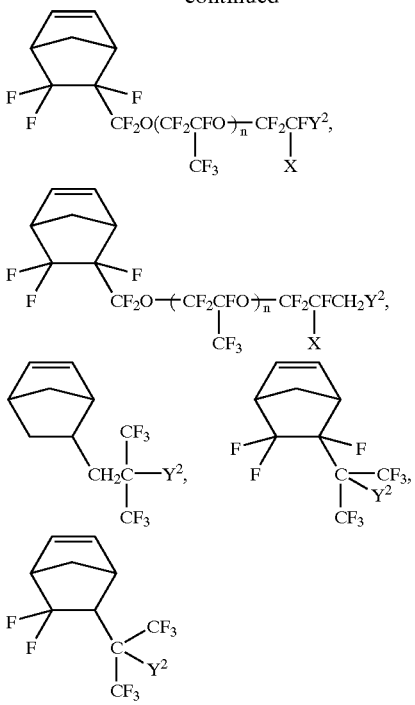

(n: from 0 to 10, X: F or $CF_3$; $Y^2$ is an acid-reactive functional group) and the like.

Also there are novel fluorine-containing monomers represented by the formula (11):

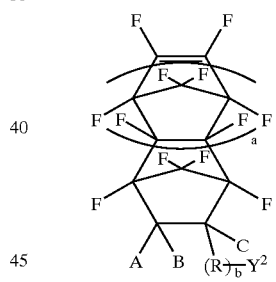

wherein A, B and C are H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group.

Examples thereof are preferably those having norbornene backbone such as:

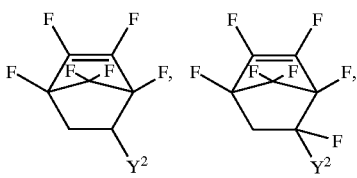

-continued
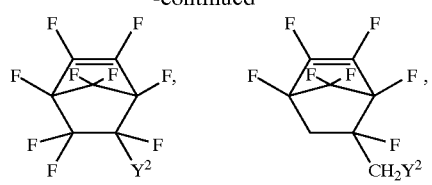
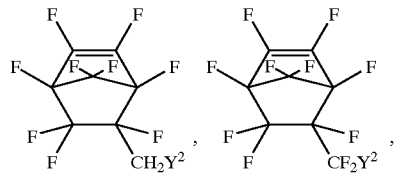
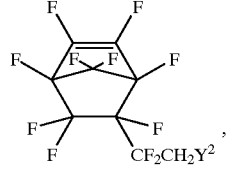
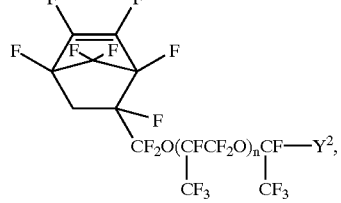
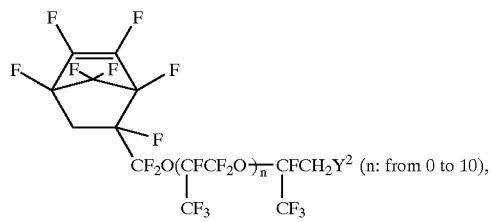
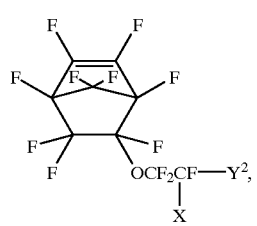
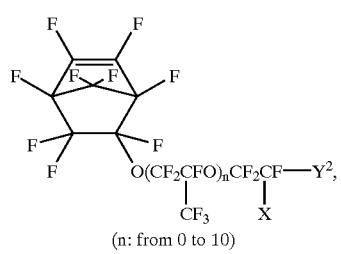
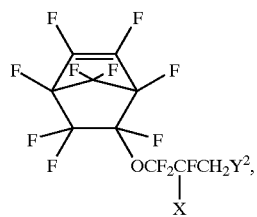
-continued
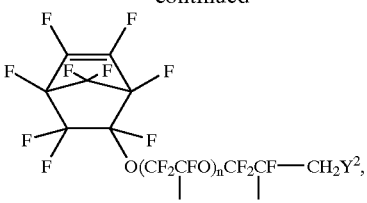
(n: from 0 to 10)
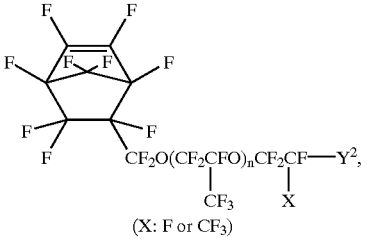
(X: F or $CF_3$)
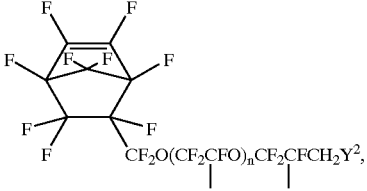
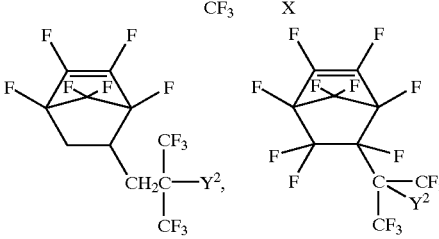
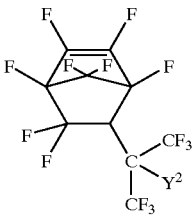
In addition, there are:
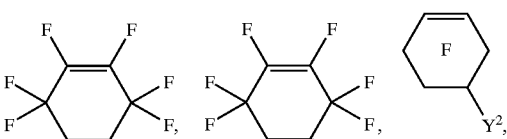
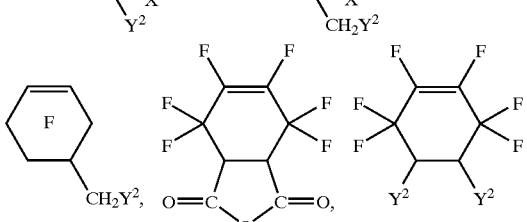
and the like, wherein X is H, F, $CF_3$ or $CH_3$; $Y^2$ is an acid-reactive functional group.

The acid-reactive groups $Y^2$ contained in those alicyclic monomers are acid-labile or acid-degradable functional groups and functional groups undergoing condensation by an acid.

① Acid-labile or Acid-degradable Functional Group:

The acid-labile or acid-degradable functional group is a functional group which can make the polymer soluble in alkaline developing solution due to action of an acid though the polymer is insoluble or hardly soluble in alkali before the reaction with an acid.

Examples thereof are functional groups which have an ability of changing to —OH group, —COOH group, —SO$_3$H group or the like due to action of an acid or cation, thereby causing the fluorine-containing polymer itself to be dissolved in alkali.

Therefore the polymer can be used as a base polymer for a positive resist. Examples of the acid-labile or acid-degradable functional group are preferably $Y^1$ exemplified in M1 of the above-mentioned formula I-(1).

② Functional Group Undergoing Condensation Reaction by an Acid:

The functional group undergoing condensation reaction by an acid enables the fluorine-containing polymer itself to be insoluble in an alkaline developing solution (or a solvent) due to action of an acid though the polymer is soluble in alkali (or the same solvent as mentioned above) before the reaction with the acid.

The functional group undergoing condensation by an acid is concretely a functional group which causes self-condensation or poly-condensation due to action of an acid or cation or condensation reaction or poly-condensation reaction with a crosslinking agent by an action of an acid in the presence of the crosslinking agent, or a functional group which causes a change in polarity by rearrangement with an acid or cation (for example, pinacol rearrangement or carbinol rearrangement). In any case, the resultant polymer becomes insoluble in alkali (or a solvent).

Thus the polymer can be used as a base polymer for a negative resist.

Preferred functional groups undergoing condensation by an acid is selected from —OH, —COOH, —CN, —SO$_3$H, epoxy group and the like.

Among them, the polymers having the structural unit having a polycyclic structure are preferred from the point that etching resistivity can be enhanced.

It is particularly preferable that the structural unit having a polycyclic structure on its trunk chain is a structural unit derived from norbornene or norbornene derivative from the viewpoint that norbornene or norbornene derivative itself has a high copolymerizability with a fluorine-containing ethylenic monomer, a glass transition temperature of the obtained polymer can be set high and dry etching resistivity can be increased.

Also a cyclic hydrocarbon monomer in which a part or the whole of hydrogen atoms have been replaced by fluorine atoms is preferred from the viewpoint of excellent transparency, particularly excellent transparency in a vacuum ultraviolet region.

Also examples of the monomer having an aliphatic ring structure on its side chain are:

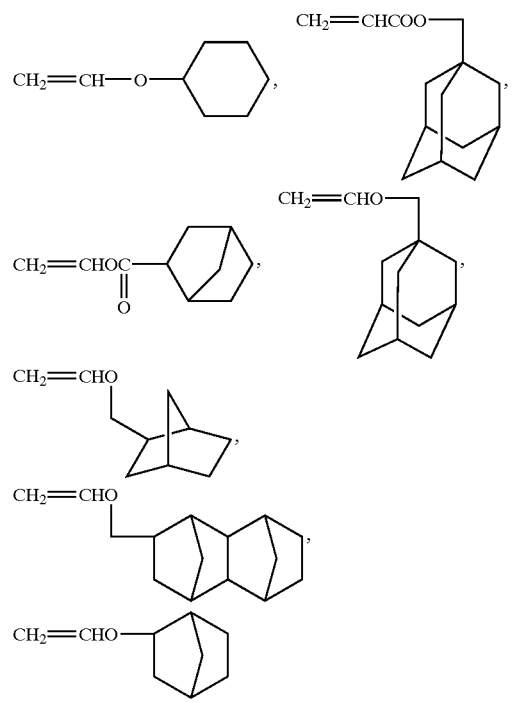

and the like.

The structural unit M3 constituting the fluorine-containing polymer (A) having an acid-labile or acid-degradable functional group is a structural unit of a fluorine-containing ethylenic monomer and thereby transparency of the fluorine-containing polymer, particularly transparency in a vacuum ultraviolet region can be improved.

The structural unit M3 is concretely the structural unit M3-1 which is derived from a fluorine-containing ethylenic monomer represented by the formula IV-M3-1:

IV-M3-1

$$-(CX^{13}X^{14}-CX^{15})-,$$
$$(CX^{18}{}_2)_{n5}$$
$$(O)_{n8}$$
$$(Rf^3)_{n10}$$
$$Z^2$$

wherein $X^{13}$, $X^{14}$ and $X^{18}$ are the same or different and each is H or F; $X^{15}$ is H, F or CF$_3$; $Z^2$ is H, F or Cl; Rf$^3$ are the same or different and each is a fluorine-containing alkylene group having 1 to 20 carbon atoms, a fluorine-containing alkylene group having 2 to 100 carbon atoms and ether bond or a fluorine-containing arylene group having 3 to 20 carbon atoms; n5 is 0 or an integer of 1 or 2; n8 and n10 are the same or different and each is 0 or 1; provided that n10 is 0, any one of $X^{13}$, $X^{14}$, $X^{18}$, $X^{15}$ or $Z^2$ has fluorine atom.

Examples of the preferred monomer constituting the structural unit M3 are:

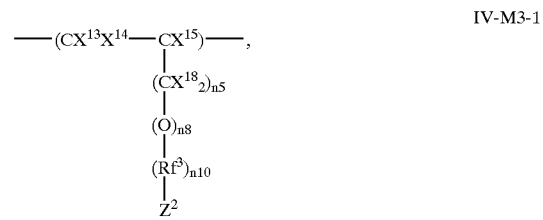

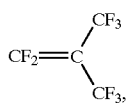

$CF_2=CFO(CF_2)_nF$ (n: from 1 to 5), $CH_2=C(CF_3)_2$, $CF_2=CFH$, $CF_2=CCl_2$,

$CH_2=CF\text{-}(CF_2)_n\text{-}Z^2$, $CH_2=CHOCH_2\text{-}(CF_2)_n\text{-}Z^2$, $CH_2=CHO\text{-}CH_2\text{-}(CF_2)_n\text{-}Z^2$, ($Z^2$ is H, F or Cl; and n is from 1 to 10)
and the like.

Among them, an ethylenic monomer having 2 or 3 carbon atoms and at least one fluorine atom is preferred from the viewpoint of copolymerizability.

Examples thereof are tetrafluoroethylene, chlorotrifluoroethylene, vinylidene fluoride, hexafluoropropylene, vinyl fluoride and the like. Particularly tetrafluoroethylene and chlorotrifluoroethylene are preferred.

The structural unit M3 is a structural unit derived from a fluorine-containing ethylenic monomer and may be a structural unit (assumed to be a structural unit M3-2) having a functional group $Z^1$ excluding the functional group contained in the structural unit M1. For example, a functional group which is not degraded by an acid is preferred. It is preferable that the functional group $Z^1$ is not changed only by its contact with an acid in a system not containing a crosslinking agent.

Examples of the preferable functional group $Z^1$ which is not degraded by an acid are —$CH_2OH$, —COOH, —$SO_3H$, —CN and the like.

For example, when the functional group $Z^1$ which is not degraded by an acid and the acid-labile or acid-degradable functional group $Y^1$ are present in the fluorine-containing polymer and when kind and proportion of the respective functional groups are adjusted, there can be obtained, for example, preferable effects that a solubility of the fluorine-containing polymer in alkali or a solvent before and after a reaction with an acid can be adjusted, a difference in the solubility in alkali or a solvent before and after a reaction with an acid can be adjusted, and functions such as adhesion to a substrate can be imparted to the fluorine-containing polymer before the reaction with an acid.

Examples of the preferable fluorine-containing ethylenic monomer having the functional group $Z^1$ which is not degraded by an acid and forming the structural unit having the functional group $Z^1$ are the fluorine-containing ethylenic monomers obtained by replacing, with the above-mentioned functional group $Z^1$, the acid-labile or acid-degradable functional group $Y^1$ of the fluorine-containing ethylenic monomers exemplified in the structural unit M1.

The functions of those functional groups make it possible to apply the fluorine-containing polymer to various acid-sensitive materials, photosensitive materials, resist materials, etc.

The structural unit M3 may be fluorine-containing ethylenic monomers other than the structural units M3-1 and M3-2, for example, fluorine-containing acryls (excluding those included in the structural unit M1-1).

Preferred is the structural unit M3-3 represented by:

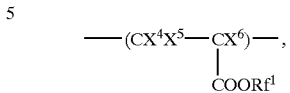

wherein $X^4$ and $X^5$ are the same or different and each is H or F; $X^6$ is H, Cl, $CH_3$, F or $CF_3$; $Rf^1$ is a fluorine-containing alkyl group having 1 to 20 carbon atoms, a fluorine-containing alkyl group having 2 to 100 carbon atoms and ether bond or a fluorine-containing aryl group having 3 to 20 carbon atoms.

In the structural unit M3-3, —$Rf^1$ is selected from the above-mentioned fluorine-containing alkyl groups. Examples thereof are preferably —$(CH_2)_m(CF_2)_n$—F, $(CH_2)_m(CF_2)_n$—H, —$(CH_2)_m(CF_2)_n$—Cl (m is an integer of from 1 to 5, n is an integer of from 1 to 10),

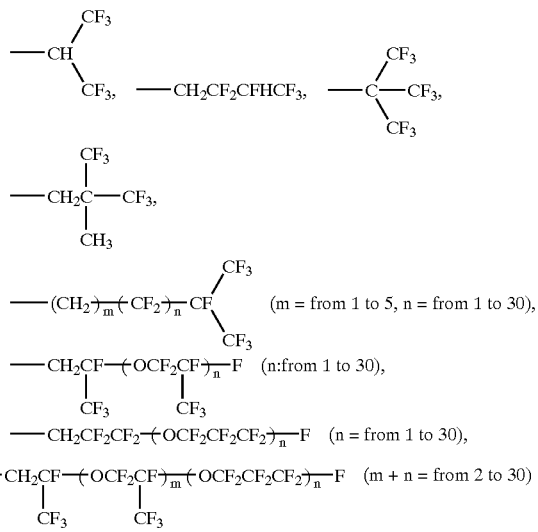

and the like.

Examples of the monomer constituting the structural unit M3-3 are:

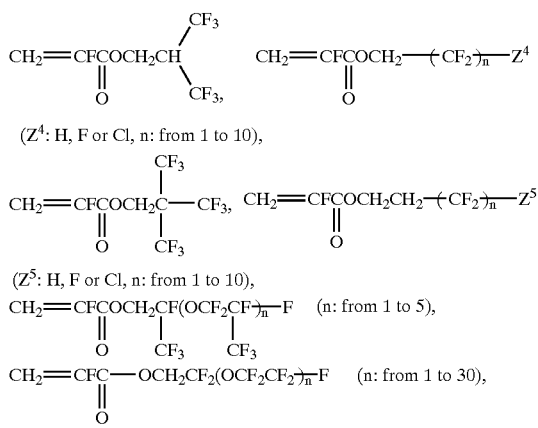

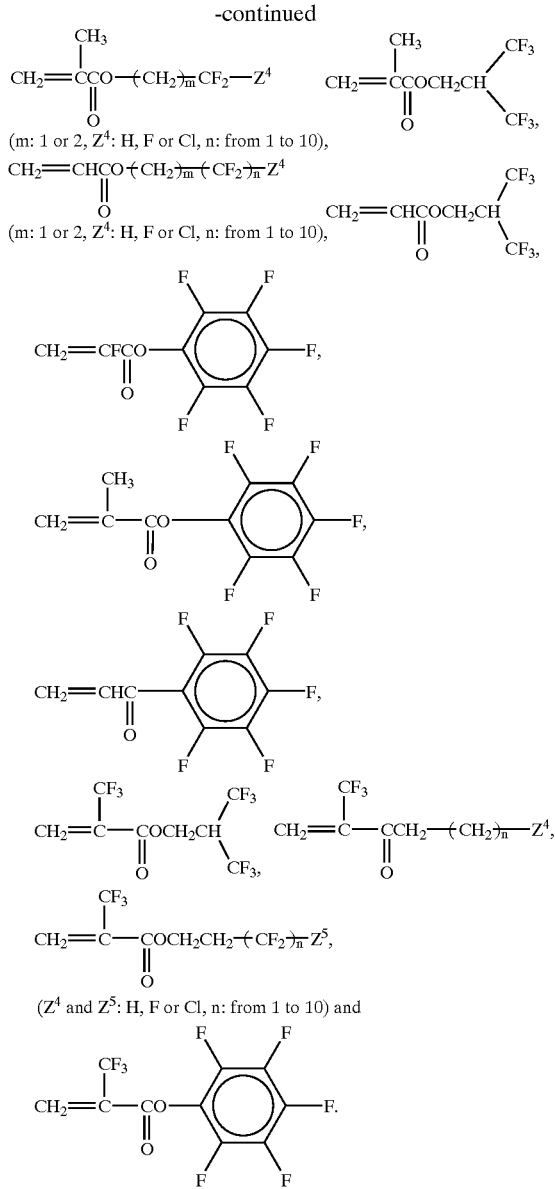
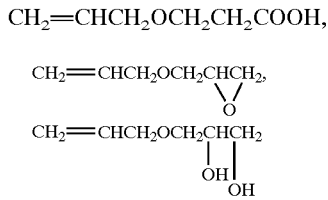

The structural unit N is an optional component and is not limited particularly as far as it is copolymerizable with M1, M1-1, M1-2, M2, M3-1, M3-2 and M3-3. The structural unit N may be selected optionally depending on an intended application and required properties of the fluorine-containing polymer. Examples of the monomer giving the structural unit N are, for instance, the following compounds.

Ethylene Monomer:

Ethylene, propylene, butene, vinyl chloride, vinylidene chloride and the like.

Vinyl Ether or Vinyl Ester Monomer:

$CH_2$=CHOR, $CH_2$=CHOCOR (R: hydrocarbon group having 1 to 20 carbon atoms) and the like.

Allyl Monomer:

$CH_2$=CHCH$_2$Cl, $CH_2$=CHCH$_2$OH, $CH_2$=CHCH$_2$COOH, $CH_2$=CHCH$_2$Br and the like.

Allyl Ether Monomer:

$CH_2$=CHCH$_2$OR (R: hydrocarbon group having 1 to 20 carbon atoms), $CH_2$=CHCH$_2$OCH$_2$CH$_2$COOH, $CH_2$=CHCH$_2$OCH$_2$CHCH$_2$
        \O/

$CH_2$=CHCH$_2$OCH$_2$CHCH$_2$
                |      |
               OH    OH and the like. In addition, there are acrylic and methacrylic monomers (having no fluorine atoms) and the like.

The molecular weight of the fluorine-containing polymer (A) having an acid-labile or acid-degradable functional group can be selected within the range of from 1,000 to 1,000,000 in the number average molecular weight depending on application, purpose and form thereof at use, and is preferably from 3,000 to 700,000, more preferably from about 5,000 to about 500,000. When the molecular weight is too low, heat resistance and mechanical properties of the obtained polymer coating film tend to become insufficient, and a too high molecular weight tends to become disadvantageous from the viewpoint of processability. Particularly when the polymer is intended to be used in the form of a coating material for forming a thin coating film, a too high molecular weight is disadvantageous from the viewpoint of film forming property, and the molecular weight is preferably from 3,000 to 200,000, particularly preferably from 3,000 to 100,000.

In the fluorine-containing polymer (A), various combinations of the structural units M1, M1-1, M1-2, M2, M3, M3-1 and N can be selected from the above-mentioned examples, depending on intended application, physical properties (particularly glass transition temperature, melting point, etc.) and functions (transparency, refractive index, etc.).

Usually the acid-reactive function (namely, a function of changing functions and properties after the action of an acid) is given to the structural unit M1, and to the polymer after the degradation are imparted the intended functions by the functional group of M1 after the degradation and as the case demands, by the functional group of M3-2. The M2 imparts dry etching resistivity and controls the Tg, and other functions and properties are controlled by M3-1 and if necessary, by N. A balance of those functions and properties is adjusted by selecting the respective kinds and proportions of M1, M2, M3-1, M3-2 and N.

For example, when enhancing transparency in a vacuum ultraviolet region for applications on a resist, particularly a $F_2$ resist, it is preferable to make a fluorine atom content of the whole polymer including M1, M2, M3 and N as high as possible. The fluorine atom content is not less than 30% by weight, preferably not less than 50% by weight, particularly preferably not less than 60% by weight. From that point of view, the polymers comprising M1-1, M1-2a, M1-2b, M3-1 and M3-2 are selected preferably. The thus obtained fluorine-containing polymer has good heat resistance, is non-crystalline and has a high transparency in a wide wavelength range including a vacuum ultraviolet region, and therefore can be used as a base polymer for a resist, particularly for a $F_2$ resist.

It was found that particularly the polymers of the present invention generally have a high transparency in a vacuum ultraviolet region. Therefore those polymers are useful for semi-conductor applications such as a $F_2$ resist and $F_2$ pellicle.

In the chemically amplifying type resist composition of the present invention, the fluorine-containing polymer (A) having an acid-labile or acid-degradable group is characterized in that such a functional group is converted to carboxyl group by a reaction with an acid.

Though the fluorine-containing polymer (A) is insoluble or hardly soluble in alkali before the reaction with an acid, it can be dissolved in an alkaline developing solution by an effect of the functional group, namely, due to action of the acid.

Therefore the fluorine-containing polymer (A) can be used as a base polymer for a positive resist.

Examples of the acid-labile or acid-degradable group are:

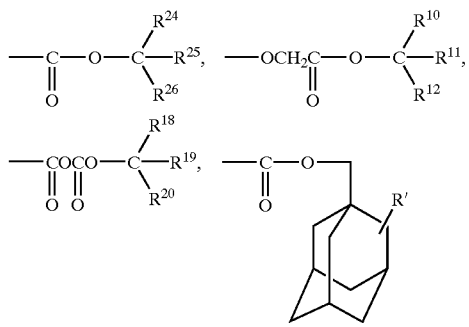

and the like, wherein $R^{24}$, $R^{25}$, $R^{26}$, $R^{10}$, $R^{11}$, $R^{12}$, $R^{18}$, $R^{19}$ and $R^{20}$ are the same or different and each is a hydrocarbon group having 1 to 10 carbon atoms, R' is H or a hydrocarbon group having 1 to 10 carbon atoms. Among them, —COOC$(CH_3)_3$, —OCH$_2$COOC$(CH_3)_3$ and the like are preferred.

Those fluorine-containing polymers having an acid-labile or acid-degradable functional group can be used for the above-mentioned positive photoresist. The acid-labile or acid-degradable functional group is called a protective group as mentioned above. Though the fluorine-containing polymer (A) itself is insoluble or hardly soluble in alkali, the functional group is dissociated or degraded by an acid generated from the photoacid generator (B) by irradiation of energy rays and functions to make the fluorine-containing polymer (A) soluble in alkali. Further there is an effect that an acid is also generated from the protecting group released by the degradation of the functional group of the fluorine-containing polymer (A) and accelerates the degradation reaction.

The chemically amplifying type resist of the present invention prepared from the fluorine-containing polymer having a functional group which is converted to carboxyl group by an acid is preferable since a sensitivity to irradiation of light is high, a solubility in a developing solution after the reaction with an acid (after deprotection) is good, and a pattern having a high resolution can be obtained.

The above-mentioned fluorine-containing polymer (A) to be used for the chemically amplifying type resist composition of the present invention, irrespective of introduction of the carboxylic acid functional group thereto, has a high transparency, particularly a high transparency in a vacuum ultraviolet region and a high sensitivity even to $F_2$ laser beams, and thus a micro resist pattern having a high resolution and a micro circuit pattern can be obtained.

In those fluorine-containing polymers (A) having an acid-labile or acid-degradable functional group, various proportions of the structural units M1, M2, M3 and N can be selected within the above-mentioned range depending on kind of the composition, intended function, kind of the functional group $Y^1$ and the like. For example, in order to make the fluorine-containing polymer soluble in alkali after the reaction with an acid, it is preferable that the structural unit M1 is present in an amount of from 5 to 100% by mole, preferably from 10 to 100% by mole, particularly preferably from 20 to 100% by mole, and a total amount of the structural units M2 and N is from 0 to 95% by mole, preferably from 0 to 90% by mole, particularly preferably from 0 to 80% by mole.

For introducing the functional group into the fluorine-containing polymer to be used for the chemically amplifying type resist composition of the present invention, various methods can be used.

Generally There can be Used:
① a method of previously synthesizing a monomer having the functional group $Y^1$ and then polymerizing,
② a method of once synthesizing a polymer having another functional group and then converting the functional group by high molecular reaction, thus introducing the functional group $Y^1$ into the polymer, or the like method.

The fluorine-containing polymer (A) to be used for the composition of the present invention can be prepared by (co)polymerizing, by various known methods, the monomers corresponding to the respective structural units, namely the ethylenic monomer (M1) having the functional group $Y^1$, alicyclic monomer (M2), fluorine-containing ethylenic monomer (M3) and as the case demands, a fluorine-containing ethylenic monomer corresponding to the optional component (N). For the polymerization, radical polymerization, anion polymerization, cation polymerization, and the like can be used. Among them, the radical polymerization method is preferably employed from the viewpoint that radical polymerizability of each monomer for obtaining the polymers of the present invention is good, control of quality such as components and molecular weight is easy and production in an industrial scale is easy. Namely, for initiating the polymerization, there is no restriction with respect to means for polymerization as far as the polymerization proceeds radically. The polymerization is initiated, for example, by an organic or inorganic radical polymerization initiator, heat, light, ionizing radiation or the like. The polymerization can be carried out by solution polymerization, bulk polymerization, suspension polymerization, emulsion polymerization or the like. Also the molecular weight is controlled by contents of monomers to be used for the polymerization, a content of the polymerization initiator, a content of a chain transfer agent and temperature. The components of the prepared polymer can be controlled by the starting monomer components.

In the chemically amplifying type resist composition of the present invention, the photoacid generator (B) is a compound which generates an acid or cation by irradiating the compound itself or the resist composition containing the compound with radioactive rays. The photoacid generator (B) can be used in a mixture of two or more of the compounds.

The photoreactive acid-generating agents as exemplified in the chemically amplifying type resist composition disclosed in Invention I can be used preferably as the photoacid generator (B) for the chemically amplifying type resist composition of the present invention.

With respect to the content of the photoacid generator (B) of the chemically amplifying type resist composition of the present invention, the same content as mentioned in the chemically amplifying type resist composition disclosed in Invention I can be used preferably.

Also to the photoresist composition of the present invention may be added an organic base which can act as a base against the acid generated from the photoacid generator.

As the organic base to be added, the same bases as described in the chemically amplifying type resist composition of Invention I can be used preferably.

In the addition of the organic base, the same adding amount as in the chemically amplifying type resist composition of Invention I can be used preferably.

The addition of the organic base imparts the same effect as in the chemically amplifying type resist composition of Invention I to the resist composition of the present invention.

To the photoresist composition of Invention IV can be added various additives which have been used in the field of photoresist such as a dissolution inhibitor, sensitizer, dye, adhesion betterment material and water storage material.

Examples of the additives which can be used preferably are the same as described in the chemically amplifying type resist composition of Invention I.

When those additives are used, the amounts thereof are the same as in the chemically amplifying type resist composition of Invention I.

In the chemically amplifying type photoresist composition of Invention IV, the solvent (C) is one which can dissolve the fluorine-containing polymer (A) having an acid-reactive functional group, the photoacid generator (B) and the above-mentioned various additives, and is not limited particularly as far as good coatability (surface smoothness, uniformity of coating thickness and the like) can be obtained.

Examples of the solvent (C) which can be used preferably are the same as described in the chemically amplifying type resist composition of Invention I.

The proportion of the solvent (C) to be used preferably is the same as in the chemically amplifying type resist composition of Invention I.

The chemically amplifying type resist composition of Invention IV is subjected to a resist pattern formation of conventional photoresist technology. The pattern formation methods to be used preferably are the same as described in the chemically amplifying type resist composition of Invention I.

It has been found that particularly by using the chemically amplifying type resist composition of Invention IV, a resist coating film (photosensitive layer) having a high transparency even in a vacuum ultraviolet region can be formed. The resist composition of Invention IV can be preferably used particularly for photolithography process using a $F_2$ laser (wavelength of 157 nm) which is under development aiming at a technology node of 0.1 μm.

Invention IV also relates to a coating film obtained by applying the composition comprising the fluorine-containing polymer having an acid-reactive functional group on a substrate.

The coating film of Invention IV is obtained by applying the fluorine-containing polymer which has an acid-reactive functional group and is high in transparency against light in a vacuum ultraviolet region.

The fluorine-containing polymer having an acid-reactive functional group for the coating film of Invention IV has a molecular absorption coefficient at 157 nm of not more than 3.0 $\mu m^{-1}$, preferably not more than 1.5 $\mu m^{-1}$, more preferably not more than 1.0 $\mu m^{-1}$.

The coating film obtained by applying the fluorine-containing polymer having a high transparency in a vacuum ultraviolet region on a substrate is naturally useful as a resist coating film (photosensitive layer) in a photolithography process using a $F_2$ laser, and in addition, is preferred because it can be used for a pellicle for $F_2$ lithography, a reflection reducing film for peripheral optical parts such as lens and silicon wafer, a non-tacky stain-proofing film for peripheral optical parts such as lens, etc.

The coating film of Invention IV can be used on various substrates according to purpose and application. Particularly in applications requiring transparency, namely in optical applications, the coating film can be applied on inorganic substrates such as a silicon wafer, glass, LiF, $CaF_2$ and $MgF_2$, transparent resins such as acrylic resin, triacetyl cellulose resin and polycarbonate resin, and in addition, metallic substrates.

The coating thickness can be widely selected depending on purpose and application. In case of applications requiring transparency, the coating thickness is not more than 1.0 μm, preferably not more than 0.5 μm, more preferably not more than 0.3 μm.

Further when the coating film of Invention IV is used for a photoresist coating film (photosensitive layer), it is preferable that the coating film is one which is formed by applying the above-mentioned chemically amplifying type photoresist composition.

The resist coating film of Invention IV is formed by applying the above-mentioned chemically amplifying type photoresist composition on a substrate such as a silicon wafer by a coating method such as spin coating and then drying. In the coating film are contained solid components such as the fluorine-containing polymer (A) having an acid-reactive group, the photoacid generator (B) and the additives.

The resist coating film of Invention IV usually has a coating thickness of as thin as not more than 1.0 μm, preferably a thin coating thickness of from 0.5 μm to 0.1 μm.

Further it is preferable that the resist coating film of Invention IV has a high transparency in a vacuum ultraviolet region, concretely has a molecular absorption coefficient at a wavelength of 157 nm of not more than 3.0 $\mu m^{-1}$, preferably not more than 1.5 $\mu m^{-1}$, further preferably not more than 1.0 $\mu m^{-1}$. Thus the coating film is preferred from the point that it can be used effectively on a lithography process using a $F_2$ laser (157 nm).

The resist coating film of Invention IV can be applied similarly on various substrates which have been used for applying a resist thereon. For example, any of a silicon wafer, a silicon wafer provided with an organic or inorganic reflection reducing film, a glass substrate and the like may be used. Particularly sensitivity and profile formation on the silicon wafer provided with an organic reflection reducing film are good.

The second of Invention IV relates to the novel fluorine-containing polymers.

The fluorine-containing polymers of Invention IV are fluorine-containing polymers having a functional group which is dissociated or degraded by an acid and is converted to carboxyl group by an acid.

The first of the novel fluorine-containing polymers is the fluorine-containing polymer having a number average molecular weight of from 1,000 to 1,000,000 and represented by the formula IV-(1):

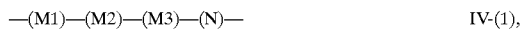  IV-(1), in which

① the structural unit M1 is a structural unit derived from a fluorine-containing ethylenic monomer having a functional group which is dissociated or degraded by an acid and is converted to carboxyl group by a reaction with an acid, ② the structural unit M2 is a structural unit derived from an alicyclic monomer, ③ the structural unit M3 is a structural unit derived from a fluorine-containing ethylenic monomer, and ④ the structural unit N is a structural unit derived from an ethylenic monomer copolymerizable with M1, M2 and M3, when M1+M2+M3 is assumed to be equal to 100% by mole, the percent by mole ratio M1/M2/M3 is 1 to 98/1 to 98/1 to 98, and the polymer comprises from 1 to 98% by mole of the structural unit M1, from 1 to 98% by mole of the structural unit M2, from 1 to 98% by mole of the structural unit M3 and from 0 to 97% by mole of the structural unit N,
M1 is a structural unit of M1-1 represented by the formula IV-M1-1:

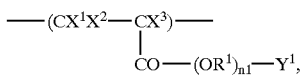     IV-M1-1 wherein $X^1$ and $X^2$ are the same or different and each is H or F; $X^3$ is H, Cl, $CH_3$, F or $CF_3$; $Y^1$ is a functional group which is dissociated or degraded by an acid and is converted to carboxyl group by a reaction with the acid; $R^1$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n1 is 0 or 1; provided that n1 is 0 or $R^1$ does not have fluorine atom, at least one of $X^1$ and $X^2$ is fluorine atom or $X^3$ is fluorine atom or $CF_3$.

The second of the novel fluorine-containing polymers is the fluorine-containing polymer having a number average molecular weight of from 1,000 to 1,000,000 and represented by the formula IV-(1):

     IV-(1), in which
① the structural unit M1 is a structural unit derived from a fluorine-containing ethylenic monomer having a functional group which is dissociated or degraded by an acid and is converted to carboxyl group by a reaction with an acid,
② the structural unit M2 is a structural unit derived from an alicyclic monomer,
③ the structural unit M3 is a structural unit derived from a fluorine-containing ethylenic monomer, and
④ the structural unit N is a structural unit derived from an ethylenic monomer copolymerizable with M1, M2 and M3,
when M1+M2+M3 is assumed to be equal to 100% by mole, the percent by mole ratio M1/M2/M3 is 1 to 98/1 to 98/1 to 98, and the polymer comprises from 1 to 98% by mole of the structural unit M1, from 1 to 98% by mole of the structural unit M2, from 1 to 98% by mole of the structural unit M3 and from 0 to 97% by mole of the structural unit N,
M1 is a structural unit of M1-2 represented by IV-M1-2:

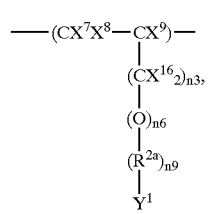     IV-M1-2 wherein $X^7$, $X^8$, $X^9$ and $X^{16}$ are the same or different and each is H or F; $Y^1$ is a functional group which is dissociated or degraded by an acid and is converted to carboxyl group by a reaction with the acid; $R^{2a}$ is a divalent hydrocarbon group having 1 to 20 carbon atoms, a fluorine-containing alkylene group having 1 to 20 carbon atoms, a fluorine-containing alkylene group having 2 to 100 carbon atoms and ether bond or a fluorine-containing arylene group having 3 to 20 carbon atoms; n6 and n9 are the same or different and each is 0 or 1; n3 is 0, 1 or 2; provided that $R^{2a}$ does not have fluorine atom, any one of $X^7$, $X^8$, $X^9$ and $X^{16}$ has fluorine atom.

In those novel fluorine-containing polymers, examples of the preferable structural unit M1 are the same as exemplified in the fluorine-containing polymer (A) having an acid-labile or acid-degradable group which is used for the chemically amplifying type resist composition of the present invention.

Also in those novel fluorine-containing polymers, examples of the preferable structural unit M2 are the same as exemplified in the fluorine-containing polymer (A) having an acid-labile or acid-degradable group which is used for the chemically amplifying type resist composition of the present invention.

Also in those novel fluorine-containing polymers, examples of the preferable structural unit M3 are the same as exemplified in the fluorine-containing polymer (A) having an acid-labile or acid-degradable group which is used for the chemically amplifying type resist composition of the present invention.

Also in those novel fluorine-containing polymers, examples of the preferable structural unit N are the same as exemplified in the fluorine-containing polymer (A) having an acid-labile or acid-degradable group which is used for the chemically amplifying type resist composition of the present invention.

Also in those novel fluorine-containing polymers, examples of the preferable proportions of the structural units M1, M2, M3 and N are the same as exemplified in the fluorine-containing polymer (A) having an acid-labile or acid-degradable group which is used for the chemically amplifying type resist composition of the present invention.

Also examples of the preferable preparation process of the novel fluorine-containing polymers are the same as exemplified in the fluorine-containing polymer (A) having an acid-labile or acid-degradable group which is used for the chemically amplifying type resist composition of the present invention.

Those fluorine-containing polymers have properties such as high transparency, low refractive index and high Tg and are preferably used not only for a resist polymer but also for optical applications such as a reflection reducing film, pellicle, optical fiber and optical wave-guide.

Preparation Examples, Examples and Comparative Examples directly relating to Invention IV are Preparation Examples 1, 2, 6, 7, 9 and 10, Examples 37 to 40, 45, 46, 48 to 57, 59 to 61, 76, 77, 80 to 87, 94 to 96, 100 to 101, 102 to 104 and 108 to 111, and Comparative Examples 1 and 2, respectively.

The fifth invention V (Invention V) relates to the chemically amplifying type photoresist composition containing, as a binder, a specific fluorine-containing polymer having an acid-reactive functional group.

The chemically amplifying type photoresist comprises a resin (polymer) component and a photoacid generator and makes use of a catalytic action of an acid generated from the acid-generating agent in a portion of the resist irradiated with energy rays. In the chemically amplifying type positive photoresist, an acid generated in its portion irradiated with energy rays is scattered by the following heat treatment (post-exposure bake: hereinafter abbreviated to PEB) to carry out deprotection of an acid-labile or acid-degradable functional group of the resin, etc. and an acid is re-generated, thereby making the energy-irradiated portion soluble in alkali.

The chemically amplifying type positive resist is classified into two types of resists. One is a resist comprising an alkali-soluble resin component, an acid-generating agent and in addition, a dissolution inhibitor having a functional group (protective group) which is dissociated or degraded due to action of an acid. The functional group of the dissolution inhibitor itself has an ability of inhibiting dissolution of the alkali-soluble resin but the resin becomes soluble in alkali after the functional group (protective group) is dissociated due to action of an acid. Another resist is one in which the resin component has a functional group (protective group) which is dissociated or degraded due to action of an acid and is insoluble or hardly soluble in alkali but becomes soluble in alkali after the functional group (protective group) is dissociated due to action of an acid.

A chemically amplifying type negative photoresist generally comprises a resin component which has a functional group capable of undergoing condensation by an acid and is soluble in alkali, an acid-generating agent and in addition, a crosslinking agent.

In such a negative photoresist, an acid generated in the energy-irradiated portion thereof is scattered by the PEB treatment and acts on the functional group undergoing condensation by an acid in the resin component and on the crosslinking agent, thereby hardening the binder resin in the energy-irradiated portion and making the resin insoluble or hardly soluble in alkali.

The chemically amplifying type photoresist composition of Invention V can be used on the above-mentioned positive and negative photoresists and comprises:

(A) a fluorine-containing polymer having an acid-reactive functional group,
(B) a photoacid generator, and
(C) a solvent.

The inventors of the present invention have found that the fluorine-containing polymer (A) having a structural unit derived from a specific norbornene derivative which has an acid-reactive group and fluorine atom or a fluoroalkyl group in one molecule has an especially high transparency against light in a vacuum ultraviolet region and excellent resist properties such as an etching resistivity, reactivity with an acid and solubility in a developing solution.

The fluorine-containing polymer (A) having an acid-reactive group which is used for the chemically amplifying type photoresist composition of Invention V is a fluorine-containing polymer having the structural unit M1 derived from the fluorine-containing alicyclic monomer which has an acid-reactive group and is represented by the formula V-(1):

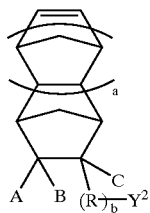

V-(1)

in which A, B and C are the same or different and each is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that b is 0 or R does not have fluorine atom, any one of A to C is fluorine atom or a fluorine-containing alkyl group.

It has been known that a dry etching resistivity is enhanced by introducing a norbornene backbone to the polymer. However conventional norbornene derivatives could not be said to have sufficient transparency, particularly transparency in a vacuum ultraviolet region. In the present invention, it has been found that by introducing fluorine atom or a fluoroalkyl group to a specific position of norbornene derivative, transparency, particularly transparency in a vacuum ultraviolet region is enhanced.

In conventional resists, an acid-reactive group necessary for a resist polymer has been introduced by polymerization of other ethylenic monomer (acrylic monomer or the like), which, however, resulted in lowering of transparency (particularly transparency in a vacuum ultraviolet region) and dry etching resistivity. It has been found in the present invention that by introducing the acid-reactive group necessary for the resist together with fluorine atom or a fluoroalkyl group to one molecule of norbornene derivative, both of good transparency (particularly transparency in a vacuum ultraviolet region) and dry etching resistivity can be imparted to the obtained fluorine-containing polymer.

In the fluorine-containing norbornene having an acid-reactive group which is represented by the above-mentioned formula and constitutes the fluorine-containing polymer (A) of the present invention, it is preferable that any one of A, B or C is fluorine atom. Also it is preferable that when A to C do not have fluorine atom, a fluorine atom content of R is not less than 60% by weight and it is further preferable that R is a perfluoroalkylene group from the point that transparency can be imparted to the polymer.

Examples thereof are:

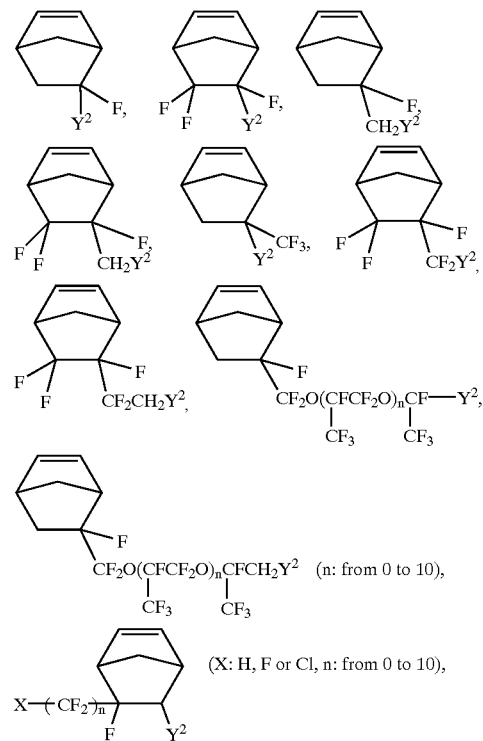

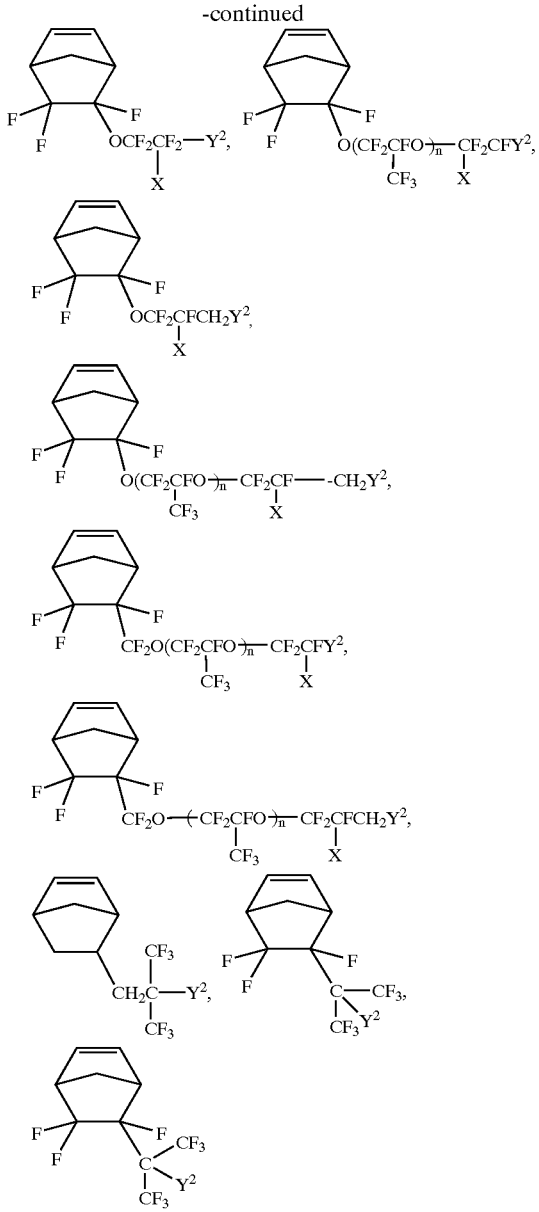

(n: from 0 to 10, X: F or $CF_3$), and the like.

The fluorine-containing polymer (A) having an acid-reactive group which is used for the chemically amplifying type photoresist composition of the present invention contains a structural unit of those fluorine-containing alicyclic monomers as an essential component.

Particularly examples of the fluorine-containing polymer having recurring units of those fluorine-containing alicyclic monomers having an acid-reactive group are the following polymers.

① Copolymer comprising the fluorine-containing alicyclic monomer of the formula V-(1) having an acid-reactive group and an ethylenic monomer.

Examples of the ethylenic monomer as a copolymerizing component are, for instance, ethylene monomers such as ethylene, propylene, butene and vinyl chloride; acrylic monomers; methacrylic monomers; allyl monomers; allyl ether monomers; styrene monomers; and the like.

② Copolymer comprising the fluorine-containing alicyclic monomer of the formula V-(1) having an acid-reactive group and a fluorine-containing ethylenic monomer.

Examples of the preferable fluorine-containing alicyclic monomer as a copolymerizing component are, for instance, tetrafluoroethylene, chlorotrifluoroethylene, hexafluoropropylene, $CF_2$=CFRf, in which Rf is a perfluoroalkyl group having 1 to 5 carbon atoms, vinylidene fluoride, vinyl fluoride, trifluoroethylene and the like. Those monomers are particularly preferred from the point that transparency can be imparted to the polymer.

③ Polymer obtained by ring-opening polymerization of the fluorine-containing alicyclic monomer of the formula V-(1) having an acid-reactive group and/or polymer obtained by hydrogenation of the polymer obtained by the ring-opening polymerization.

④ Copolymer obtained by ring-opening polymerization of the fluorine-containing alicyclic monomer of the formula V-(1) having an acid-reactive group with an alicyclic monomer represented by:

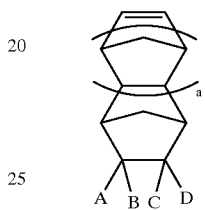

wherein A, B, C and D are the same or different and each is H, F, an alkyl group having 1 to 10 carbon atoms or a fluorine-containing alkyl group having 1 to 10 carbon atoms, a is 0 or an integer of from 1 to 3, and/or copolymer obtained by hydrogenation of the copolymer obtained by the ring-opening polymerization.

It is particularly preferable that the fluorine-containing polymer (A) having an acid-reactive group is a fluorine-containing polymer represented by the formula V-(2):

—(M1)—(M2)—(N)—   V-(2), in which

① the structural unit M1 is a structural unit derived from a fluorine-containing alicyclic monomer having an acid-reactive group and represented by the formula V-(1), ② the structural unit M2 is a structural unit derived from a fluorine-containing ethylenic monomer and ③ the structural unit N is a structural unit derived from a monomer copolymerizable with M1 and M2, when M1+M2 is assumed to be equal to 100% by mole, the percent by mole ratio M1/M2 is 1 to 99/1 to 99, and the polymer comprises from 1 to 99% by mole of the structural unit M1, from 1 to 99% by mole of the structural unit M2 and from 0 to 98% by mole of the structural unit N.

Those fluorine-containing polymers are prepared by copolymerizing the structural unit M1 with the fluorine-containing ethylenic monomer and are preferable from the point that transparency, particularly transparency in a vacuum ultraviolet region can be further enhanced.

Another example of the fluorine-containing polymer (A) having an acid-reactive group is a fluorine-containing polymer represented by the formula V-(3):

—(M1)—(M2)—(M3)—(N)—   V-(3), in which the structural unit M1 is a structural unit derived from a fluorine-containing alicyclic monomer of the above-mentioned formula V-(1) having an acid-reactive group, the structural unit M2 is a structural unit derived from a fluorine-containing ethylenic monomer, the structural unit M3 is a structural unit derived from an alicyclic monomer represented by the formula (4):

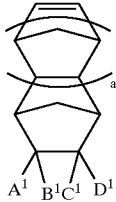

(4)

wherein $A^1$, $B^1$, $C^1$ and $D^1$ are the same or different and each is H, F, an alkyl group having 1 to 10 carbon atoms, a fluorine-containing alkyl group having 1 to 10 carbon atoms or a functional group other than the acid-reactive group of M1; a is 0 or an integer of from 1 to 3, and the structural unit N is a structural unit derived from a monomer copolymerizable with M1, M2 and M3, when M1+M2+M3 assumed to be is equal to 100% by mole, the percent by mole ratio M1+M3/M2 is 30/70 to 70/30, and the polymer comprises from 1 to 98% by mole of the structural unit M1, from 1 to 98% by mole of the structural unit M2, from 1 to 98% by mole of the structural unit M3 and from 0 to 97% by mole of the structural unit N.

The introduction of the structural unit M3 is preferable from the point that dry etching property can be further enhanced, in other words, from the point that the content of the acid-reactive functional group in the fluorine-containing polymer (A) can be controlled without lowering the dry etching property.

The norbornene derivative of the formula (4) forming the structural unit M3 may have or may not have fluorine atom, and is selected from known norbornenes or substituted norbornenes.

The fluorine-containing ethylenic monomers of the structural unit M2 constituting the fluorine-containing polymers (A) represented by the formulae V-(2) and V-(3) are the structural units derived from the fluorine-containing ethylenic monomers represented by the following formula M2-1:

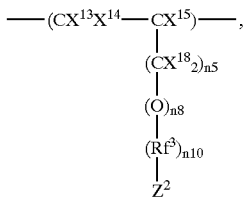

in which $X^{13}$, $X^{14}$ and $X^{18}$ are the same or different and each is H or F; $X^{15}$ is H, F or $CF_3$; $Z^2$ is H, F or Cl; $Rf^3$ is the same or different and each is a fluorine-containing alkylene group having 1 to 20 carbon atoms, a fluorine-containing alkylene group having 2 to 100 carbon atoms and ether bond or a fluorine-containing arylene group having 3 to 20 carbon atoms; n5 is 0 or an integer of 1 or 2; n8 and n10 are the same or different and each is 0 or 1; provided that n10 is 0, at least one of $X^{13}$, $X^{14}$, $X^{18}$ and $Z^2$ is fluorine atom or $X^{15}$ is fluorine atom or $CF_3$.

Examples of the preferable monomer constituting the structural unit M2 are:

$CF_2=CF_2$, $CF_2=CH_2$, $CF_2=CFCl$, $CF_2=CFCF_3$,

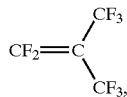

$CF_2=CFO(CF_2)_nF$ (n: 1 to 5), $CH_2=C(CF_3)_2$, $CF_2=CFH$, $CF_2=CCl_2$,

$CH_2=CF{\hspace{-0.3em}-\hspace{-0.3em}}(CF_2)_n{\hspace{-0.3em}-\hspace{-0.3em}}Z^2$ ($Z^2$ is the same as $Rf^3$ in M2-1, n: from 1 to 10), $CH_2=CHOCH_2{\hspace{-0.3em}-\hspace{-0.3em}}(CF_2)_n{\hspace{-0.3em}-\hspace{-0.3em}}Z^2$ ($Z^2$ is the same as $Rf^3$ in M2-1, n: from 1 to 10), $CH_2=CHO-CH_2{\hspace{-0.3em}-\hspace{-0.3em}}(CF_2)_n{\hspace{-0.3em}-\hspace{-0.3em}}Z^2$ ($Z^2$ is the same as $Rf^3$ in M2-1, n: from 1 to 10)

and the like.

Particularly preferred are ethylenic monomers having 2 or 3 carbon atoms and at least one fluorine atom from the viewpoint of copolymerizability.

Examples thereof are tetrafluoroethylene, chlorotrifluoroethylene, vinylidene fluoride, hexafluoropropylene, vinyl fluoride and the like. Particularly tetrafluoroethylene and chlorotrifluoroethylene are preferred.

The structural unit N is an optional component, is not particularly limited as far as it is copolymerizable with the structural units M1 and M2, and is optionally selected depending on required properties of the fluorine-containing polymer.

The molecular weight of the fluorine-containing polymer (A) to be used for the above-mentioned chemically amplifying type resist of the present invention can be selected within the range of from 1,000 to 1,000,000 in a number average molecular weight depending on application, purpose and form thereof at use, preferably from 3,000 to 700,000, more preferably from about 5,000 to about 500,000. When the molecular weight is too low, heat resistance and mechanical properties of the obtained polymer coating film tend to become insufficient, and a too high molecular weight is disadvantageous from the viewpoint of processability. Particularly in the case of forming a thin coating film in the form of a coating material, a too high molecular weight is disadvantageous from the viewpoint of film forming property. The molecular weight is preferably not more than 200,000, particularly preferably not more than 100,000.

The combinations of the structural units M1, M2, M3 and N of the fluorine-containing polymer (A) can be selected from the above-mentioned examples, depending on intended applications, physical properties (particularly glass transition temperature, etc.) and functions (transparency, refractive index, etc.).

Usually the acid-reactive function (namely a function of changing functions and properties after the reaction with an acid) and dry etching property are given to the structural unit M1, and other functions and properties are controlled by M2 and if necessary by N. A balance of those functions and properties is adjusted by selecting the respective kinds and proportions of M1, M2, M3 and N.

For example, when enhancing transparency in a vacuum ultraviolet region for application on a resist, particularly a $F_2$ resist, it is preferable to make a fluorine atom content of the whole polymer including M1, M2, M3 and N as high as possible. The fluorine atom content is not less than 30% by weight, preferably not less than 50% by weight, particularly preferably not less than 60% by weight. From that point of view, the polymers of the formulae V-(2) and V-(3) are selected preferably. The thus obtained fluorine-containing polymer has good heat resistance, is non-crystalline and has a high transparency in a wide wavelength range including a vacuum ultraviolet region, and therefore is useful as a base polymer for a resist, particularly for a $F_2$ resist.

It was found that particularly the polymers of the formulae V-(2) and V-(3) of the present invention generally have a high transparency in a vacuum ultraviolet region. Therefore those polymers are useful for semi-conductor material applications such as a $F_2$ resist and $F_2$ pellicle.

In the chemically amplifying type resist composition of the present invention, the fluorine-containing polymer (A) having an acid-reactive group comprises the fluorine-containing polymer having the acid-reactive group $Y^2$. The acid-reactive group $Y^2$ is concretely an acid-labile or acid-degradable functional group or a functional group undergoing condensation by an acid.

① Acid-labile or Acid-degradable Functional Group:

The acid-labile or acid-degradable functional group is a functional group which can make the polymer soluble in an alkaline developing solution due to action of an acid though the polymer is insoluble or hardly soluble in alkali before the reaction with an acid.

Examples thereof are functional groups which are capable of changing to —OH group, —COOH group, —SO$_3$H group or the like due to action of an acid or cation, thereby causing the fluorine-containing polymer itself to be dissolved in alkali.

Therefore the polymer can be used as a base polymer for a positive resist.

Examples of the preferable acid-labile or acid-degradable functional group are:

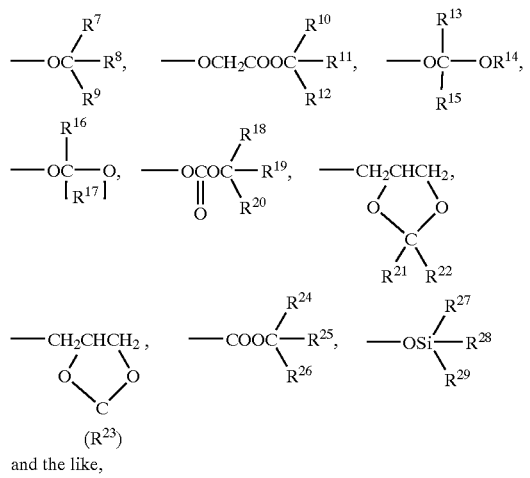

and the like, wherein $R^7$, $R^8$, $R^9$, $R^{10}$, $R^{11}$, $R^{12}$, $R^{14}$, $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or a hydrocarbon group having 1 to 10 carbon atoms; and $R^{17}$ and $R^{23}$ are a divalent hydrocarbon group having 2 to 10 carbon atoms.

More preferable examples are:

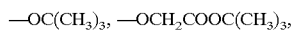

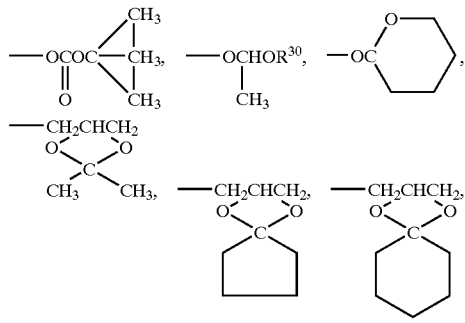

wherein $R^{30}$ is an alkyl group having 1 to 10 carbon atoms.

Among them, those changing to carboxyl group by a reaction with an acid are preferred from the viewpoint of excellent solubility in an aqueous alkaline solution (developing solution). Examples thereof are:

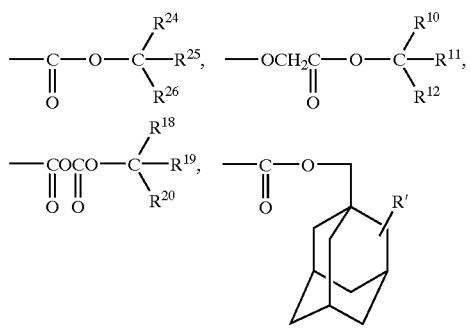

and the like, wherein $R^{24}$, $R^{25}$, $R^{26}$, $R^{10}$, $R^{11}$, $R^{12}$, $R^{18}$, $R^{19}$ and $R^{20}$ are the same or different and each is a hydrocarbon group having 1 to 10 carbon atoms, R' is H or a hydrocarbon group having 1 to 10 carbon atoms. Among them, —COOC(CH$_3$)$_3$, —OCH$_2$COOC(CH$_3$)$_3$ and the like are preferred.

Those fluorine-containing polymers having an acid-labile or acid-degradable functional group can be used for the above-mentioned positive photoresist. The acid-labile or acid-degradable functional group is called the protective group as mentioned above. Though the fluorine-containing polymer (A) before the reaction is insoluble or hardly soluble in alkali, the functional group is dissociated or degraded by an acid generated from the photoacid generator (B) by irradiation of energy rays and functions to change the fluorine-containing polymer (A) to be soluble in alkali. Further an acid is also generated from a group released by the degradation of the functional group in the fluorine-containing polymer (A), which has an effect of accelerating the degradation reaction.

In those fluorine-containing polymers having an acid-labile or acid-degradable functional group, the proportions of the structural units M1, M2, M3 and N can be selected within the above-mentioned range depending on kind of the composition, intended function, kind of the functional group $Y^2$ and the like. For example, in order to make the fluorine-containing polymer soluble in alkali after the reaction with an acid, it is preferable that M1 is present in an amount of from 5 to 100% by mole, preferably from 10 to 100% by mole, particularly preferably from 20 to 100% by mole, and a total amount of the structural units M2, M3 and N is from 0 to 95% by mole, preferably from 0 to 90% by mole, particularly preferably from 0 to 80% by mole.

② Functional Group Undergoing Condensation by an Acid:

The functional group undergoing condensation by an acid enables the fluorine-containing polymer itself to be insoluble in an alkaline developing solution (or a solvent) due to action of an acid though the polymer is soluble in alkali before the reaction with the acid (or the same solvent as mentioned above).

The functional group undergoing condensation reaction by an acid is concretely a functional group which causes self-condensation or poly-condensation due to action of an acid or cation or condensation reaction or poly-condensation reaction with a crosslinking agent due to action of an acid in the presence of the crosslinking agent, or a functional group which causes a change in polarity by rearrangement with an acid or cation (for example, pinacol rearrangement or carbinol rearrangement). In any case, the resultant polymer becomes insoluble in alkali (or a solvent).

A preferred functional group undergoing condensation by an acid is selected from —OH, —COOH, —CN, —SO₃H, epoxy group and the like.

Those fluorine-containing polymers having such a functional group undergoing condensation reaction by an acid can be used for the above-mentioned negative photoresist. The functional group undergoing condensation reaction by an acid causes condensation or poly-condensation reaction or rearrangement reaction by an acid generated from the photoacid generator (B) by irradiation of energy rays, thereby causing a self-crosslinking reaction, rearrangement reaction in a molecule and crosslinking reaction with a crosslinking agent contained in the composition and making the fluorine-containing polymer (A) insoluble or hardly soluble in a developing solution (alkali or a solvent) though the fluorine-containing polymer (A) before the reaction is soluble in the developing solution.

Further in the present invention it is particularly preferable that the functional group undergoing condensation reaction by an acid is one which can impart a function of making the polymer soluble in a developing solution such as an alkali or a solvent before the reaction with an acid (for example, —COOH, —SO₃H, —OH or the like). The functional group undergoing condensation reaction by an acid may be one which has only a function of causing a condensation reaction (crosslinking reaction) by an acid and making the polymer insoluble in the developing solution (—CN, epoxy group or the like). In that case, the polymer can be used as a negative photoresist in combination with other functional group having a function of making the polymer soluble in the developing solution or by using the fluorine-containing polymer having a backbone structure capable of dissolving in the developing solution.

It is particularly preferable that the fluorine-containing polymer having the functional group undergoing condensation by an acid is a polymer soluble in an aqueous alkaline solution before the reaction with an acid, which makes it possible to carry out a developing process (dissolving process) in an aqueous system without using a solvent (particularly a flammable solvent) as a developing solution and thus the polymer is advantageous from the viewpoint of safety and environment.

In case where the acid-reactive group $Y^2$ is the group undergoing condensation by an acid, it is preferable that the structural unit M1 is present in an amount of from 5 to 100% by mole, preferably from 10 to 100% by mole, particularly preferably from 20 to 100% by mole, and a total amount of the structural units M2, M3 and N is from 0 to 95% by mole, preferably from 0 to 90% by mole, particularly preferably from 0 to 80% by mole.

The crosslinking agent is not limited particularly and can be optionally selected from those which have been used as a crosslinking agent for a negative resist.

The polymers of the present invention obtained by polymerizing the formula V-(1), concretely the polymers of V-(2) and V-(3) are characterized by having the acid-reactive functional group $Y^2$. For introducing those functional groups into the fluorine-containing polymers, various methods can be used. Generally there can be used:

① a method of previously synthesizing a monomer having the functional group $Y^2$ and then polymerizing, ② a method of once synthesizing a polymer having another functional group and then converting the functional group by high molecular reaction, thus introducing the functional group $Y^2$ into the polymer or the like method.

For example, for introducing the acid-labile or acid-degradable functional group by the method ②, there can be used a method of once preparing a fluorine-containing polymer having OH group and then reacting the polymer with a vinyl ether such as ethyl vinyl ether or dihydropyran in the presence of an acid such as toluenesulfonic acid, thus introducing a functional group (ketals) decomposable by an acid; a method of reacting a fluorine-containing polymer having 1,2-diol with ketone to obtain a functional group decomposable by an acid (cyclic acetal compound); or the like method.

The fluorine-containing polymer (A) which is used for the composition of the present invention can be prepared by (co)polymerizing, by various known processes, the monomers corresponding to the respective structural units, namely the fluorine-containing norbornene monomer (M1) having the functional group $Y^2$, the fluorine-containing ethylenic monomer (M2) and if necessary, a monomer corresponding to the optional component (N). For the polymerization, radical polymerization, anion polymerization, cation polymerization, and the like can be used. Among them, the radical polymerization method is preferably employed from the viewpoint that radical polymerizability of each monomer for obtaining the polymers of the present invention is good, quality control such as components and molecular weight is easy and production in an industrial scale is easy. Namely, for initiating the polymerization, there is no restriction with respect to means for polymerization as far as the polymerization proceeds radically. The polymerization is initiated, for example, by an organic or inorganic radical polymerization initiator, heat, light, ionizing radiation or the like. The polymerization can be carried out by solution polymerization, bulk polymerization, suspension polymerization, emulsion polymerization or the like. Also the molecular weight is controlled by contents of monomers to be used for the polymerization, a content of the polymerization initiator, a content of a chain transfer agent and temperature. The components of the prepared polymer can be controlled by the starting monomer components.

In the chemically amplifying type resist composition of the present invention, the photoacid generator (B) is a compound which generates an acid or cation by irradiating the compound itself or the resist composition containing the compound with radioactive rays. The photoacid generator (B) can be used in a mixture of two or more of the compounds.

The photoreactive acid-generating agents as exemplified in the chemically amplifying type resist composition disclosed in Invention I can be used preferably as the photoacid generator (B) for the chemically amplifying type resist composition of the present invention.

With respect to the content of the photoacid generator (B) of the chemically amplifying type resist composition of the present invention, the same content as mentioned in the chemically amplifying type resist composition disclosed in Invention I can be used preferably.

Also to the photoresist composition of the present invention may be added an organic base which can act as a base against the acid generated from the photoacid generator.

As the organic base to be added, the same organic bases as described in the chemically amplifying type resist composition of Invention I can be used preferably.

In the addition of the organic base, the same adding amount as in the chemically amplifying type resist composition of Invention I can be used preferably.

The addition of the organic base imparts, to the resist composition of the present invention, the same effect as in the chemically amplifying type resist composition of Invention I.

Also in the chemically amplifying type resist composition of the present invention, when a negative resist composition is prepared by using the fluorine-containing polymer (A) having a functional group undergoing condensation by an acid, a crosslinking agent may be used as case demands.

The crosslinking agent to be used is not limited particularly, and the same crosslinking agents as described in the chemically amplifying type resist composition of Invention I can be used preferably.

With respect to the proportion of the crosslinking agent of the photoresist composition (particularly negative type) of the present invention, the same proportion as described in the chemically amplifying type resist composition of Invention I can be used preferably.

To the photoresist composition of the present invention can be added various additives which have been used in the field of photoresist such as a dissolution inhibitor, sensitizer, dye, adhesion betterment material and water storage material.

Examples of the additives which can be used preferably are the same as in the chemically amplifying type resist composition of Invention I.

Those additives can be used in the same amounts as in the chemically amplifying type resist composition of Invention I.

In the chemically amplifying type resist composition of the present invention, the solvent (C) is one which can dissolve the fluorine-containing polymer (A) having an acid-reactive functional group, the photoacid generator (B) and the above-mentioned various additives, and is not limited particularly as far as good coatability (surface smoothness, uniformity of coating thickness and the like) can be obtained.

Examples of the solvent (C) which can be used preferably are the same as in the chemically amplifying type resist composition of Invention I.

The proportion of the solvent (C) to be used preferably is the same as in the chemically amplifying type resist composition of Invention I.

The chemically amplifying type resist composition of the present invention is subjected to a resist pattern formation of conventional photoresist technology. The pattern formation method to be used preferably is the same as in the chemically amplifying type resist composition of Invention I.

It has been found that by using the chemically amplifying type resist composition of the present invention, a resist coating film (photosensitive layer) having a high transparency even in a vacuum ultraviolet region can be obtained. The resist composition can be preferably used particularly for photolithography process using a $F_2$ laser (wavelength of 157 nm) which is under development aiming at a technology node of 0.1 μm.

Invention V also relates to the coating film obtained by applying the composition comprising the fluorine-containing polymer having an acid-reactive functional group on a substrate.

The coating film of the present invention is obtained by applying the fluorine-containing polymer which has an acid-reactive functional group and is high in transparency against light in a vacuum ultraviolet region.

The fluorine-containing polymer having an acid-reactive functional group which is used for the coating film of the present invention has a molecular absorption coefficient at 157 nm of not more than 3.0 $\mu m^{-1}$ preferably not more than 1.5 $\mu m^{-1}$, more preferably not more than 1.0 $\mu m^{-1}$.

The coating film obtained by applying, on a substrate, the fluorine-containing polymer having a high transparency in a vacuum ultraviolet region is naturally useful as a resist coating film (photosensitive layer) in a photolithography process using a $F_2$ laser, and in addition, is preferable because it can be used for a pellicle for $F_2$ lithography, a reflection reducing film for optical parts such as lens and silicon wafer, a non-tacky stain-proofing film for lens and peripheral optical parts, etc.

The coating film of the present invention can be used on various substrates according to purpose and application. Particularly in applications requiring transparency, namely, in optical applications, the coating film can be applied on inorganic substrates such as a silicon wafer, glass, LiF, $CaF_2$ and $MgF_2$, transparent resins such as an acrylic resin, triacetyl cellulose resin and polycarbonate resin, and other metallic substrates.

The coating thickness can be widely selected depending on purpose and application. In the case of applications requiring transparency, the coating thickness is not more than 1.0 μm, preferably not more than 0.5 μm, more preferably not more than 0.3 μm.

Further when the coating film of the present invention is used for a photoresist coating film (photosensitive layer), it is preferable that the coating film is formed by applying the above-mentioned chemically amplifying type photoresist composition.

The resist coating film of the present invention is formed by applying the above-mentioned chemically amplifying type photoresist composition on a substrate such as a silicon wafer by a coating method such as spin coating and then drying. In the coating film are contained solid components such as the fluorine-containing polymer (A) having an acid-reactive functional group, the photoacid generator (B) and additives.

The resist coating film of the present invention usually has a coating thickness of as thin as not more than 1.0 μm, preferably a thin coating thickness of from 0.5 μm to 0.1 μm.

Further it is preferable that the resist coating film of the present invention has a high transparency in a vacuum ultraviolet region, concretely has a molecular absorption coefficient at a wavelength of 157 nm of not more than 3.0 $\mu m^{-1}$, more preferably not more than 1.5 $\mu m^{-1}$, further preferably not more than 1.0 $\mu m^{-1}$. Thus the coating film is preferable from the point that it can be used effectively on a lithography process using a $F_2$ laser (157 nm).

The resist coating film of the present invention can be applied similarly on various substrates which have been used for applying a resist. For example, any of a silicon wafer, a silicon wafer provided with an organic or inorganic reflection reducing film, a glass substrate and the like may be used. Particularly sensitivity and profile formation on the silicon wafer provided with an organic reflection reducing film are good.

The second of Invention V relates to the novel fluorine-containing polymers.

The first fluorine-containing polymer of Invention V contains the structural unit derived from the novel fluorine-containing norbornene derivative having an acid-reactive functional group and concretely is the fluorine-containing polymer which has a number average molecular weight of from 1,000 to 1,000,000 and contains the structural unit M1 derived from a fluorine-containing alicyclic monomer having an acid-reactive group and represented by the formula V-(1):

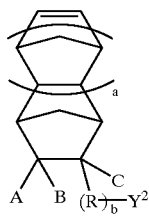

V-(1)

in which A, B and C are the same or different and each is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that b is 0 or R does not have fluorine atom, any one of A to C is fluorine atom or a fluorine-containing alkyl group.

The second novel fluorine-containing polymer of Invention V is the fluorine-containing polymer having a molecular weight of from 1,000 to 1,000,000 and represented by the formula V-(2)

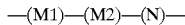

—(M1)—(M2)—(N)— V-(2), wherein the structural unit M1 is a structural unit derived from the fluorine-containing alicyclic monomer of the formula V-(1) having an acid-reactive group, the structural unit M2 is a structural unit derived from a fluorine-containing ethylenic monomer, and the structural unit N is a structural unit derived from a monomer copolymerizable with M1 and M2, when M1+M2 is assumed to be equal to 100% by mole, the percent by mole ratio M1/M2 is 1 to 99/1 to 99, and the fluorine-containing polymer comprises from 1 to 99% by mole of the structural unit M1, from 1 to 99% by mole of the structural unit M2 and from 0 to 98% by mole of the structural unit N.

The third novel fluorine-containing polymer of Invention V is the fluorine-containing polymer having a number average molecular weight of from 1,000 to 1,000,000 and represented by the formula V-(3):

—(M1)—(M2)—(M3)—(N)— V-(3), in which the structural unit M1 is a structural unit derived from the fluorine-containing alicyclic monomer of the formula V-(1) having an acid-reactive group, the structural unit M2 is a structural unit derived from a fluorine-containing ethylenic monomer, the structural unit M3 is a structural unit derived from an alicyclic monomer represented by the formula (4):

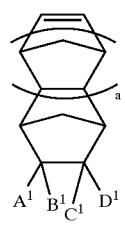

(4)

wherein $A^1$, $B^1$, $C^1$ and $D^1$ are the same or different and each is H, F, an alkyl group having 1 to 10 carbon atoms or a fluorine-containing alkyl group having 1 to 10 carbon atoms; a is 0 or an integer of from 1 to 3, and the structural unit N is a structural unit derived from a monomer copolymerizable with M1, M2 and M3, when M1+M2+M3 is assumed to be equal to 100% by mole, the percent by mole ratio M1+M3/M2 is 30/70 to 70/30, and the polymer comprises from 1 to 98% by mole of the structural unit M1, from 1 to 98% by mole of the structural unit M2, from 1 to 98% by mole of the structural unit M3 and from 0 to 97% by mole of the structural unit N.

In those novel fluorine-containing polymers, examples of the preferable structural unit M1 are the same as described in the fluorine-containing polymer (A) having an acid-reactive group which is used for the chemically amplifying type resist composition of the present invention.

Also in the novel fluorine-containing polymers, examples of the preferable structural unit M2 are the same as described in the fluorine-containing polymer (A) having an acid-reactive group which is used for the chemically amplifying type resist composition of the present invention.

Also in the novel fluorine-containing polymers, examples of the preferable structural unit M3 are the same as described in the fluorine-containing polymer (A) having an acid-reactive group which is used for the chemically amplifying type resist composition of the present invention.

Also in the novel fluorine-containing polymers, examples of the preferable structural unit N are the same as described in the fluorine-containing polymer (A) having an acid-reactive group which is used for the chemically amplifying type resist composition of the present invention.

Also the composition (proportion, etc.) of the structural units M1, M2, M3 and N constituting the novel fluorine-containing polymers are the same as described in the fluorine-containing polymer (A) having an acid-reactive group which is used for the chemically amplifying type resist composition of the present invention.

Also examples of the preferable acid-reactive group of the structural unit M1 constituting the novel fluorine-containing polymers are the same as described in the fluorine-containing polymer (A) having an acid-reactive group which is used for the chemically amplifying type resist composition of the present invention.

Also examples of the preferable preparation process of the novel fluorine-containing polymers are the same as described in the fluorine-containing polymer (A) having an acid-reactive group which is used for the chemically amplifying type resist composition of the present invention.

Those three novel fluorine-containing polymers are characterized by having the structural unit derived from the novel norbornene derivative of the formula V-(1). Those novel norbornene derivatives can be obtained by various processes, generally by Diels-Alder reaction of the fluorine-containing ethylenic monomer having the acid-reactive group $Y^2$ with cyclopentadienes.

Those fluorine-containing polymers possess properties such as a high transparency, a low refractive index and a high Tg and have an acid-reactive functional group or a functional group undergoing condensation by an acid (or crosslinkable), and therefore can be used not only for resist applications but also optical applications such as a reflection reducing film, pellicle, optical fiber and optical wave-guide.

Preparation Examples, Examples and Comparative Examples which directly relate to Invention V are Preparation Examples 8 to 10, Examples 36, 41 to 44, 58, 78, 79, 97 to 99 and 105 to 107, and Comparative Examples 1 and 2, respectively.

EXAMPLE

The present invention is then explained below by means of Examples, but is not limited to them.

Preparation Example 1
(Synthesis of Fluorine-containing Acrylate having —OC—$(CH_3)_3$ Group)

A 1-liter four-necked glass flask provided with a reflux condenser, thermometer, stirrer and dropping funnel was charged with 400 g of methylene chloride, 103.6 g of tert-butanol and 111 g of triethylamine, followed by cooling to 5° C. with ice and keeping at that temperature.

While stirring in a stream of nitrogen gas, 92 g of α-fluoroacrylic acid fluoride: $CH_2$=CFCOF was added dropwise over about 60 minutes.

After completion of the addition, the temperature was decreased to room temperature and the stirring was continued for 1.5 hours.

After completion of the reaction, the mixture was washed with water and then an organic layer was dried with anhydrous magnesium sulfate, followed by distilling to obtain 105 g of t-butyl-αfluoroacrylate $CH_2$=CFCOOC$(CH_3)_3$, the structure of which was identified by the GC-Mass, $^{19}$F-NMR, $^1$H-NMR and IR analyses.

Example 1
(Synthesis of Fluorine-containing Acrylate Copolymer having —OC—$(CH_3)_3$ Group)

In a 200-milliliter four-necked glass flask provided with a reflux condenser, thermometer and stirrer, 12 g of $CH_2$=CFCOOCH$(CF_3)_2$ and 2.5 g of $CH_2$=CFCOOC$(CH_3)_3$ obtained in Preparation Example 1 were dissolved in 50 g of ethyl acetate, and with stirring, the solution was subjected to bubbling with nitrogen gas for about 30 minutes.

Then 0.207 g of mercaptoacetic acid isooctyl ester and 0.052 g of 2,2-azobis isobutyronitrile (AIBN) were added thereto, followed by heating and stirring at 65° C. for five hours to obtain a highly viscous polymer solution.

The polymer solution was poured into a large amount of n-hexane to coagulate the polymer. The coagulated polymer was removed and dried to isolate 10.5 g of polymer. The polymer was one comprising the structural units of $CH_2$=CFCOOC$(CH_3)_3$:$CH_2$=CFCOOCH$(CF_3)_2$ in a ratio of 23:77% by mole according to the $^{19}$F-NMR analysis. The content of fluorine atom was 45.48% by weight by the elementary analysis, the number average molecular weight Mn was 160,000 by the GPC analysis and the glass transition temperature (Tg) was 123° C. by the DSC analysis.

Example 2
(Synthesis of Fluorine-containing Acrylate Copolymer having —OC—$(CH_3)_3$ Group)

Polymerization and refining of the polymer were carried out in the same manner as in Example 1 except that in the same equipment as in Example 1, a reaction was carried out at 70° C. for five hours using 8.9 g of $CH_2$=CFCOOCH$(CF_3)_2$, 5.3 g of $CH_2$=CFCOOC$(CH_3)_3$ obtained in Preparation Example 1, 0.047 g of mercaptoacetic acid isooctyl ester and 0.014 g of AIBN, and 8.5 g of polymer was obtained.

The polymer was one comprising the structural units of $CH_2$=CFCOOC$(CH_3)_3$:$CH_2$=CFCOOCH$(CF_3)_2$ in a ratio of 47:53% by mole according to the $^{19}$F-NMR analysis. The content of fluorine atom was 38.64% by weight by the elementary analysis, the Mn was 50,000 by the GPC analysis and the Tg was 130° C. by the DSC analysis.

Example 3
(Synthesis of Fluorine-containing Allyl Ether Homopolymer having OH Group)

A 100 ml glass flask provided with a stirrer was charged with 20.4 g of perfluoro-(1,1,9,9-tetrahydro-2,5-bistrifluoromethyl-3,6-dioxanonenol):

$$CH_2=CFCF_2OCFCF_2OCFCH_2OH$$
$$\phantom{CH_2=CFCF_2O}|\phantom{CF_2OCF}|$$
$$\phantom{CH_2=CFCF_2OCF}CF_3\phantom{CF_2O}CF_3$$

and 8.6 g of a solution of 8.0% by weight of [H$(CF_2CF_2)_3$—COO—]$_2$ in perfluorohexane. After the inside of the flask was sufficiently replaced with nitrogen gas, stirring was carried out at 20° C. for 24 hours in a stream of nitrogen gas, and a solid having a high viscosity was produced.

The obtained solid was dissolved in diethyl ether and the obtained solution was poured into perfluorohexane, followed by separation and drying to obtain 18.6 g of colorless transparent polymer. The polymer was a fluorine-containing polymer having OH group at an end of its side chain and consisting of the above-mentioned structural unit of the fluorine-containing allyl ether according to the $^{19}$F-NMR and IR analyses. The number average molecular weight of the polymer was 21,000 according to the GPC analysis using tetrahydrofuran (THF) as a solvent.

Example 4
(Synthesis of Fluorine-containing Allyl Ether Homopolymer having OH Group)

Polymerization and refining of the polymer were carried out in the same manner as in Example 3 except that 12 g of perfluoro-(1,1,6,6-tetrahydro-2-trifluoromethyl-3-oxa-5-hexanol):

$$CH_2=CFCF_2OCFCH_2OH$$
$$\phantom{CH_2=CFCF_2O}|$$
$$\phantom{CH_2=CFCF_2OC}CF_3$$

was used instead of perfluoro-(1,1,9,9-tetrahydro-2,5-bistrifluoromethyl-3,6-dioxanonenol), and 10.5 g of a colorless transparent polymer was obtained.

The polymer was a fluorine-containing polymer having —OH group at an end of its side chain and consisting of the above-mentioned structural unit of the fluorine-containing allyl ether according to the $^{19}$F-NMR and IR analyses. The number average molecular weight of the polymer was 7,300 according to the GPC analysis.

Preparation Example 2
(Synthesis of Fluorine-containing Allyl Ether having —OCH$_2$COOC(CH$_3$)$_3$ Group)

The same 200 ml four-necked glass flask as in Preparation Example 1 was charged with 50 ml of tetrahydrofuran, and after adding 7.8 g of sodium hydride (60%) previously washed with hexane in a stream of nitrogen gas, the flask was cooled to 5° C. and 80 g of perfluoro-(1,1,9,9-tetrahydro-2,5-bistrifluoromethyl-3,6-dioxa-8-nonenol)

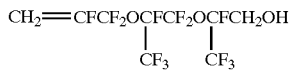

was slowly added dropwise, followed by further stirring at room temperature for one hour. Then 30 g of t-butyl chloroacetate ClCH$_2$COOC—(CH$_3$)$_3$ was added dropwise over 30 minutes and stirring was carried out at room temperature for two hours.

The mixture was poured into 500 ml of water and an organic layer was separated, followed by washing with water, drying and distilling. Thus 58.0 g of a fluorine-containing allyl ether having an acid-labile group and represented by:

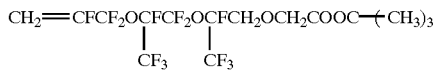

was obtained. The boiling point thereof was 75° to 77° C./7 mmHg.

The above-mentioned monomer was identified by the $^{19}$F-NMR, $^1$H-NMR and IR analyses.

Example 5
(Synthesis of Fluorine-containing Allyl Ether Polymer having —OCH$_2$COOC—(CH$_3$)$_3$ Group)

Polymerization and refining of the polymer were carried out in the same manner as in Example 3 except that 6.7 g of a fluorine-containing allyl ether having an acid-labile group which was obtained in Preparation Example 2 and represented by:

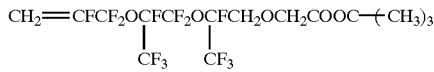

and 15.3 g of perfluoro-(1,1,9,9-tetrahydro-2,5-bistrifluoromethyl-3,6-dioxa-8-nonenol):

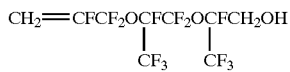

were used instead of single use of perfluoro-(1,1,9,9-tetrahydro-2,5-bistrifluoromethyl-3,6-dioxa-8-nonenol). Thus 19.3 g of a colorless transparent polymer was obtained.

According to the $^{19}$F-NMR and $^1$H-NMR analyses, the polymer was a copolymer of the above-mentioned fluorine-containing allyl ether having —OCH$_2$COOC(CH$_3$)$_3$ group: the fluorine-containing ally ether having —CH$_2$OH group= 26:74% by mole.

According to the GPC analysis, the number average molecular weight of the copolymer was 14,400.

Example 6
(Synthesis of Fluorine-containing Allyl Ether Polymer having —OCH$_2$COOC—(CH$_3$)$_3$ Group)

Polymerization and refining of the polymer were carried out in the same manner as in Example 5 except that 13.45 g of the fluorine-containing allyl ether having an acid-labile group which was obtained in Preparation Example 2 and represented by:

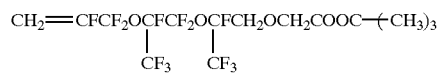

and 10.2 g of perfluoro-(1,1,9,9-tetrahydro-2,5-bistrifluoromethyl-3,6-dioxa-8-nonenol):

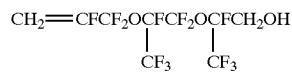

were used. Thus 20.1 g of a colorless transparent polymer was obtained.

According to the $^{19}$F-NMR and $^1$H-NMR analyses, the polymer was a copolymer comprising the above-mentioned structural units, namely the fluorine-containing allyl ether having —OCH$_2$COOC—(CH$_3$)$_3$ group and the fluorine-containing ally ether having —CH$_2$OH group in a ratio of 43:57% by mole.

According to the GPC analysis, the number average molecular weight of the polymer was 13,200.

Example 7
(Protection by 1-ethoxyethyl Group of Fluorine-containing Allyl Ether Polymer having OH Group)

In a 100-milliliter four-necked glass flask provided with a reflux condenser, thermometer, stirrer and dropping funnel, 10.0 g of fluorine-containing allyl ether homopolymer having OH group which was obtained in Example 3 was dissolved in 50 ml of diethyl ether completely and then 0.023 g of p-toluenesulfonic acid monohydrate was dissolved therein. Then thereto was added dropwise over thirty minutes a solution obtained by dissolving 0.44 g of ethyl vinyl ether in 10 ml of diethyl ether while stirring in a stream of nitrogen gas at room temperature.

The mixture after the reaction was poured into 500 ml of n-hexane to coagulate the polymer which was then separated and dried. Thus 9.1 g of a colorless transparent polymer was obtained. According to $^{19}$F-NMR and $^1$H-NMR analyses, a ratio of 1-ethoxy-ethylization (proportion of 1-ethoxyethyl group to a total of OH group and 1-ethoxyethyl group) was 15% by mole.

The obtained polymer was a copolymer comprising the structural units of fluorine-containing allyl ether having:

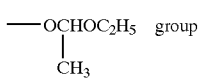

and fluorine-containing allyl ether having —CH$_2$OH group in a ratio of 15/85% by mole.

According to the GPC analysis, the number average molecular weight of the polymer was 20,200.

Example 8
(Protection by 1-ethoxyethyl of Fluorine-containing Allyl Ether Polymer having OH Group)

The reaction for protection by 1-ethoxyethyl and refining of the polymer were carried out in the same manner as in Example 7 except that 0.88 g of ethyl vinyl ether was used, and 9.5 g of a colorless transparent polymer was obtained.

According to the $^{19}$F-NMR and $^1$H-NMR analyses, the ratio of 1-ethoxy-ethylization of the polymer was 38% by mole.

The obtained polymer was a copolymer comprising the structural units of fluorine-containing allyl ether having

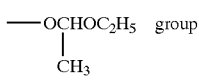

and fluorine-containing allyl ether having —CH$_2$OH group in a ratio of 38/62% by mole.

According to the GPC analysis, the number average molecular weight of the polymer was 19,200.

Preparation Example 3
(Synthesis of Fluorine-containing Allyl Ether having

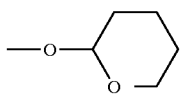

Group)

In the same four-necked glass flask as in Preparation Example 1, 80 g of perfluoro-(1,1,9,9-tetrahydro-2,5-bistrifluoromethyl-3,6-dioxa-8-nonenol) and 0.02 g of p-toluenesulfonic acid monohydride were dissolved in 50 ml of dichloromethane. After 17.6 g of dihydropyran:

was added dropwise with stirring at room temperature over 30 minutes, the stirring was continued at room temperature for six hours.

After the reaction, the mixture was subjected to distillation and 63.4 g of fluorine-containing allyl ether:

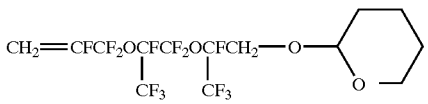

having

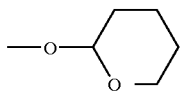

group was obtained. The boiling point of the obtained polymer was 74° to 76° C./4 mmHg.

The structure of the polymer was identified by the $^{19}$F-NMR, $^1$H-NMR and IR analyses.

Example 9
(Synthesis of Fluorine-containing Allyl Ether Polymer having

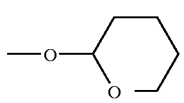

Group)

Polymerization and refining of the polymer were carried out in the same manner as in Example 3 except that 12.3 g of fluorine-containing allyl ether having an acid-labile group

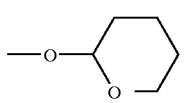

which was obtained in Preparation Example 3 and represented by:

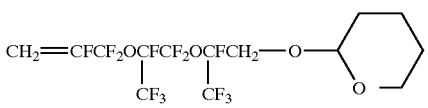

and 10.2 g of perfluoro-(1,1,9,9-tetrahydro-2,5-bistrifluoromethyl-3,6-dioxa-8-nonenol)

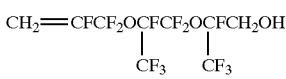

were used instead of a single use of perfluoro-(1,1,9,9-tetrahydro-2,5-bistrifluoromethyl-3,6-dioxa-8-nonenol), and 19.1 g of a colorless transparent polymer was obtained.

According to the $^{19}$F-NMR and $^1$H-NMR analyses, the polymer was a copolymer comprising the structural units of the above-mentioned monomers, namely the fluorine-containing allyl ether having a

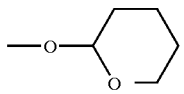

group and the fluorine-containing allyl ether having —CH$_2$OH group in a ratio of 65/35% by mole.

According to the GPC analysis, the number average molecular weight of the polymer was 10,200.

Example 10
(Synthesis of Fluorine-containing Cyclic Polymer having OH Group)

A 200 ml glass flask provided with a stirrer was charged with 6.1 g of perfluoro-(1,1,9,9-tetrahydro-2,5-bistrifluoromethyl-3,6-dioxanonenol):

6.7 g of perfluoro(5,5-dihydro-ally vinyl ether) [$CH_2=CFCF_2OCF=CF_2$], 160 g of HCFC-225 (a mixture of $CF_3CF_2CHCl_2/CClF_2CF_2CHClF$) and 6.9 g solution of 8.0% by weight of $[H(CF_2CF_2)_3-COO]_2-$ in perfluorohexane. After the inside of the flask was sufficiently replaced with nitrogen gas, stirring was carried out in a stream of nitrogen gas at 20° C. for 24 hours. Then the solvent in the reaction mixture was distilled off by an evaporator for concentration and the reaction mixture was poured into hexane, followed by coagulating, separating and drying of the polymer. Thereby 10.2 g of a colorless transparent polymer was obtained.

The obtained polymer had good solubility in general-purpose solvents such as acetone, ethyl acetate, butyl acetate and THF.

In the IR analysis of the polymer, an absorption of —OH group was found, but no absorption of double bond was recognized (in the range of from 1,400 to 1,700 Å).

According to the $^{19}$F-NMR and $^1$H-NMR analyses, the polymer was a copolymer having any one of the cyclic structures:

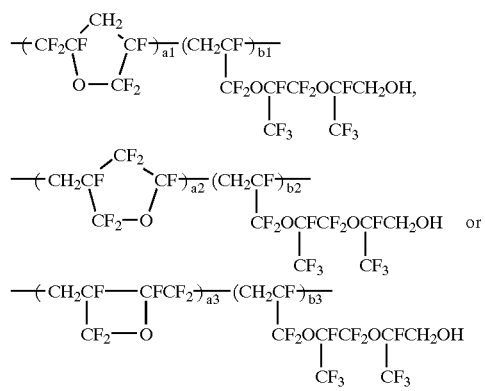

and having a ratio of the structural units (a1+a2+a3/b1+b2+b3) of 65/35% by mole.

According to the GPC analysis, the number average molecular weight of the polymer was 18,300.

Example 11
(Introduction of 1-ethoxyethyl into Cyclic Polymer having OH Group)

In the same 100 ml four-necked glass flask as in Example 7, 10.0 g of the cyclic polymer having OH group and obtained in Example 10 was dissolved completely in 50 ml of diethyl ether. Therein was dissolved 0.012 g of p-toluenesulfonic acid monohydride. Then a solution prepared by dissolving 1.1 g of ethyl vinyl ether in 10 ml of diethyl ether was added dropwise over 30 minutes while stirring at room temperature in a stream of nitrogen gas.

A polymer was isolated from the solution in the same manner as in Example 7 after the reaction, and 9.6 g of a colorless transparent polymer was obtained.

According to the IR analysis, disappearance of —OH group was confirmed, and according to the $^{19}$F-NMR and $^1$H-NMR analyses, the proportion of 1-ethoxyethyl of the polymer was 100%.

Namely the polymer was a copolymer comprising the cyclic structural unit of Example 10 and the allyl ether structural unit having:

—OCHOC$_2$H$_5$
|
CH$_3$ group in a ratio of 65/35% by mole.

According to the GPC analysis, the number average molecular weight of the polymer was 17,500.

Example 12
(Synthesis of Fluorine-containing Polymer having —OH Group and —SO$_3$H Group)

Polymerization and refining of the polymer were carried out in the same manner as in Example 3 except that 2.2 g of perfluoro vinyl ether:

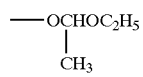

having —SO$_2$F group and 18.4 g of perfluoro-(1,1,9,9-tetrahydro-2,5-bistrifluoromethyl-3,6-dioxa-8-nonenol):

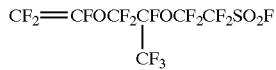

were used instead of a single use of perfluoro-(1,1,9,9-tetrahydro-2,5-bistrifluoromethyl-3,6-dioxa-8-nonenol), and 17.8 g of a colorless transparent polymer was obtained.

The obtained polymer was put in a 10% NaOH solution to be subjected to hydrolysis and then was put in an aqueous solution of $^1$N-HCl, followed by washing with water and drying. Thus 16.1 g of a polymer was obtained.

According to the $^{19}$F-NMR, $^1$H-NMR and IR analyses, the polymer was a copolymer comprising the structural units of the above-mentioned monomers, namely the perfluoro vinyl ether having —SO$_3$H and the fluorine-containing allyl ether having OH group in a ratio of 8.7/91.3% by mole.

Example 13
(Synthesis of Fluorine-containing Ally Ether Polymer having —OH Group and —COOH Group)

Polymerization and refining of the polymer were carried out in the same manner as in Example 3 except that 10.7 g of perfluoro-(9,9-dihydro-2,5-bistrifluoromethyl-3,6-dioxa-8-nonenoic acid):

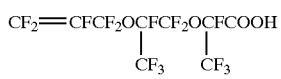

and 10.2 g of perfluoro-(1,1,9,9-tetrahydro-2,5-bistrifluoromethyl-3,6-dioxa-8-nonenol):

were used instead of a single use of perfluoro-(1,1,9,9-tetrahydro-2,5-bistrifluoromethyl-3,6-dioxa-8-nonenol), and 16.5 g of a colorless transparent polymer was obtained.

According to the $^{19}$F-NMR and $^1$H-NMR analyses, the polymer was a copolymer comprising the structural units of the above-mentioned monomers, namely the fluorine-containing allyl ether having COOH group and the fluorine-containing allyl ether having OH group in a ratio of 53/47% by mole.

Examples 14 to 24
(Preparation of Coating Composition and Measurement of Transparency at 157 nm in a Vacuum Ultraviolet Region)
(1) Preparation of Coating Composition The mixture of the fluorine-containing polymer (A) having an acid-reactive functional group, the photoacid generator (B) and the solvent (C) which was obtained by dissolving in the mixing ratio shown in Table 1 was filtrated through a 0.5 μm PTFE membrane filter.

S-(trifluoromethyl)-dibenzothiopheniumtrifluoromethane sulfonate:

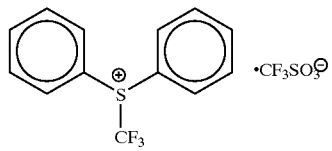

was used as the photoacid generator.

(2) Coating

① Coating on a Substrate (MgF$_2$) for Measuring Transparency

Each coating composition was applied on a MgF$_2$ substrate at room temperature by spin-coating under the condition of 1,000 rpm. After the coating, the coating composition was baked at 100° C. for 15 minutes to form a transparent coating film.

② Measurement of Coating Thickness

A coating film was formed by applying the respective coating compositions under the same conditions as above except that a silicon wafer was used instead of the MgF$_2$ substrate.

The coating thickness was measured with a AFM device (SPI3800 available from SEIKO DENSHI KABUSHIKI KAISHA). The results are shown in Table 1.

(3) Measurement of Transparency in a Vacuum Ultraviolet Region

① Measuring Device

Setani-Namioka type spectrometer (BL-7B available from HIGH ENERGY KENKYU KIKO)

Slit: 7/8-7/8

Detector: PMT

Grating (GII: Blaze wavelength 160 nm, 1,200 gratings/mm)

For an optical system, refer to Rev. Sic. Instrum., 60(7), 1917 (1989) by H. Namba, et al.

② Measurement of Transmitting Spectrum

A transmitting spectrum at wavelength of 200 to 100 nm in a coating film formed by applying each coating composition on the MgF$_2$ substrate by the method of (2) ① was measured using the above-mentioned device.

A transmittance (%) at 157 nm is shown in Table 1. Further a molecular absorption coefficient was calculated from the transmittance and the coating thickness and is shown in Table 1.

TABLE 1

| | Ex. 14 | Ex. 15 | Ex. 16 | Ex. 17 | Ex. 18 |
|---|---|---|---|---|---|
| Fluorine-containing polymer (A) | | | | | |
| Kind of polymer | Ex. 1 | Ex. 2 | Ex. 1 | Ex. 2 | Ex. 3 |
| | Fluorine-containing allyl ether | Fluorine-containing acryl | Fluorine-containing acryl | Fluorine-containing acryl | Fluorine-containing |
| Kind of functional group | —COOC—(CH$_3$)$_3$ | —COOC—(CH$_3$)$_3$ | —COOC—(CH$_3$)$_3$ | —COOC—(CH$_3$)$_3$ | —OH |
| Amount of functional group (% by mole) | 23 | 47 | 23 | 47 | 100 |
| Photoacid generator (B)[1] % by weight based on (A) | — | — | 5.5 | 5.2 | — |
| Solvent (C) | Butyl acetate | Butyl acetate | Butyl acetate | Butyl acetate | Butyl acetate |
| Content of polymer (%) | 3.0 | 3.0 | 3.0 | 3.0 | 5.0 |
| Coating thickness (nm) | 149 | 140 | 123 | 104 | 112 |
| Transmittance at 157 nm (%) | 44.8 | 50.3 | 48.7 | 56.3 | 94.5 |
| Molecular absorption coefficient at 157 nm (μm$^{-1}$) | 2.34 | 2.13 | 2.54 | 2.40 | 0.22 |

| | Ex. 19 | Ex. 20 | Ex. 21 | Ex. 22 | Ex. 23 | Ex. 24 |
|---|---|---|---|---|---|---|
| Fluorine-containing polymer (A) | | | | | | |
| Kind of polymer | Ex. 5 | Ex. 6 | Ex. 5 | Ex. 6 | Ex. 10 | Ex. 11 |
| | Fluorine-containing allyl ether | Fluorine-containing allyl ether | Fluorine-containing all ether | Fluorine-containing allyl ether | Fluorine-containing cyclic polymer | Fluorine-containing cyclic polymer |
| Kind of functional group | —OCH$_2$COOC—(CH$_3$)$_3$/—OH | —OCH$_2$COOC—(CH$_3$)$_3$/—OH | —OCH$_2$COOC—(CH$_3$)$_3$/—OH | —OCH$_2$COOC—(CH$_3$)$_3$/—OH | —OH | —OCHOC$_2$H$_5$<br>      CH$_3$ |
| Amount of functional group (% by mole) | 26/74 | 43/57 | 26/74 | 43/57 | 35 | 35 |
| Photoacid generator (B)[1] % by weight based on (A) | — | — | 4.0 | 4.0 | — | — |
| Solvent (C) | Butyl acetate | Butyl acetate | Butyl acetate | Butyl acetate | Butyl acetate | Butyl acetate |
| Content of polymer (%) | 5.0 | 5.0 | 5.0 | 5.0 | 5.0 | 5.0 |
| Coating thickness (nm) | 96 | 85 | 138 | 126 | 170 | 155 |
| Transmittance at 157 nm (%) | 82.0 | 76.9 | 77.1 | 68.6 | 71.4 | 69.5 |
| Molecular absorption coefficient at 157 nm (μm$^{-1}$) | 0.90 | 1.34 | 0.82 | 1.30 | 0.86 | 1.02 |

[1] Photoreactive acid-generating agent: S-(trifluoromethyl)-dibenzothiopheniumtrifluoromethane sulfonate

Example 25
(Determination of Acid Reactivity)

1.0 gram of the fluorine-containing allyl ether polymer having —OCH$_2$COOC—(CH$_3$)$_3$ group which was obtained in Example 6 was dipped in 50 ml of 0.1 N HCl solution at 50° C. for one hour. Then 1.0 g each of the polymer subjected to dipping in the above-mentioned hydrochloric acid solution and the polymer obtained in Example 6 and not subjected to dipping in the hydrochloric acid solution was dipped in 50 ml of a 2.38% aqueous solution of tetramethyl ammonium hydroxide at 50° C. for one hour, respectively.

The polymer itself of Example 6 was insoluble in the above-mentioned aqueous alkaline solution, but the polymer of Example 6 subjected to dipping in the HCl solution was dissolved completely in the aqueous alkaline solution.

Example 26
(Synthesis of Copolymer of Fluorine-containing Allyl Ether having COOH Group and Vinylidene Fluoride)

A 100 ml stainless steel autoclave provided with a valve, pressure gauge and thermometer was charged with 3.52 g of perfluoro-(9,9-dihydro-2, 5-bistrifluoromethyl-3 ,6-dioxa-8-nonenoic acid):

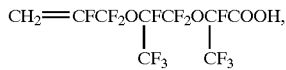

50 ml of perfluorohexane and 0.1 g of dinormalpropylperoxy carbonate (NPP). The inside of a system was sufficiently replaced with nitrogen gas while cooling with a dry ice/methanol solution. Then 8.9 g of vinylidene fluoride (VdF) was introduced through the valve, followed by shaking for reaction at 40° C. for 20 hours. With the advance of the reaction, a gauge pressure was lowered from 12.8 kgf/cm$^2$G before the reaction to 9.8 kgf/cm$^2$G.

After the un-reacted monomer was released, a coagulated solid was removed and dissolved in diethyl ether, followed by re-coagulating with a solvent mixture of hexane and toluene (50/50) to separate a copolymer. Vacuum drying was carried out until a constant value was obtained. Thus 4.8 g of a copolymer was obtained.

According to the $^1$H-NMR and $^{19}$F-NMR analyses, the obtained copolymer was a copolymer comprising VdF and fluorine-containing allyl ether having COOH group in a ratio of 81/19% by mole.

Example 27
(Synthesis of Copolymer Comprising Vinyl Ether having OH Group and Tetrafluoroethylene)

The same autoclave as in Example 26 was charged with 12 g of 2-hydroxyethyl vinyl ether, 40 ml of HCFC-225 (same as in Example 10) and 0.95 g of dinormalpropylperoxy carbonate (NPP). The inside of a system was sufficiently replaced with nitrogen gas while cooling with a dry ice/methanol solution. Then 13.8 g of tetrafluoroethylene (TFE) was introduced through the valve, followed by shaking for reaction at 40° C. for 12 hours. With the advance of the reaction, a gauge pressure was lowered from 12.8 kgf/cm$^2$G before the reaction to 9.0 kgf/cm$^2$G.

After the un-reacted monomer was released, a coagulated solid was removed and dissolved in acetone, followed by re-coagulating with a solvent mixture of hexane and benzene (50/50) to separate a copolymer. Vacuum drying was carried out until a constant value was obtained. Thus 6.5 g of a copolymer was obtained.

According to the $^1$H-NMR and $^{19}$F-NMR analyses, the obtained copolymer was a copolymer comprising TFE and 2-hydroxyethyl vinyl ether in a ratio of 52/48% by mole.

Preparation Example 4
(Synthesis of Fluorine-containing Acrylate having

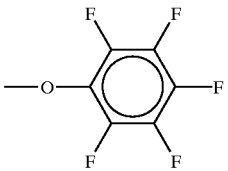

Group)

A 500 ml four-necked glass flask provided with a reflux condenser, thermometer, stirrer and dropping funnel was charged with 150 ml of methylene chloride, 40.4 g of perfluorophenol:

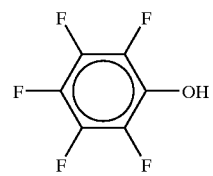

and 30.1 g of triethylamine, followed by cooling with ice to 5° C. and keeping at that temperature.

Then 25 g of α-fluoroacrylic acid fluoride CH$_2$=CFCOF was added dropwise over about 30 minutes with stirring in a stream of nitrogen gas.

After the addition, the temperature was raised to room temperature and the stirring was continued for 2.5 hours.

After the reaction, the mixture was washed with water and an organic layer thereof was dried with anhydrous magnesium sulfate, followed by distilling. Thereby 47 g of perfluorophenyl-αfluoroacrylate:

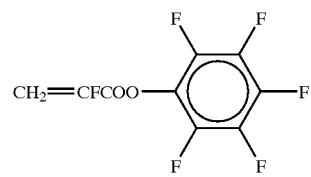

was obtained (56° to 57° C./7.0 mmHg). The polymer structure was identified by the GC-Mass, $^{19}$F-NMR, $^1$H-NMR and IR analyses.

Preparation Example 5
(Synthesis of Fluorine-containing Acrylate having

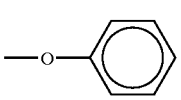

Group)

A reaction was carried out in the same manner as in Preparation Example 4 except that 21 g of phenol was used instead of perfluorophenol, and 28 g of phenyl-αfluroacrylate:

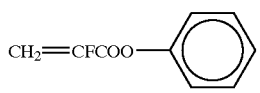

was obtained. The polymer structure was identified by the GC-Mass, $^{19}$F-NMR, $^{1}$H-NMR and IR analyses.

Example 28
(Synthesis of Perfluorophenyl-αfluroacrylate Homopolymer)

The same 100 ml glass flask as in Example 3 was charged with 7 g of perfluorophenyl-αfluroacrylate obtained in Preparation Example 4 and 20 ml of ethyl acetate, followed by bubbling with nitrogen gas for about 30 minutes with stirring. Then 0.06 g of 2,2-azobisisobutyronitrile (AIBN) was added thereto, followed by heating and stirring at 60° C. for three hours. Thus a polymer solution having a high viscosity was obtained.

The obtained polymer solution was added to a mixture of ethyl acetate and methanol (50/50) to coagulate the polymer. The polymer was then removed and further dissolved in N-methylpyrrolidone, followed by re-coagulating with a mixture of ethyl acetate and methanol (50/50) and drying. Thereby 4.5 g of homopolymer was obtained.

Example 29
(Synthesis of Phenyl-αfluroacrylate Homopolymer)

Synthesis of homopolymer was carried out in the same manner as in Example 28 except that 4.5 g of phenyl-αfluroacrylate obtained in Preparation Example 5 was used instead of pefluorophenyl-αfluroacrylate, and thereby 3.2 g of homopolymer was obtained.

Examples 30 to 35
(Measurement of Transparency at 157 nm in Vacuum Ultraviolet Region)

Measurement of transparency at 157 nm in a vacuum ultraviolet region was carried out by the following steps.

(1) Preparation of Coating Composition

A mixture of the fluorine-containing polymer and solvent which was prepared by mixing and dissolving at the mixing ratio shown in Table 2 was filtrated with a 0.5 μm PTFE membrane filter.

(2) Coating

The mixture was applied on a MgF$_2$ substrate in the same manner as in Example 14 and a coating thickness was measured. The results are shown in Table 2.

(3) Measurement of Transparency at 157 nm in Vacuum Ultraviolet Region

A transmitting spectrum was measured in the same manner as in Example 14 and a transmittance at 157 nm and a molecular absorption coefficient were calculated. The results are shown in Table 2.

TABLE 2

|  | Ex. 30 | Ex. 31 | Ex. 32 |
| --- | --- | --- | --- |
| Fluorine-containing polymer | Ex. 8 | Ex. 9 | Ex. 26 |
| Kind of polymer | Fluorine-containing allyl ether | Fluorine-containing allyl ether | VdF/fluorine-containing allyl ether |
| Kind of functional group | —OCHOC$_2$H$_5$ \| CH$_3$ | —O—(tetrahydropyran) | —COOH |
| % by mole of functional group | 38 | 65 | 19 |
| Solvent | Butyl acetate | Butyl acetate | Butyl acetate |
| Content of polymer (%) | 3.0 | 3.0 | 3.0 |
| Coating thickness (nm) | 380 | 163 | 130 |
| Transmittance at 157 nm (%) | 75.2 | 79.6 | 47.0 |
| Molecular absorption coefficient at 157 nm (μm$^{-1}$) | 0.33 | 0.61 | 2.5 |

|  | Ex. 33 | Ex. 34 | Ex. 35 |
| --- | --- | --- | --- |
| Fluorine-containing polymer | Ex. 27 | Ex. 28 | Ex. 29 |
| Kind of polymer | TFE/vinyl ether | Fluorine-containing acryl | Fluorine-containing acryl |
| Kind of functional group | —OH | — | — |
| % by mole of functional group | 48 | — | — |
| Solvent | Butyl acetate | NMP | NMP |
| Content of polymer (%) | 3.0 | 3.0 | 3.0 |
| Coating thickness (nm) | 80 | 160 | 200 |
| Transmittance at 157 nm (%) | 44.2 | 61.5 | 3.04 |
| Molecular absorption coefficient at 157 nm (μm$^{-1}$) | 4.4 | 1.3 | 7.6 |

Example 36
(Synthesis of Fluorine-containing Norbornene)

A 300 ml four-necked glass flask provided with a reflux condenser, thermometer, stirrer and dropping funnel was charged with 61 g of cyclopentadiene, 26 g of t-butyl-αfluroacrylate obtained in Preparation Example 1, 50 ml of tetrahydrofuran and 0.1 g of hydroquinone and was maintained at 25° C.

With stirring in a stream of nitrogen gas, 4.0 g of boron trifluoride-diethyl ether complex was added dropwise, and after completion of the addition, the stirring was continued for reaction at room temperature for 48 hours.

After completion of the reaction, tetrahydrofuran was distilled off, a residue was removed and water was added, followed by extraction with methylene chloride. After a layer of methylene chloride was washed with a 5% aqueous solution of sodium hydrogencarbonate, an organic layer was dried with anhydrous magnesium sulfate.

After the drying, the organic layer was separated and methylene chloride was distilled off with an evaporator. Then distillation was carried out to obtain 14 g of fluorine-containing norbornene:

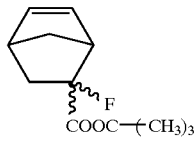

having an acid-reactive group (70° to 72° C./2 mmHg).

The norbornene structure was identified by the GC-Mass, $^{19}$F-NMR and $^1$H-NMR analyses.

Example 37
(Synthesis of Copolymer of Norbornene, Tetrafluroethylene and Tert-butyl-αfluroacrylate)

The same 300 ml autoclave as in Example 26 was charged with 10.5 g of bicyclo[2.2.1]hept-2-ene (2-norbornene), 16.2 g of tert-butyl-αfluroacrylate obtained in Preparation Example 1, 140 ml of HCFC-141b and 0.5 g of bis(4-tert-butylcyclohexyl)peroxy dicarbonate (TCP), and the inside of a system was sufficiently replaced with nitrogen gas while cooling with a dry ice/methanol solution. Then 22.0 g of tetrafluroethylene (TFE) was introduced through the valve, followed by shaking for reaction at 40° C. for 12 hours. With the advance of the reaction, a gauge pressure was lowered from 7.5 kgf/cm$^2$G before the reaction to 4.2 kgf/cm$^2$G.

After releasing of the un-reacted monomer, a polymerization solution was removed and, after concentration, was re-coagulated with hexane to separate a copolymer. Vacuum drying was carried out until a constant value was obtained, and 36.5 g of a copolymer was obtained.

According to the $^1$H-NMR and $^{19}$F-NMR analyses, the copolymer was one comprising TFE, 2-norbornene and tert-butyl-αfluroacrylate in a ratio of 11/20/69% by mole.

According to the GPC analysis, the number average molecular weight of the copolymer was 23,000.

Example 38
(Synthesis of Copolymer of Norbornene, Tetrafluroethylene and Tert-butyl-αfluroacrylate)

The same 300 ml autoclave as in Example 26 was charged with 10.5 g of 2-norbornene, 16.2 g of tert-butyl-αfluroacrylate obtained in Preparation Example 1, 140 ml of HCFC-141b and 0.5 g of bis(4-tert-butylcyclohexyl)peroxy dicarbonate (TCP) and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.8 kgf/cm$^2$G before the reaction to 8.5 kgf/cm$^2$G.

After releasing of the un-reacted monomer, a polymerization solution was removed and, after concentration, was re-coagulated with hexane to separate a copolymer. Vacuum drying was carried out until a constant value was obtained, and 24.5 g of a copolymer was obtained.

According to the $^1$H-NMR and $^{19}$F-NMR analyses, the copolymer was one comprising TFE, 2-norbornene and tert-butyl-αfluroacrylate in a ratio of 19/22/59% by mole.

According to the GPC analysis, the number average molecular weight of the copolymer was 17,000.

Example 39
(Synthesis of Copolymer of Norbornene, Tetrafluroethylene and Tert-butyl-αfluroacrylate)

The same 300 ml autoclave as in Example 26 was charged with 10.5 g of 2-norbornene, 9.8 g of tert-butyl-αfluroacrylate obtained in Preparation Example 1, 140 ml of HCFC-141b and 0.5 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.8 kgf/cm$^2$G before the reaction to 9.0 kgf/cm$^2$G.

After releasing of the un-reacted monomer, a polymerization solution was removed and re-coagulated with methanol to separate a copolymer. Vacuum drying was carried out until a constant value was obtained, and 20.9 g of a copolymer was obtained.

According to the $^1$H-NMR and $^{19}$F-NMR analyses, the copolymer was one comprising TFE, 2-norbornene and tert-butyl-αfluroacrylate in a ratio of 31/30/39% by mole.

According to the GPC analysis, the number average molecular weight of the copolymer was 9,800.

Example 40
(Synthesis of Copolymer of Norbornene, Tetrafluroethylene and Tert-butyl-αfluroacrylate)

The same 300 ml autoclave as in Example 26 was charged with 11.8 g of 2-norbornene, 9.8 g of tert-butyl-αfluroacrylate obtained in Preparation Example 1, 140 ml of HCFC-141b and 0.5 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.2 kgf/cm$^2$G before the reaction to 9.1 kgf/cm$^2$G.

After releasing of the un-reacted monomer, a polymerization solution was removed and re-coagulated with methanol to separate a copolymer. Vacuum drying was carried out until a constant value was obtained, and 18.0 g of a copolymer was obtained.

According to the $^1$H-NMR and $^{19}$F-NMR analyses, the copolymer was one comprising TFE, 2-norbornene and tert-butyl-αfluroacrylate in a ratio of 45/35/20% by mole.

According to the GPC analysis, the number average molecular weight of the copolymer was 4,300.

Example 41
(Synthesis of Copolymer of Tetrafluroethylene and Fluorine-containing Norbornene)

The same 300 ml autoclave as in Example 26 was charged with 15.9 g of fluorine-containing norbornene obtained in Example 36, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 30.0 g of tetrafluroethylene (TFE) was introduced through the valve, followed by shaking for reaction at 40° C. for 12 hours. With the advance of the reaction, a gauge pressure was lowered from 10.2 kgf/cm$^2$G before the reaction to 9.6 kgf/cm$^2$G.

After releasing of the un-reacted monomer, a polymerization solution was removed and re-coagulated with methanol to separate a copolymer. Vacuum drying was carried out until a constant value was obtained, and 8.5 g of a copolymer was obtained.

According to the $^{19}$F-NMR analysis, the copolymer was one comprising TFE and fluorine-containing norbornene in a ratio of 50/50% by mole.

According to the GPC analysis, the number average molecular weight of the copolymer was 4,600.

Example 42
(Synthesis of Copolymer of Norbornene, Tetrafluroethylene and Fluorine-containing Norbornene)

The same 300 ml autoclave as in Example 26 was charged with 7.0 g of 2-norbornene, 47.5 g of fluorine-containing norbornene obtained in Example 36, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 30.0 g of tetrafluroethylene (TFE) was introduced through the valve, followed by shaking for reaction at 40° C. for 12 hours. With the advance of the reaction, a gauge pressure was lowered from 10.1 kgf/cm$^2$G before the reaction to 9.3 kgf/cm$^2$G.

After releasing of the un-reacted monomer, a polymerization solution was removed and re-coagulated with methanol to separate a copolymer. Vacuum drying was carried out until a constant value was obtained, and 13.5 g of a copolymer was obtained.

According to the $^1$H-NMR and $^{19}$F-NMR analyses, the copolymer was one comprising TFE, 2-norbornene and fluorine-containing norbornene in a ratio of 50/14/36% by mole.

According to the GPC analysis, the number average molecular weight of the copolymer was 4,600.

Example 43
(Synthesis of Copolymer of Norbornene, Tetrafluroethylene and Fluorine-containing Norbornene)

The same 300 ml autoclave as in Example 26 was charged with 14 g of 2-norbornene, 31 g of fluorine-containing norbornene obtained in Example 36, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 30.0 g of tetrafluroethylene (TFE) was introduced through the valve, followed by shaking for reaction at 40° C. for 12 hours. With the advance of the reaction, a gauge pressure was lowered from 10.2 kgf/cm$^2$G before the reaction to 8.9 kgf/cm$^2$G.

After releasing of the un-reacted monomer, a polymerization solution was removed and re-coagulated with methanol to separate a copolymer. Vacuum drying was carried out until a constant value was obtained, and 17.5 g of a copolymer was obtained.

According to the $^1$H-NMR and $^{19}$F-NMR analyses, the copolymer was one comprising TFE, 2-norbornene and fluorine-containing norbornene in a ratio of 53/25/22% by mole.

According to the GPC analysis, the number average molecular weight of the copolymer was 4,000.

Example 44
(Synthesis of Copolymer of Norbornene, Tetrafluroethylene and Fluorine-containing Norbornene)

The same 300 ml autoclave as in Example 26 was charged with 27.3 g of 2-norbornene, 47.4 g of fluorine-containing norbornene obtained in Example 36, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 30.0 g of tetrafluroethylene (TFE) was introduced through the valve, followed by shaking for reaction at 40° C. for 12 hours. With the advance of the reaction, a gauge pressure was lowered from 10.1 kgf/cm$^2$G before the reaction to 9.5 kgf/cm$^2$G.

After releasing of the un-reacted monomer, a polymerization solution was removed and re-coagulated with methanol to separate a copolymer. Vacuum drying was carried out until a constant value was obtained, and 16.5 g of a copolymer was obtained.

According to the $^1$H-NMR and $^{19}$F-NMR analyses, the copolymer was one comprising TFE, 2-norbornene and fluorine-containing norbornene in a ratio of 56/29/15% by mole.

According to the GPC analysis, the number average molecular weight of the copolymer was 5,300.

Example 45
(Synthesis of Copolymer of Norbornene, Tetrafluroethylene and Fluorine-containing Allyl Ether)

The same 300 ml autoclave as in Example 26 was charged with 17.0 g of 2-norbornene, 39.1 g of fluorine-containing allyl ether:

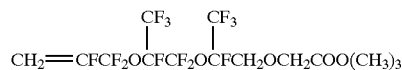

obtained in Preparation Example 2, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.0 kgf/cm$^2$G before the reaction to 9.5 kgf/cm$^2$G.

After releasing of the un-reacted monomer, a polymerization solution was removed and re-coagulated with methanol to separate a copolymer. Vacuum drying was carried out until a constant value was obtained, and 9.0 g of a copolymer was obtained.

According to the $^1$H-NMR and $^{19}$F-NMR analyses, the copolymer was one comprising TFE, 2-norbornene and fluorine-containing allyl ether in a ratio of 50/34/16% by mole.

According to the GPC analysis, the number average molecular weight of the copolymer was 3,900.

Preparation Example 6
(Synthesis of Fluorine-containing Allyl Ether having —COOC(CH$_3$)$_3$ Group)

The same 300 ml four-necked glass flask as in Preparation Example 1 was charged with 50 ml of pyridine and after adding 50 g of thionyl chloride in a stream of nitrogen gas, the autoclave was cooled to 5° C. and 84 g of perfluoro-(9, 9-dihydro-2,5-bistrifluoromethyl-3,6-dioxa-8-nonenoic acid)

was slowly added dropwise. Further after stirring for three hours under cooling with ice, excessive thionyl chloride and solvent were distilled off under reduced pressure, and a reaction mixture was obtained. The reaction mixture was slowly added dropwise into the same 200 ml four-necked glass flask as in Preparation Example 1, in which 50 ml of triethylamine, 50 ml of methylene chloride and 20 g of tert-buthanol had been previously mixed and cooled to 5° C. After completion of the addition, the temperature of the mixture in the flask was restored to room temperature and the stirring was continued for 12 hours. The mixture was then poured into 500 ml of 1N hydrochloric acid and an organic layer was separated, washed with water, dried and distilled. Thus 76.0 g of fluorine-containing allyl ether having an acid-labile group and represented by the formula:

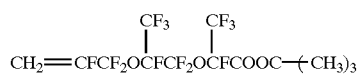

was obtained. The boiling point thereof was 42° to 46° C./0.2 mmHg.

The above monomer was identified by the $^{19}$F-NMR, $^{1}$H-NMR and IR analyses.

Example 46
(Synthesis of Copolymer of Norbornene, Tetrafluroethylene and Fluorine-containing Allyl Ether)

The same 300 ml autoclave as in Example 26 was charged with 17.0 g of 2-norbornene, 33.2 g of fluorine-containing allyl ether:

obtained in Preparation Example 6, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.3 kgf/cm$^2$G before the reaction to 9.4 kgf/cm$^2$G.

After releasing of the un-reacted monomer, a polymerization solution was removed and re-coagulated with methanol to separate a copolymer. Vacuum drying was carried out until a constant value was obtained, and 12.0 g of a copolymer was obtained.

According to the $^{1}$H-NMR and $^{19}$F-NMR analyses, the copolymer was one comprising TFE, 2-norbornene and fluorine-containing allyl ether in a ratio of 47/40/13% by mole.

According to the GPC analysis, the number average molecular weight of the copolymer was 4,400.

Example 47
(Synthesis of Copolymer of Tetrafluroethylene and Fluorine-containing Vinyl Ether)

The same 100 ml autoclave as in Example 26 was charged with 24.5 g of fluorine-containing vinyl ether: $CH_2=CHOCH_2CH_2(CF_2)_7CF_3$, 40 ml of HCFC-141b and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluoroethylene (TFE) was introduced through the valve, followed by shaking for reaction at 40° C. for 12 hours. With the advance of the reaction, a gauge pressure was lowered from 10.0 kgf/cm$^2$G before the reaction to 3.4 kgf/cm$^2$G.

After releasing of the un-reacted monomer, a polymerization product was removed and, washed with HCFC-141b, methanol and hexane to separate a copolymer. Vacuum drying was carried out until a constant value was obtained, and 16.5 g of a copolymer was obtained. According to the $^{1}$H-NMR and $^{19}$F-NMR analyses, the copolymer was one comprising TFE and fluorine-containing vinyl ether in a ratio of 51/49% by mole.

Examples 48 to 57
(Deprotection of Copolymer of Norbornene, Tetrafluroethylene and Tert-butyl-αfluroacrylate and Solubility in Alkaline Developing Solution)

(1) Deprotection

In a 100 ml egg-plant type flask, 5 g each of copolymers comprising of norbornene, tetrafluroethylene and tert-butyl-αfluoroacrylate was dissolved in 80 g of methylene chloride and, trifluoroacetic acid shown in Table 3 was added thereto, followed by stirring at room temperature for 12 hours. After the reaction, excessive trifluoroacetic acid and methylene chloride were distilled off under reduced pressure. A remaining solid component was washed with distilled water several times, dissolved in tetrafluroethylene and re-coagulated with hexane to separate a copolymer. A deprotection ratio was calculated from the results of the $^{1}$H-NMR and $^{19}$F-NMR analyses. The results are shown in Table 3.

(2) Coating

A copolymer obtained in the same manner as in Example 14 was dissolved in propyleneglycol monoethylether acetate (PGMEA) in a concentration of 3.0% and applied on a silicon substrate.

(3) Solubility in Alkaline Developing Solution

A 2.38% aqueous solution of tetramethyl ammonium hydroxide was dropped on the silicon substrate coated with the copolymer to evaluate a solubility thereof. The results are shown in Table 3.

TABLE 3

|  | Ex. 48 | Ex. 49 | Ex. 50 | Ex. 51 | Ex. 52 |
| --- | --- | --- | --- | --- | --- |
| Fluorine-containing polymer | Ex. 37 | Ex. 37 | Ex. 37 | Ex. 38 | Ex. 38 |
| Trifluoroacetic acid (g) | 4 | 8 | 16 | 4 | 8 |
| Deprotection ratio (%) | 5 | 44 | 68 | 10 | 58 |
| Content of COOH group (%) | 4 | 30 | 46 | 6 | 34 |
| Solubility in alkaline developing solution | Not dissolved | Dissolved | Dissolved | Not dissolved | Dissolved |

|  | Ex. 53 | Ex. 54 | Ex. 55 | Ex. 56 | Ex. 57 |
| --- | --- | --- | --- | --- | --- |
| Fluorine-containing polymer | Ex. 38 | Ex. 39 | Ex. 39 | Ex. 39 | Ex. 40 |
| Trifluoroacetic acid (g) | 16 | 4 | 8 | 16 | 16 |

TABLE 3-continued

| Deprotection ratio (%) | 75 | 32 | 55 | 84 | 90 |
|---|---|---|---|---|---|
| Content of COOH group (%) | 44 | 13 | 21 | 33 | 18 |
| Solubility in alkaline developing solution | Dissolved | Not dissolved | A residue partly remained undissolved | Dissolved | A residue partly remained undissolved |

Example 58
(Deprotection of Copolymer of Tetrafluroethylene and Fluorine-containing Norbornene and Solubility in Alkaline Developing Solution)

Deprotection and solubility in an alkaline developing solution of the fluorine-containing polymer obtained in Example 41 were evaluated in the same manner as in Example 48. The sample subjected to deprotecting with 16 g of trifluoroacetic acid was dissolved in a 2.38% aqueous solution of tetramethyl ammonium hydroxide.

Example 59
(Synthesis of Copolymer of Cyclopentene, Tetrafluroethylene and Tert-butyl-αfluroacrylate)

The same 100 ml autoclave as in Example 26 was charged with 3.4 g of cyclopentene, 1.5 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 8.0 kgf/cm$^2$G before the reaction to 7.7 kgf/cm$^2$G.

After releasing of the un-reacted monomer, a polymerization solution was removed and, re-coagulated with hexane to separate a copolymer. Vacuum drying was carried out until a constant value was obtained, and 1.7 g of a copolymer was obtained.

According to the $^1$H-NMR and $^{19}$F-NMR analyses, the copolymer was one comprising TFE, cyclopentene and tert-butyl-αfluroacrylate in a ratio of 18/41/41% by mole.

According to the GPC analysis, the number average molecular weight of the copolymer was 15,000.

Example 60
(Synthesis of Copolymer of Cyclopentene, Tetrafluroethylene and Tert-butyl-αfluroacrylate)

The same 100 ml autoclave as in Example 26 was charged with 1.7 g of cyclopentene, 1.5 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 8.0 kgf/cm$^2$G before the reaction to 7.7 kgf/cm$^2$G.

After releasing of the un-reacted monomer, a polymerization solution was removed and, re-coagulated with hexane to separate a copolymer. Vacuum drying was carried out until a constant value was obtained, and 2.9 g of a copolymer was obtained.

According to the $^1$H-NMR and $^{19}$F-NMR analyses, the copolymer was one comprising TFE, cyclopentene and tert-butyl-αfluroacrylate in a ratio of 29/36/35% by mole.

According to the GPC analysis, the number average molecular weight of the copolymer was 14,000.

Example 61
(Synthesis of Copolymer of Cyclopentene, Tetrafluroethylene and Tert-butyl-methacrylate)

The same 100 ml autoclave as in Example 26 was charged with 3.4 g of cyclopentene, 3.6 g of tert-butyl-methacrylate, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 8.0 kgf/cm$^2$G before the reaction to 7.9 kgf/cm$^2$G.

After releasing of the un-reacted monomer, a polymerization solution was removed and, re-coagulated with hexane to separate a copolymer. Vacuum drying was carried out until a constant value was obtained, and 3.8 g of a copolymer was obtained.

According to the $^1$H-NMR and $^{19}$F-NMR analyses, the copolymer was one comprising TFE, cyclopentene and tert-butyl-methacrylate in a ratio of 13/17/70% by mole.

According to the GPC analysis, the number average molecular weight of the copolymer was 5,800.

Example 62
(Synthesis of Copolymer of Cyclopentene, Tetrafluroethylene and Tert-butyl-methacrylate)

The same 100 ml autoclave as in Example 26 was charged with 1.7 g of cyclopentene, 1.5 g of tert-butyl-methacrylate, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 9.0 kgf/cm$^2$G before the reaction to 8.9 kgf/cm$^2$G.

After releasing of the un-reacted monomer, a polymerization solution was removed and, re-coagulated with hexane to separate a lo copolymer. Vacuum drying was carried out until a constant value was obtained, and 2.8 g of a copolymer was obtained.

According to the $^1$H-NMR and $^{19}$F-NMR analyses, the copolymer was one comprising TFE, cyclopentene and tert-butyl-methacrylate in a ratio of 34/37/29% by mole.

According to the GPC analysis, the number average molecular weight of the copolymer was 5,600.

Example 63
(Synthesis of Copolymer of (perfluorooctyl)ethylene, Tetrafluroethylene and Tert-butyl-αfluroacrylate)

The same 100 ml autoclave as in Example 26 was charged with 17.8 g of (perfluorooctyl)ethylene (CH$_2$=CH(CF$_2$)

₇CF₃), 5.9 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 8.0 g of tetrafluroethylene (TFE) was introduced through the valve, followed by shaking for reaction at 40° C. for 18 hours. With the advance of the reaction, a gauge pressure was lowered from 7.8 kgf/cm²G before the reaction to 7.5 kgf/cm²G.

After releasing of the un-reacted monomer, a polymerization solution was removed and, re-coagulated with hexane to separate a copolymer. Vacuum drying was carried out until a constant value was obtained, and 7.8 g of a copolymer was obtained.

According to the ¹H-NMR and ¹⁹F-NMR analyses, the copolymer was one comprising TFE, (perfluorooctyl)ethylene and tert-butyl-αfluroacrylate in a ratio of 9/9/82% by mole.

According to the GPC analysis, the number average molecular weight of the copolymer was 170,000.

Example 64
(Synthesis of Copolymer of (perfluorooctyl)ethylene, Tetrafluroethylene and Tert-butyl-αfluroacrylate)

The same 100 ml autoclave as in Example 26 was charged with 22.3 g of (perfluorooctyl)ethylene, 1.5 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 7.0 kgf/cm²G before the reaction to 5.0 kgf/cm²G.

After releasing of the un-reacted monomer, a polymerization solution was removed and, re-coagulated with hexane to separate a copolymer. Vacuum drying was carried out until a constant value was obtained, and 3.0 g of a copolymer was obtained.

According to the ¹H-NMR and ¹⁹F-NMR analyses, the copolymer was one comprising TFE, (perfluorooctyl)ethylene and tert-butyl-αfluroacrylate in a ratio of 15/19/66% by mole.

According to the GPC analysis, the number average molecular weight of the copolymer was 89,000.

Example 65
(Synthesis of Copolymer of (perfluorooctyl)ethylene, Tetrafluroethylene and Tert-butyl-methacrylate)

The same 100 ml autoclave as in Example 26 was charged with 22.3 g of (perfluorooctyl)ethylene, 1.5 g of tert-butyl-methacrylate, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 6.5 kgf/cm²G before the reaction to 5.5 kgf/cm²G.

After releasing of the un-reacted monomer, a polymerization solution was removed and, re-coagulated with hexane to separate a copolymer. Vacuum drying was carried out until a constant value was obtained, and 2.0 g of a copolymer was obtained.

According to the ¹H-NMR and ¹⁹F-NMR analyses, the copolymer was one comprising TFE, (perfluorooctyl)ethylene and tert-butyl-methacrylate in a ratio of 37/30/33% by mole.

According to the GPC analysis, the number average molecular weight of the copolymer was 8,100.

Example 66
(Synthesis of Copolymer of (perfluorooctyl)ethylene, Tetrafluroethylene and Tert-butyl-methacrylate)

The same 100 ml autoclave as in Example 26 was charged with 22.3 g of (perfluorooctyl)ethylene, 0.71 g of tert-butyl-methacrylate, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 6.5 kgf/cm²G before the reaction to 6.2 kgf/cm²G.

After releasing of the un-reacted monomer, a polymerization solution was removed and, re-coagulated with hexane to separate a copolymer. Vacuum drying was carried out until a constant value was obtained, and 1.5 g of a copolymer was obtained.

According to the ¹H-NMR and ¹⁹F-NMR analyses, the copolymer was one comprising TFE, (perfluorooctyl)ethylene and tert-butyl-methacrylate in a ratio of 34/36/30% by mole.

According to the GPC analysis, the number average molecular weight of the copolymer was 13,000.

Example 67
(Synthesis of Copolymer of Allyl Alcohol, Tetrafluroethylene and Tert-butyl-αfluroacrylate)

The same 100 ml autoclave as in Example 26 was charged with 2.4 g of allyl alcohol (CH₂=CHCH₂OH), 5.8 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 8.0 g of tetrafluroethylene (TFE) was introduced through the valve, followed by shaking for reaction at 40° C. for 18 hours. With the advance of the reaction, a gauge pressure was lowered from 6.2 kgf/cm²G before the reaction to 6.0 kgf/cm²G.

After releasing of the un-reacted monomer, a polymerization solution was removed and, re-coagulated with hexane to separate a copolymer. Vacuum drying was carried out until a constant value was obtained, and 7.0 g of a copolymer was obtained.

According to the ¹H-NMR and ¹⁹F-NMR analyses, the copolymer was one comprising TFE, allyl alcohol and tert-butyl-αfluroacrylate in a ratio of 8/39/53% by mole.

According to the GPC analysis, the number average molecular weight of the copolymer was 12,000.

Example 68
(Synthesis of Copolymer of Allyl Alcohol, Tetrafluroethylene and Tert-butyl-αfluroacrylate)

The same 100 ml autoclave as in Example 26 was charged with 2.9 g of allyl alcohol, 1.5 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 9.2 kgf/cm$^2$G before the reaction to 8.2 kgf/cm$^2$G.

After releasing of the un-reacted monomer, a polymerization solution was removed and, re-coagulated with hexane to separate a copolymer. Vacuum drying was carried out until a constant value was obtained, and 2.4 g of a copolymer was obtained.

According to the $^1$H-NMR and $^{19}$F-NMR analyses, the copolymer was one comprising TFE, allyl alcohol and tert-butyl-αfluroacrylate in a ratio of 20/55/25% by mole.

According to the GPC analysis, the number average molecular weight of the copolymer was 12,000.

Example 69
(Synthesis of Copolymer of 4,4-ditrifluoromethyl-1-butene-4-ol, Tetrafluroethylene and Tert-butyl-αfluroacrylate)

The same 100 ml autoclave as in Example 26 was charged with 11.2 g of 4,4-di(trifluoromethyl)-1-butene-4-ol.THF adduct (CH$_2$=CHCH$_2$C(CF$_3$)$_2$OH.THF), 2.9 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 8.0 g of tetrafluroethylene (TFE) was introduced through the valve, followed by shaking for reaction at 40° C. for 18 hours. With the advance of the reaction, a gauge pressure was lowered from 6.5 kgf/cm$^2$G before the reaction to 6.2 kgf/cm$^2$G.

After releasing of the un-reacted monomer, a polymerization solution was removed and, re-coagulated with hexane to separate a copolymer. Vacuum drying was carried out until a constant value was obtained, and 5.9 g of a copolymer was obtained.

According to the $^1$H-NMR and $^{19}$F-NMR analyses, the copolymer was one comprising TFE, 4,4-ditrifluoromethyl-1-butene-4-ol and tert-butyl-αfluroacrylate in a ratio of 19/33/48% by mole.

According to the GPC analysis, the number average molecular weight of the copolymer was 28,000.

Example 70
(Synthesis of Copolymer of 4,4-ditrifluoromethyl-1-butene-4-ol, Tetrafluroethylene and tert-butyl-αfluroacrylate)

The same 100 ml autoclave as in Example 26 was charged with 14.0 g of 4,4-ditrifluoromethyl-1-butene-4-ol-THF adduct, 0.73 g of tert-butyl-αfluroacrylate obtained in Preparation Example 1, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 8.0 g of tetrafluroethylene (TFE) was introduced through the valve, followed by shaking for reaction at 40° C. for 18 hours. With the advance of the reaction, a gauge pressure was lowered from 8.0 kgf/cm$^2$G before the reaction to 7.0 kgf/cm$^2$G.

After releasing of the un-reacted monomer, a polymerization solution was removed and, re-coagulated with hexane to separate a copolymer. Vacuum drying was carried out until a constant value was obtained, and 2.6 g of a copolymer was obtained.

According to the $^1$H-NMR and $^{19}$F-NMR analyses, the copolymer was one comprising TFE, 4,4-ditrifluoromethyl-1-butene-4-ol and tert-butyl-αfluroacrylate in a ratio of 23/46/31% by mole.

According to the GPC analysis, the number average molecular weight of the copolymer was 17,000.

Example 71
(Synthesis of Copolymer of 4,4-ditrifluoromethyl-1-butene-4-ol, Tetrafluroethylene and Tert-butyl-methacrylate)

The same 100 ml autoclave as in Example 26 was charged with 14.0 g of 4,4-ditrifluoromethyl-1-butene-4-ol.THF adduct, 3.6 g of tert-butyl-methacrylate, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 8.0 kgf/cm$^2$G before the reaction to 7.9 kgf/cm$^2$G.

After releasing of the un-reacted monomer, a polymerization solution was removed and, re-coagulated with hexane to separate a copolymer. Vacuum drying was carried out until a constant value was obtained, and 3.3 g of a copolymer was obtained.

According to the $^1$H-NMR and $^{19}$F-NMR analyses, the copolymer was one comprising TFE, 4,4-ditrifluoromethyl-1-butene-4-ol and tert-butyl-methacrylate in a ratio of 10/35/55% by mole.

According to the GPC analysis, the number average molecular weight of the copolymer was 4,900.

Example 72
(Synthesis of Copolymer of 4,4-ditrifluoromethyl-1-butene-4-ol, Tetrafluroethylene and Tert-butyl-methacrylate)

The same 100 ml autoclave as in Example 26 was charged with 14.0 g of 4,4-ditrifluoromethyl-1-butene-4-ol.THF adduct, 0.72 g of tert-butyl-methacrylate, 40 ml of the same HCFC-225 as in Example 10 and 0.3 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 8.0 kgf/cm$^2$G before the reaction to 7.9 kgf/cm$^2$G.

After releasing of the un-reacted monomer, a polymerization solution was removed and, re-coagulated with hexane to separate a copolymer. Vacuum drying was carried out until a constant value was obtained, and 2.3 g of a copolymer was obtained.

According to the $^1$H-NMR and $^{19}$F-NMR analyses, the copolymer was one comprising TFE, 4,4-ditrifluoromethyl-1-butene-4-ol and tert-butyl-methacrylate in a ratio of 44/16/40% by mole.

According to the GPC analysis, the number average molecular weight of the copolymer was 6,100.

Example 73
(Synthesis of Copolymer of (perfluorooctyl)ethylene and Tert-butyl-αfluroacrylate)

A 100 ml four-necked flask provided with a thermometer, dropping funnel, reflux pipe and three-way cock was charged with 30 ml of buytl acetate and 0.5 g of AIBN, and after the inside of a system was sufficiently replaced with nitrogen gas, the flask was rapidly heated to 95° C. in an oil bath under nitrogen atmosphere. Thereto was added dropwise a solution of a mixture of 22.3 g of (perfluorooctyl) ethylene, 3.7 g of tert-butyl-αfluroacrylate and butyl acetate over three hours. After the addition, the reaction was continued further by stirring for three hours.

After completion of the reaction, the polymerization solution was removed and concentrated by an evaporator, followed by re-coagulating with hexane to separate a copolymer. Vacuum drying was carried out until a constant value was obtained, and 2.7 g of a copolymer was obtained.

According to the $^1$H-NMR and $^{19}$F-NMR analyses, the copolymer was one comprising (perfluorooctyl)ethylene and tert-butyl-αfluroacrylate in a ratio of 19/81% by mole.

According to the GPC analysis, the number average molecular weight of the copolymer was 7,700.

Example 74

(Synthesis of Copolymer of (perfluorooctyl)ethylene and Tert-butyl-αfluroacrylate)

A 100 ml four-necked flask provided with a thermometer, dropping funnel, reflux pipe and three-way cock was charged with 30 ml of buytl acetate and 0.5 g of AIBN, and after the inside of a system was sufficiently replaced with nitrogen gas, the flask was rapidly heated to 95° C. in an oil bath under nitrogen atmosphere. Thereto was added dropwise a solution of a mixture of 17.9 g of (perfluorooctyl) ethylene, 2.9 g of tert-butyl-αfluroacrylate and butyl acetate over three hours. After the addition, the reaction was continued further by stirring for three hours.

After completion of the reaction, the polymerization solution was removed and concentrated by an evaporator, followed by re-coagulating with hexane to separate a copolymer. Vacuum drying was carried out until a constant value was obtained, and 3.3 g of a copolymer was obtained.

According to the $^1$H-NMR and $^{19}$F-NMR analyses, the copolymer was one comprising (perfluorooctyl)ethylene and tert-butyl-αfluroacrylate in a ratio of 37/63% by mole.

According to the GPC analysis, the number average molecular weight of the copolymer was 1,800.

Example 75

(Synthesis of Copolymer of (perfluorooctyl)ethylene and Tert-butyl-methacrylate)

A 100 ml four-necked flask provided with a thermometer, dropping funnel, reflux pipe and three-way cock was charged with 30 ml of buytl acetate and 0.5 g of AIBN, and after the inside of a system was sufficiently replaced with nitrogen gas, the flask was rapidly heated to 95° C. in an oil bath under nitrogen atmosphere. Thereto was added dropwise a solution of a mixture of 22.3 g of (perfluorooctyl) ethylene, 7.1 g of tert-butyl-methacrylate and butyl acetate over three hours. After the addition, the reaction was continued further by stirring for three hours.

After completion of the reaction, the polymerization solution was removed and concentrated by an evaporator, followed by re-coagulating with hexane to separate a copolymer. Vacuum drying was carried out until a constant value was obtained, and 3.3 g of a copolymer was obtained.

According to the $^1$H-NMR and $^{19}$F-NMR analyses, the copolymer was one comprising (perfluorooctyl)ethylene and tert-butyl-methacrylate in a ratio of 40/60% by mole.

According to the GPC analysis, the number average molecular weight of the copolymer was 7,000.

Preparation Example 7

(Synthesis of Cyclopentene Derivative)

A two-necked egg-plant type flask provided with a septum and reflux pipe was charged with 2-cyclopentene-1-acetic acid:

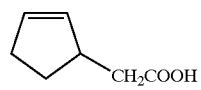

(25 g, 0.198 mmol) and thionyl chloride (50 g) and was heated to a temperature where the reflux was initiated (80° C., bath temperature: 110° C.). After the three-hour reaction, excessive thionyl chloride was distilled off under reduced pressure by means of an aspirator, followed by distillation to obtain an acid chloride (boiling point: 44° to 47° C., 4 mmHg). Then tert-butanol (50 ml) and ether (50 ml) were put in a three-necked flask provided with a reflux pipe, dropping funnel and thermometer, and thereto was added dropwise n-butyl lithium (173 ml, 0.277 mol) over one hour while cooling in ice bath. After the addition, stirring was continued for a while, and the above-mentioned acid chloride was added dropwise thereto over one hour while cooling in ice bath. After completion of the addition, the stirring was continued at room temperature for 24 hours. After completion of the reaction, R225 was put therein and an organic phase was washed with 2N hydrochloric acid several times and then with saturated brine several times and dried with magnesium sulfate. After the drying, magnesium sulfate was filtrated to concentrate the solvent. The concentrated product was distilled and 32 g of an intended ester:

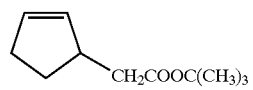

was obtained (boiling point: 52° to 55° C., 1 mmHg).

Also cyclopentene derivative:

was synthesized in the same manner (boiling point: 57° to 60° C., 5 mmHg).

Example 76

(Synthesis of Copolymer of Cyclopentene Derivative and Tetrafluroethylene)

The same 100 ml autoclave as in Example 26 was charged with 4.6 g of cyclopentene derivative:

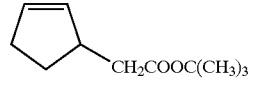

obtained in Preparation Example 7, 40 ml of HCFC-141b and 0.5 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 10.0 kgf/cm$^2$G before the reaction to 9.8 kgf/cm$^2$G.

After releasing of the un-reacted monomer, the polymerization solution was removed and re-coagulated with hexane to separate a copolymer. Vacuum drying was carried out until a constant value was obtained, and 0.9 g of a copolymer was obtained.

According to the elementary analysis, the copolymer was one comprising TFE and cyclopentene derivative in a ratio of 50/50% by mole.

According to the GPC analysis, the number average molecular weight of the copolymer was 1,500.

Example 77

(Synthesis of Copolymer of Cyclopentene Derivative and Tetrafluroethylene)

The same 100 ml autoclave as in Example 26 was charged with 4.2 g of cyclopentene derivative:

obtained in Preparation Example 7, 40 ml of HCFC-141b and 0.5 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 10.0 kgf/cm²G before the reaction to 9.8 kgf/cm²G.

After releasing of the un-reacted monomer, the polymerization solution was removed and re-coagulated with hexane to separate a copolymer. Vacuum drying was carried out until a constant value was obtained, and 1.3 g of a copolymer was obtained.

According to the elementary analysis, the copolymer was one comprising TFE and cyclopentene derivative in a ratio of 50/50% by mole.

According to the GPC analysis, the number average molecular weight of the copolymer was 2,100.

Preparation Example 8

(Synthesis of Norbornene Derivative)

Synthesis of α-trifluoromethacrylate-tert-butylester:

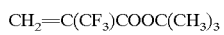

was carried out in the same manner as in Preparation Example 7 except that α-trifluoromethylacrylic acid:

was used instead of 2-cyclopentene-1-acetic acid. Then the synthesized α-trifluoromethylacrylic acid-tert-butyl ester was subjected to reaction with cyclopentadiene by Diel's-Alder reaction, and an intended norbornene derivative:

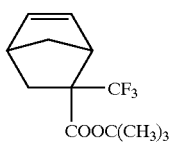

was obtained. The synthesis was carried out in the same manner as in Example 36 except that α-trifluoromethylacrylic acid-tert-butyl ester was used instead of tert-butyl-α-fluoroacrylate.

Example 78

(Synthesis of Copolymer of Norbornene Derivative and Tetrafluroethylene)

The same 100 ml autoclave as in Example 26 was charged with 6.6 g of norbornene derivative:

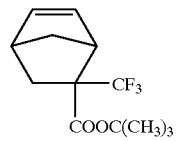

obtained in Preparation Example 8, 40 ml of HCFC-141b and 0.5 g of bis(4-tert-butylcyclohexyl)peroxy dicarbonate (TCP), and the inside of a system was sufficiently replaced with nitrogen gas while cooling with a dry ice/methanol solution. Then 10.0 g of tetrafluroethylene (TFE) was introduced through the valve, followed by shaking for reaction at 40° C. for 18 hours. With the advance of the reaction, a gauge pressure was lowered from 10.0 kgf/cm²G before the reaction to 9.8 kgf/cm²G.

After releasing of the un-reacted monomer, a polymerization solution was removed and, re-coagulated with hexane to separate a copolymer. Vacuum drying was carried out until a constant value was obtained, and 2.2 g of a copolymer was obtained.

According to the elementary analysis, the copolymer was one comprising TFE and norbornene derivative in a ratio of 50/50% by mole.

According to the GPC analysis, the number average molecular weight of the copolymer was 4,200.

Example 79

(Synthesis of Copolymer of Norbornene, Tetrafluroethylene and Fluorine-containing Norbornene Derivative)

The same 300 ml autoclave as in Example 26 was charged with 7.0 g of 2-norbornene, 58.7 g of fluorine-containing norbornene derivative:

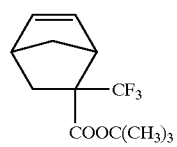

obtained in Preparation Example 8, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 30.0 g of tetrafluroethylene (TFE) was introduced through the valve, followed by shaking for reaction at 40° C. for 12 hours. With the advance of the reaction, a gauge pressure was lowered from 10.7 kgf/cm²G before the reaction to 9.8 kgf/cm²G.

After releasing of the un-reacted monomer, a polymerization solution was removed and, re-coagulated with methanol to separate a copolymer. Vacuum drying was carried out until a constant value was obtained, and 14.5 g of a copolymer was obtained.

According to the $^1$H-NMR and $^{19}$F-NMR analyses, the copolymer was one comprising TFE, 2-norbornene and fluorine-containing norbornene in a ratio of 49/19/32% by mole.

According to the GPC analysis, the number average molecular weight of the copolymer was 4,800.

Example 80
(Synthesis of Copolymer of 2,3-dihydrofuran, Tetrafluroethylene and Tert-butyl-αfluroacrylate)

The same 500 ml autoclave as in Example 26 was charged with 7.0 g of 2,3-dihydrofuran, 5.8 g of tert-butyl-αfluroacrylate obtained in Preparation Example 1, 40 ml of the same HCFC-225 as in Example 10 and 0.8 g of bis(4-tert-butylcyclohexyl)peroxy dicarbonate (TCP), and the inside of a system was sufficiently replaced with nitrogen gas while cooling with a dry ice/methanol solution. Then 40.0 g of tetrafluroethylene (TFE) was introduced through the valve, followed by shaking for reaction at 40° C. for 18 hours. With the advance of the reaction, a gauge pressure was lowered from 9.0 kgf/cm$^2$G before the reaction to 8.8 kgf/cm$^2$G.

After releasing of the un-reacted monomer, a polymerization solution was removed and, re-coagulated with hexane to separate a copolymer. Vacuum drying was carried out until a constant value was obtained, and 10.9 g of a copolymer was obtained.

According to the $^1$H-NMR and $^{19}$F-NMR analyses, the copolymer was one comprising TFE, 2,3-dihydrofuran and tert-butyl-αfluroacrylate in a ratio of 23/33/44% by mole.

According to the GPC analysis, the number average molecular weight of the copolymer was 16,000.

Example 81
(Synthesis of Copolymer of 2,3-dihydrofuran, Tetrafluroethylene and Tert-butyl-methacrylate)

The same 500 ml autoclave as in Example 26 was charged with 7.0 g of 2,3-dihydrofuran, 5.6 g of tert-butyl-methacrylate, 40 ml of the same HCFC-225 as in Example 10 and 0.8 g of bis(4-tert-butylcyclohexyl) peroxy dicarbonate (TCP), and the inside of a system was sufficiently replaced with nitrogen gas while cooling with a dry ice/methanol solution. Then 40.0 g of tetrafluroethylene (TFE) was introduced through the valve, followed by shaking for reaction at 40° C. for 18 hours. With the advance of the reaction, a gauge pressure was lowered from 9.0 kgf/cm$^2$G before the reaction to 8.8 kgf/cm$^2$G.

After releasing of the un-reacted monomer, a polymerization solution was removed and, re-coagulated with hexane to separate a copolymer. Vacuum drying was carried out until a constant value was obtained, and 10.8 g of a copolymer was obtained.

According to the $^1$H-NMR and $^{19}$F-NMR analyses, the copolymer was one comprising TFE, 2,3-dihydrofuran and tert-butyl-methacrylate in a ratio of 33/35/32% by mole.

According to the GPC analysis, the number average molecular weight of the copolymer was 9,800.

Example 82
(Synthesis of Copolymer of Cyclopentene, Tetrafluroethylene and Fluorine-containing Allyl Ether)

The same 300 ml autoclave as in Example 26 was charged with 13.0 g of cyclopentene, 33.2 g of fluorine-containing allyl ether:

obtained in Preparation Example 6, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.3 kgf/cm$^2$G before the reaction to 9.4 kgf/cm$^2$G.

After releasing of the un-reacted monomer, a polymerization solution was removed and, re-coagulated with methanol to separate a copolymer. Vacuum drying was carried out until a constant value was obtained, and 9.0 g of a copolymer was obtained.

According to the $^1$H-NMR and $^{19}$F-NMR analyses, the copolymer was one comprising TFE, cyclopentene and fluorine-containing allyl ether in a ratio of 47/39/14% by mole.

According to the GPC analysis, the number average molecular weight of the copolymer was 4,400.

Example 83
(Synthesis of Copolymer of Cyclopentene, Tetrafluroethylene and Fluorine-containing Allyl Ether)

The same 300 ml autoclave as in Example 26 was charged with 13.0 g of cyclopentene, 39.1 g of fluorine-containing allyl ether:

obtained in Preparation Example 2, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.1 kgf/cm$^2$G before the reaction to 9.7 kgf/cm$^2$G.

After releasing of the un-reacted monomer, a polymerization solution was removed and, re-coagulated with methanol to separate a copolymer. Vacuum drying was carried out until a constant value was obtained, and 7.8 g of a copolymer was obtained.

According to the $^1$H-NMR and $^{19}$F-NMR analyses, the copolymer was one comprising TFE, cyclopentene and fluorine-containing allyl ether in a ratio of 50/33/17% by mole.

According to the GPC analysis, the number average molecular weight of the copolymer was 4,200.

Example 84
(Synthesis of Copolymer of 2,3-dihydrofuran, Tetrafluroethylene and Fluorine-containing Allyl Ether)

The same 300 ml autoclave as in Example 26 was charged with 13.4 g of 2,3-dihydrofuran, 33.2 g of fluorine-containing allyl ether:

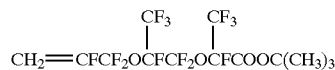

obtained in Preparation Example 6, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.3 kgf/cm$^2$G before the reaction to 9.4 kgf/cm$^2$G.

After releasing of the un-reacted monomer, a polymerization solution was removed and, re-coagulated with methanol to separate a copolymer. Vacuum drying was carried out until a constant value was obtained, and 9.5 g of a copolymer was obtained.

According to the $^1$H-NMR and $^{19}$F-NMR analyses, the copolymer was one comprising TFE, 2,3-dihydrofuran and fluorine-containing allyl ether in a ratio of 47/35/18% by mole.

According to the GPC analysis, the number average molecular weight of the copolymer was 4,100.

Example 85
(Synthesis of Copolymer of 2,3-dihydrofuran, Tetrafluroethylene and Fluorine-containing Allyl Ether)

The same 300 ml autoclave as in Example 26 was charged with 13.4 g of 2,3-dihydrofuran, 39.1 g of fluorine-containing allyl ether:

obtained in Preparation Example 2, 140 ml of HCFC-141b and 1.0 g of bis(4-tert-butylcyclohexyl)peroxy dicarbonate (TCP), and the inside of a system was sufficiently replaced with nitrogen gas while cooling with a dry ice/methanol solution. Then 36.0 g of tetrafluroethylene (TFE) was introduced through the valve, followed by shaking for reaction at 40° C. for 12 hours. With the advance of the reaction, a gauge pressure was lowered from 10.1 kgf/cm$^2$G before the reaction to 9.7 kgf/cm$^2$G.

After releasing of the un-reacted monomer, a polymerization solution was removed and, re-coagulated with methanol to separate a copolymer. Vacuum drying was carried out until a constant value was obtained, and 8.8 g of a copolymer was obtained.

According to the $^1$H-NMR and $^{19}$F-NMR analyses, the copolymer was one comprising TFE, 2,3-dihydrofuran and fluorine-containing allyl ether in a ratio of 49/32/19% by mole.

According to the GPC analysis, the number average molecular weight of the copolymer was 4,500.

Examples 86 to 93
(Measurement of Absorption Coefficient of Light having a Wavelength of 157 nm, Solubility in a Developing Solution and Dry Etching Resistance)
(1) Measurement of Absorption Coefficient 3% butyl acetate solutions of each polymer shown in Table 4 were prepared and applied on a MgF$_2$ substrate by a spin coater so that a coating thickness became from 100 to 200 nm. After the coating film was dried at room temperature for six hours or more, a transmittance of light having a wavelength of 157 nm was measured with a vacuum ultraviolet spectrophotometer in the same manner as in Example 14. Also a coating thickness of the same film was measured with an interferometer, and an absorption coefficient was calculated from the obtained transmittance and coating thickness. The results are shown in Table 4.

(2) Evaluation of Solubility in Developing Solution

The polymer was dissolved in a solvent and reacted with trifluoroacetic acid for deprotection of t-butyl protective group contained in the polymer. After confirming with $^1$H-NMR that 85% or more of t-butyl protective groups had undergone deprotection and had been converted to carboxylic acid, 10% butyl acetate solution of the polymer subjected to deprotecting was prepared and applied on a Si substrate with a spin coater so that a coating thickness became 200 nm. The coating film was dried at room temperature for six hours or more. After the thickness of the dried film was measured with AFM, the coated film was dipped in a 3% aqueous solution of TMAH for 60 seconds. Then the coated substrate was removed and dried at room temperature. The coating thickness was measured with AFM and whether or not there is a remaining film was checked. The results are shown in Table 4.

(3) Evaluation of Dry Etching Resistance

10% butyl acetate solution of the polymer was prepared and applied on a Si substrate with a spin coater so that a coating thickness became 200 nm. After pre-baking at 120° C. for two minutes, the coating thickness was measured with an interference thickness meter. After that, the coated substrate was put in a chamber of ICP (inductively-coupled plasma) etching equipment and subjected to etching. A pressure of etching gas (Ar/N$_2$/C$_4$F$_8$ gas mixture) was 10 mTorr. Irradiation of plasma was carried out under the conditions of 13.56 MHz and 900 W in an upper electrode and 400 kHz and 100 W in a lower electrode. An etching time was 60 seconds.

The coating thickness after the etching was measured with an interference thickness meter, and an etching rate was calculated. The obtained etching rate is shown by comparing with an etching rate of a resist (TArF-6a-63 available from TOKYO OHKA KOGYO CO., LTD.) for use on lithography for ArF laser. Namely, the measured etching rate is represented by a ratio to the etching rate of the comparison polymer (the above-mentioned resist for ArF laser) on the assumption that the etching rate of the comparison polymer is 1. The results are shown in Table 4. Table 4 shows an absorption coefficient at 157 nm, solubility in a 3% aqueous solution of TMAH and dry etching resistance (compared with ArF resist) of each polymer.

TABLE 4

| Example No. | Fluorine-containing polymer | Absorption coefficient ($\mu m^{-1}$) | Solubility | Etching rate (compared with ArF resist) |
|---|---|---|---|---|
| 86 | Ex. 59 | 3.7 | ◯ | 1.15 |
| 87 | Ex. 61 | 4.9 | ◯ | 1.39 |
| 88 | Ex. 63 | 2.6 | ◯ | 1.21 |
| 89 | Ex. 64 | 2.0 | ◯ | 1.02 |
| 90 | Ex. 65 | 3.9 | ◯ | 1.20 |
| 91 | Ex. 66 | 3.2 | ◯ | 1.04 |
| 92 | Ex. 69 | 2.4 | ◯ | 1.16 |
| 93 | Ex. 73 | 2.6 | ◯ | 1.21 |

Preparation Example 9

(Synthesis of Copolymer of Norbornene, Tetrafluroethylene and Norbornene having —COOC(CH₃)₃)

The same 300 ml autoclave as in Example 26 was charged with 27.3 g of 2-norbornene, 45.4 g of norbornene:

having —COOC(CH₃)₃, 140 ml of HCFC-141b, 30.0 g of tetrafluroethylene and 1.0 g of bis(4-tert-butylcyclohexyl) peroxy dicarbonate (TCP), and a reaction was carried out in the same manner as in Example 44. Thus 12.5 g of a copolymer was obtained.

According to the ¹H-NMR, ¹⁹F-NMR and elementary analyses, the copolymer was one comprising TFE, 2-norbornene and norbornene having —COOC(CH₃)₃ in a ratio of 49/38/13% by mole.

Preparation Example 10

Synthesis of Copolymer of Tetrafluroethylene and Norbornene having —COOC(CH₃)₃ Group A reaction was carried out in the same manner as in Example 43 except that 13.9 g of norbornene:

having —COOC(CH₃)₃ group was used instead of the fluorine-containing norbornene obtained in Example 36, and a fluorine-containing polymer was isolated. Thus 6.9 g of a white powder was obtained.

According to the ¹H-NMR, ¹⁹F-NMR and elementary analyses, the copolymer was one comprising TFE and norbornene having —COOC(CH₃)₃ in a ratio of 51/49% by mole.

Examples 94 to 101 and Comparative Examples 1 and 2

Measurement of Absorption Coefficient of Light having a Wavelength of 157 nm, Solubility in a Developing Solution and Dry Etching Resistance With respect to each of fluorine-containing polymers having norbornene, (1) measurement of absorption coefficient, (2) evaluation of solubility in a developing solution, and (3) evaluation of dry etching resistance were carried out in the same manner as in Example 86.

The results are shown in Table 5.

TABLE 5

| Example No. | Fluorine-containing polymer | Absorption coefficient | Solubility | Etching rate (compared with ArF resist) |
|---|---|---|---|---|
| 94 | Ex. 38 | 3.8 | ○ | 1.28 |
| 95 | Ex. 39 | 2.7 | ○ | 1.22 |
| 96 | Ex. 40 | 2.7 | ○ | 0.95 |
| 97 | Ex.41 | 3.1 | ○ | 0.92 |
| 98 | Ex. 42 | 2.8 | ○ | 0.85 |
| 99 | Ex. 44 | 2.4A | (A residue partly remains undissolved) | 0.81 |
| 100 | Ex.45 | 1.1 | ○ | 1.08 |
| 101 | Ex. 46 | 0.96 | Δ (A residue partly remains undissolved) | 1.02 |
| Com.Ex.1 | Prep. Ex. 9 | 3.1 | Δ (A residue partly remains undissolved) | 1.05 |
| Com.Ex.2 | Prep. Ex. 10 | 3.9 | ○ | 1.21 |

Examples 102 to 117

(1) Preparation of Coating Composition

A resist composition was prepared in the same manner as in Example 14 using the fluorine-containing polymer (A) having functional group, the photoacid generator (B) and the solvent (C) in a mixing ratio shown in Table 6. S-(trifluoromethyl)-dibenzothiopheniumtrifluoromethane sulfonate:

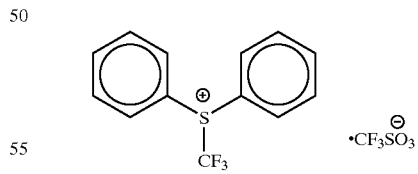

was used as the photoacid generator (B).

(2) Coating

Coating on MgF₂ and measurement of a coating thickness were carried out in the same manner as in Example 14.

(3) Measurement of Transparency in a Vacuum Ultraviolet Region

A transparency of the resist coating film was measured in the same manner as in Example 14.

TABLE 6

| Ex. No. | Fluorine-containing polymer (A) | Photoacid generator (B) [% by weight based on (A)] | Solvent (C) (content of polymer, % by weight) | Coating thickness (nm) | Molecular absorption coefficient at 157 nm |
|---|---|---|---|---|---|
| 102 | Ex. 38 | 5.0 | Butyl acetate (4.0) | 120 | 4.0 |
| 103 | Ex. 39 | 5.0 | Butyl acetate (4.0) | 130 | 2.9 |
| 104 | Ex. 40 | 5.0 | Butyl acetate (4.0) | 110 | 3.0 |
| 105 | Ex. 41 | 5.0 | Butyl acetate (4.0) | 120 | 3.4 |
| 106 | Ex. 42 | 5.0 | Butyl acetate (4.0) | 150 | 3.0 |
| 107 | Ex. 43 | 5.0 | Butyl acetate (4.0) | 130 | 2.7 |
| 108 | Ex. 45 | 5.0 | Butyl acetate (4.0) | 110 | 1.2 |
| 109 | Ex. 46 | 5.0 | Butyl acetate (4.0) | 130 | 1.1 |
| 110 | Ex. 59 | 5.0 | Butyl acetate (4.0) | 110 | 3.9 |
| 111 | Ex. 61 | 5.0 | Butyl acetate (4.0) | 120 | 5.0 |
| 112 | Ex. 63 | 5.0 | Acetone (4.0) | 100 | 2.8 |
| 113 | Ex. 64 | 5.0 | Acetone (4.0) | 120 | 2.2 |
| 114 | Ex. 65 | 5.0 | Acetone (4.0) | 110 | 4.2 |
| 115 | Ex. 66 | 5.0 | Acetone (4.0) | 100 | 3.4 |
| 116 | Ex. 69 | 5.0 | Acetone (4.0) | 120 | 2.5 |
| 117 | Ex. 73 | 5.0 | Acetone (4.0) | 130 | 2.8 |

According to the present invention, a novel fluorine-containing polymer which has an acid-reactive group and possesses a high transparency against energy rays (radioactive rays) in a vacuum ultraviolet region (157 nm) can be provided, and a fluorine-containing base polymer material prepared from the polymer and suitable for a photoresist and a chemically amplifying type resist composition prepared from those polymer and material can be provided.

What is claimed is:

1. A chemically amplifying type photoresist composition which comprises:

(A) a fluorine-containing polymer having an acid-reactive functional group, (B) a photoacid generator and (C) a solvent, wherein the fluorine-containing polymer (A) having an acid-reactive group is a fluorine-containing polymer represented by the formula (2):

—(M1)—(M2)—(N)—     (2)

in which

① the structural unit M1 is a structural unit derived from the fluorine-containing alicyclic monomer having an acid-reactive group of the formula (1):

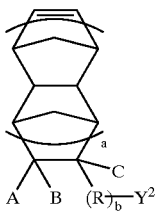

wherein the fluorine-containing polymer (A) having an acid-labile or acid-degradable group is a fluorine-containing polymer represented by the formula (3):

—(M1)—(M2)—(M3)—(N)—     (3)

in which

① the structural unit M1 is a structural unit derived from the fluorine-containing alicyclic monomer having an acid-reactive group of the formula (1):

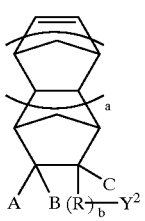

in which A, B and C are the same or different and each is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-labile or acid-degradable functional group; provided that when b is 0 or R does not have fluorine atom, at least one of A to C is fluorine atom or a fluorine-containing alkyl group, ② the structural unit M2 is a structural unit derived from a fluorine-containing ethylenic monomer, in which A, B and C are the same or different and each is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that at least one of A to C is fluorine atom or a fluorine-containing alkyl group, ② the structural unit M2 is a structural unit derived from a fluorine-containing ethylenic monomer and ③ the structural unit N is a structural unit derived from a monomer copolymerizable with M1 and M2, when M1+M2 is assumed to be equal to 100% by mole, the percent by mole ratio M1/M2 is 1 to 99/1 to 99, said polymer comprises from 1 to 99% by mole of the structural unit M1, from 1 to 99% by mole of the structural unit M2 and from 0 to 98% by mole of the structural unit N.

2. The chemically amplifying type photoresist composition of claim 1, wherein the acid-reactive group $Y^2$ of the flourine-containing alicyclic monomer of the formula (1)constituting the fluorine-containing polymer (A) having an acid-reactive group is an acid-labile or acid-degradable functional group.

3. The chemically amplifying type photoresist composition of claim 2, wherein the acid-labile or acid-degradable functional group is:

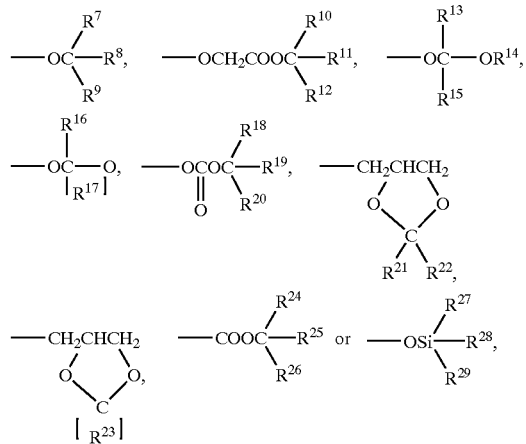

wherein $R^7$, $R^8$, $R^9$, $R^{10}$, $R^{11}$, $R^{12}$, $R^{14}$, $R^{18}$, $R^{19}$, $R^{20}$, $R^{21}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or hydrocarbon groups having 1 to 10 carbon atoms; and $R^{17}$ and $R^{23}$ are divalent hydrocarbon groups having 2 to 10 carbon atoms.

4. The chemically amplifying type photoresist composition of claim 3, wherein the acid-labile or acid-degradable functional group is:

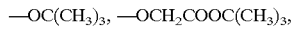

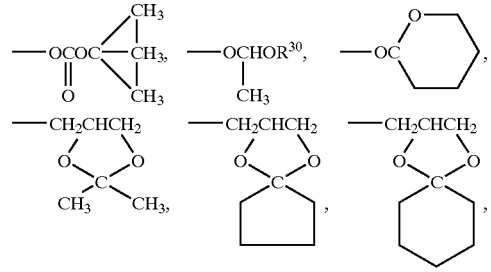

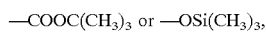

wherein $R^{30}$ is an alkyl group having 1 to 10 carbon atoms.

5. The chemically amplifying type photoresist composition of claim 2, wherein the acid-labile or acid-degradable functional group is a functional group which is converted to carboxyl group by a reaction with an acid.

6. The chemically amplifying type photoresist composition of claim 1, wherein the acid-reactive group $Y^2$ is a functional group which is capable of undergoing condensation reaction by an acid.

7. The chemically amplifying type photoresist composition of claim 6, wherein the functional group which is capable of undergoing condensation reaction by an acid is selected from the group consisting of —OH, —COOH, —CN, —SO$_3$H and epoxy group.

8. The chemically amplifying type photoresist composition of claim 1, wherein in the fluorine-containing alicyclic monomer of the formula (1) constituting the fluorine-containing polymer (A) having an acid-reactive group, at least one of A, B and C is fluorine atom.

9. The chemically amplifying type photoresist composition of claim 1, wherein in the fluorine-containing polymer (A) having an acid-reactive group, the structural unit M2 is a fluorine-containing ethylenic monomer having 2 or 3 carbon atoms.

10. The chemically amplifying type photoresist composition of claim 9, wherein in the fluorine-containing polymer (A) having an acid-reactive group, the structural unit M2 is a structural unit derived from a monomer selected from tetrafluoroethylene and chlorotrifluoroethylene.

11. The chemically amplifying type photoresist composition of claim 1, wherein in the fluorine-containing polymer (A) having an acid-reactive group, the proportion of the structural unit M1 is not less than 10% by mole based on the whole structural units constituting the fluorine-containing copolymer.

12. A chemically amplifying type photoresist composition which comprises:

(A) a fluorine-containing polymer having an acid-labile or acid-degradable functional group, (B) a photoacid generator and (C) a solvent, ③ the structural unit M3 is a structural unit derived from an alicyclic monomer represented by the formula(4):

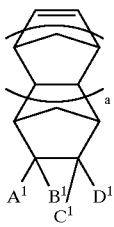

(4)

wherein $A^1$, $B^1$, $C^1$ and $D^1$ are the same or different and each is H, F, an alkyl group having 1 to 10 carbon atoms or a fluorine-containing alkyl group having 1 to 10 carbon atoms; a is 0 or an integer of from 1 to 3, and ④ the structural unit N is a structural unit derived from a monomer copolymerizable with M1, M2 and M3, when M1+M2+M3 is assumed to be equal to 100% by mole, the percent by mole ratio M1+M3/M2 is 30/70 to 70/30, said polymer comprises from 1 to 98% by mole of the structural unit M1, from 1 to 98% by mole of the structural unit M2, from 1 to 98% by mole of the structural unit M3 and from 0 to 97% by mole of the structural unit N.

13. The chemically amplifying type photoresist composition of claim 12, wherein the acid-labile or acid-degradable functional group is:

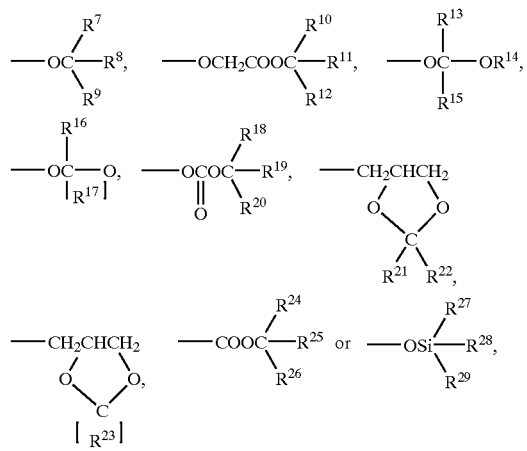

wherein $R^7$, $R^8$, $R^9$, $R^{10}$, $R^{11}$, $R^{12}$, $R^{14}$, $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or hydrocarbon groups having 1 to 10 carbon atoms; and $R^{17}$ and $R^{23}$ are divalent hydrocarbon groups having 2 to 10 carbon atoms.

14. The chemically amplifying type photoresist composition of claim 13, wherein the acid-labile or acid-degradable functional group is:

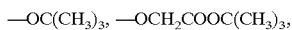

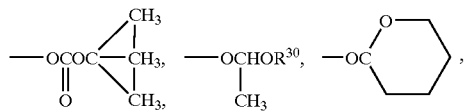

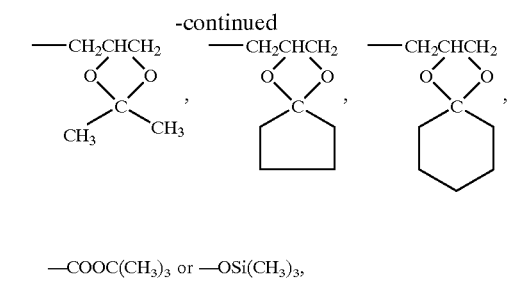

—COOC(CH$_3$)$_3$ or —OSi(CH$_3$)$_3$, wherein $R^{30}$ is an alkyl group having 1 to 10 carbon atoms.

15. The chemically amplifying type photoresist composition of claim 12 wherein the acid-labile or acid-degradable functional group is a functional group which is converted to carboxyl group by a reaction with an acid.

16. The chemically amplifying type photoresist composition of claim 12, wherein in the fluorine-containing alicyclic monomer of the formula (1) constituting the fluorine-containing polymer (A) having an acid-labile or acid-degradable group, at least one of A to C is fluorine atom or a fluorine-containing alkyl group.

17. The chemically amplifying type photoresist composition of claim 12, wherein in the fluorine-containing alicyclic monomer of the formula (1) constituting the fluorine-containing polymer (A) having an acid-labile or acid-degradable group, at least one of A, B and C is fluorine atom.

18. The chemically amplifying type photoresist composition of claim 12, wherein in the fluorine-containing polymer (A) having an acid-labile or acid-degradable group, the structural unit M2 is a fluorine-containing ethylenic monomer having 2 or 3 carbon atoms.

19. The chemically amplifying type photoresist composition of claim 18, wherein in the fluorine-containing polymer (A) having an acid-labile or acid-degradable group, the structural unit M2 is a structural unit derived from a monomer selected from tetrafluoroethylene and chlorotrifluoroethylene.

20. The chemically amplifying type photoresist composition of claim 12, wherein in the fluorine-containing polymer (A) having an acid-labile or acid-degradable group, the proportion of the structural unit M1 is not less than 10% by mole based on the whole structural units constituting the fluorine-containing copolymer.

21. A fluorine-containing polymer having a number average molecular weight of from 1,000 to 1,000,000 and represented by the formula (2):

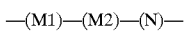

(2)

in which

① the structural unit M1 is a structural unit derived from a fluorine-containing alicyclic monomer having an acid-reactive group of the formula (1):

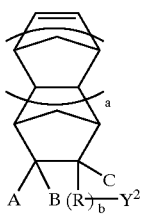

(1)

in which A, B and C are the same or different and each is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-reactive functional group; provided that at least one of A to C is fluorine atom or a fluorine-containing alkyl group, ② the structural unit M2 is a structural unit derived from a fluorine-containing ethylenic monomer, and ③ the structural unit N is a structural unit derived from a monomer copolymerizable with M1 and M2, when M1+M2 is assumed to be equal to 100% by mole, the percent by mole ratio M1/M2 is 1 to 99/1 to 99, said polymer comprises from 1 to 99% by mole of the structural unit M1, from 1 to 99% by mole of the structural unit M2 and from 0 to 98% by mole of the structural unit N.

22. The fluorine-containing polymer of claim 21, wherein the acid-reactive group $Y^2$ of the fluorine-containing alicyclic monomer of the formula (1) constituting the fluorine-containing polymer (A) having an acid-reactive group is an acid-labile or acid-degradable functional group.

23. The fluorine-containing polymer of claim 22, wherein the acid-labile or acid-degradable functional group is:

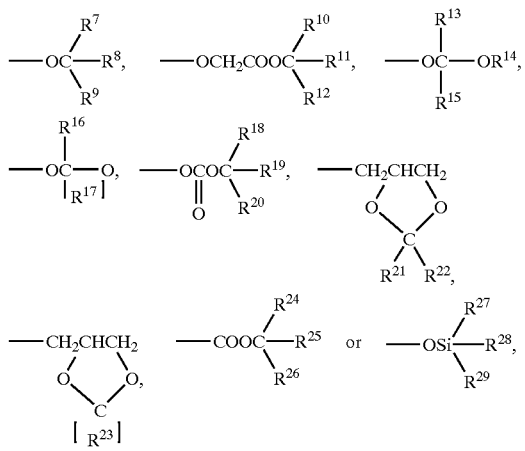

wherein $R^7$, $R^8$, $R^9$, $R^{10}$, $R^{11}$, $R^{12}$, $R^{14}$, $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or hydrocarbon groups having 1 to 10 carbon atoms; and $R^{17}$ and $R^{23}$ are divalent hydrocarbon groups having 2 to 10 carbon atoms.

24. The fluorine-containing polymer of claim 23, wherein the acid-labile or acid-degradable functional group is:

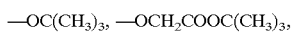

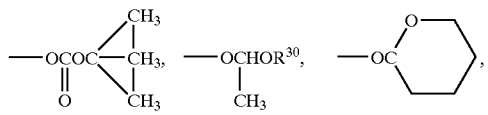

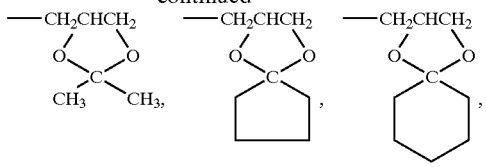

—COOC(CH₃)₃ or —OSi(CH₃)₃, wherein $R^{30}$ is an alkyl group having 1 to 10 carbon atoms.

25. The fluorine-containing polymer of claim 22, wherein the acid-labile or acid-degradable functional group is a functional group which is converted to carboxyl group by a reaction with an acid.

26. The fluorine-containing polymer of claim 21, wherein the acid-reactive group $Y^2$ is a functional group which is capable of undergoing condensation reaction by an acid.

27. The fluorine-containing polymer of claim 26, wherein the functional group which is capable of undergoing condensation reaction by an acid is selected from group consisting of —OH, —COOH, —CN, —SO₃H and epoxy group.

28. The fluorine-containing polymer of claim 21, wherein in the fluorine-containing alicyclic monomer of the formula (1), at least one of A, B and C is fluorine atom.

29. The fluorine-containing polymer of claim 21, wherein the structural unit M2 is a fluorine-containing ethylenic monomer having 2 or 3 carbon atoms.

30. The fluorine-containing polymer of claim 29, wherein in the fluorine-containing polymer (A) having an acid-reactive group, the structural unit M2 is a structural unit derived from a monomer selected from tetrafluoroethylene and chlorotrifluoroethylene.

31. A fluorine-containing polymer having a number average molecular weight of from 1,000 to 1,000,000 which is represented by the formula (3):

—(M1)—(M2)—(M3)—(N)— (3)

in which

① the structural unit M1 is a structural unit derived from a fluorine-containing alicyclic monomer having an acid-labile or acid-degradable group of the formula (1):

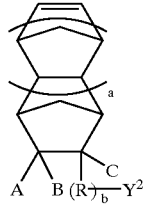

(1)

in which A, B and C are the same or different and each is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 3; b is 0 or 1; $Y^2$ is an acid-labile or acid-degradable functional group; provided that when b is 0 or R does not have fluorine atom, at least one of A to C is fluorine atom or a fluorine-containing alkyl group, ② the structural unit M2 is a structural unit derived from a fluorine-containing ethylenic monomer, ③ the structural unit M3 is a structural unit derived from an alicyclic monomer represented by the formula (4):

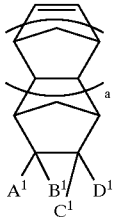

(4)

wherein $A^1$, $B^1$, $C^1$ and $D^1$ are the same or different and each is H, F, an alkyl group having 1 to 10 carbon atoms or a fluorine-containing alkyl group having 1 to 10 carbon atoms; a is 0 or an integer of from 1 to 3, and ④ the structural unit N is a structural unit derived from a monomer copolymerizable with M1, M2 and M3, when M1+M2+M3 is assumed to be equal to 100% by mole, the percent by mole ratio M1+M3/M2 is 30/70 to 70/30, said polymer comprises from 1 to 98% by mole of the structural unit M1, from 1 to 98% by mole of the structural unit M2, from 1 to 98% by mole of the structural unit M3 and from 0 to 97% by mole of the structural unit N.

32. The fluorine-containing polymer of claim 31, wherein the acid-labile or acid-degradable functional group is:

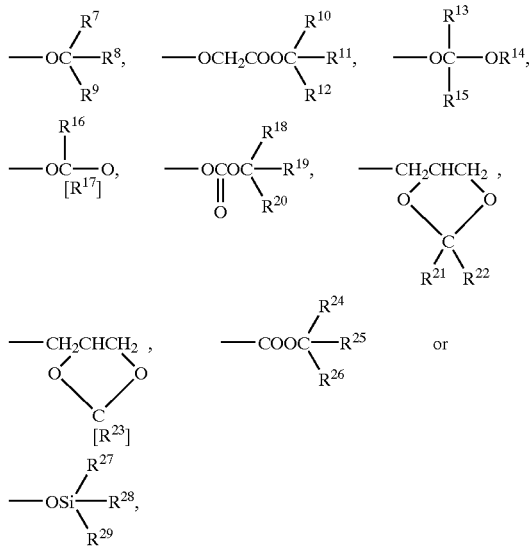

wherein $R^7$, $R^8$, $R^9$, $R^{10}$, $R^{11}$, $R^{12}$, $R^{14}$, $R^{18}$, $R^{19}$, $R^{20}$, $R^{21}$, $R^{22}$, $R^{24}$, $R^{25}$, $R^{26}$, $R^{27}$, $R^{28}$ and $R^{29}$ are the same or different and each is a hydrocarbon group having 1 to 10 carbon atoms; $R^{13}$, $R^{15}$ and $R^{16}$ are H or hydrocarbon groups having 1 to 10 carbon atoms; and $R^{17}$ and $R^{23}$ are divalent hydrocarbon groups having 2 to 10 carbon atoms.

33. The fluorine-containing polymer of claim 32, wherein the acid-labile or acid-degradable functional group is:

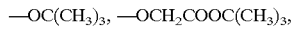

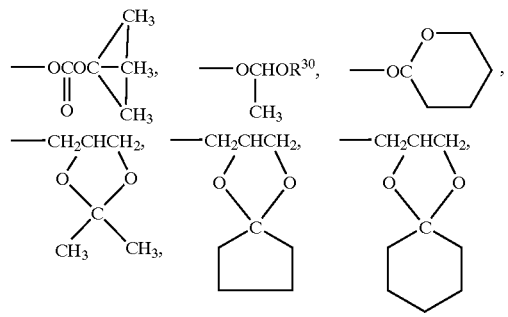

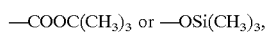

wherein $R^{30}$ is an alkyl group having 1 to 10 carbon atoms.

34. The fluorine-containing polymer of claim 31, wherein the acid-labile or acid-degradable functional group is a functional group which is converted to carboxyl group by a reaction with an acid.

35. The chemically amplifying type photoresist composition of claim 31, wherein in the fluorine-containing alicyclic monomer of the formula (1) constituting the fluorine-containing polymer (A) having an acid-labile or acid-degradable group, at least one of A to C is fluorine atom or a fluorine-containing alkyl group.

36. The fluorine-containing polymer of claim 31, wherein in the fluorine-containing alicyclic monomer of the formula (1) constituting the fluorine-containing polymer (A) having an acid-labile or acid-degradable group, at least one of A, B and C is fluorine atom.

37. The fluorine-containing polymer of claim 31, wherein in the fluorine-containing polymer (A) having an acid-labile or acid-degradable group, the structural unit M2 is a fluorine-containing ethylenic monomer having 2 or 3 carbon atoms.

38. The fluorine-containing polymer of claim 37, wherein in the fluorine-containing polymer (A) having an acid-labile or acid-degradable group, the structural unit M2 is a structural unit derived from a monomer selected from tetrafluoroethylene and chlorotrifluoroethylene.

* * * * *